(12) United States Patent
Tarng et al.

(10) Patent No.: US 11,608,677 B2
(45) Date of Patent: Mar. 21, 2023

(54) SMART WINDOW FOR GREEN ENERGY SMART HOME AND SMART GRID WITH FIELD PROGRAMMABLE SYSTEM ON CHIP FPSOC OF ANLINX, MILINX AND ZILINX

(71) Applicant: Min Ming Tarng, San Jose, CA (US)

(72) Inventors: Min Ming Tarng, San Jose, CA (US); Mei-Jech Lin, San Jose, CA (US); Eric Yu-Shiao Tarng, San Jose, CA (US); Alfred Yu-Chi Tarng, San Jose, CA (US); Angela Yu-Shiu Tarng, San Jose, CA (US); Huang-Chang Tarng, San Jose, CA (US)

(73) Assignee: Tang System, PDcGA:Professional Disclub Golf Association, San Jose, CA (US)

( * ) Notice: Subject to any disclaimer, the term of this patent is extended or adjusted under 35 U.S.C. 154(b) by 266 days.

(21) Appl. No.: 17/193,263

(22) Filed: Mar. 5, 2021

(65) Prior Publication Data
US 2021/0293083 A1    Sep. 23, 2021

Related U.S. Application Data

(63) Continuation-in-part of application No. 12/752,121, filed on Apr. 1, 2010, now Pat. No. 9,520,827, and a
(Continued)

(51) Int. Cl.
*E06B 9/24* (2006.01)
*G02F 1/163* (2006.01)
(Continued)

(52) U.S. Cl.
CPC ............... *E06B 9/24* (2013.01); *F24F 11/46* (2018.01); *F24F 11/83* (2018.01); *F24F 11/88* (2018.01);
(Continued)

(58) Field of Classification Search
CPC ... C09K 9/02; H02S 40/32; E60B 7/02; H02J 7/35
See application file for complete search history.

(56) References Cited

U.S. PATENT DOCUMENTS

2022/0137476 A1*    5/2022    Trikha .................. G06F 3/0412
                                                        359/265

* cited by examiner

*Primary Examiner* — Jeffrey M Shin

(57) ABSTRACT

The smart window for the smart home and smart grid can harvest energy and supply power to the home, grid and window itself. The smart window for the smart home and smart grid has all the Electrochromic panel, Solar panel and Multimedia panel been the same full window wide view and aligned with each other in IGU. To be a home automation system, the smart window has local/remote access/control capabilities. There are several types of smart windows working as master device or slave device. The operation of smart window automation system has three modes, normal/open mode, shut/tint mode and smart phone mode. The tube of air circulation system is hidden inside the frame surrounding IGU. Most of the electronic components are integrated to be FPSOC Field Programmable System On Chip that all the electronic component is hidden in the frame surrounding IGU, too. Therefore, the smart window doesn't have any blockage of window view with the Solar panel, Electrochromic panel, Multimedia panel and air circulation system. The smart window has the clean outlook as the conventional dual panel IGU does. The master device of the smart window system is similar to the huge screen working as a smart phone. In normal/open mode, the smart window is similar to the conventional dual panel window having the full-panel clean and clear view. For the different architectures of the smart homes, the smart window must have versatile alignments and system control that the smart window has to be implemented with the Field Programmable System On
(Continued)

Chips of Anlinx, Milinx and Zilinx made of the W5RS advanced FPSOC chip technologies.

20 Claims, 82 Drawing Sheets

Related U.S. Application Data continuation-in-part of application No. 12/422,719, filed on Apr. 13, 2009, now Pat. No. 8,487,653, and a continuation-in-part of application No. 15/810,005, filed on Nov. 11, 2017, now Pat. No. 10,328,357, and a continuation-in-part of application No. 12/317,973, filed on Dec. 31, 2008, now Pat. No. 8,089,324, and a continuation-in-part of application No. 12/291,984, filed on Nov. 14, 2008, now Pat. No. Plant 20,686, and a continuation-in-part of application No. 12/291,618, filed on Nov. 12, 2008, now Pat. No. 7,876,188, and a continuation-in-part of application No. 12/229,412, filed on Aug. 23, 2008, now Pat. No. 8,089,323, and a continuation-in-part of application No. 12/082,601, filed on Apr. 12, 2008, now abandoned, and a continuation-in-part of application No. 12/079,179, filed on Mar. 25, 2008, now Pat. No. 8,089,353, and a continuation-in-part of application No. 11/593,271, filed on Nov. 6, 2006, now Pat. No. 7,511,589, and a continuation-in-part of application No. 11/500,125, filed on Aug. 5, 2006, now Pat. No. 7,525,392, and a continuation-in-part of application No. 08/892,358, filed on Jul. 14, 1997, now Pat. No. 5,850,093, and a continuation-in-part of application No. 08/854,800, filed on May 12, 1997, now abandoned, and a continuation-in-part of application No. 08/081,074, filed on Jun. 22, 1993, now Pat. No. 5,793,125, and a continuation-in-part of application No. 15/472,262, filed on Mar. 28, 2017, now abandoned, and a continuation-in-part of application No. 13/918,989, filed on Jun. 16, 2013, now abandoned.

(51) Int. Cl.
*G02F 1/153* (2006.01)
*F24F 11/46* (2018.01)
*F24F 11/83* (2018.01)
*F24F 11/89* (2018.01)
*H02S 40/32* (2014.01)
*H02J 50/12* (2016.01)
*H04W 4/33* (2018.01)
*F24F 11/88* (2018.01)

(52) U.S. Cl.
CPC ............ *F24F 11/89* (2018.01); *G02F 1/1533* (2013.01); *G02F 1/163* (2013.01); *H02J 50/12* (2016.02); *H02S 40/32* (2014.12); *H04W 4/33* (2018.02); *E06B 2009/2464* (2013.01); *E06B 2009/2476* (2013.01)

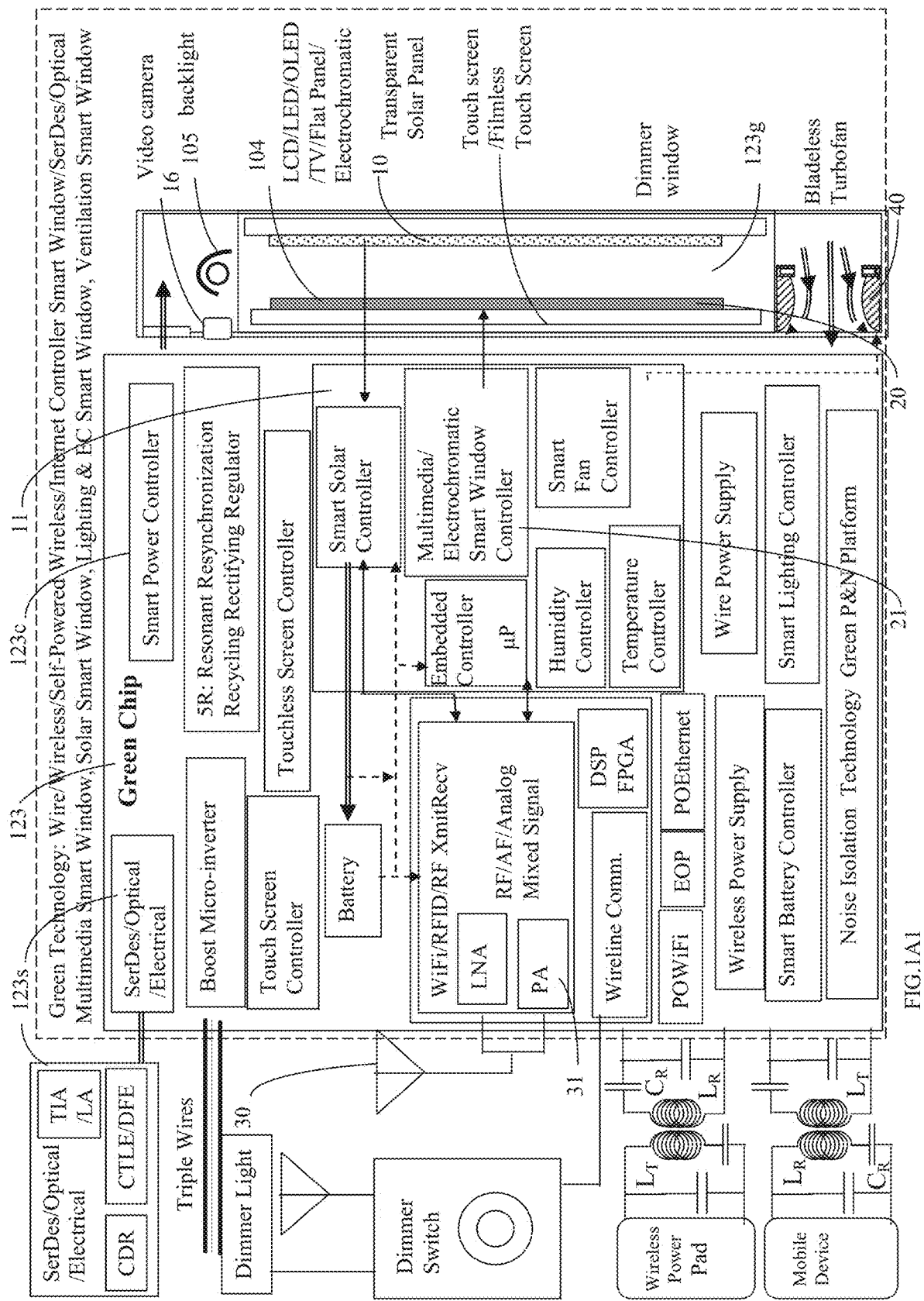
FIG. 1A1

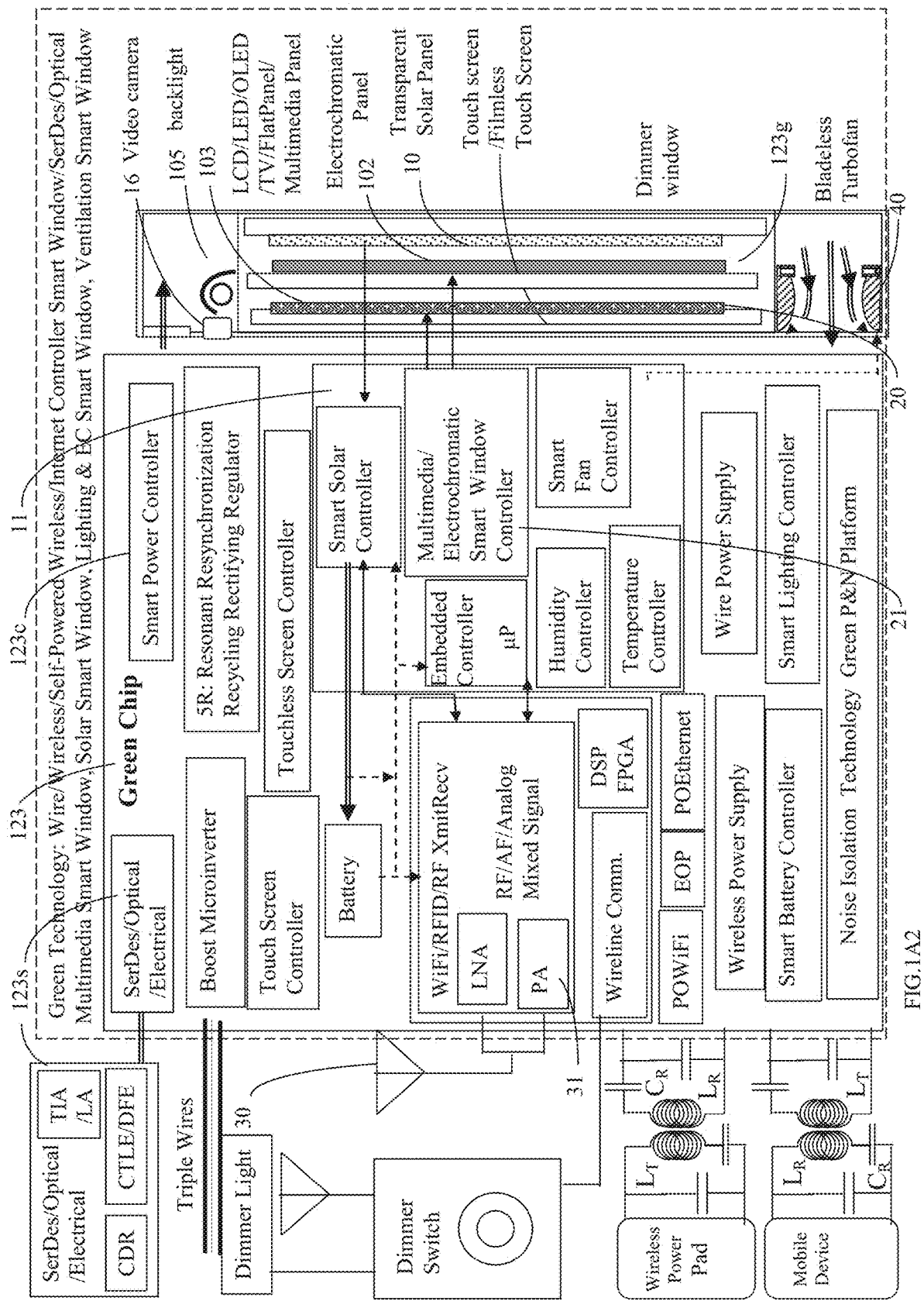
FIG.1A2

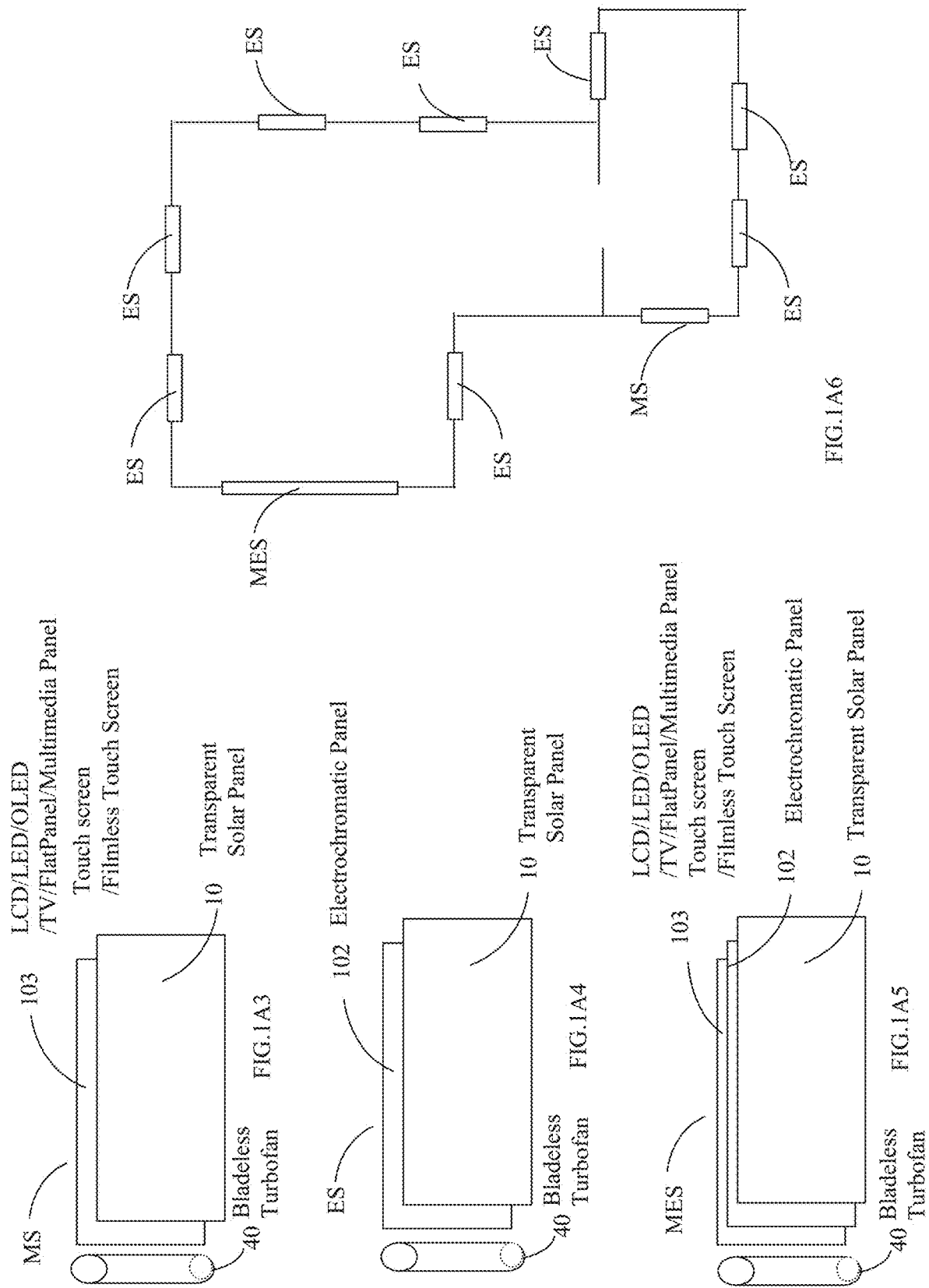

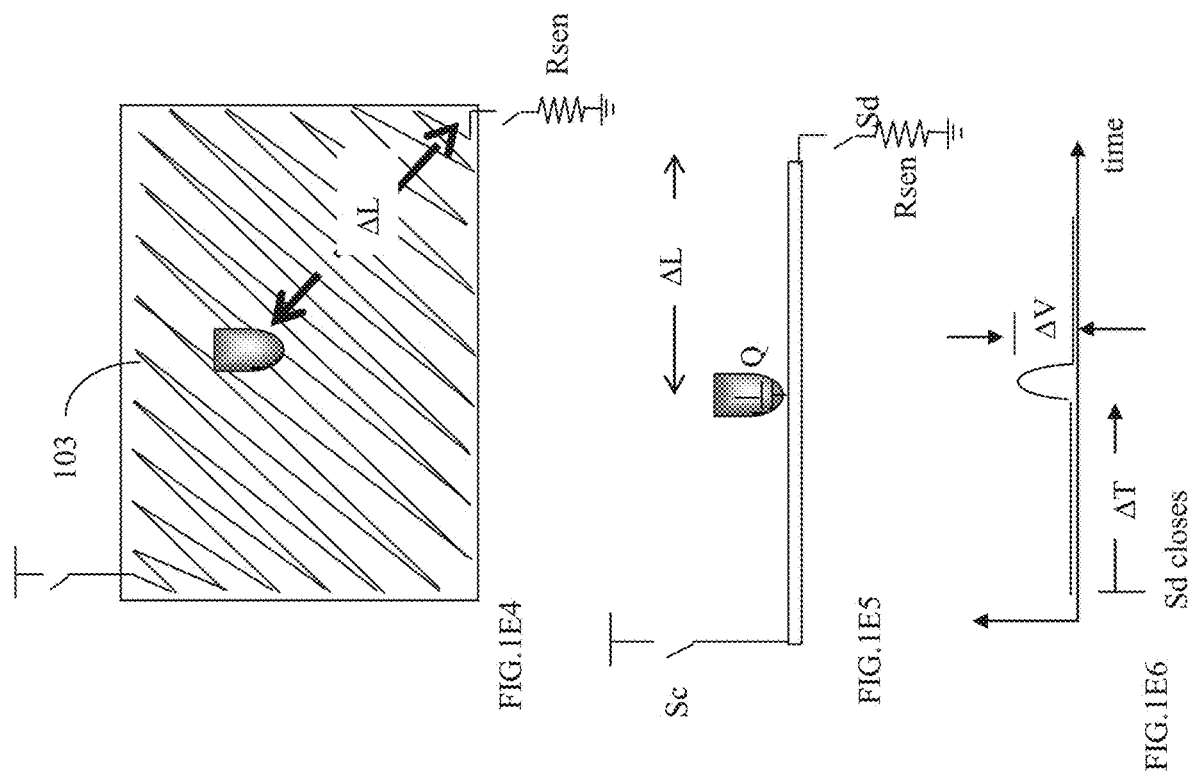
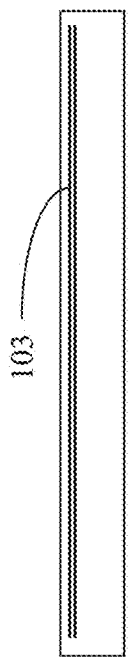
FIG.1E1
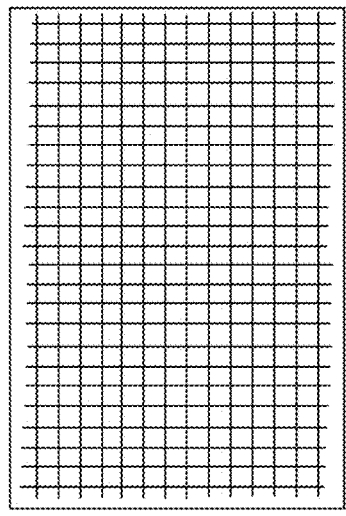
FIG.1E2
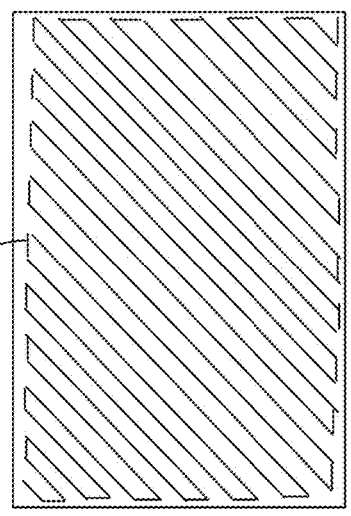
FIG.1E3

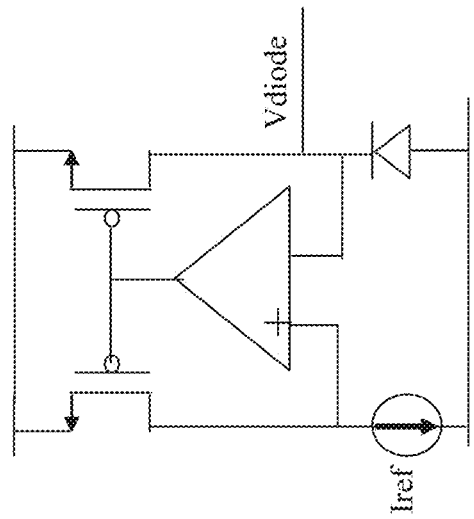
FIG.1F4A
FIG.1F4B
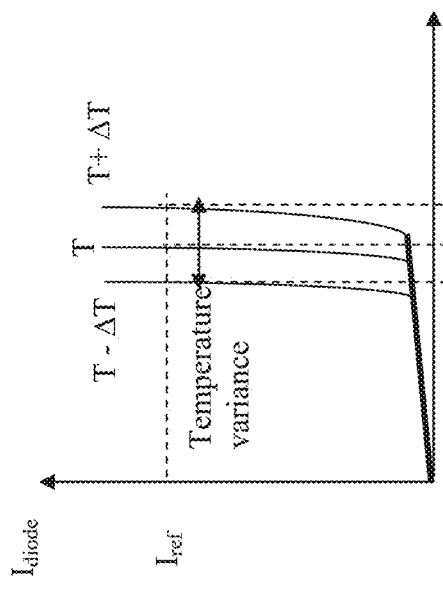
FIG.1F2
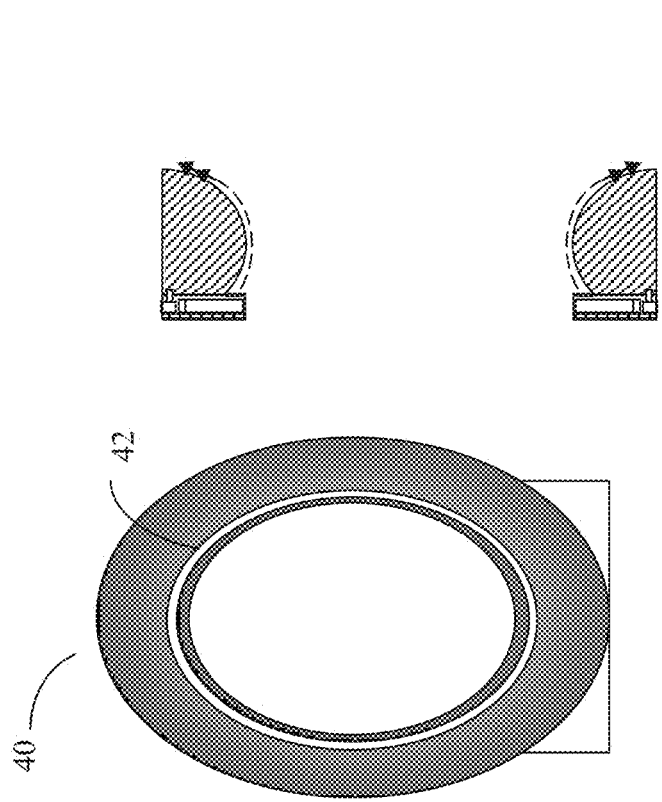
FIG.1F1
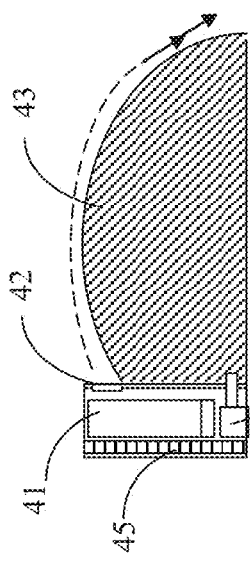
FIG.1F3

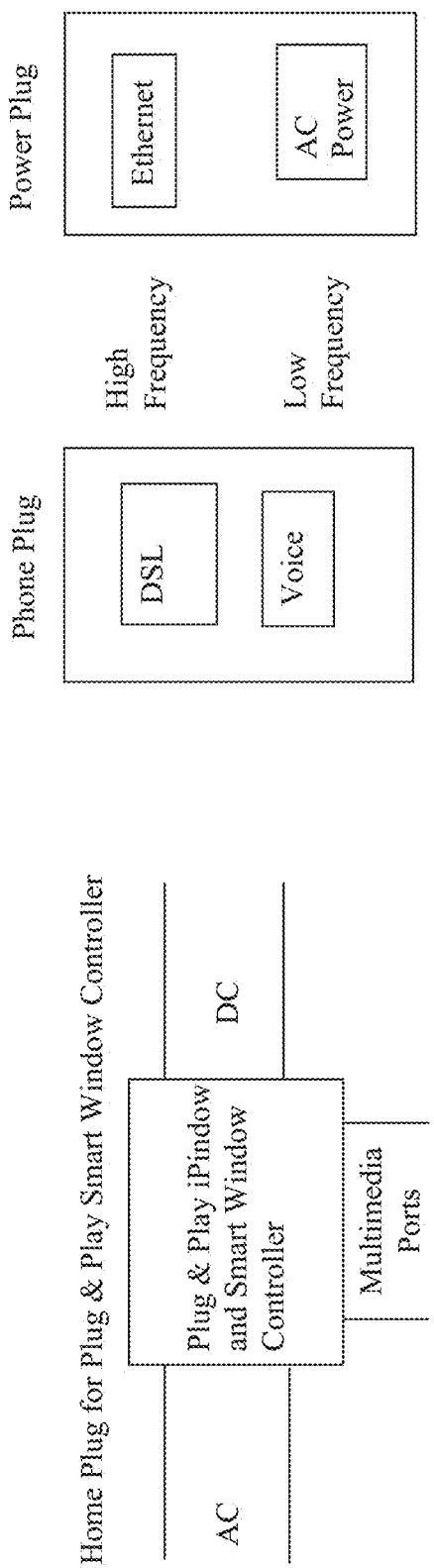
FIG.1G1
FIG.1G2
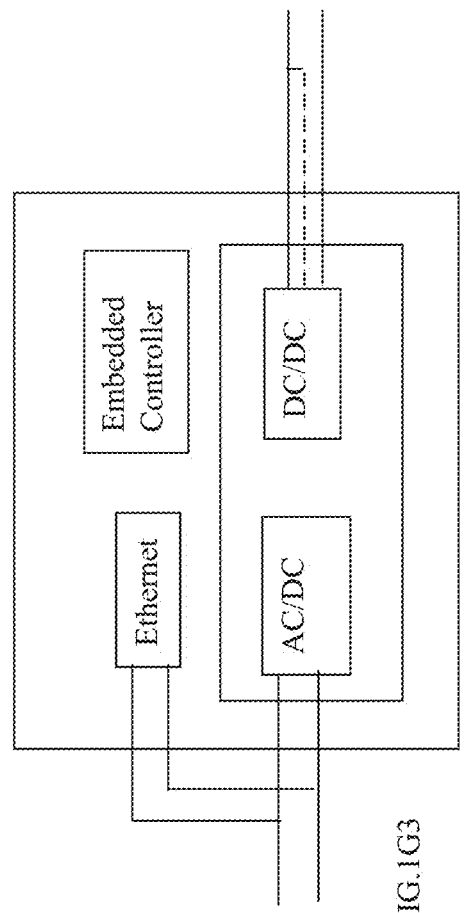
FIG.1G3

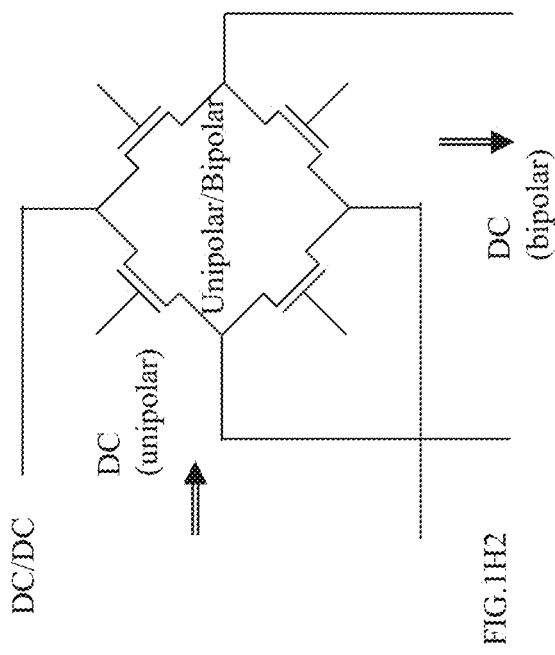
FIG.1H1
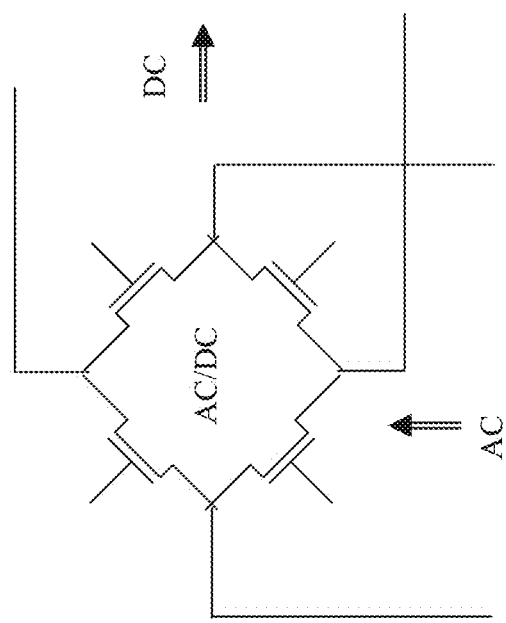
FIG.1H2
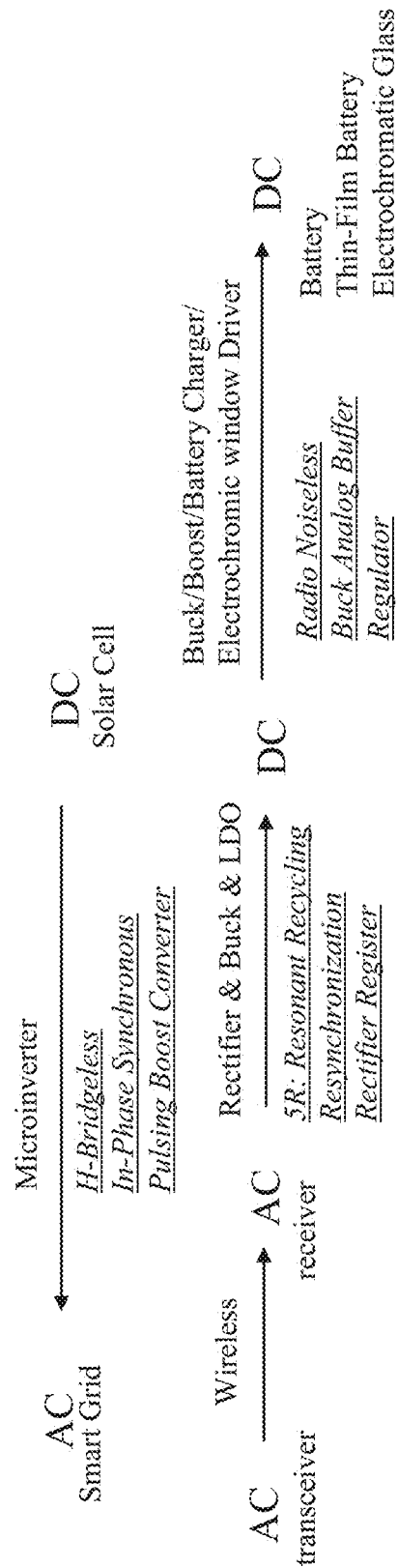
FIG.1I

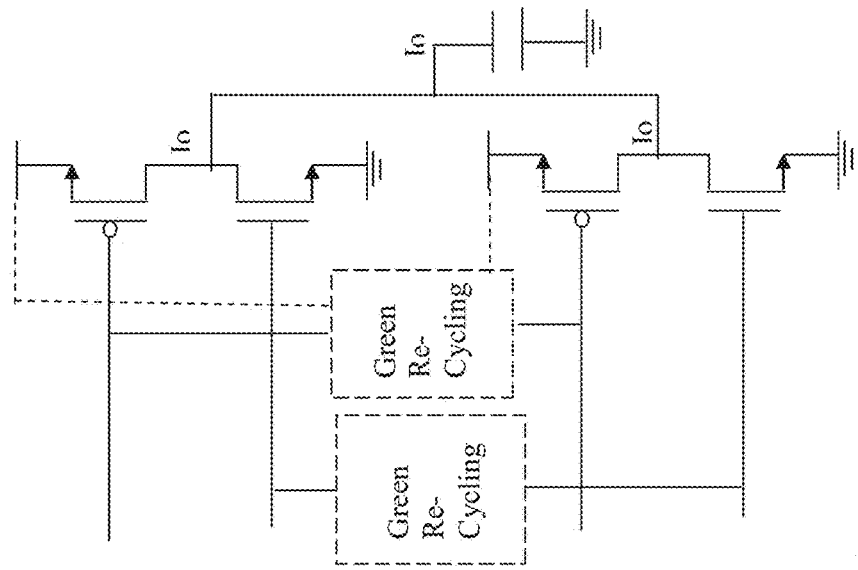
FIG.1K
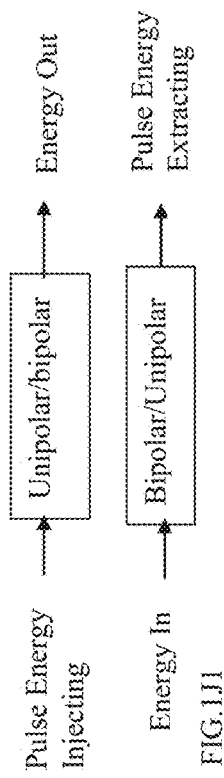
FIG.1J1
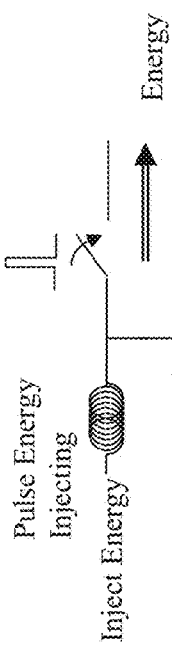
FIG.1J2
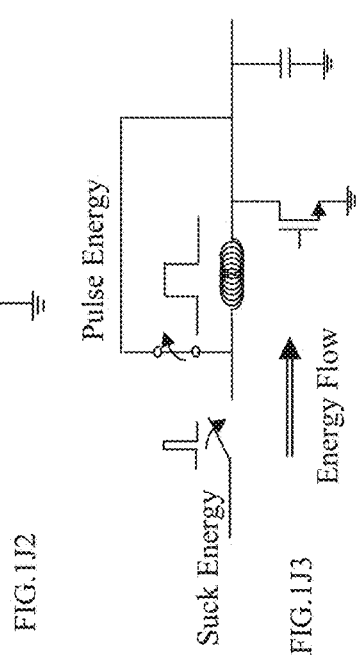
FIG.1J3
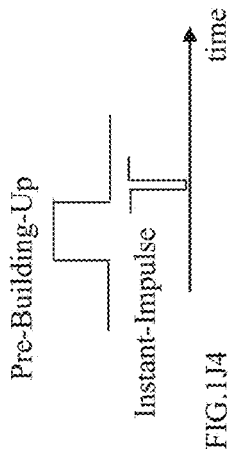
FIG.1J4

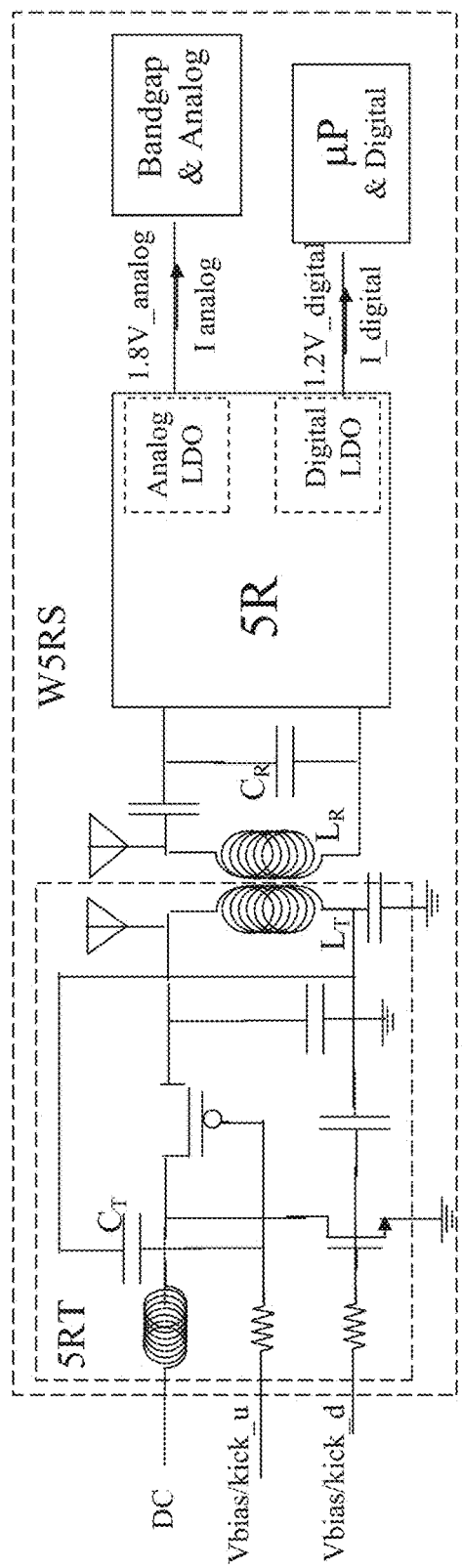
FIG.1L1
FIG.1L2
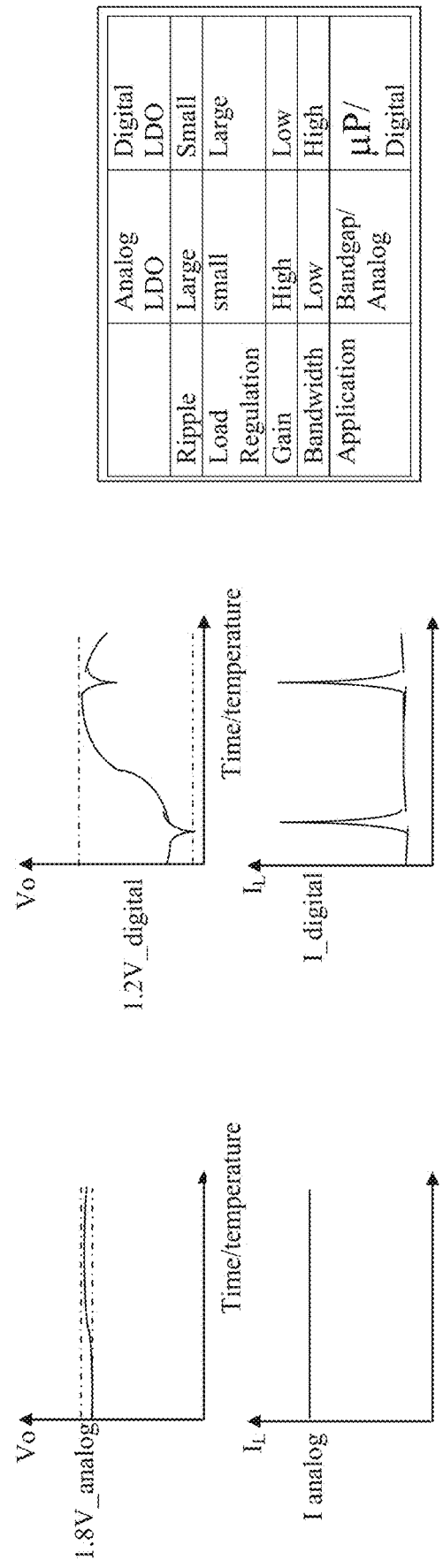
FIG.1L4
FIG.1L3

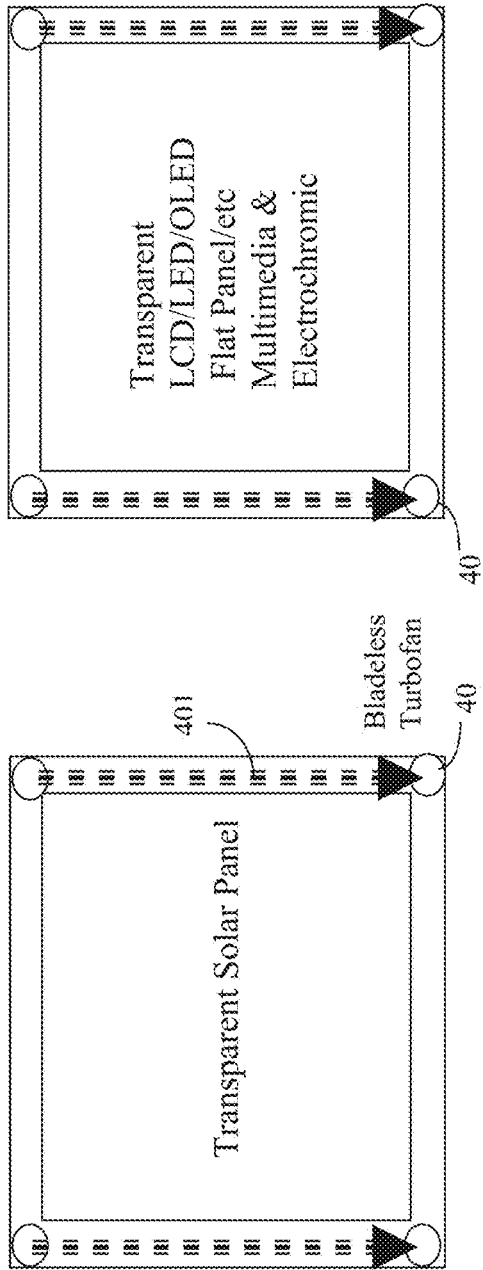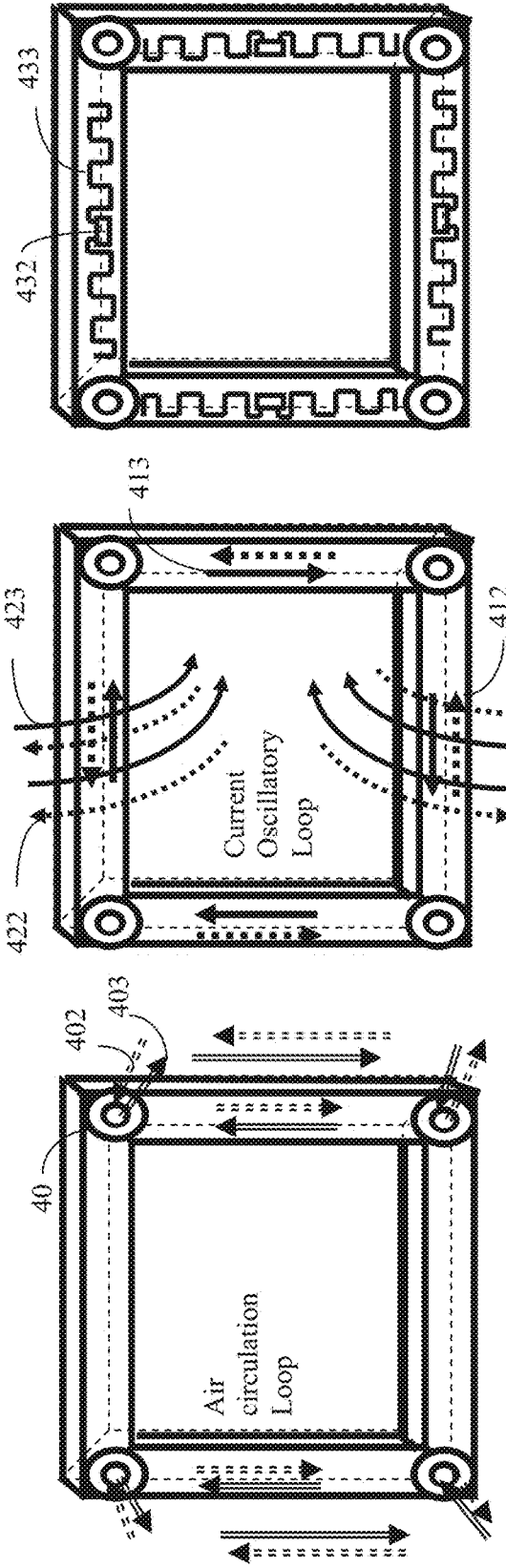

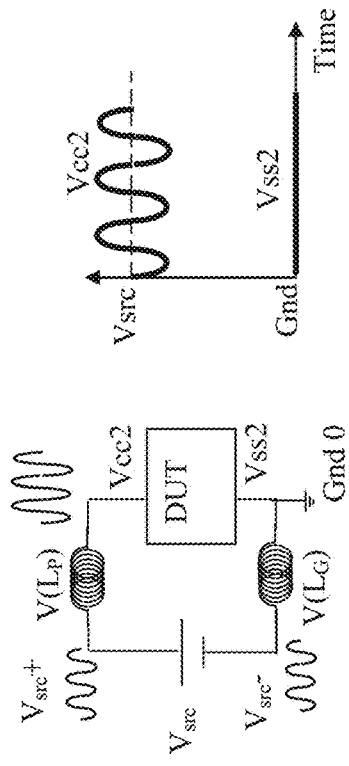
FIG.6A
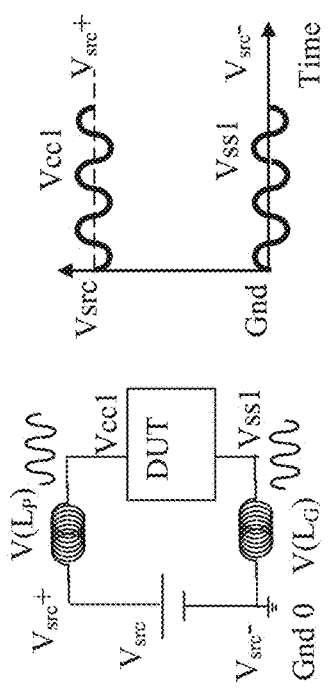
FIG.6C
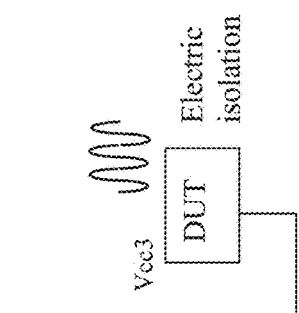
FIG.6B
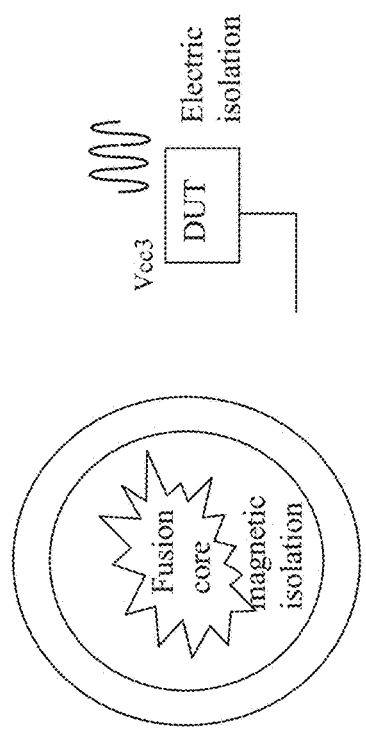
FIG.6D
FIG.6E

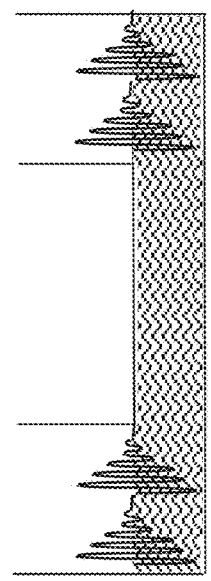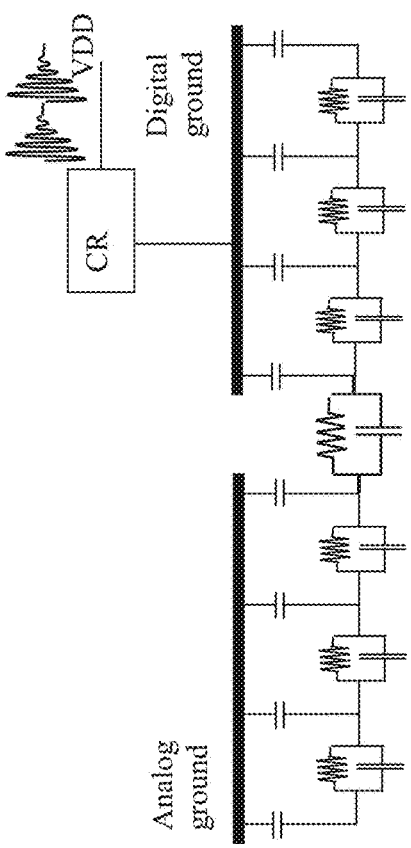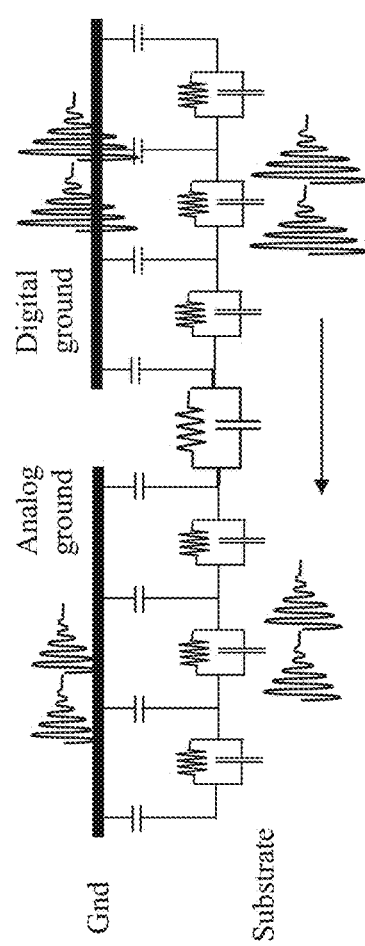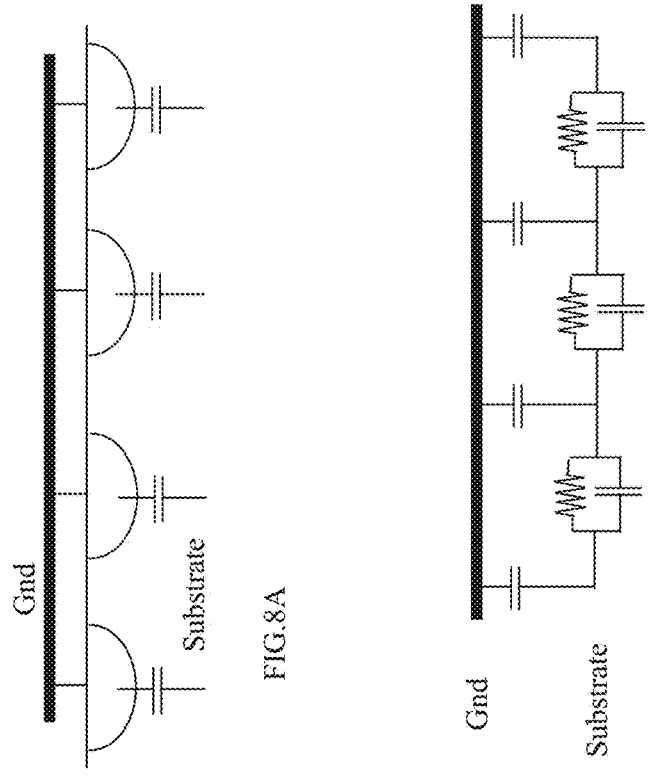

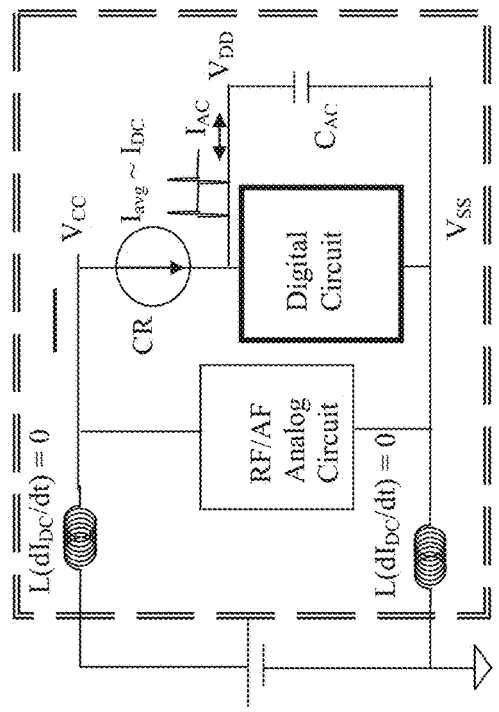
FIG.10A
FIG.10B
| Conventional | Green P&N |
|---|---|
| Multi-Chip | Single Chip |
| On-Board Bypass Capacitor $C_{bypass\_capacitor}$ | On-Chip Storage AC Capacitor $C_{AC}$ |
| Voltage Regulator VR | Current Regulator CR |
| Constant Output Voltage ($V_{AA}$) | Constant Output Current ($I_{CC}$) |
| Supply constant Voltage to FF/AF/Analog Circuits | Supply constant Current to Digital Circuits |
FIG.10C
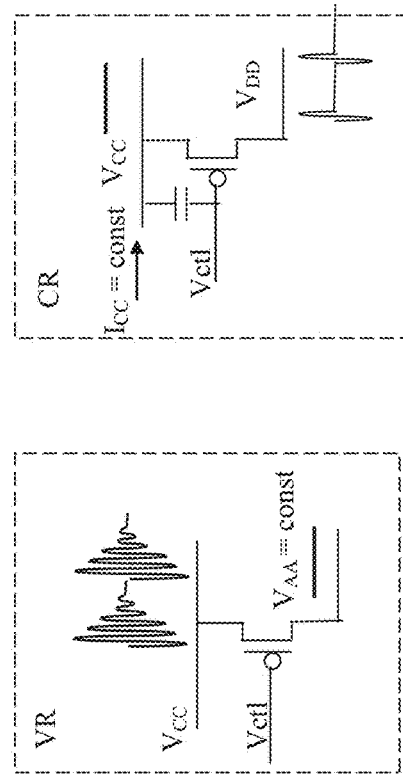
FIG.10D
FIG.10E

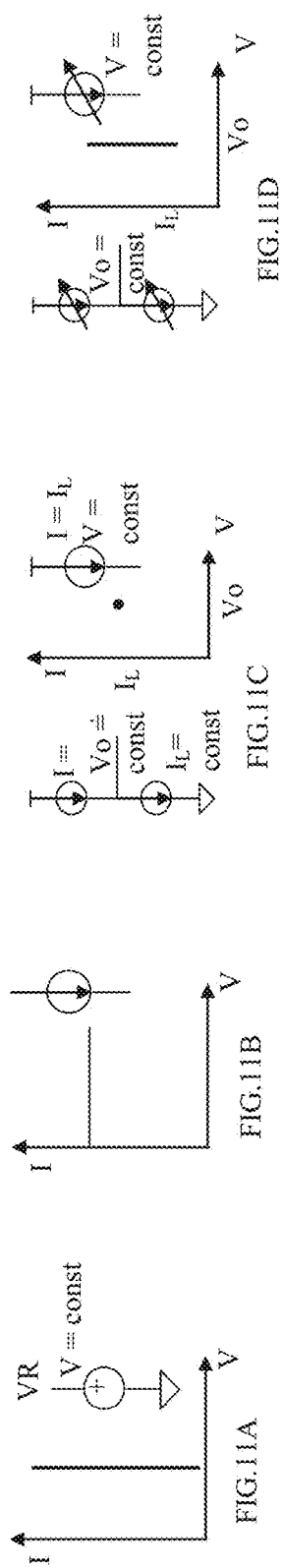
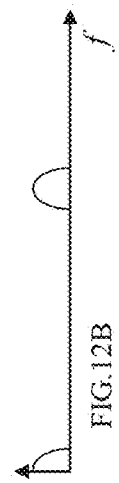
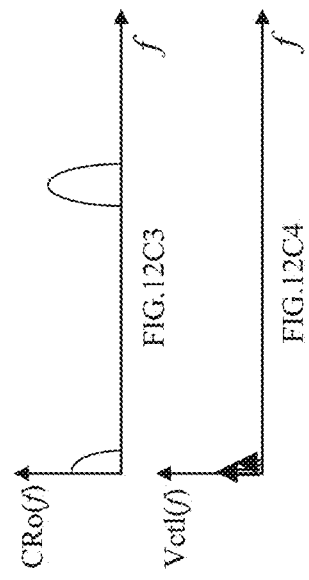
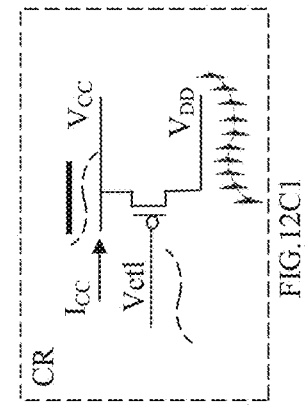
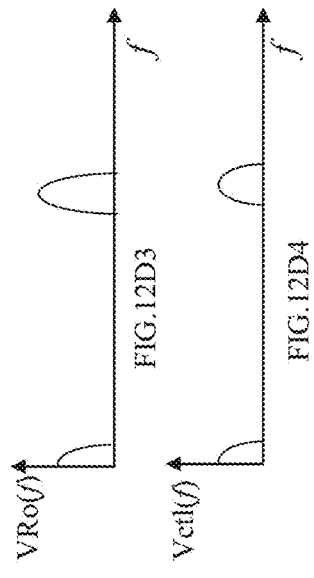
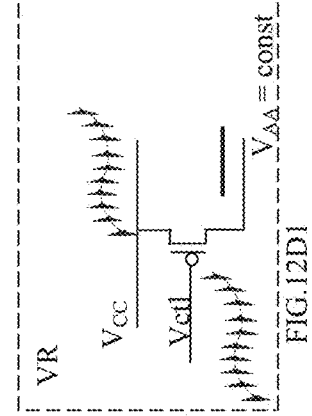

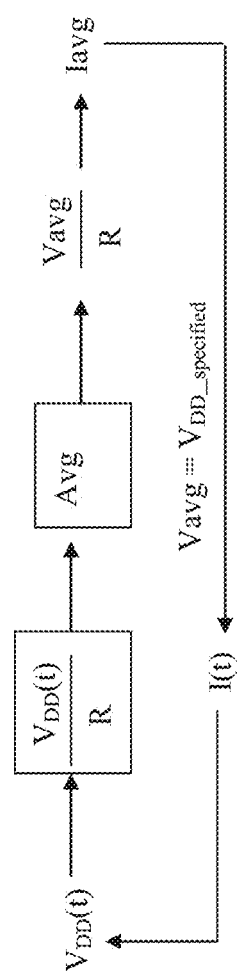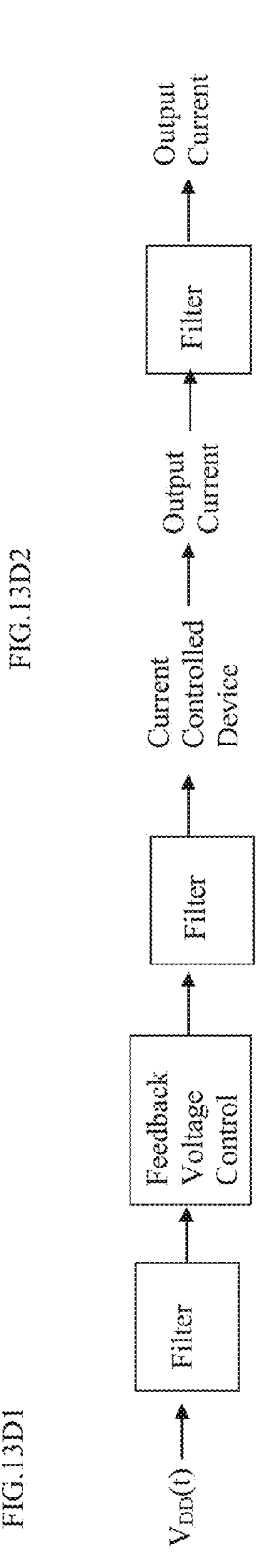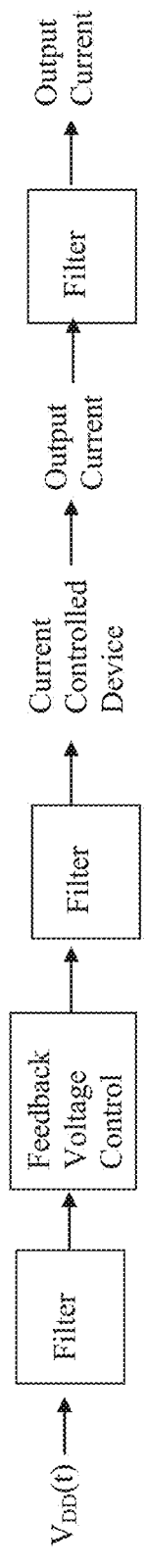

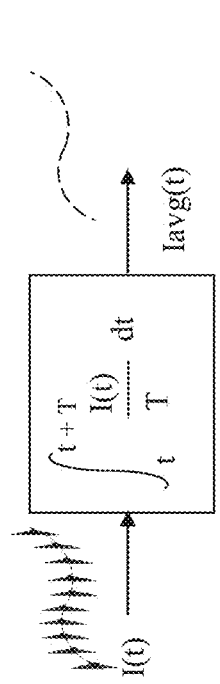
FIG.14B
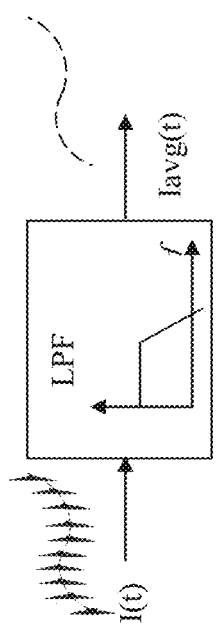
FIG.14D
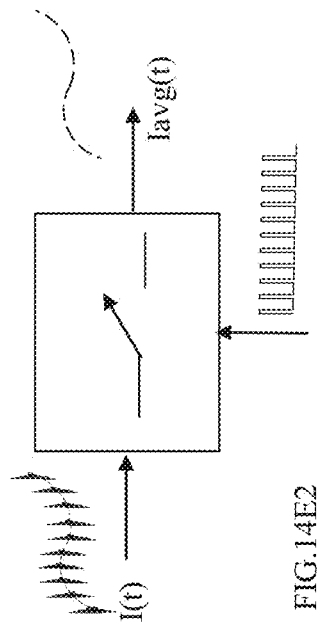
FIG.14E2
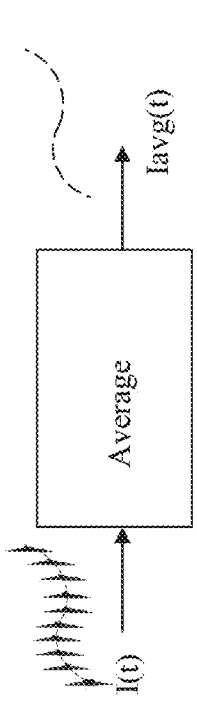
FIG.14A
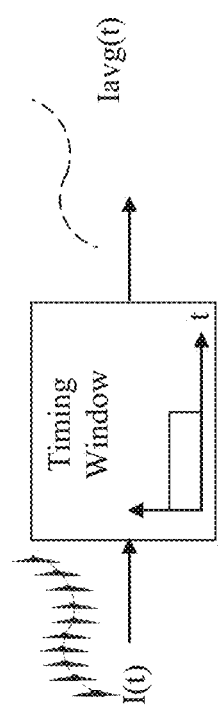
FIG.14C
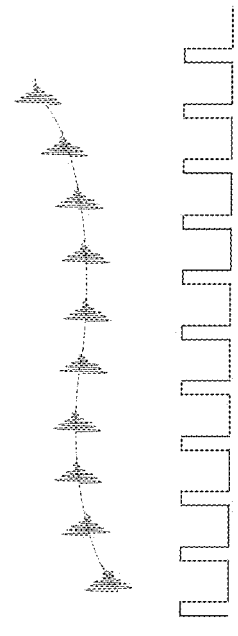
FIG.14E1

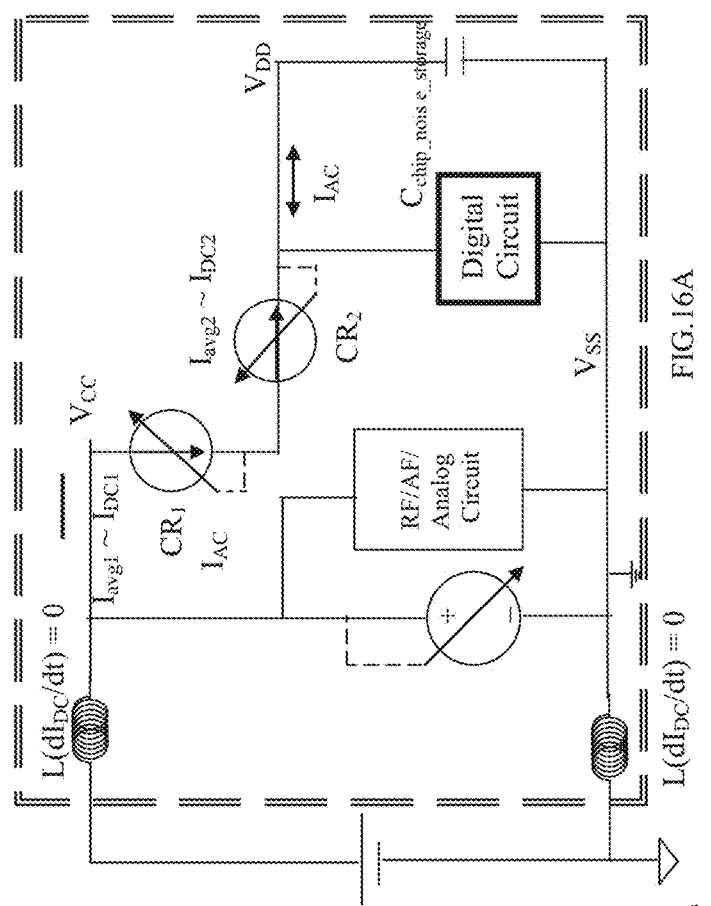
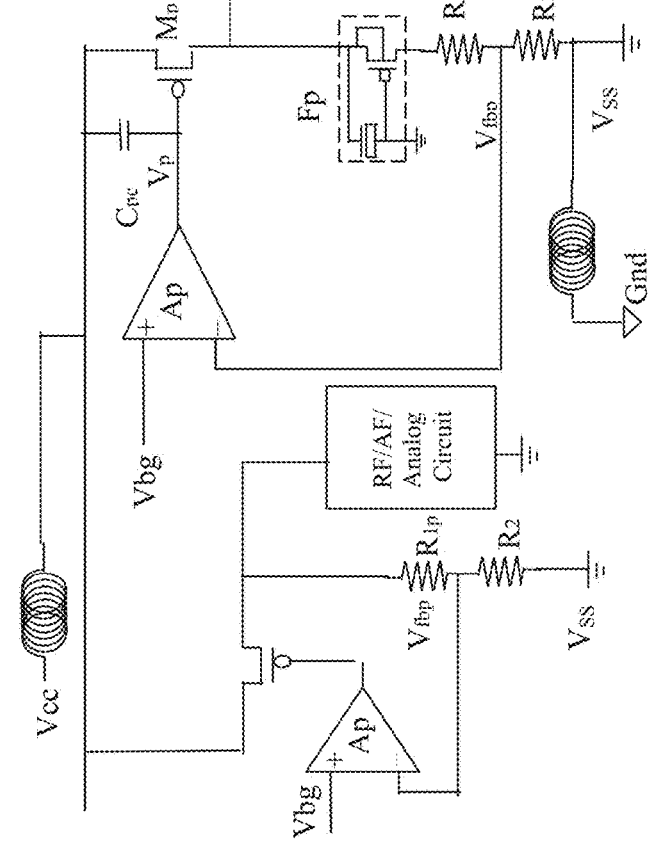
FIG.16A
FIG.16B

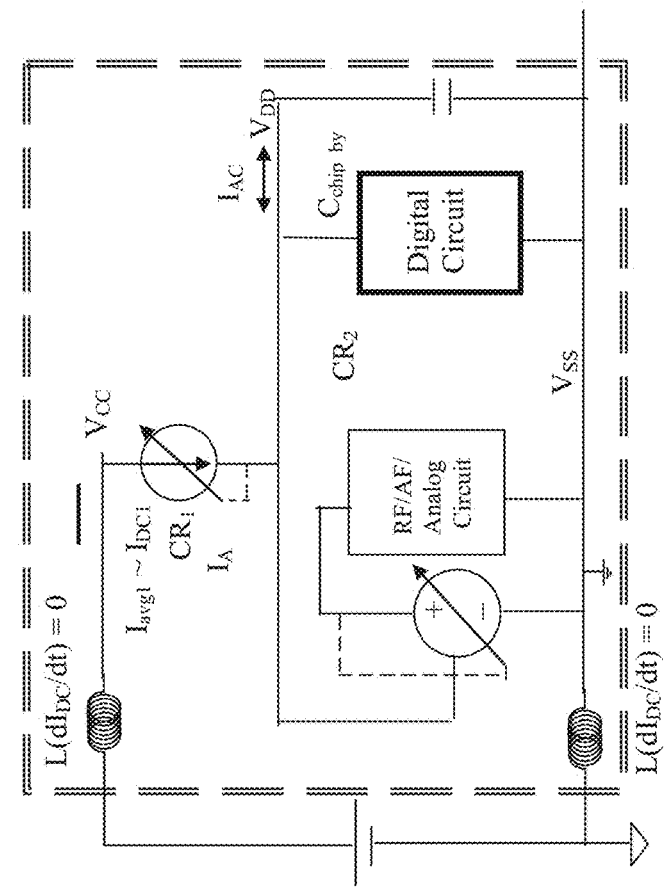
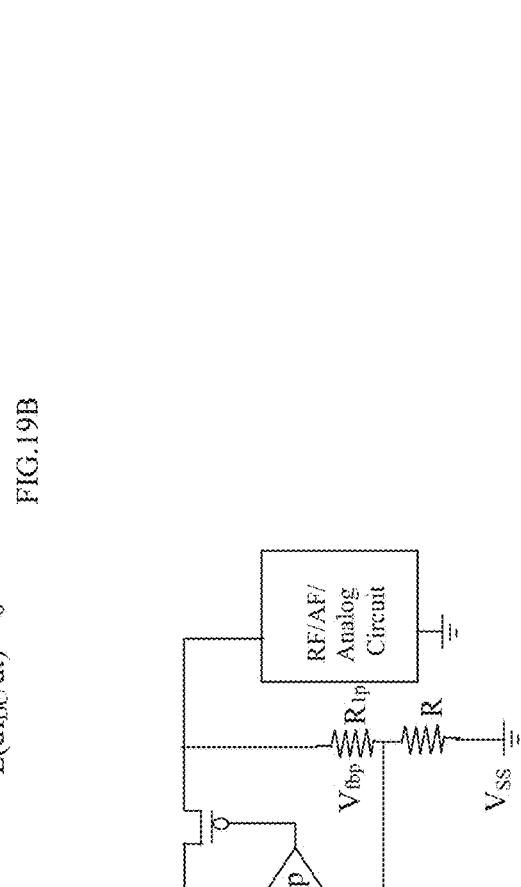
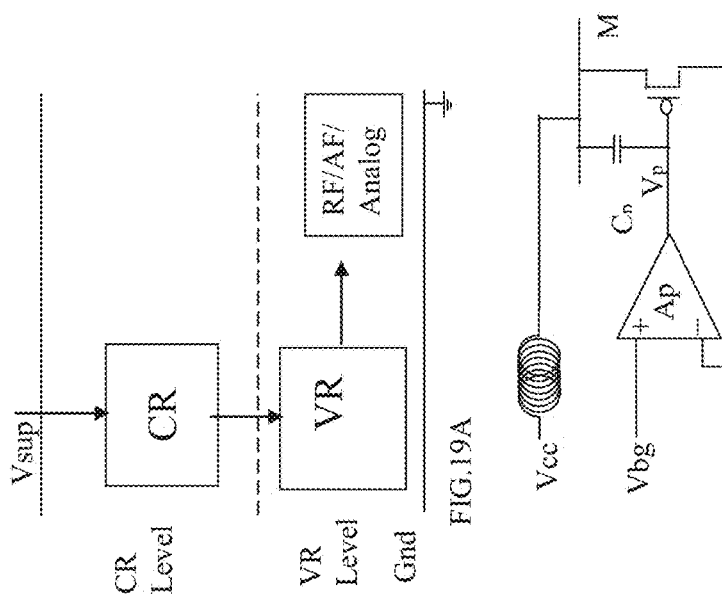
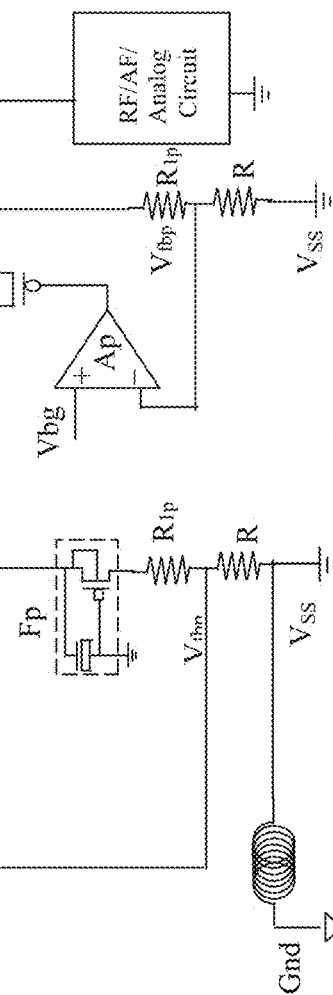
FIG.19A  FIG.19B  FIG.19C

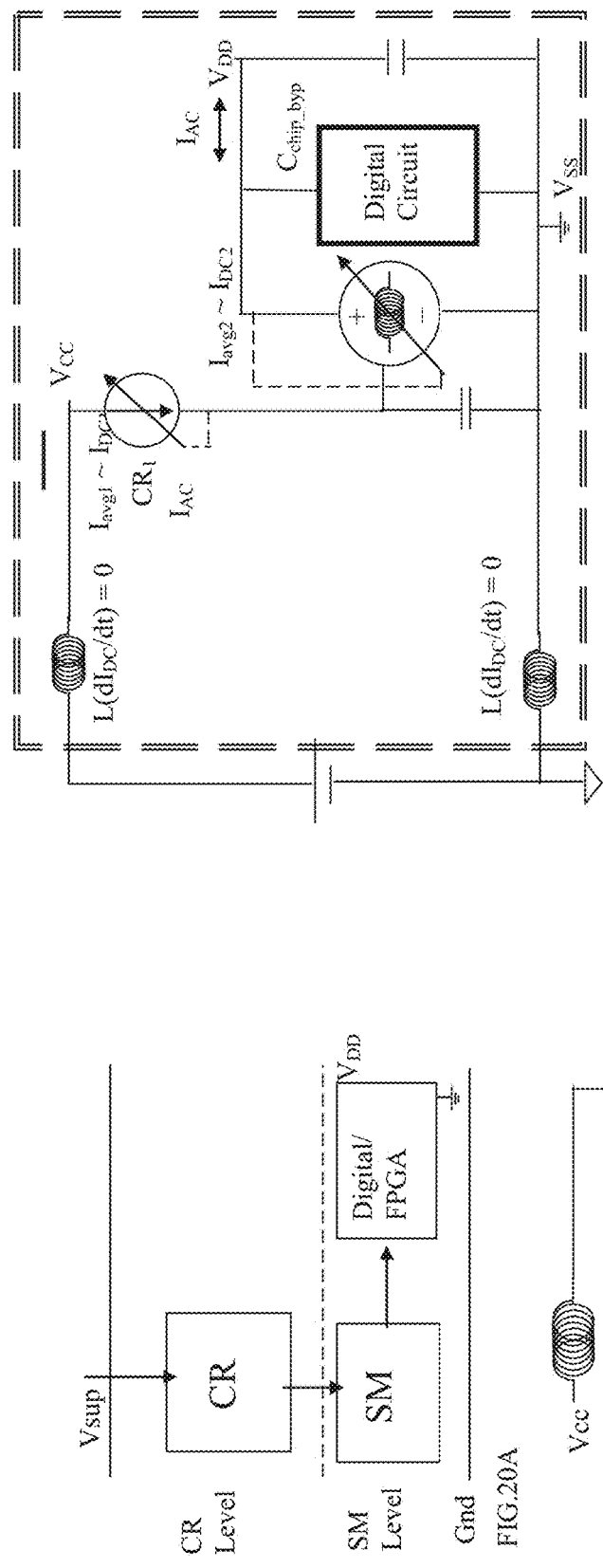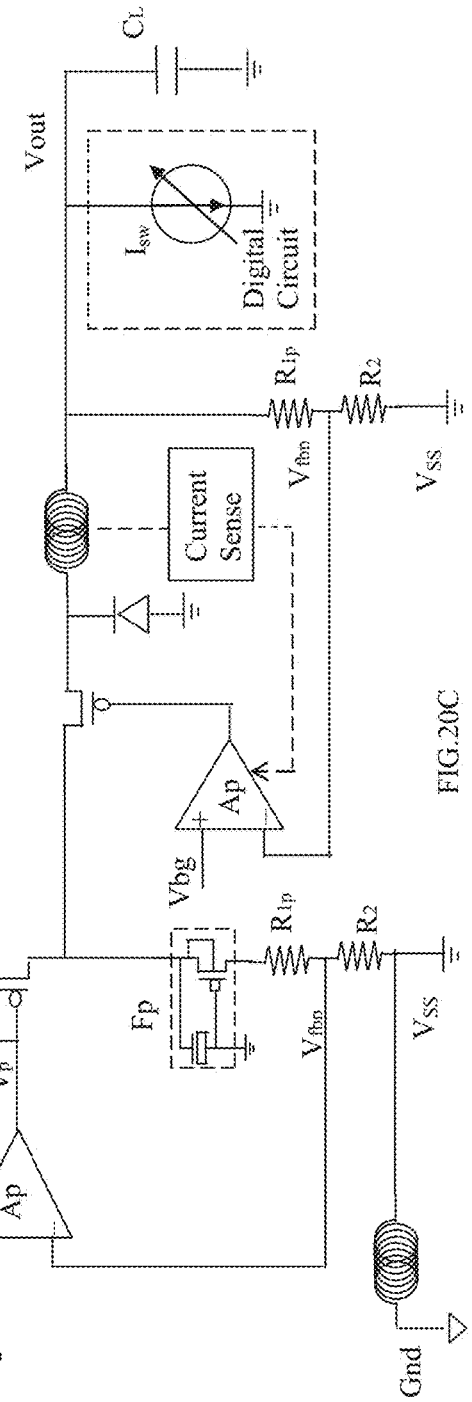
FIG. 20A
FIG. 20B
FIG. 20C

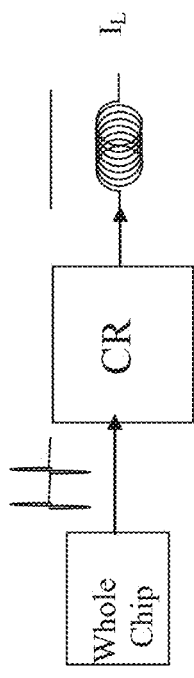
FIG.21A
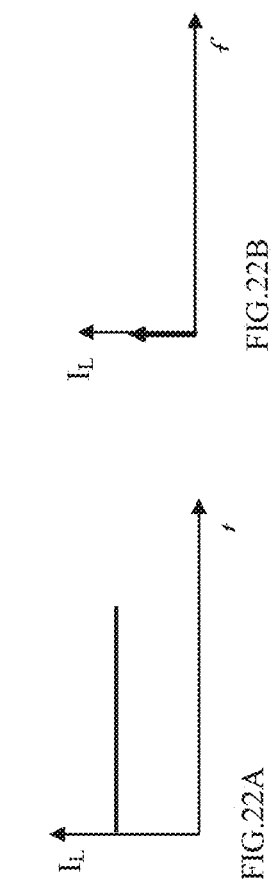
FIG.21B
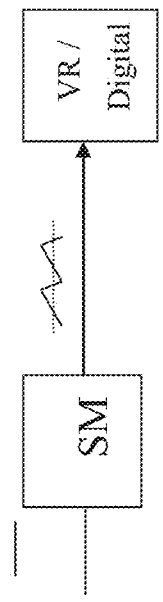
FIG.21C1
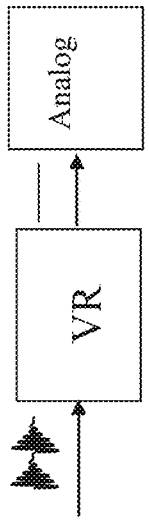
FIG.21C2
FIG.22A
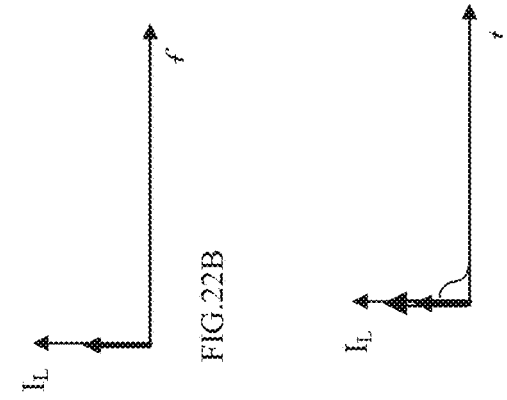
FIG.22B
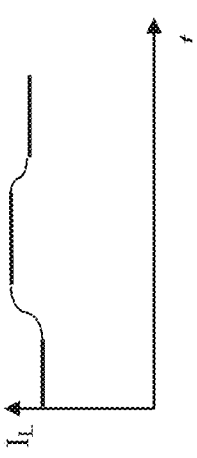
FIG.23A
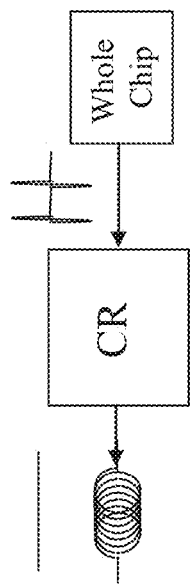
FIG.23B

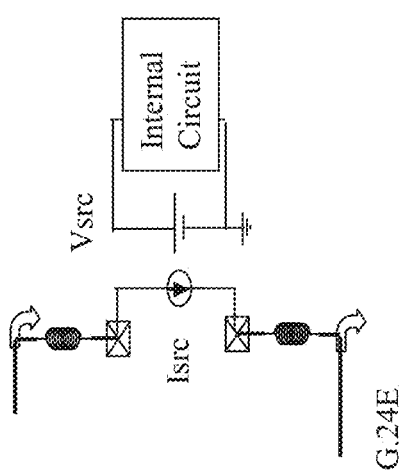
FIG.24E
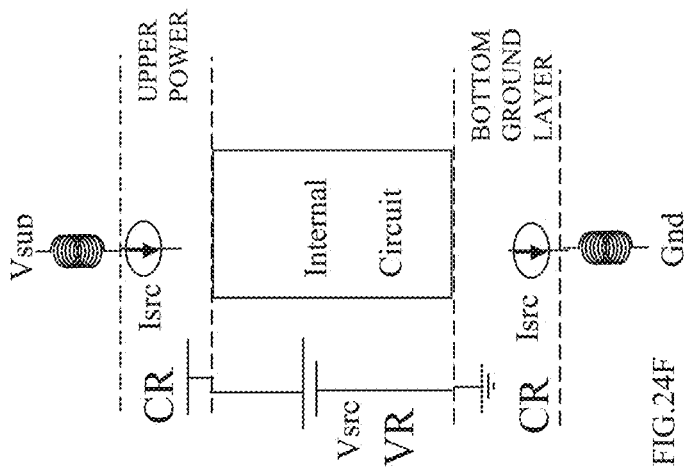
FIG.24F
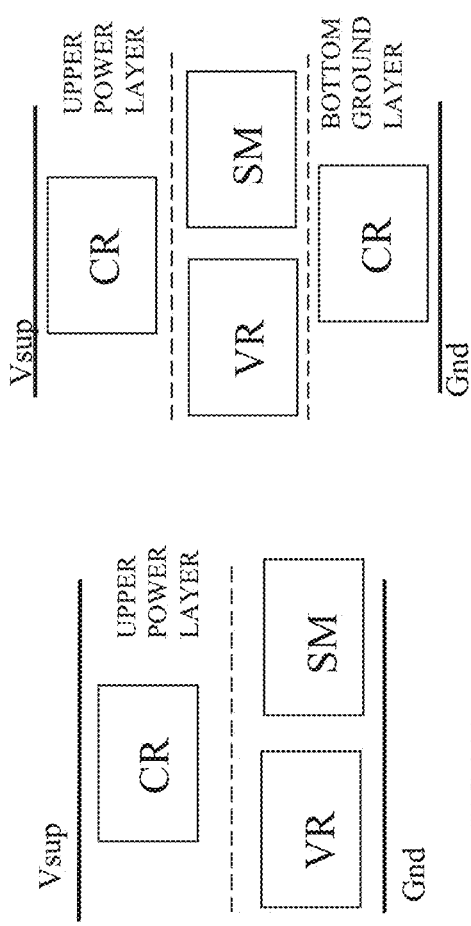
FIG.24A
FIG.24C
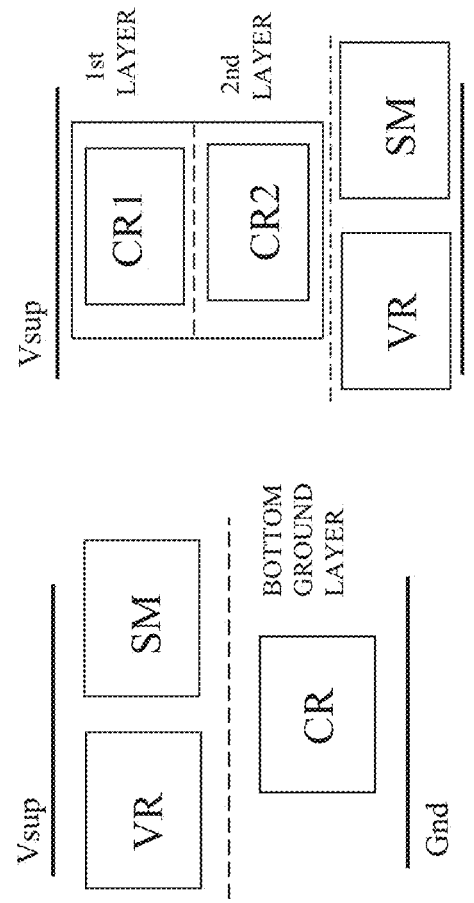
FIG.24B
FIG.24D

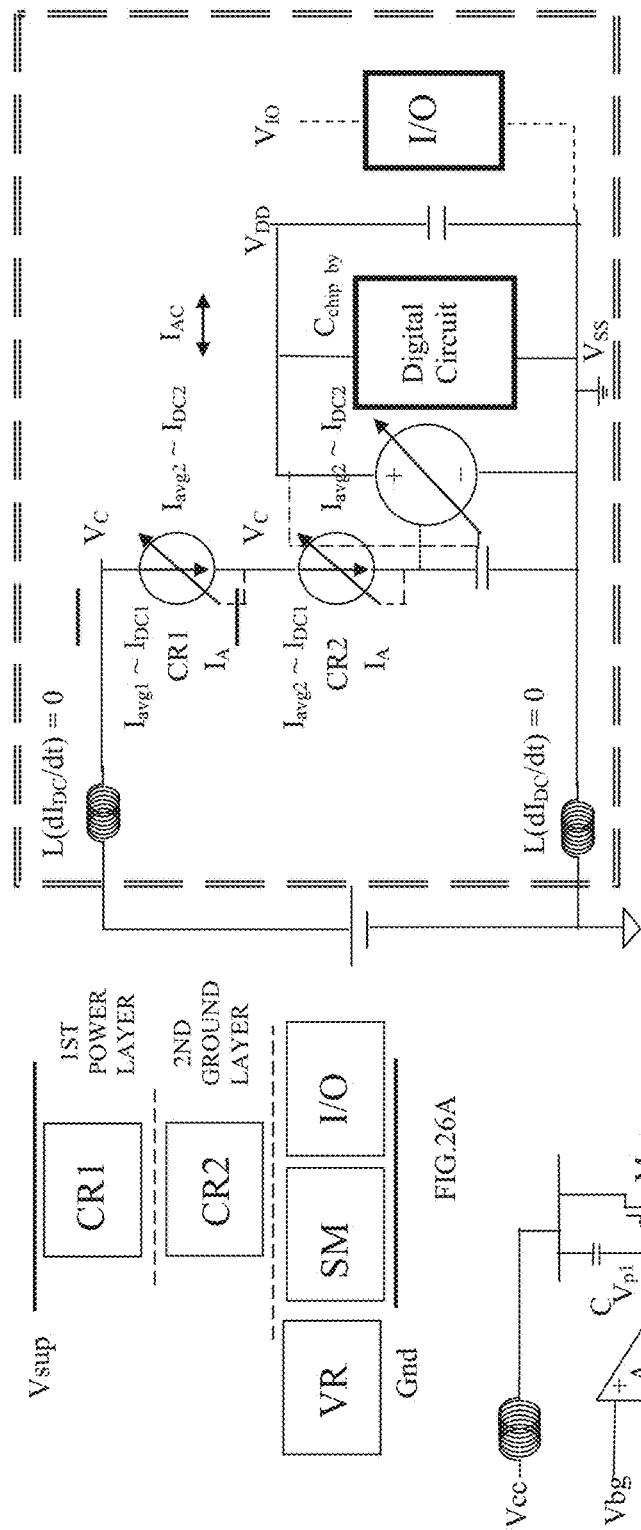
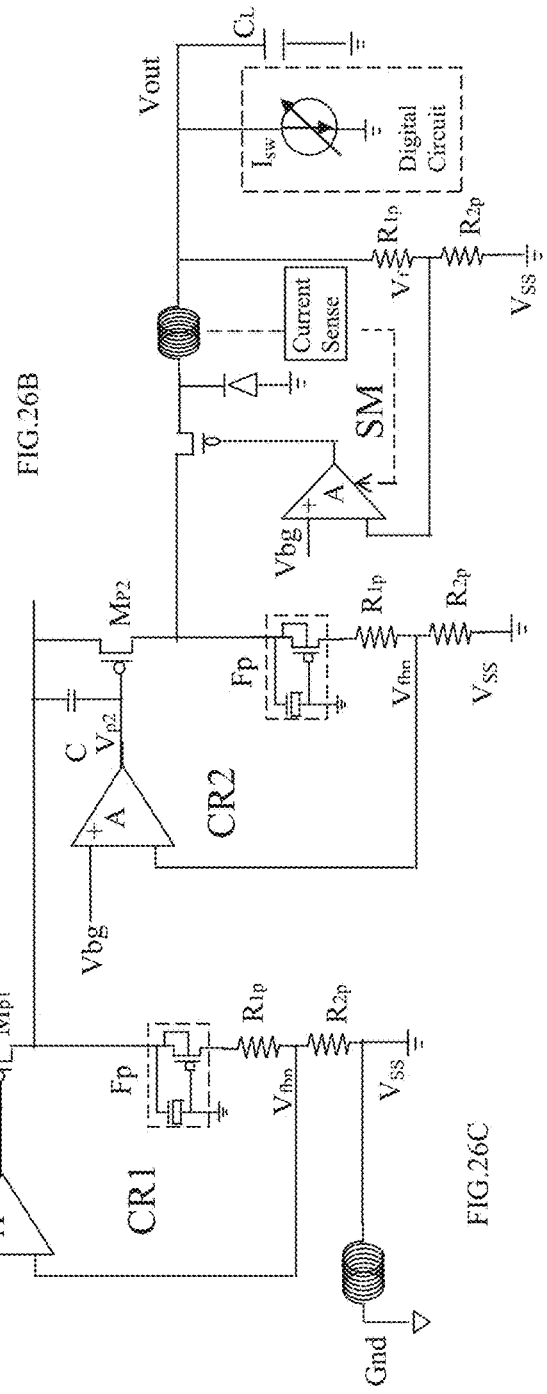

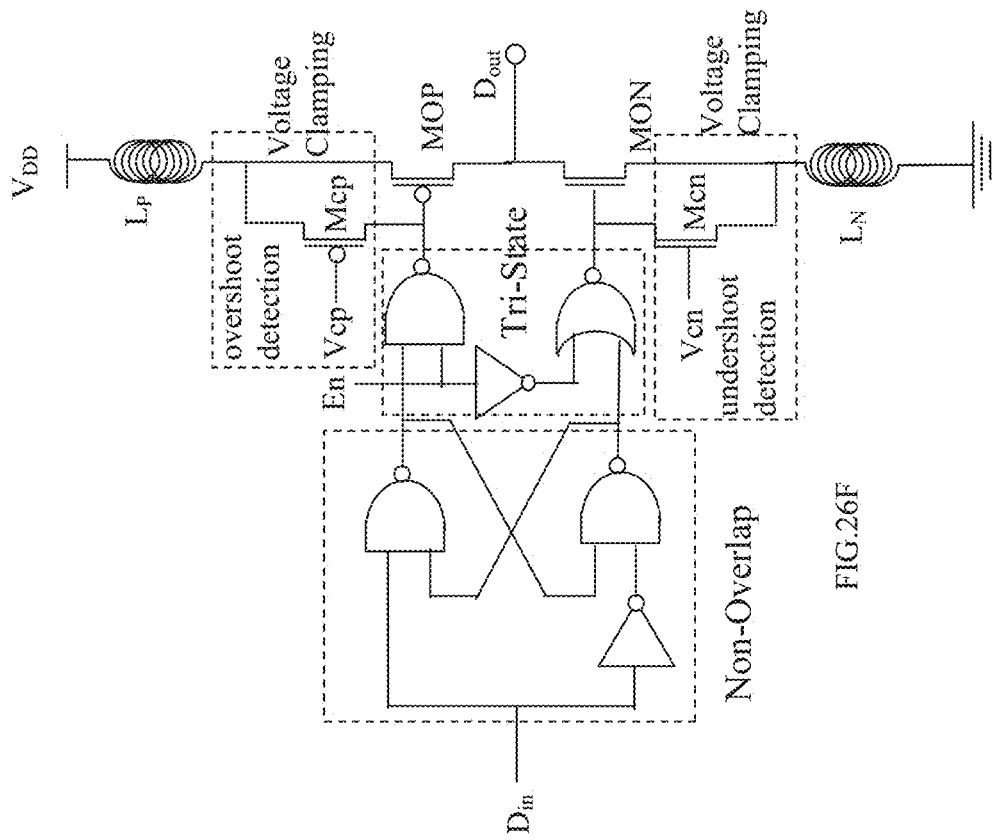
FIG.26F
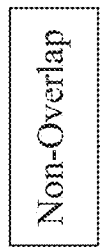
FIG.26D1
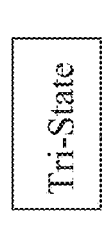
FIG.26D2
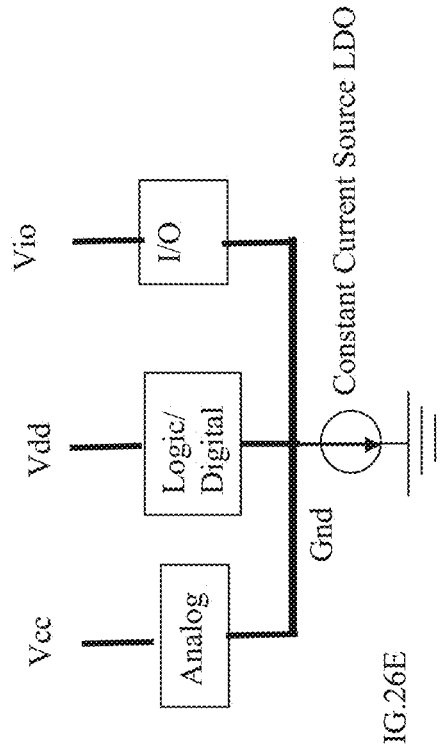
FIG.26E

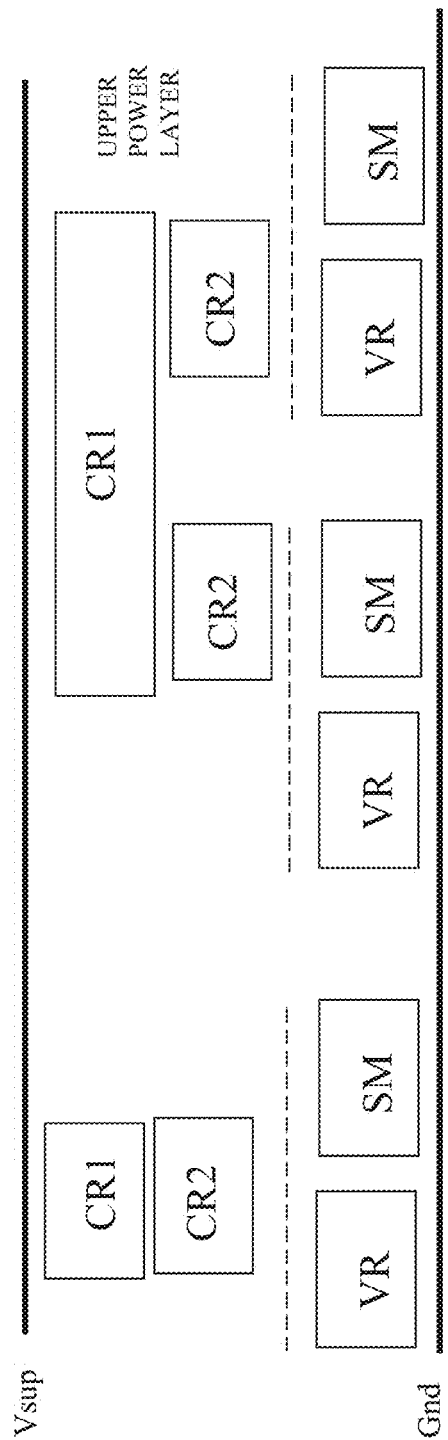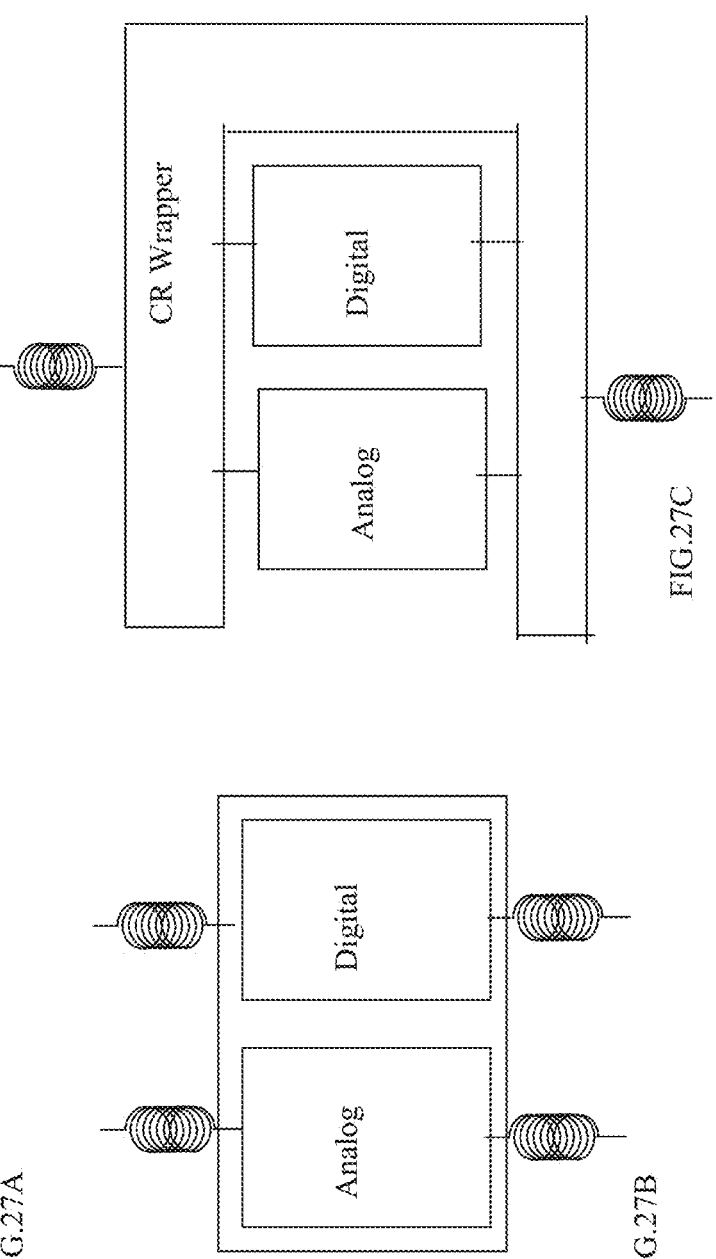

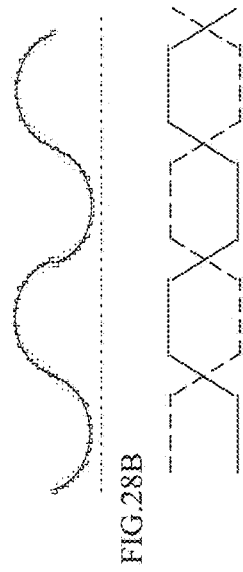
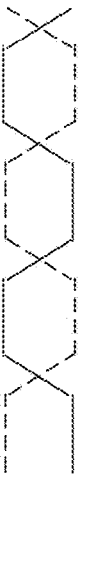
FIG.28B
FIG.28C
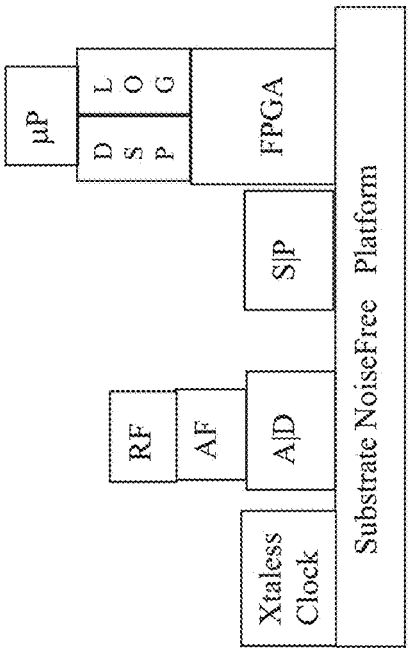
FIG.29B
FIG.30B
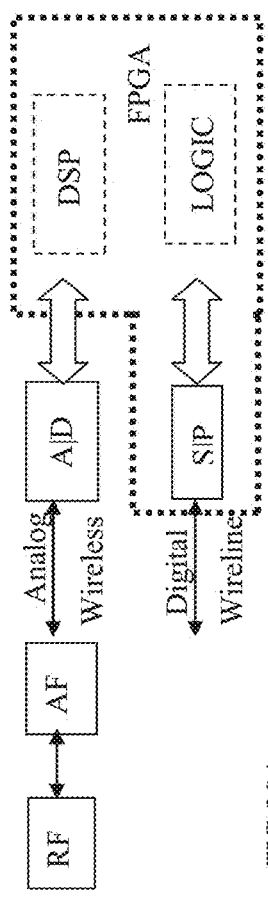
FIG.28A
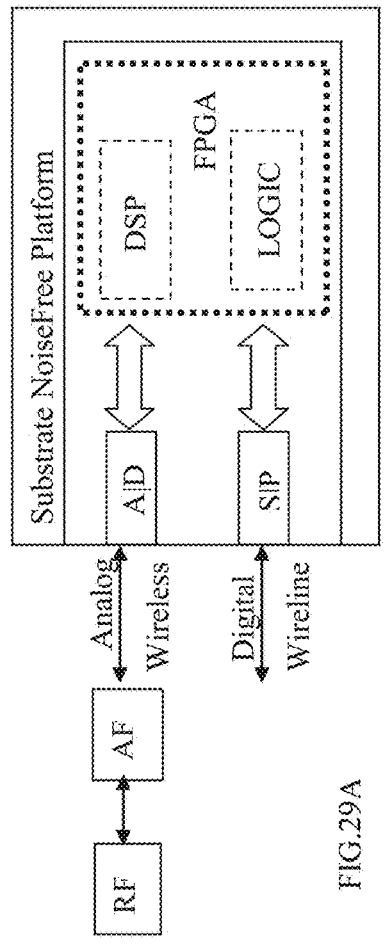
FIG.29A
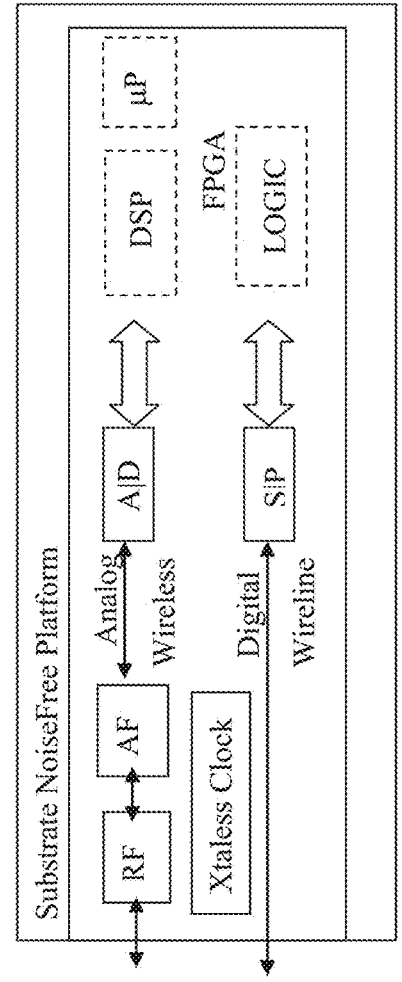
FIG.30A

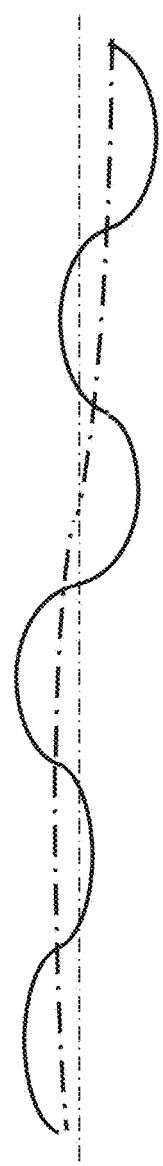
FIG.31E1
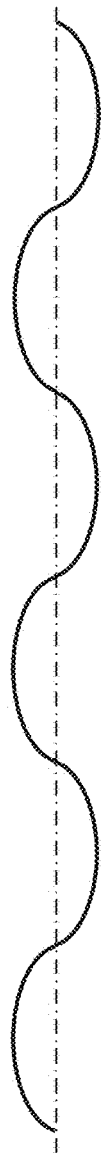
FIG.31E2
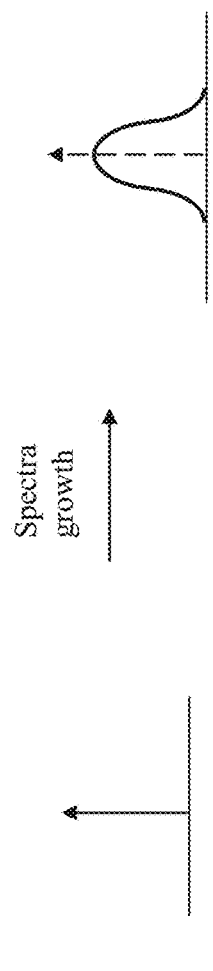
FIG.31F1
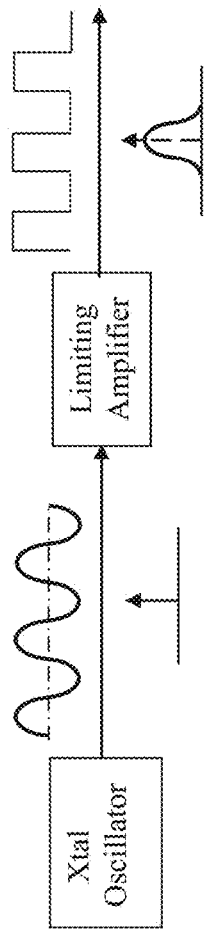
FIG.31F2
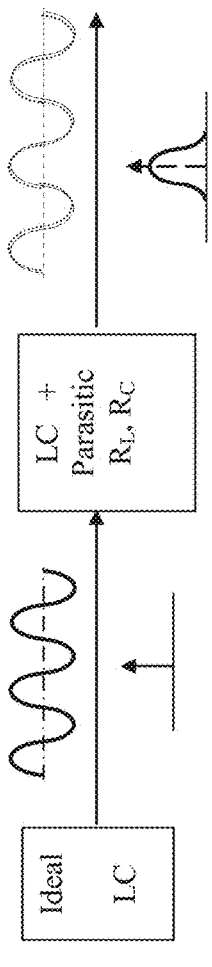
FIG.31F3

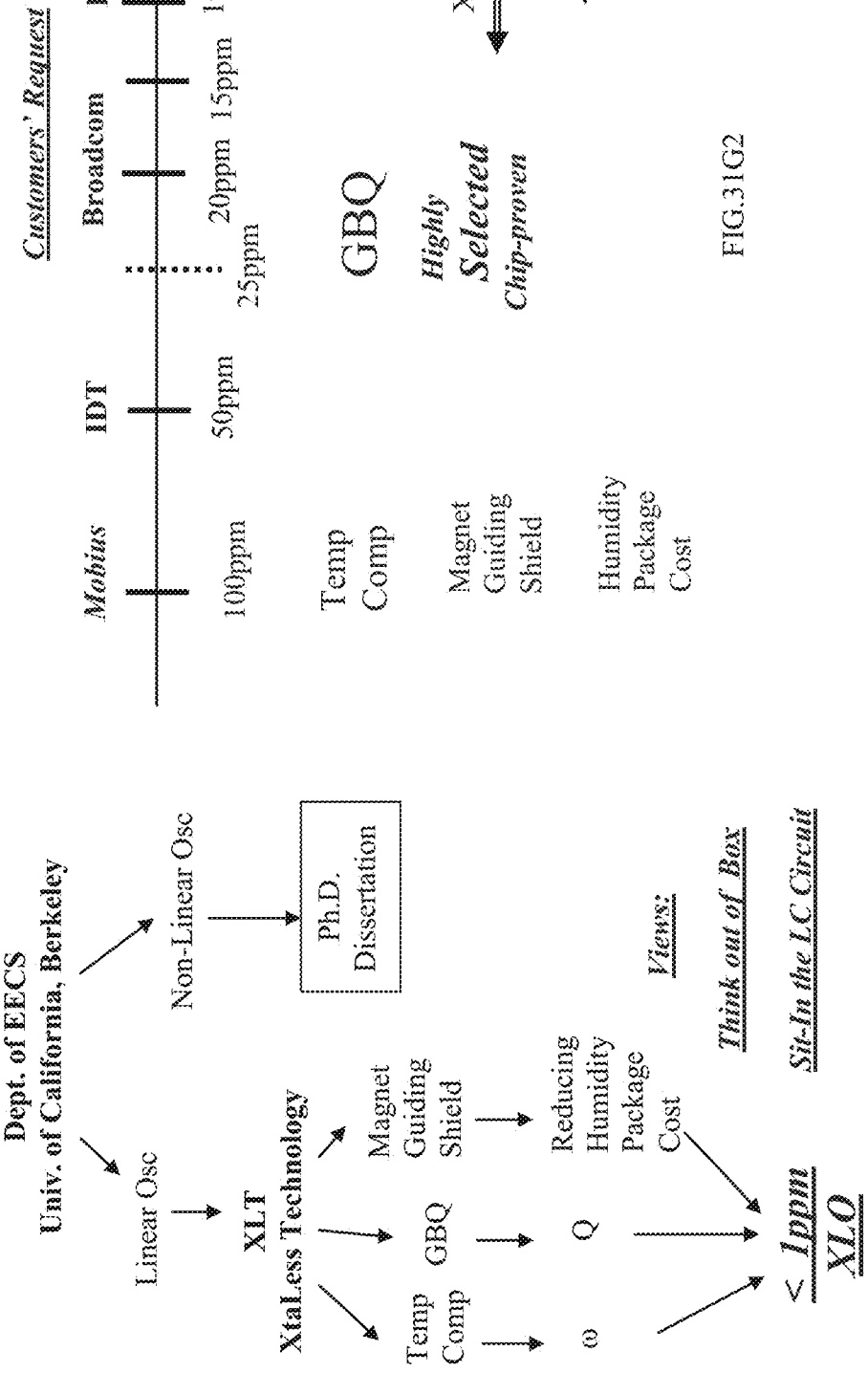
FIG.31G2
FIG.31G1

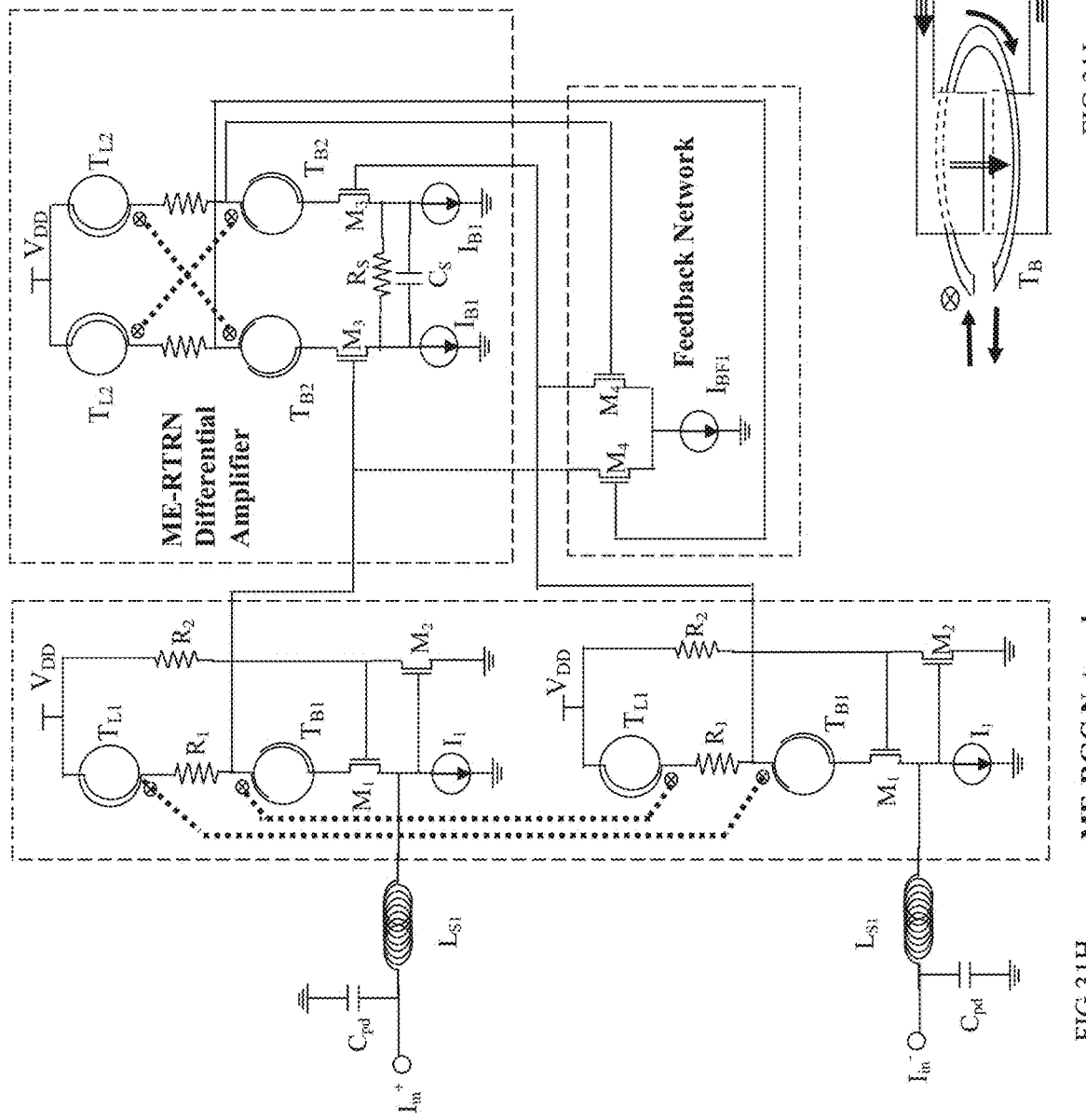

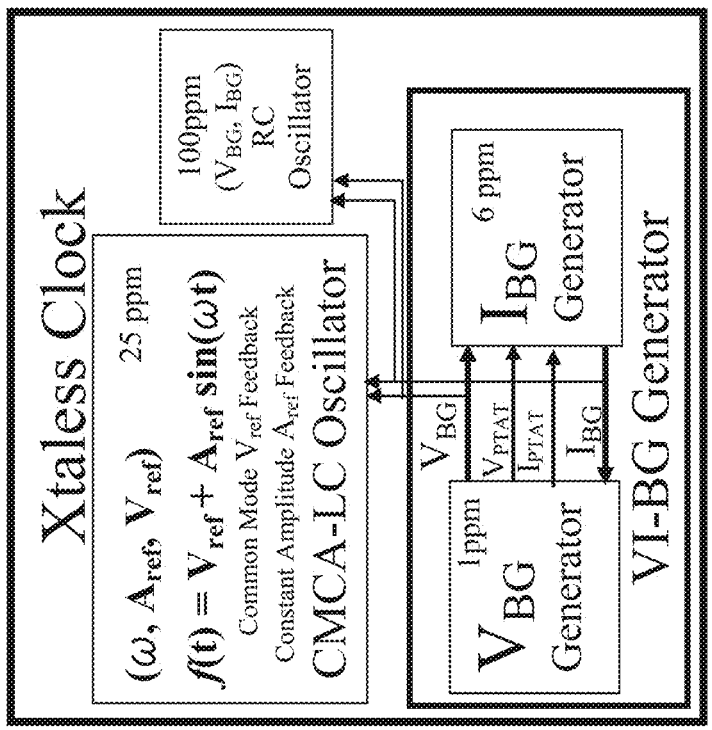
FIG.31K
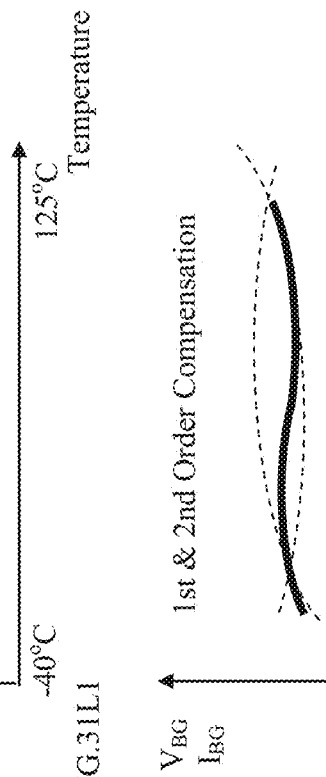
FIG.31L1
FIG.31L2

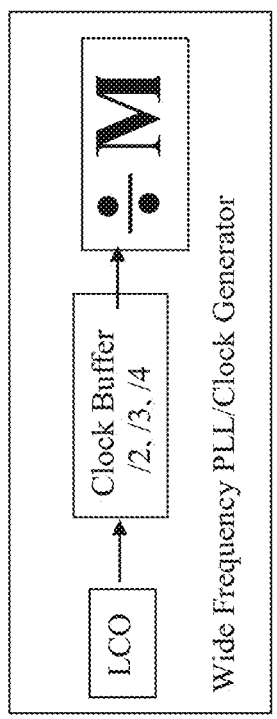
FIG.31M
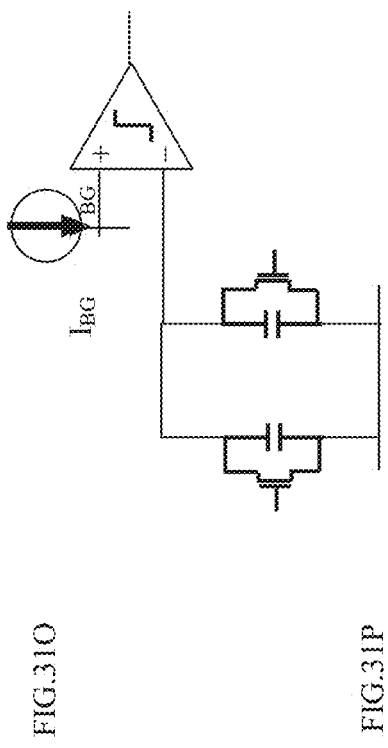
FIG.31N1
FIG.31N2
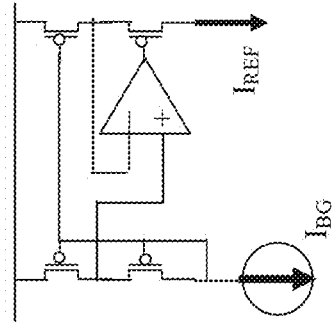
FIG.31O
FIG.31P
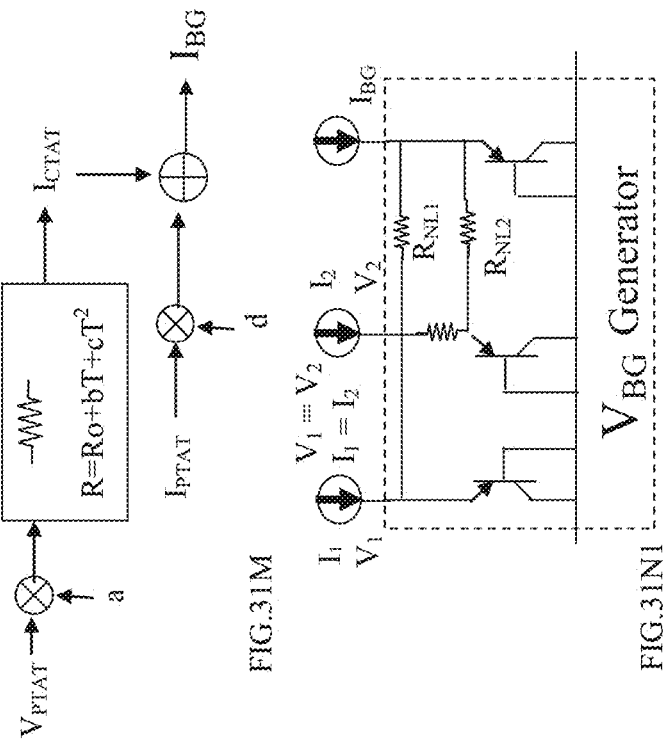
FIG.31Q1
FIG.31Q2

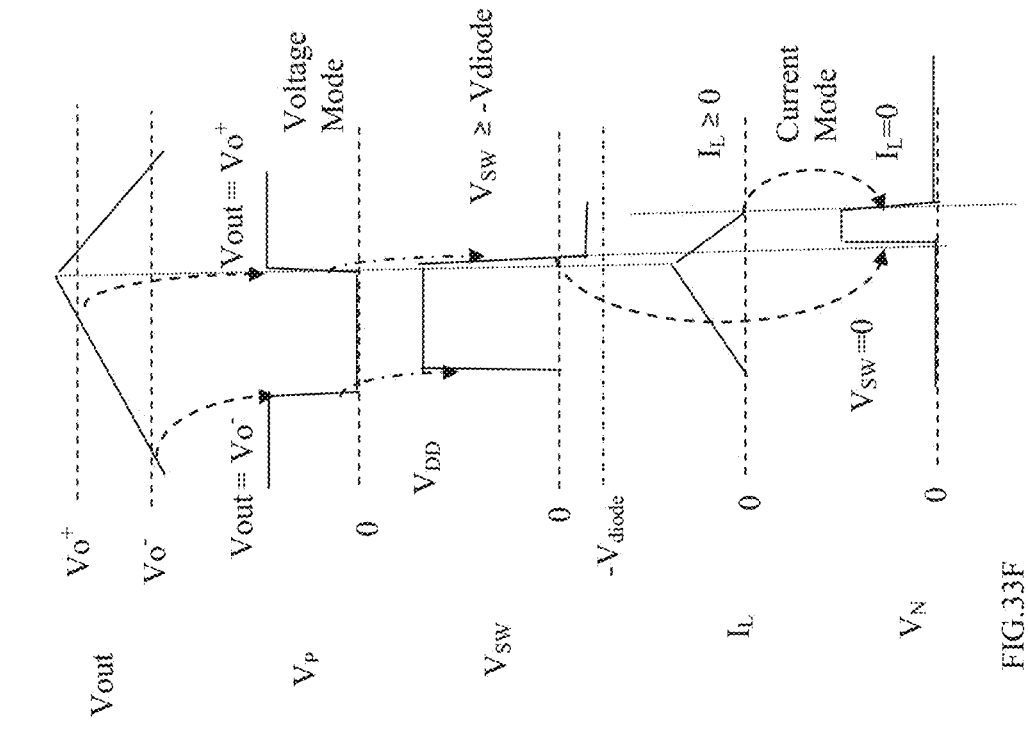
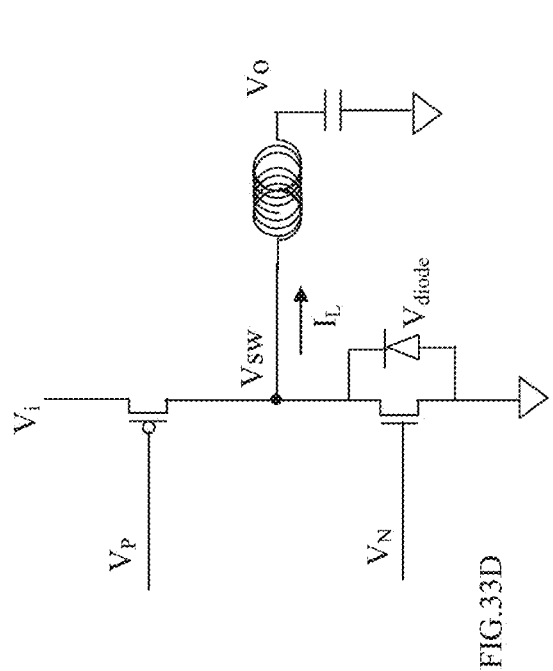
FIG.33D
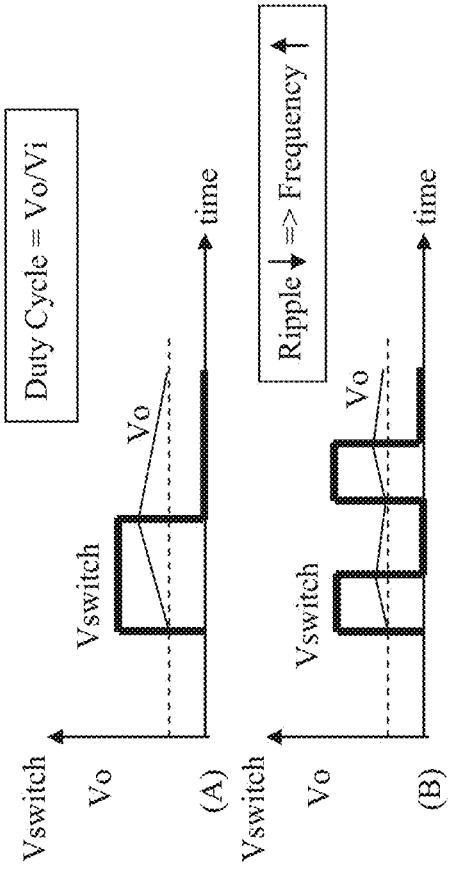
FIG.33E
FIG.33F

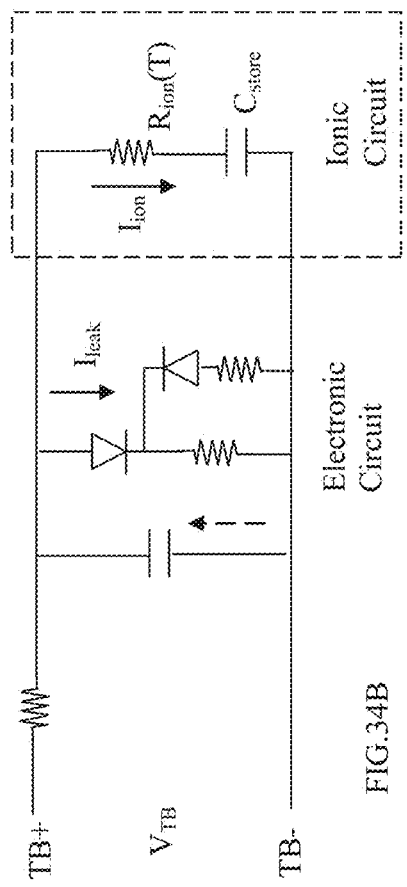
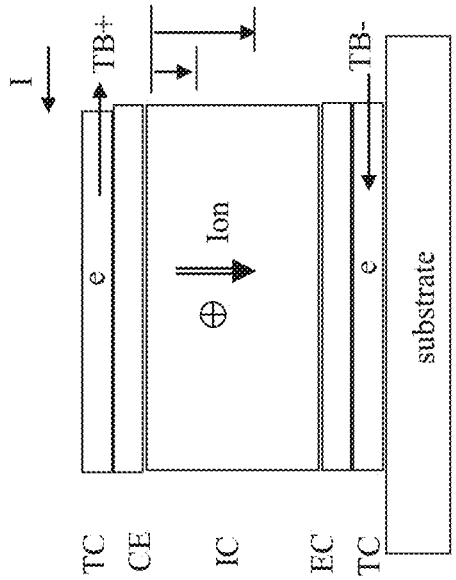
FIG.34A
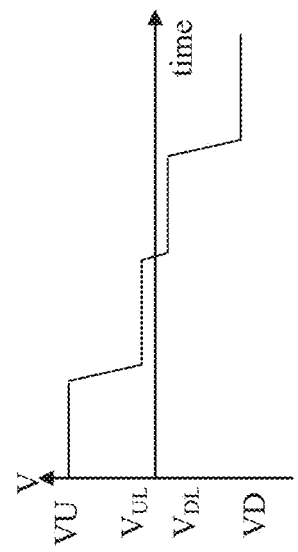
FIG.34B
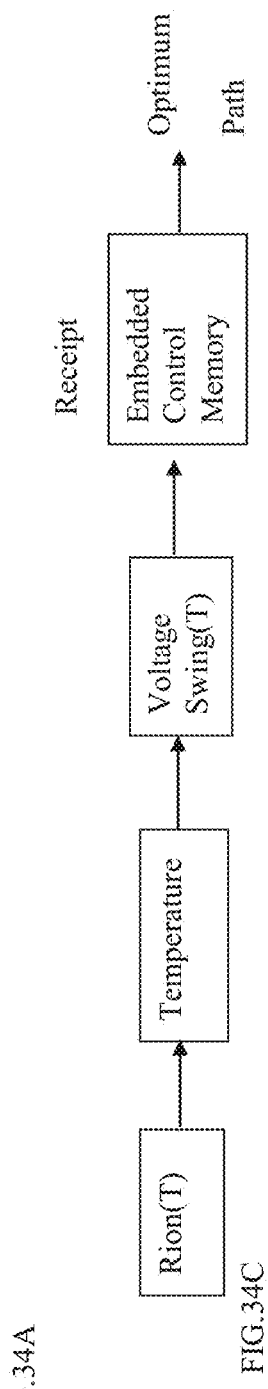
FIG.34C
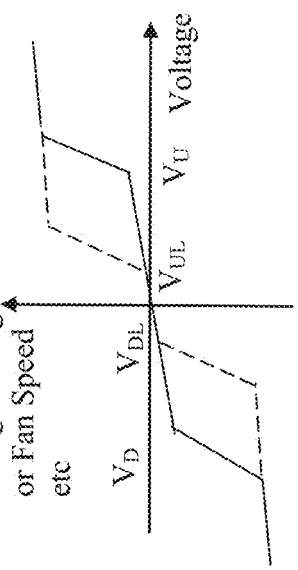
FIG.34D
FIG.34E

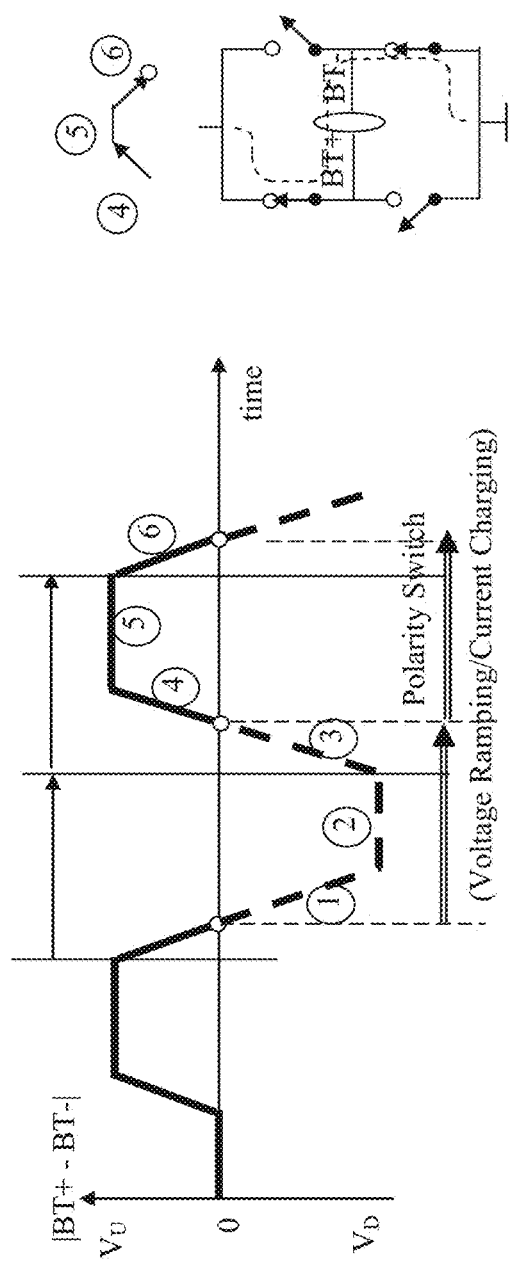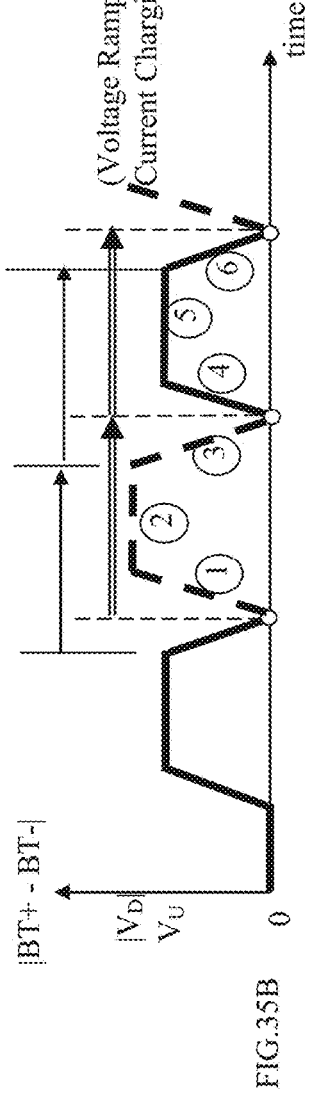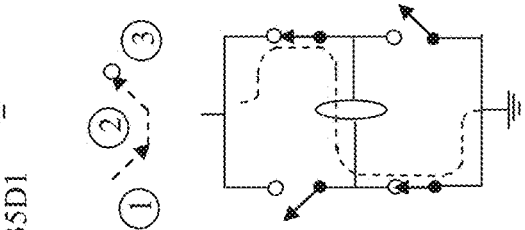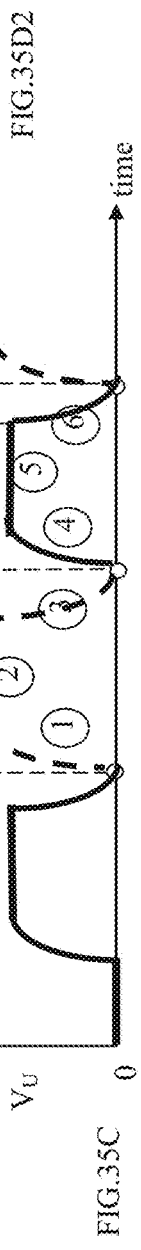
FIG.35A FIG.35B FIG.35C FIG.35D1 FIG.35D2

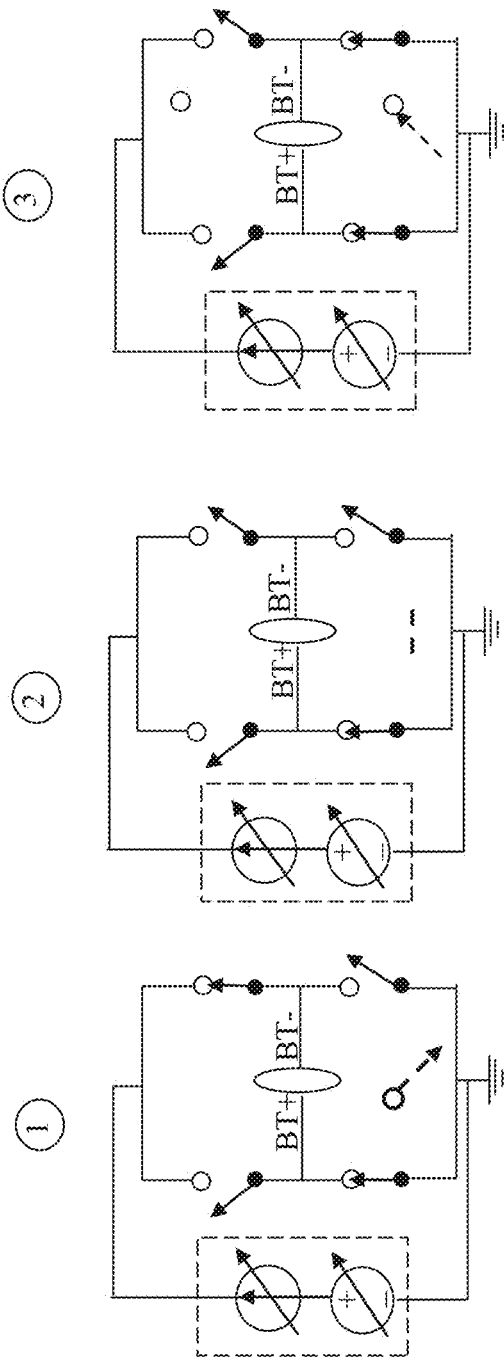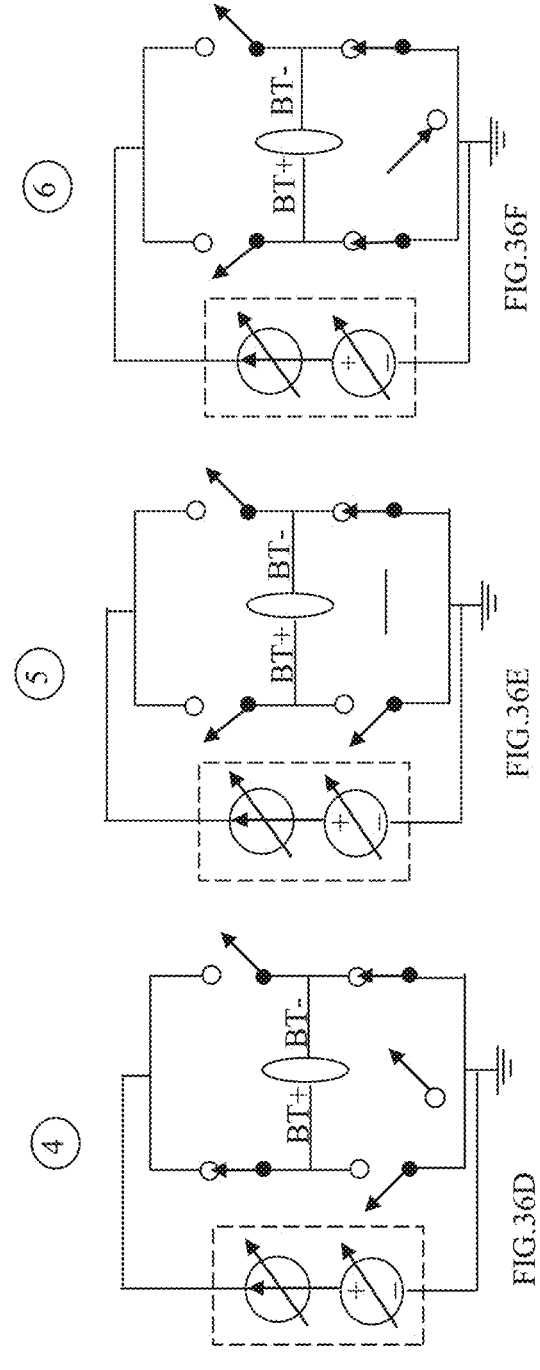

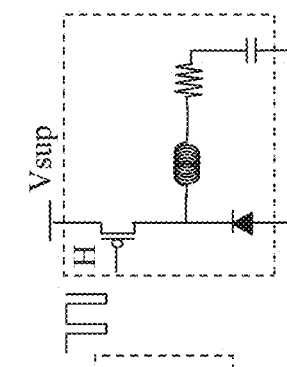
FIG.37A1
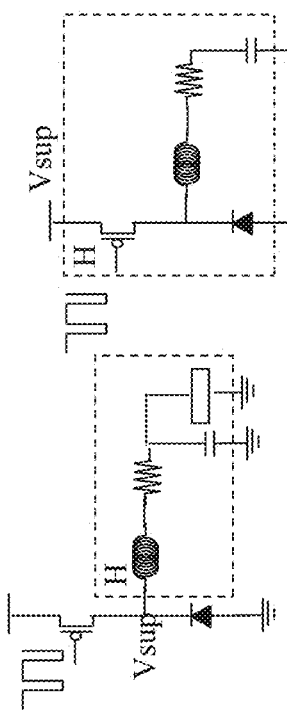
FIG.37B1
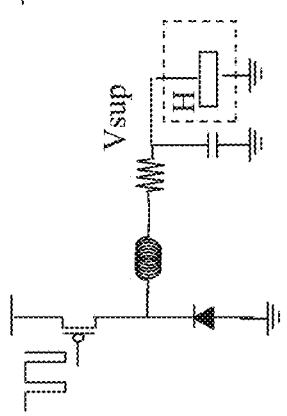
FIG.37C1
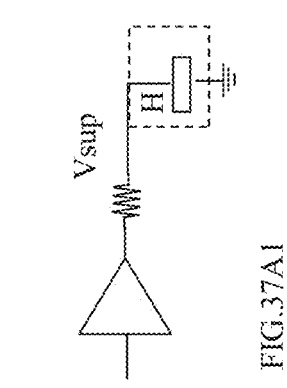
FIG.37D1
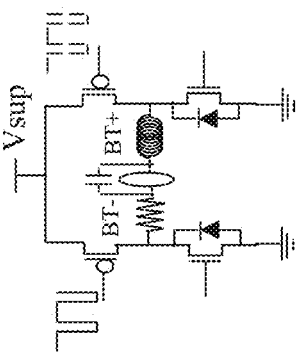
FIG.37A2
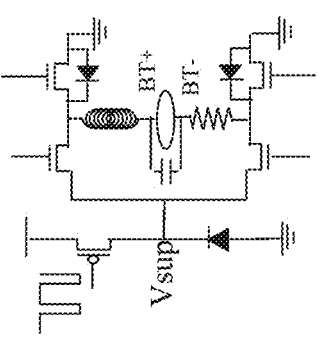
FIG.37B2
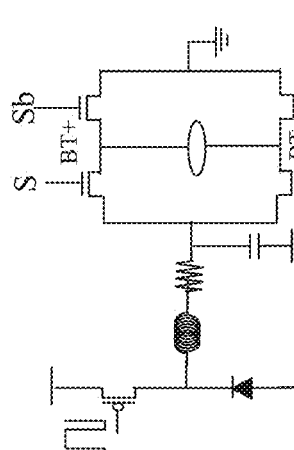
FIG.37C2
FIG.37D2

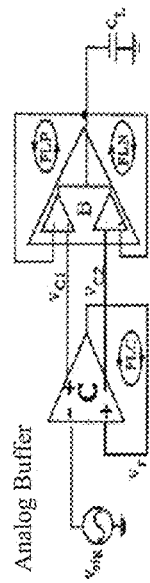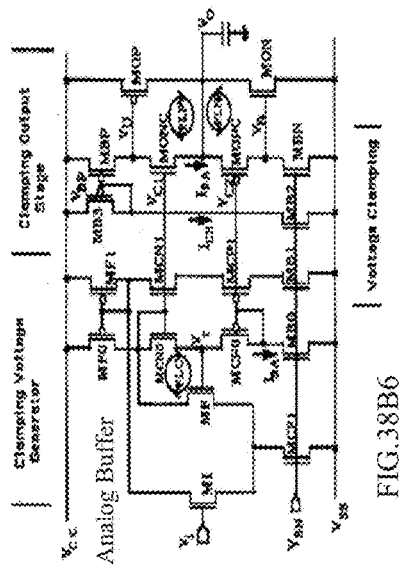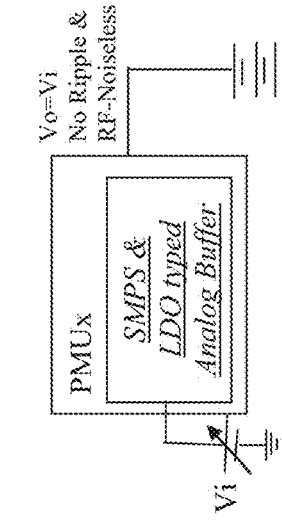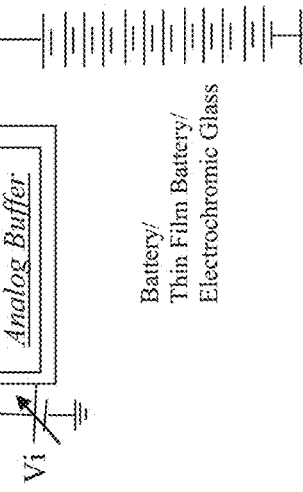
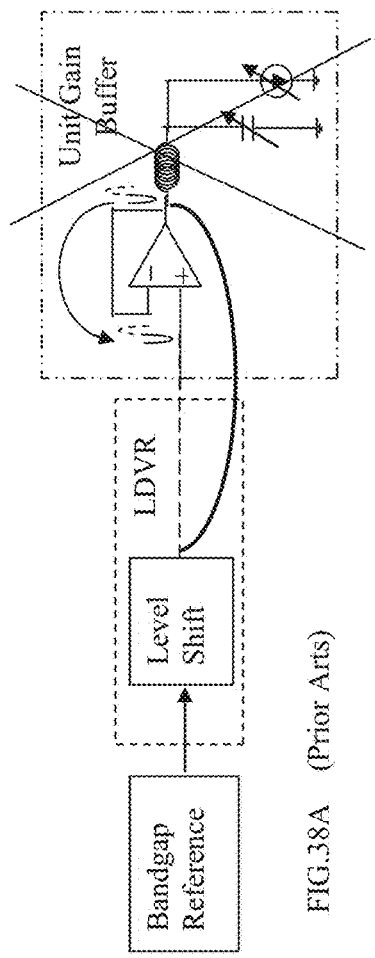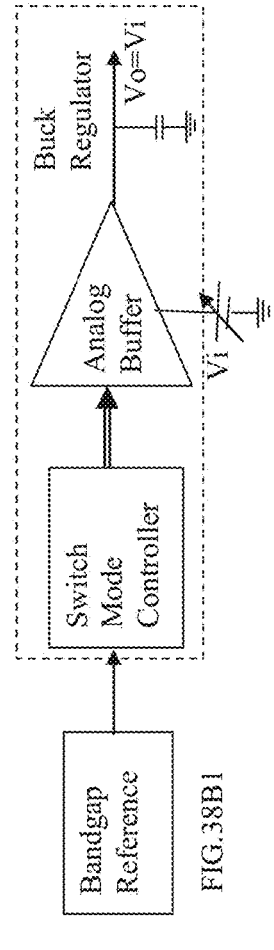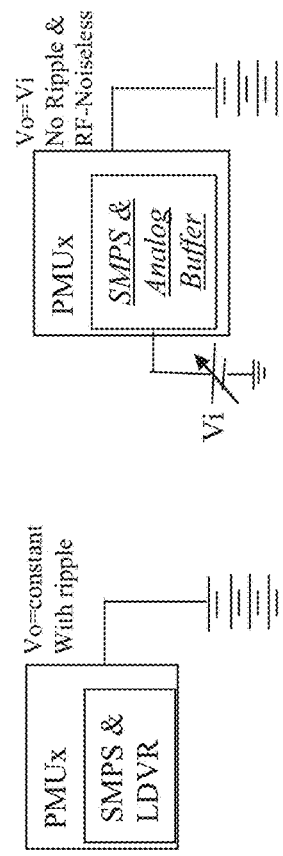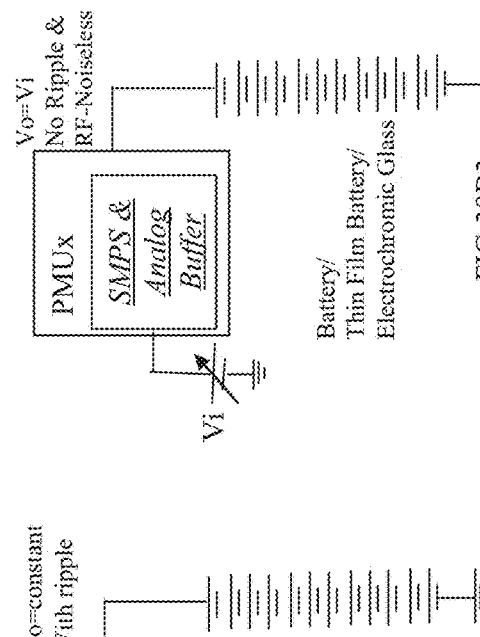

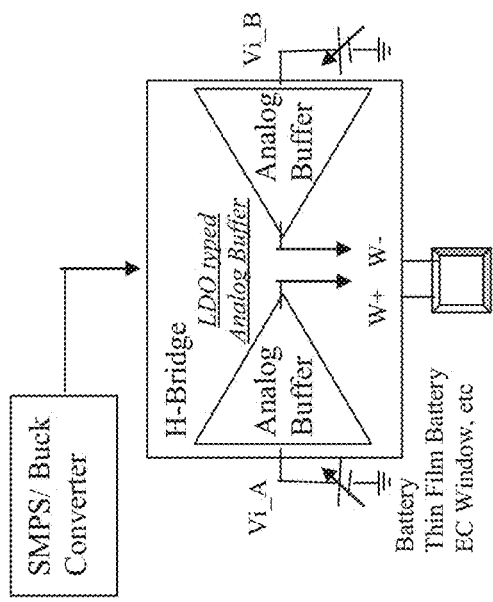
FIG.38B8
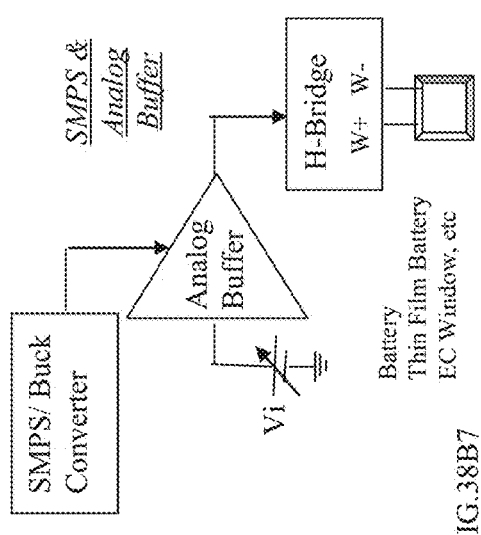
FIG.38B7
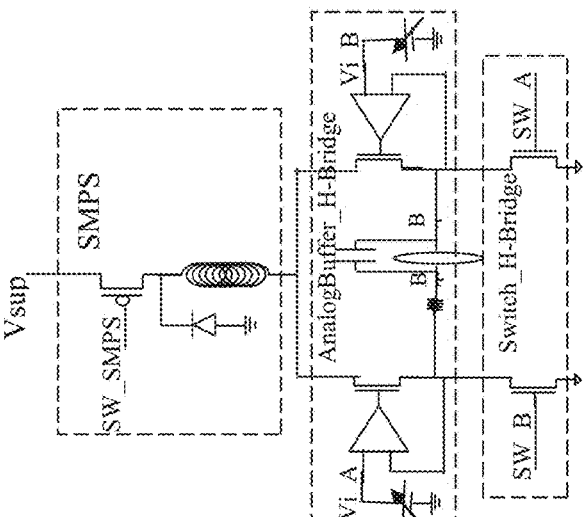
FIG.38B11
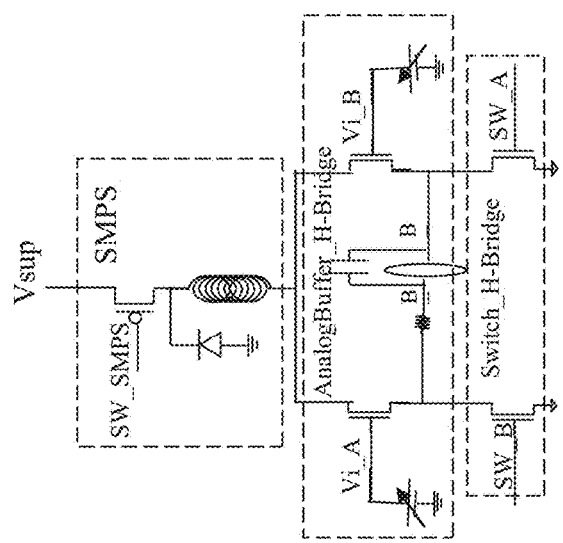
FIG.38B10
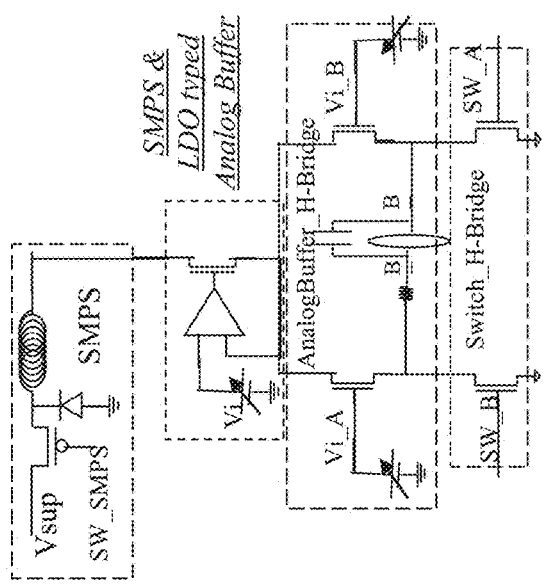
FIG.38B9

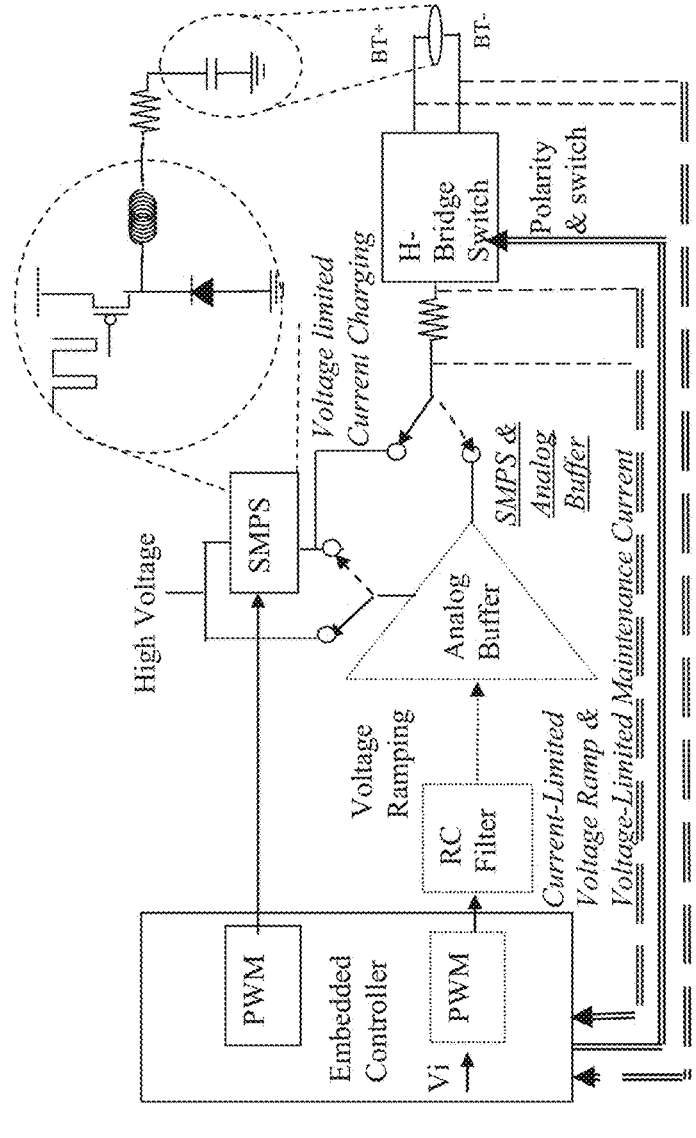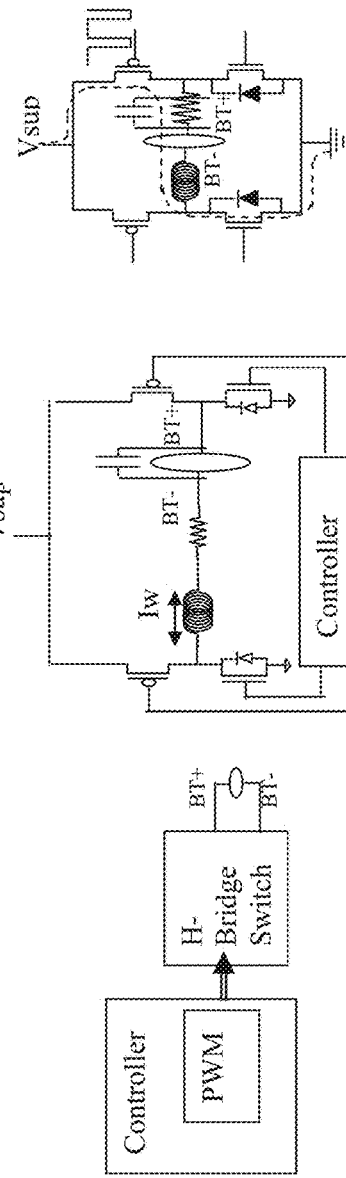

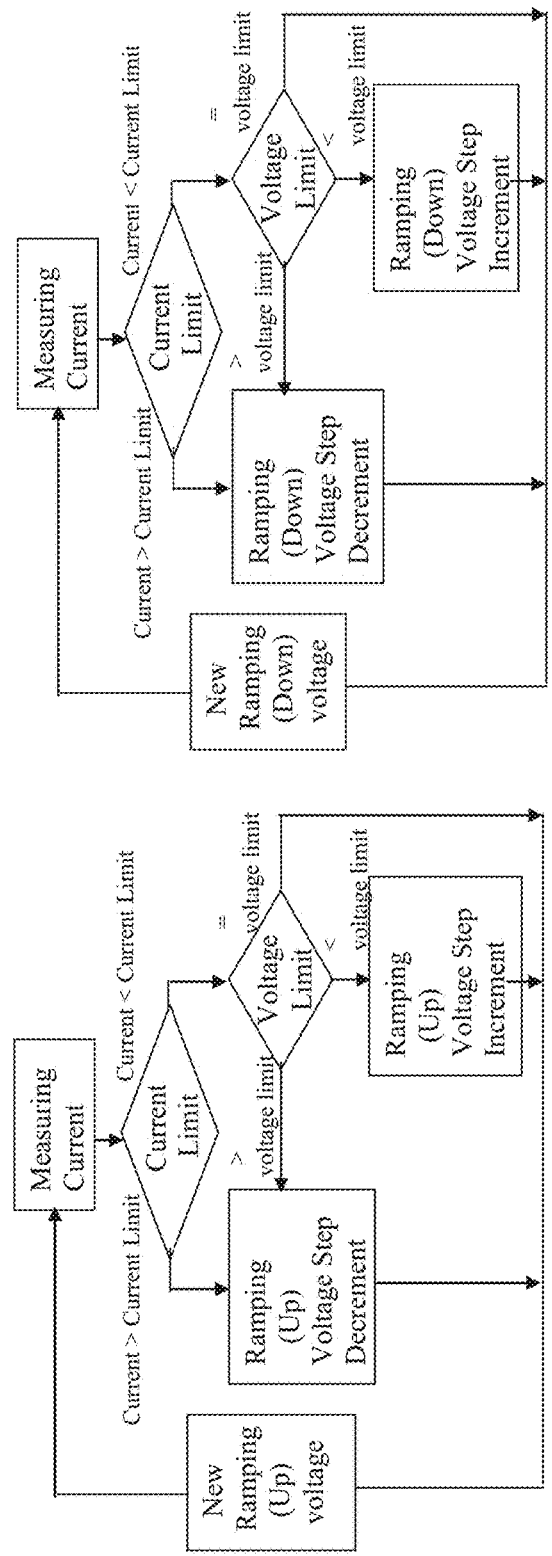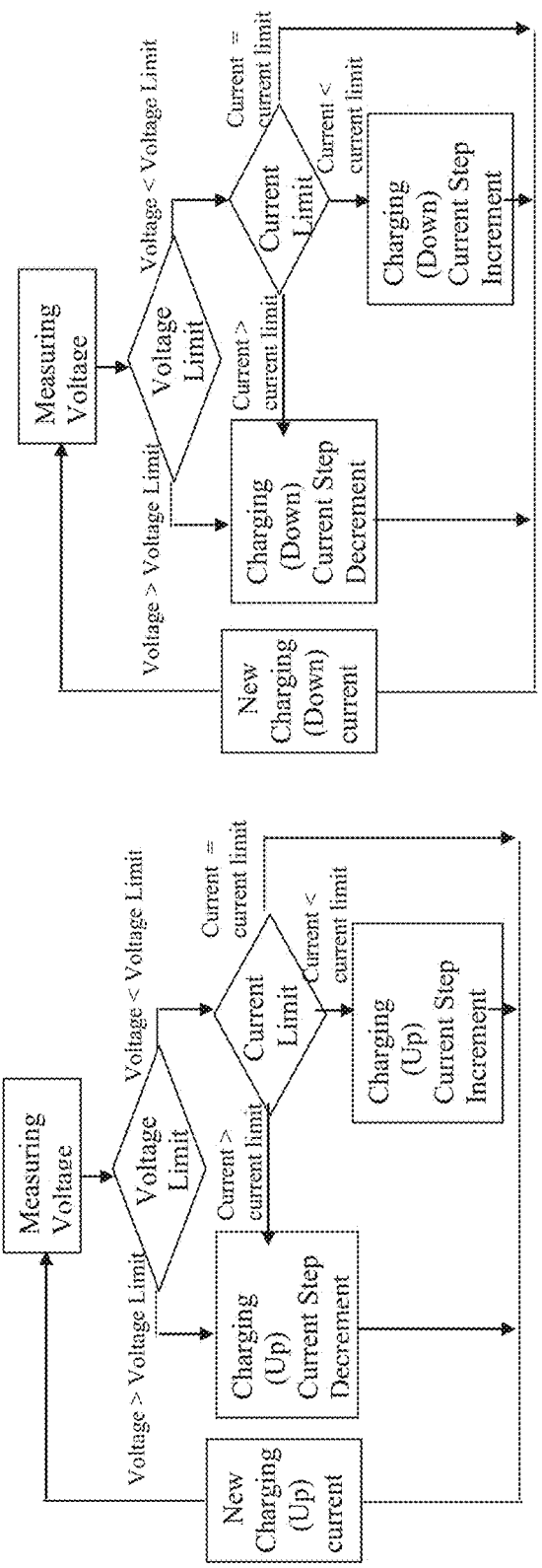

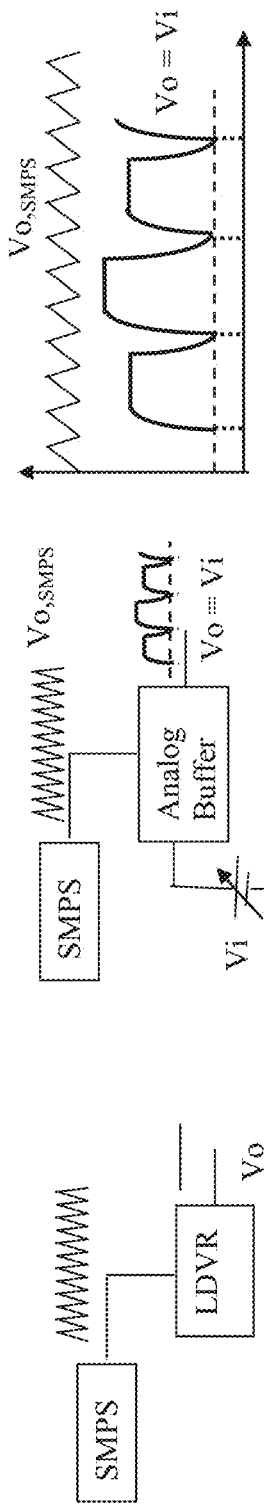
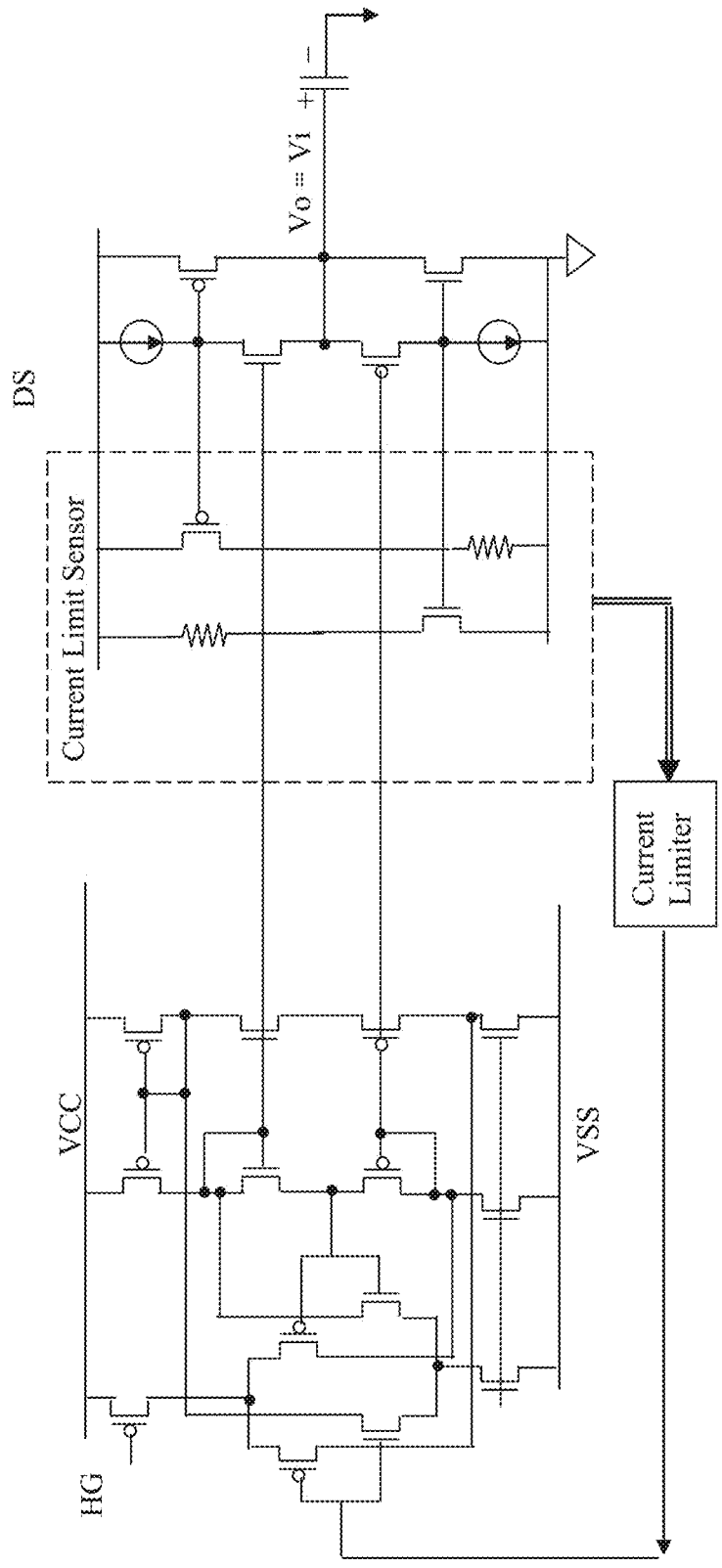

$Vwire+ = Vboard+ - Vwindow+$
$Vwire- = Vwire+ = Vwire$ $Vwindow = Vwindow+ - Vwindow-$
$= Vboard+ - Vboard- - 2*Vwire$
$= Vboard+ - Vboard- - 2*(Vboard+ - Vwindow+)$
$= 2*Vwindow+ - (Vboard+ + Vboard-)$

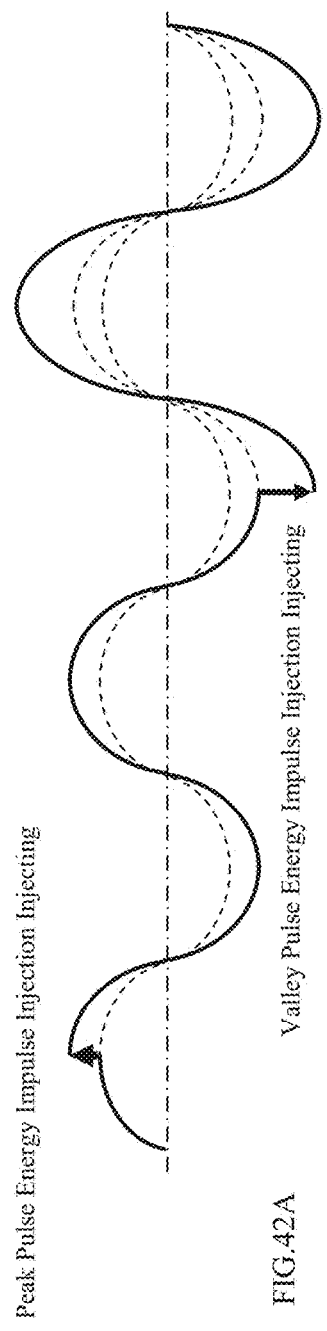
FIG.42A
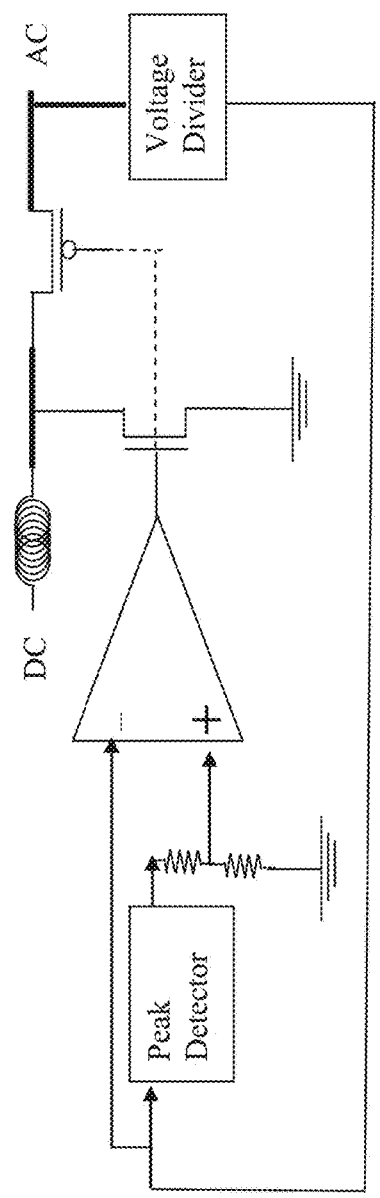
FIG.42B1
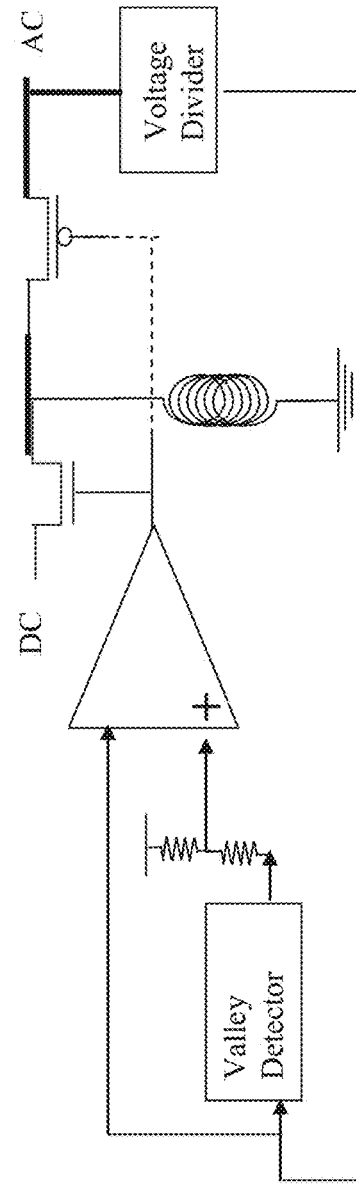
FIG.42B2

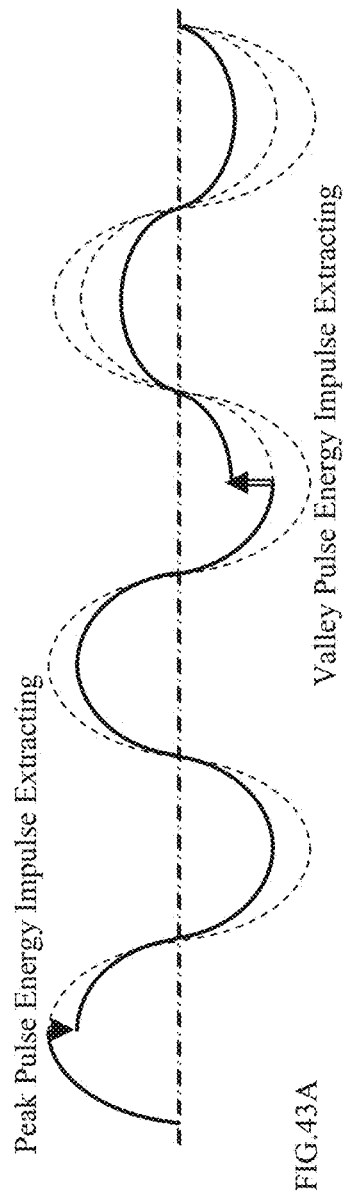
FIG. 43A
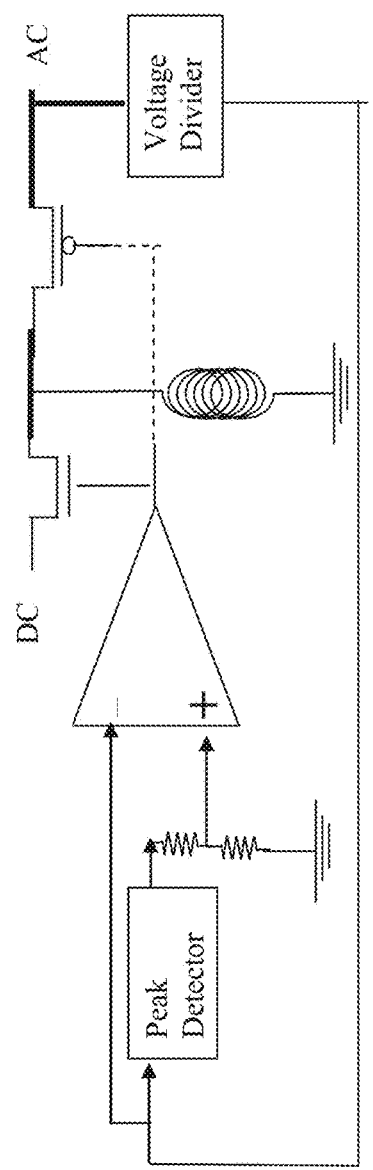
FIG. 43B1
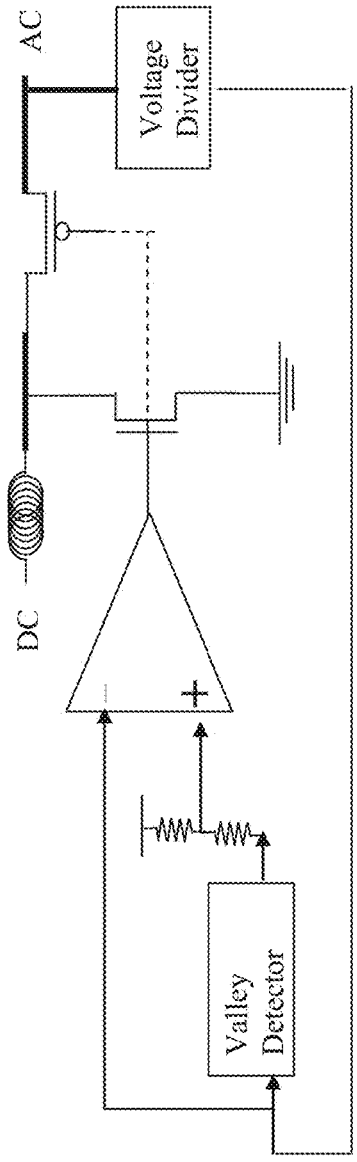
FIG. 43B2

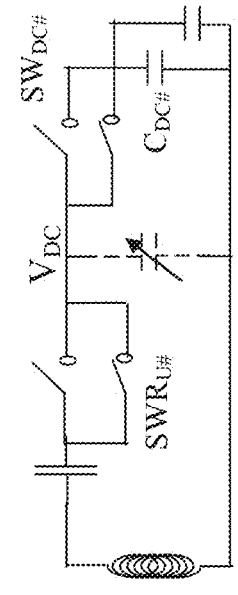
FIG.45A1
FIG.45A2
FIG.45A3
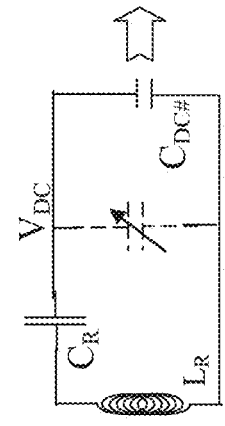
FIG.45A4
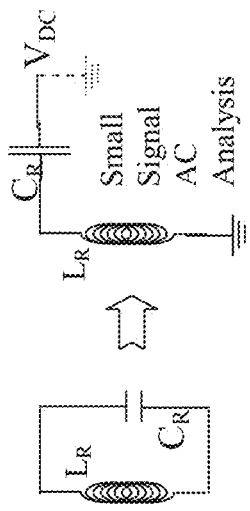
FIG.45B1
FIG.45B2
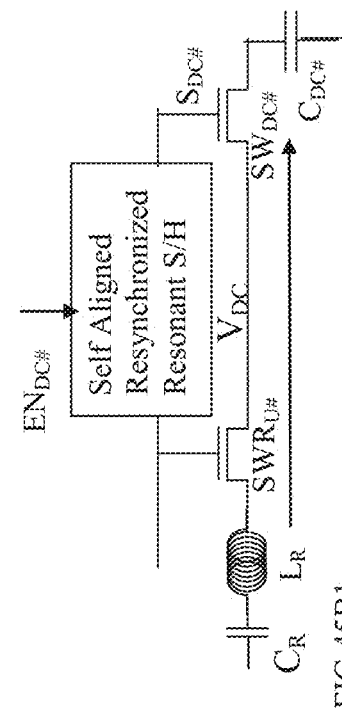
FIG.45C1
FIG.45C2A
FIG.45C2B
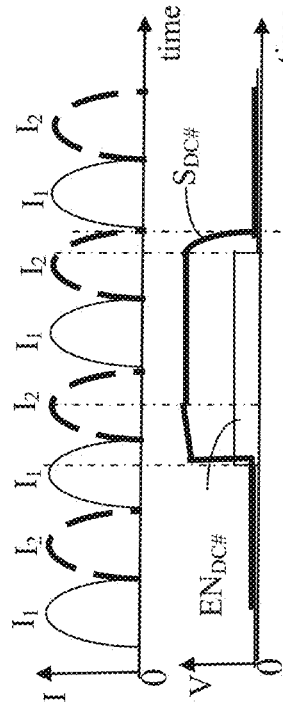

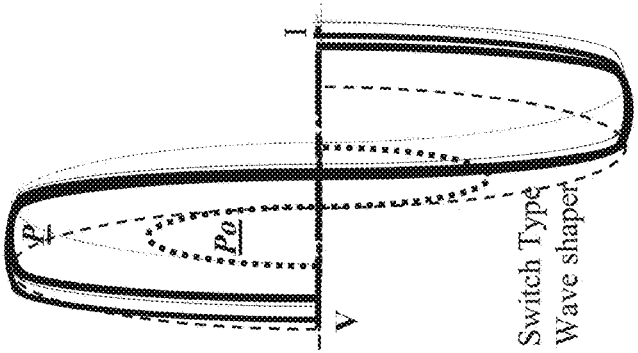
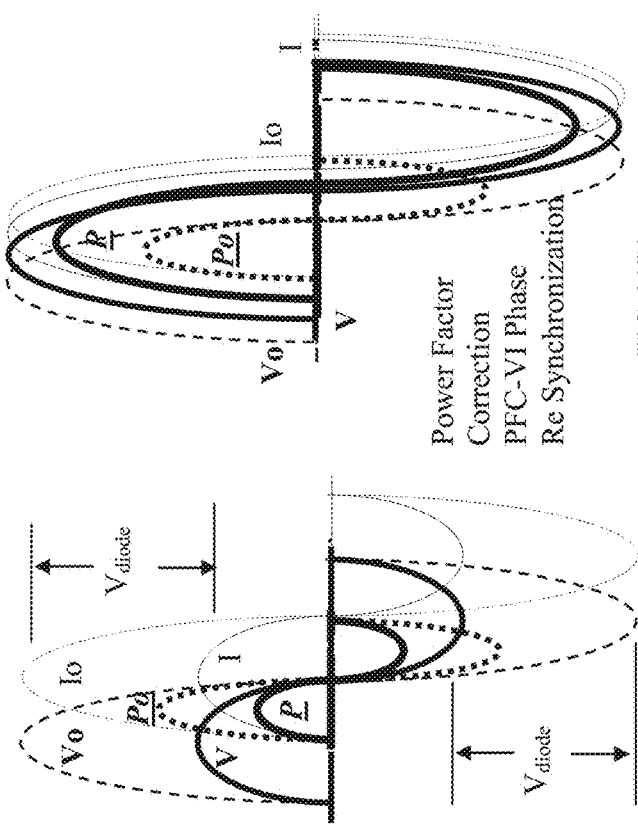
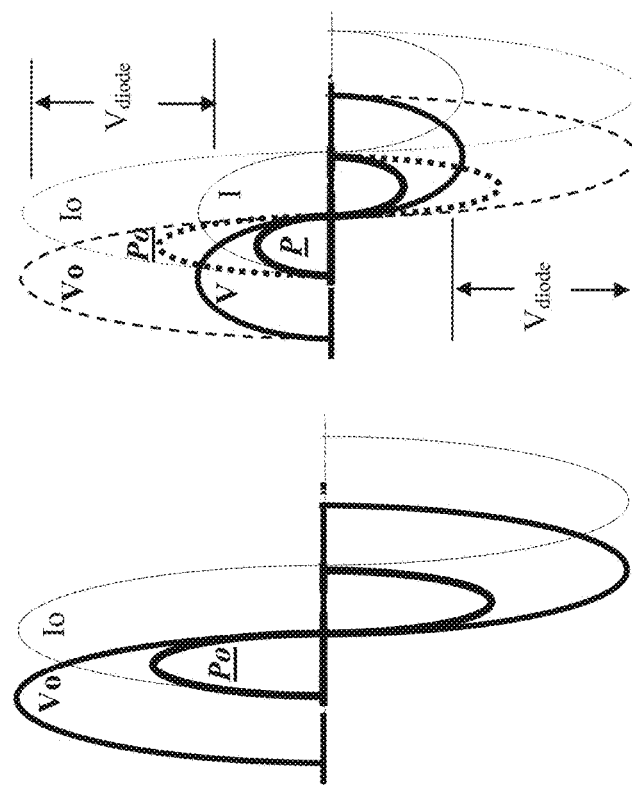
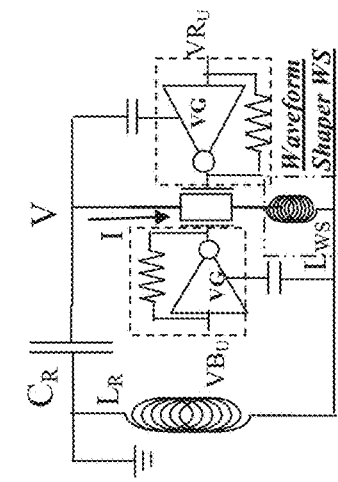
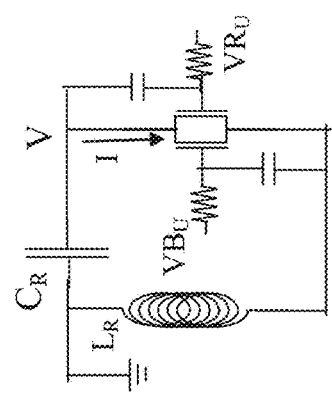
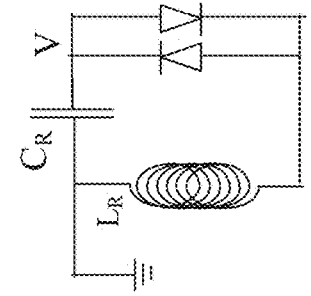
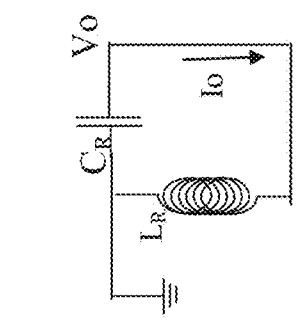

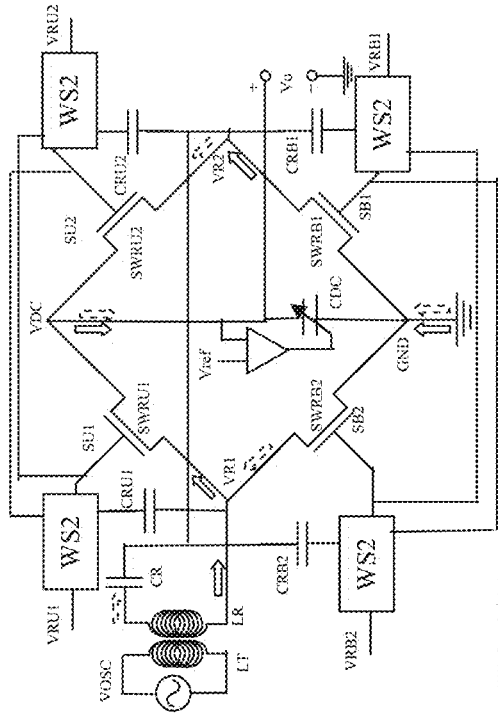
FIG.45H1
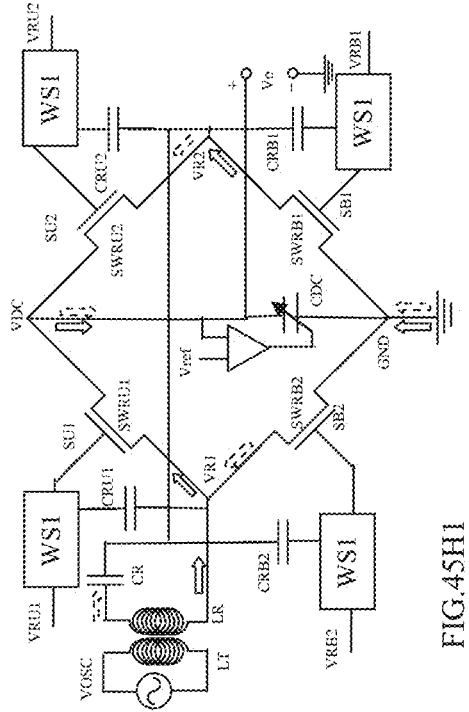
FIG.45I1
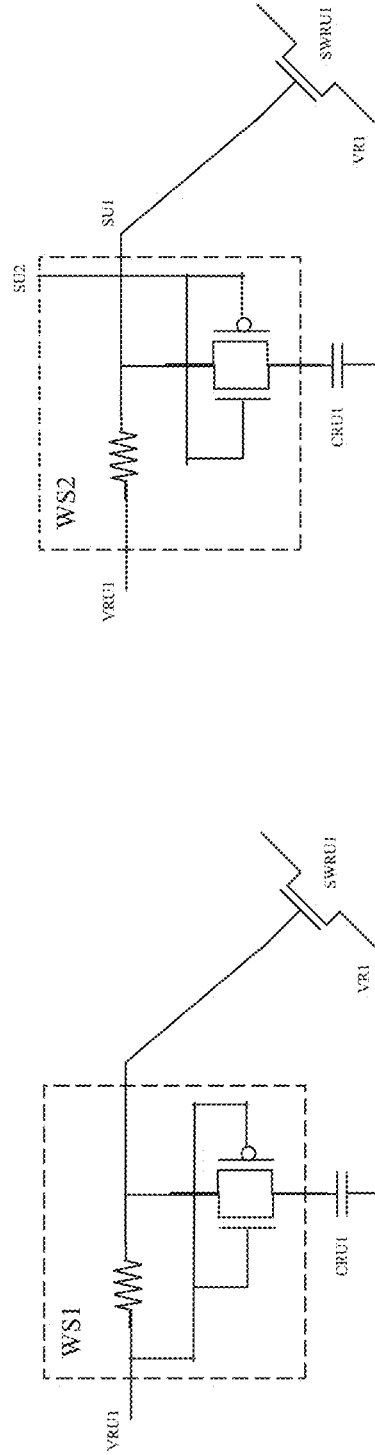
FIG.45H2
FIG.45I2

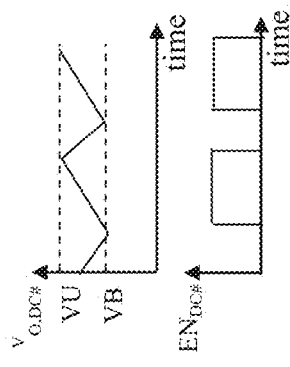
FIG. 45J2
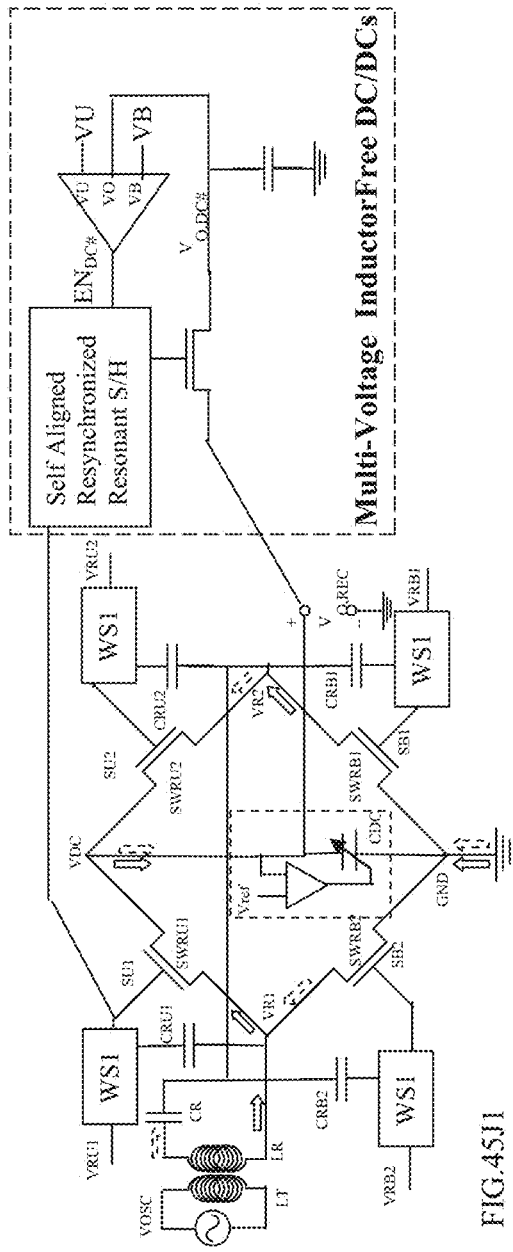
FIG. 45J1
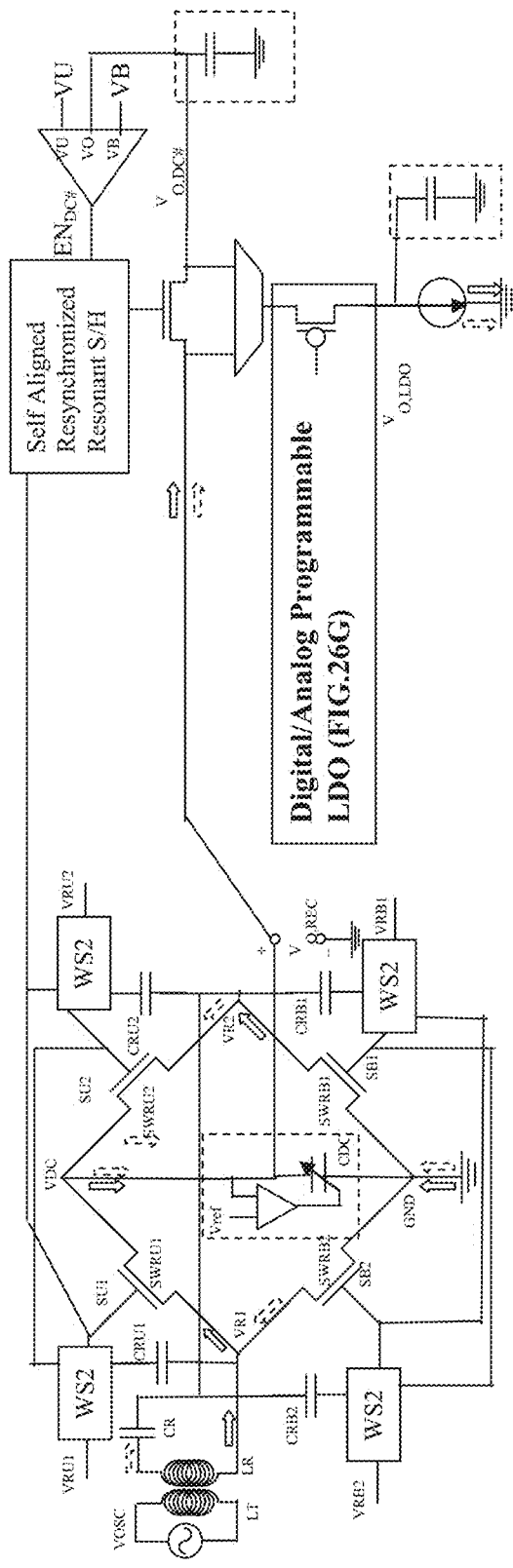
FIG. 45K

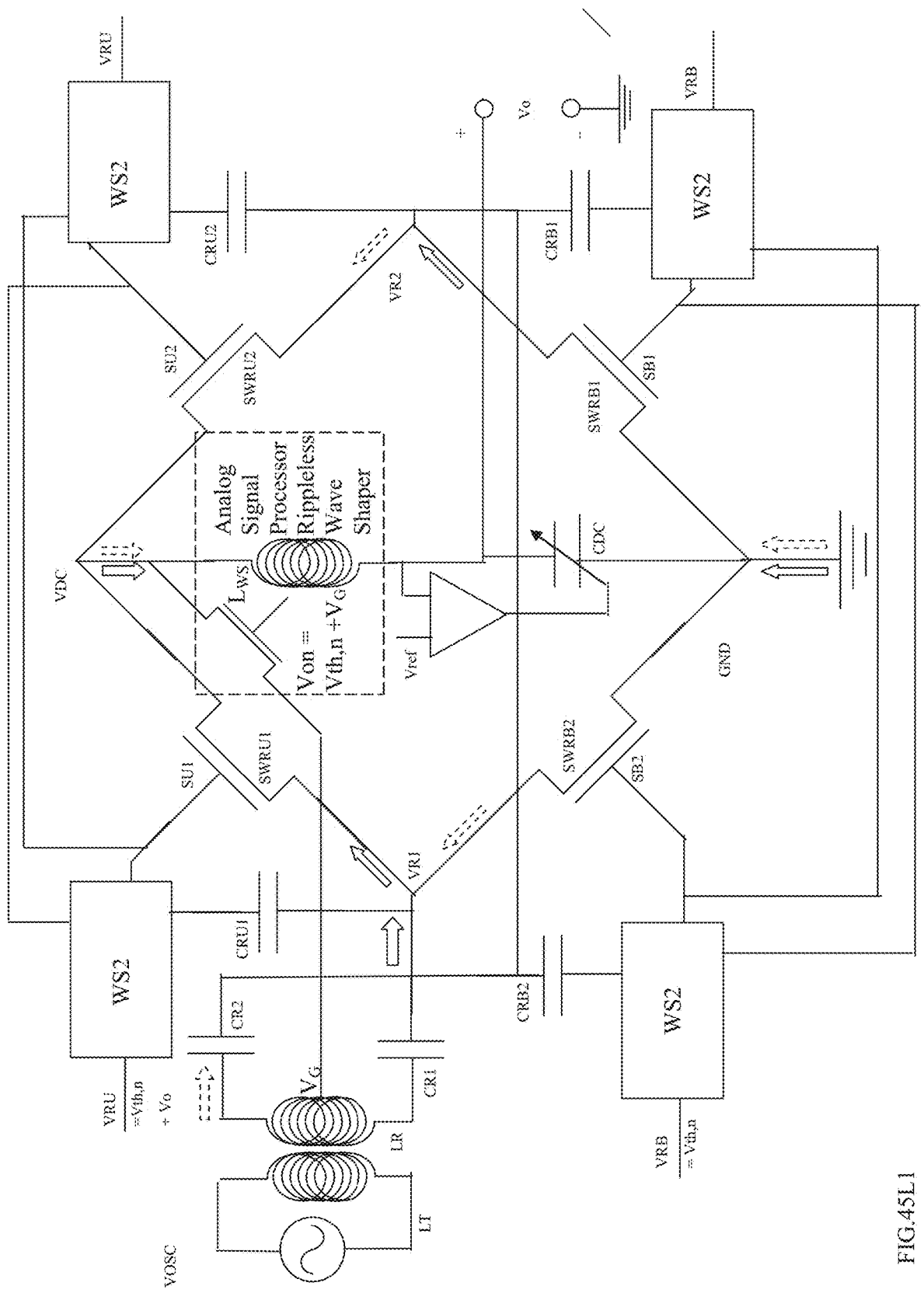
FIG.45L1

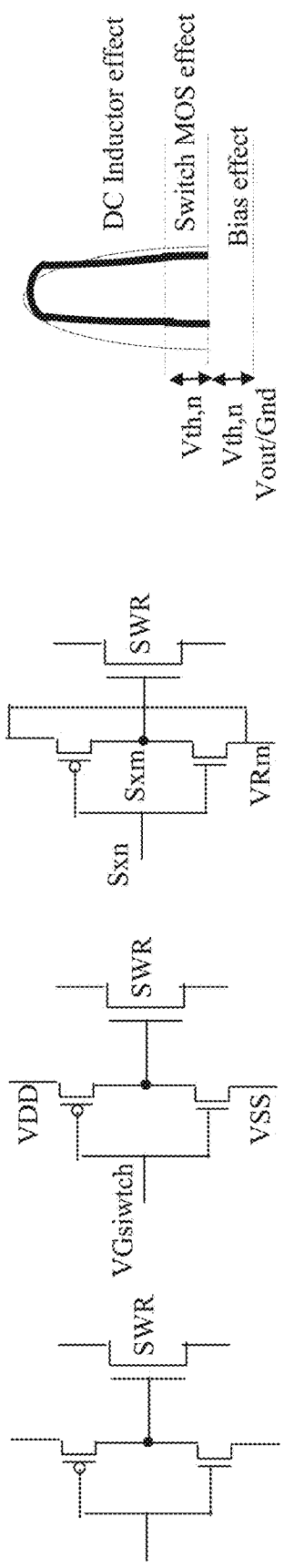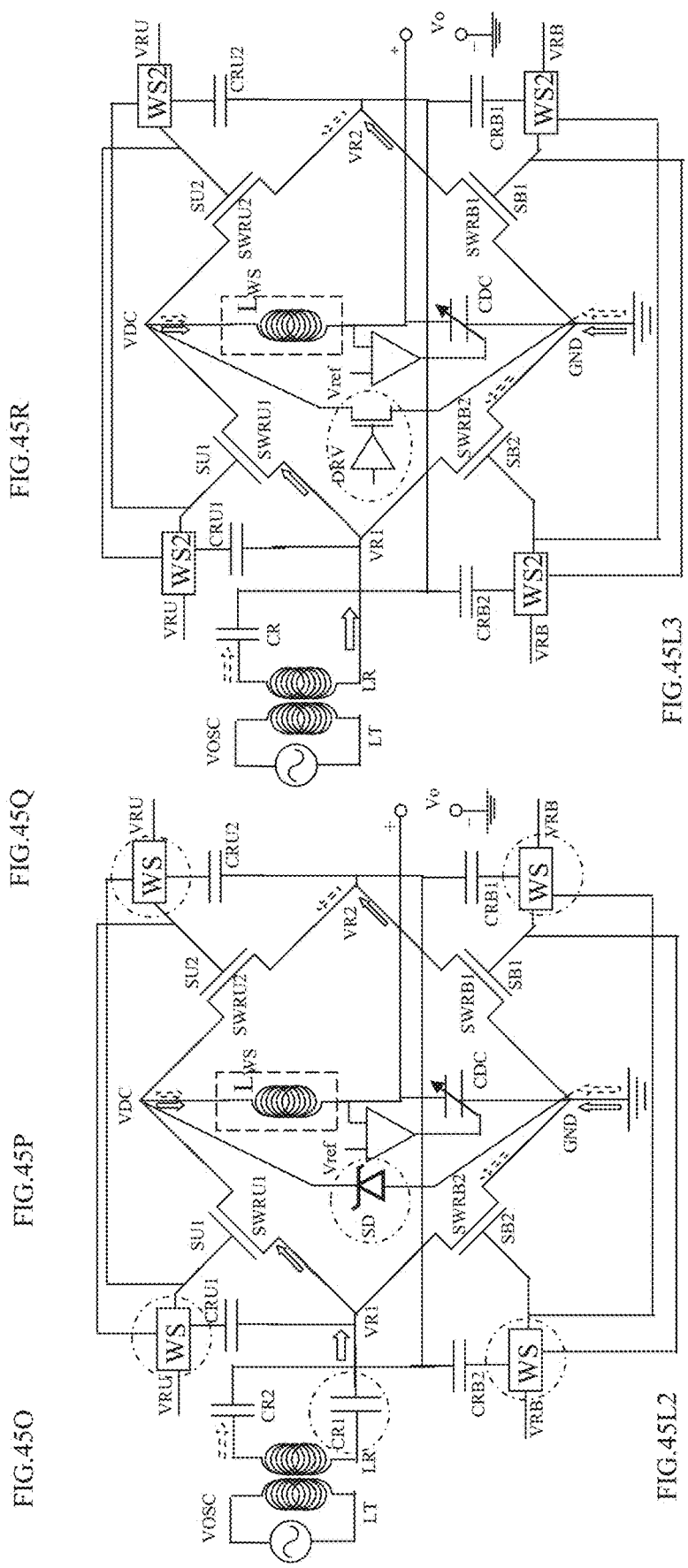

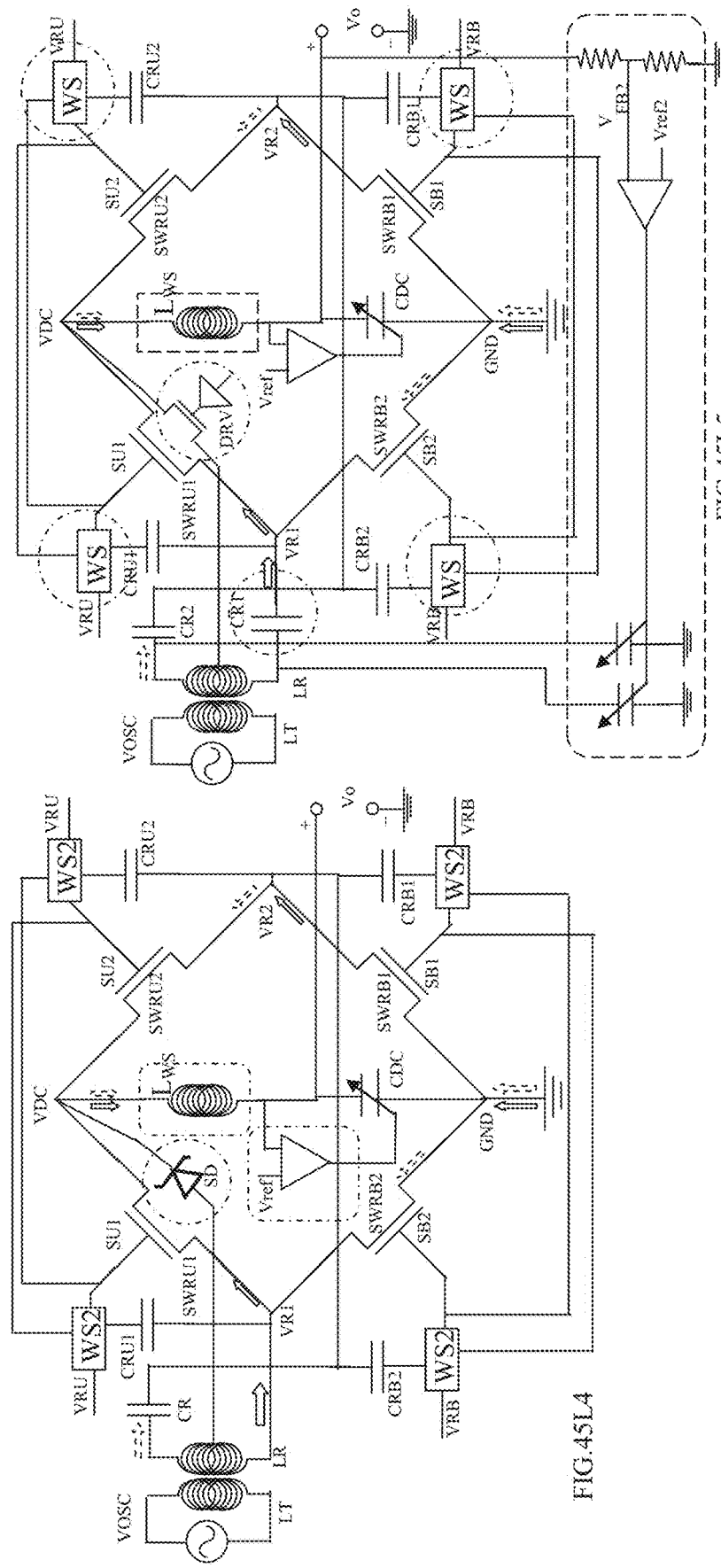

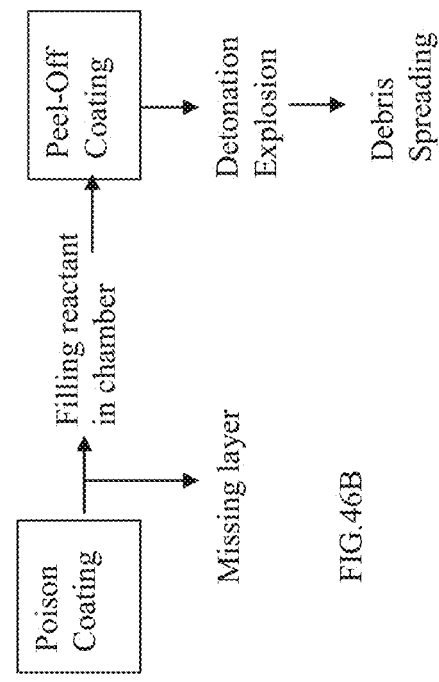
FIG. 46B
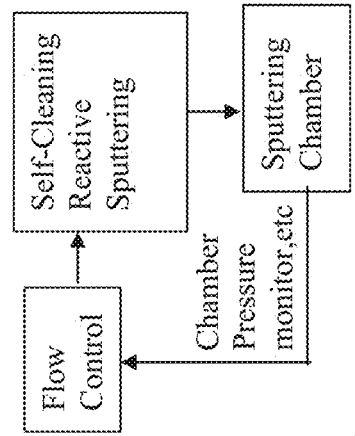
FIG. 46D
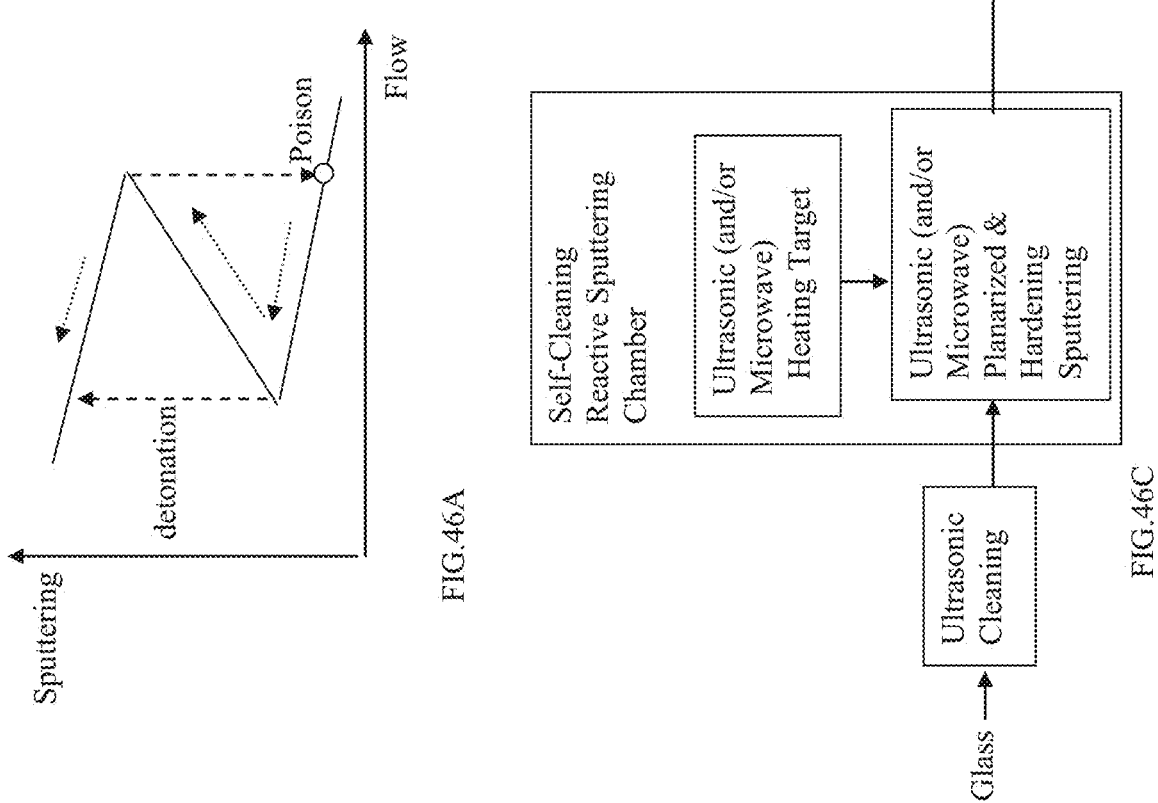
FIG. 46A
FIG. 46C

SMART WINDOW FOR GREEN ENERGY SMART HOME AND SMART GRID WITH FIELD PROGRAMMABLE SYSTEM ON CHIP FPSOC OF ANLINX, MILINX AND ZILINX

RELATED APPLICATIONS

This patent application is the Continuation in Part application of application of
U.S. application Ser. No. 12/752,121 filed Apr. 1, 2010 claiming priorities of
U.S. application Ser. No. 12/422,719 filed Apr. 13, 2009;
U.S. patent application Ser. No. 15/810,005 filed Nov. 11, 2017, now U.S. Pat. No. 10,328,357 issued in Jun. 25, 2019;
U.S. patent application Ser. No. 12/317,973, filed Dec. 31, 2008, now U.S. Pat. No. 8,089,324 issued on Jan. 3, 2012;
U.S. patent application Ser. No. 12/291,984, filed Nov. 12, 2008;
U.S. patent application Ser. No. 12/291,618, filed Nov. 12, 2008, now U.S. Pat. No. 7,876,188 issued on Jan. 25, 2011;
U.S. patent application Ser. No. 12/288,770, filed Oct. 23, 2008, now U.S. Pat. No. 7,663,349 issued on Feb. 16, 2010;
U.S. patent application Ser. No. 12/229,412, filed Aug. 23, 2008, now U.S. Pat. No. 8,089,323 issued on Jan. 3, 2012;
U.S. patent application Ser. No. 12/082,601, filed Apr. 12, 2008;
U.S. patent application Ser. No. 12/079,179, filed Mar. 25, 2008, now U.S. Pat. No. 8,089,353 issued on Jan. 3, 2012;
U.S. patent application Ser. No. 11/593,271, filed Nov. 6, 2006, now U.S. Pat. No. 7,511,589 issued on Mar. 31, 2009;
U.S. patent application Ser. No. 11/500,125, filed Aug. 5, 2006, now U.S. Pat. No. 7,525,392 issued on Apr. 28, 2009;
U.S. patent application Ser. No. 08/892,358, filed Jul. 14, 1997, now U.S. Pat. No. 5,850,093 issued on Dec. 15, 1998;
U.S. patent application Ser. No. 08/854,800, filed Mar. 23, 1992, now U.S. Pat. No. 5,280,200 issued on Jan. 18, 1994;
U.S. patent application Ser. No. 08/081,074, filed Jun. 22, 1993, now U.S. Pat. No. 5,793,125 issued on Aug. 11, 1998;
U.S. patent application Ser. No. 577,792, filed Sep. 5, 1990, now U.S. Pat. No. 5,198,691 issued on Mar. 30, 1993;
U.S. patent application Ser. No. 577,791, filed Sep. 5, 1990, now U.S. Pat. No. 5,111,076 issued on May 5, 1992;
which was the Continue in Part of U.S. application Ser. No. 13/918,989 filed Jun. 16, 2013 claiming priorities of which was the Continue in Part of U.S. application Ser. No. 15/472,262 filed Mar. 28, 2017
which herein incorporated by references in its entirety.

BACKGROUND

Field of Invention

The smart window is the system design for the future smart home has the entertainment, remote access and control, green power management, lighting management and air condition, etc. The smart home is the home automation system design having the Master and Slave devices. (1) To be feasible, the smart window must be as transparent having window view as the conventional IGU Insulated Glass Unit. (2) To have the same window view as conventional IGU, all the complex electronic components are embedded in the frame of the smart window. (3) To have all the complex electronic components embedded in the frame, all the complex components are integrated to be the FPSOC chip, Field programmable System On Chip. (4) To prove all the electronic components being able to be integrated, the Field Programmable System On Chip FPSOC of Anlinx, Milinx and Zilinx is disclosed in detail. As shown in FIG. 1A3, FIG. 1A4, FIG. 1A5 and FIG. 1A6, the Green Energy Smart Window home automation system is implemented with the master smart window and the slave smart window. As shown in FIG. 1A5, the master smart window has the transparent Multimedia panel, Electrochromic panel and transparent Solar panel. As shown in FIG. 1A3, the master smart window has transparent Multimedia panel and transparent Solar panel. As shown in FIG. 1A4, the slave smart window has the Electrochromic panel and transparent Solar panel. To have the energy harvest for smart grid, the transparent solar panel has the full window area. To have the entertainment, the transparent multimedia panel has the fill window area, too. To have the clean and clear vision, the air circulation of the AC air conditioner cannot pass through the window panel area and must pass through the frame post of the window as shown in FIG. 1N1. The green energy smart window further comprising smart fan. The smart fan comprises the pipe, bladeless turbofan and temperature sensor inside the frame of IGU of the green energy smart window. The bladeless turbofan locates at the opening of the pipe and circulates the air for air conditioning through the pipe. The temperature sensor detects the temperatures of air to activate the smart fans.

The innovative smart window system design integrates all the different technologies to be the smart window. The smart window for the green energy smart home has the patentable innovations for the following multiple functions: (1) controlling the light and heat injecting into rooms; (2) air conditioning tube design for the clean and clear IGU; (3) both local and remote/internet/wireless access control for smart window automation system of green energy smart home; (4) not only providing energy to smart window itself but also providing energy to smart home and smart grid; (5) in the normal Open mode, the complete view of the smart window is clean and clear without any blockage and dust, etc.; (6) in the Smart Phone mode, the smart window serves as the entertainment, communication, computation, local and remote control access, etc.; (7) in the Shut Mode or Smart Phone Mode, the smart window serves as the screen to block the view of the smart window; (8) with the FPSOC Field Programmable System On Chip of Anlinx, Milinx and Zilinx chips, the smart window can serve the versatile requirements of different architectures of smart home; (9) the electronic components are integrated in the FPSOC chip that all the electronic blocks can be embedded in the frame to have the clean view as the conventional window does. None of the prior inventions has the above nine characteristics.

As shown in the FIG. 1A, the Green Energy Smart Window of W5RS is the new standard which is promoted by the innovative company, Tang System. The transparent multimedia panel, electrochromic panel and transparent solar panel are in the side view. However, the electronic block diagrams are implemented with FPSOC and embedded in the smart window frame. A Green Energy Smart Window of Wireless Window 5R System W5RS is constituted of Transparent Multimedia panel, Electrochromic panel and Transparent Solar panel, etc. The Transparent Solar Cell panel harvests solar energy to be electric energy to provide power to Transparent Multimedia panel and Electrochromic panel. The Green Energy Smart Window is not only self-powered but also provides the electrical energy to the home, smart grid and mobile devices. "W5RS" is the killer product application in Silicon Valley and "5R" is the killer core IP technology in Silicon Valley. "W5" represents the "Wireless and Wireline Weaving Wishful Window". "5R" represents "Recycling Resonant Resynchronizing Rectifying Regulator". "5S" represents the "Smart Solar Supply Silicon System".

In summary, the energy supplied for the house warming or the house cooling is the largest power consumption. The largest amount energy dissipation is the window of the house. The Electrochromic EC window is adopted to minimize the largest power consumption. However, the Electrochromic EC window has the leaking current that the EC window controller has the stand-by power consumption. So, we need to have the Green Energy Smart Window for the Smart Home. The Green Energy Smart Window of Smart Home has to be energy self-contained. The transparent solar window of the Smart Window for Smart Home can convert the sunlight energy to be the energy of battery, smart grid and electrochromic EC window, etc. To have the clear window view, all the electronic components are embedded inside the frame of the smart window. To have all the electronic component embedded inside the frame, most of the electronic components are integrated to be the FPSOC. Therefore, the FPSOC is the key technology for the implementation of the clear view smart window. The 23Less Green Technologies for the Field Programmable System On Chip FPSOC of the Green Energy Smart Window are as follows.

(1) Defectless Uniform multi-state dimmer EC Glass;
(2) PowerLoss-Less 5R: Recycling Resonant Resynchronous Rectifier Regulator;
(3) H-Bridgeless AC|DC converter;
(4) RF-Noiseless Window Driver;
(5) H-Bridgeless Microinverter;
(6) Rippleless Battery Charger;
(7) Curtainless Smart Window;
(8) Filmless Touch Screen;
(9) Touchless Screen;
(10) Rippless Fast Lock PLL;
(11) Humidity-EMI-Less Xtaless LC Clock with plastic package;
(12) bladeless turbofan;
(13) PowerLoss-Less PA;
(14) Xtaless Clock;
(15) Inductorless SNIPS;
(16) Ground BounceLess I/O;
(17) Overshootless LDO;
(18) Rippleless LDO;
(19) Sawless LNA;
(20) Capless LDO;
(21) Diodeless Random Generator;
(22) Resistorless Current Sensor;
(23) Brakeless Motor Vehicle;

So, the green technology needs to provide the house energy to fill up the energy requirement. It needs to convert the conventional window to be the Green Energy Smart Window. It needs to incorporate all the dimmer light, dimmer window, multimedia panel, electrochromic panel and solar panel, etc. to be wireless network. For the versatile complex home environment, through the wireless network, the master smart window control the slave smart window. The green technology is for the smart window multimedia panel, solar panel and EC panel, etc. To have the efficient wireless charging of Power over WiFi, PoWiFi, the RF power amplifier PA of the window controller needs to be power efficient. The WiFi PA has power efficiency to be less than 15%. For the WiFi standard, our Power-Lossless conjugated PA has the power efficiency more than 75%. To receive the wireless efficiently, the 5R core technology converts the AC sinusoidal power energy to DC energy with high power efficiency being larger than 95%. Even for the wireless power supply standards of the Wireless Power Consortium (WPC) Qi and Alliance For Wireless Power (A4WP), the novel "single stage" 5R can have the AC/DC power efficiency as high as 95% which is the highest record in the world. It is the record of the world.

Furthermore, our Sawless low noise amplifier LNA works in the noiseless integrated chip with our Power-Lossless conjugated PA. Our noise isolation technology is the key technology for the next-generation cutting-edge Field-System-On-Chip FPSOC. The controller costs a lot. The controller has to be the integrated chip to save the cost. To integrate the controller to be an integrated chip, it must have the noise isolation technology. To merge ASIC with FPGA to be the FPSOC, it needs the Noise Isolation Technology of Green Technology. With our 23Less Green Technology, we can generate the noiseless Field Programmable System On Chip FPSOC. With our ultrasonic assisted deposition, platen and hardening process, the Defectless Uniform multi-state dimmer EC Glass can be achieved to make the smart EC Window to be commercial.

A Green Energy Smart Window of Wireless 5R System W5RS is constituted of transparent Multimedia panel, Electrochromic panel and transparent Solar panel. The transparent Solar Cell panel harvests solar energy to be electric energy to provide power to transparent Multimedia panel and Electrochromic panel. The electrical energy further provides to smart grid and mobile devices. Furthermore, Green Energy Smart Window of W5RS adopts the isolation technology to integrate the FPGA, Analog Front, RF Front, Digital circuits, etc. to be FPSOC. ASIC is Application Specific Integrated Circuit. FPGA is Field Programmable Gate Array and FPSOC is the Field-System-On-Chip. For the Green Technology, FPSOC will merge ASIC and FPGA together to be the Field-System-On-Chip. As the semiconductor device process continues shrinking down, the mask price and process price are much higher. The product revenue of one-generation cannot recover the investment. It needs the revenue of several generations to cover the Non-recurring engineering (NRE) cost. So, all the chips will be forced to be FPSOC. So far, there are ASIC and FPGA two categories. In the future, it will only have FPSOC, Field-System-On-Chip.

Anlinx is analog programmable chip. Milinx is mixed signal programmable chip. Zilinx is the analog, digital, mixed signal and RF programmable chip. The Field-System-On-Chip FPSOC of Anlinx, Milinx and Zilinx is based on the 23Less green technology to integrate the FPGA with ASIC to be the field programmable FPSOC. Thanks to the cooperative works of Dr. Mei Jech Lin, Eric Yu-Shiao Tarng, Alfred Yu-Chi Tarng. Angela Yu-Shiu Tarng, Shun-Yu Nieh and Huang-Chang Tarng, the revolutionary innovations had developed to be the FPSOC of Anlinx, Milinx and Zilinx.

Description of Prior Art

The smart window is to implement the innovative green energy smart home and smart grid, etc. However, this smart window concept doesn't exist before. Due to the lack of the FPSOC technologies, the electrochromic window, the solar energy harvest panel, multimedia TV and air circulation, etc. technologies are existed piece by piece and they cannot integrate as the smart window does. The solar energy harvest panel doesn't have the full panel width as the electrochromic window does. The solar energy panel blocks the sunshine that the solar energy harvest panel is only a small portion of the window panel. It cannot generate enough power to the smart grid as well as the smart home does. Furthermore, the air circulation flows between the panels. It violates the working principle of Insulated Glass Unit IGU. Therefore, there is no air circulation in the IGU of electrochromic window.

Furthermore, the system integration of the multiple smart panels doesn't exist. The smart solar panel doesn't exist. The Electrochromic window consumes a lot of power due to the power leakage of the electrochromic thin-film battery of the electrochromic glass. The Multimedia window is not compatible with Electrochromic window. The Solar Window doesn't provide energy to smart grid and mobile devices, either. Furthermore, the FPGA field programmable gate array cannot integrate the high performance ADC on the same chip. The switch noise generated by the FPGA will destroy all the performance of the high performance ADC analog to digital convener. Therefore, there is no high performance ADC on FPGA. The radio front, analog front RF/AF/analog circuits cannot be integrated on FPGA, either. All these ADC and RF/AF/analog circuits are left to be on the ASIC application specific integrated chip. The chips are the noise generators. All the noise generated by the chips is dumped on the board. There is an implicit assumption that the board is the ground having the infinite capacitance. However, this implicit assumption is no more true as the mobile products becomes thin and small. There is no big board to serve as the ideal ground. Since there is no isolation technology in the conventional chip that the ASIC still has to be used. The noise isolation of the conventional chip adopts the multiple power and ground buses. Furthermore, without the 23Less Green Technology, the electronic components cannot be integrated to be chips that the electronic components cannot be embedded in the frame of window. It makes the window having no clear view.

Objects and Advantages

The next generation smart home has the green energy management, communication multimedia and remote internet control for home. The smart window is the core technology of the smart home and smart grid. The Green Energy Smart Window of W5RS has the communication and multimedia capabilities of phone, internet and TV services. Even for the WPC Qi and A4WP wireless power supply standards, the novel single stage 5R can have the AC/DC power efficiency as high as 95% which is the highest record in the world. "5S" represents "Smart Solar Supply Silicon System". "W5" represents "Wireless Wireline Weave Wishful Window". "5R" represents "Recycling Resonant Resynchronization Rectifying Regulator". "W5RS" is the killer application product of Silicon Valley and "5R" is the killer core IP technology of Silicon Valley. Using the noise isolation technology to build up the platform to integrate all the FPGA and ASIC together to be FPSOC, the Green Energy Smart Window provides the complete set solution for smart home. It saves all the world energy consumption by more than half. Furthermore, the system integration of the transparent multimedia panel, electrochromic panel, transparent solar panel and the FPSOC makes the smart window having the clean outlook and clear view as the conventional IGU Insulated Glass Unit does.

BRIEF DESCRIPTION OF THE FIGURES

FIG. 1A1 is the overall system of the Green Energy Smart Window for the Smart Home; it includes the transparent multimedia panel such as LCD/LED/OLED/TV Flat panel and/or electrochromatic panel, the transparent solar cell panel, ventilation, smart fan controller, humidity controller, transparent touch screen, touchless screen, battery, thin-film battery, wireless communication, wireless power supply, SerDes, fiber optic communication, smart fan, EC window and dimmer light, etc.; all the transparent multimedia panel, electrochromic panel and solar panel have the whole window size. FIG. 1A2 is the overall system of the Green Energy Smart Window having multiple glass or plastic support panels for the transparent multimedia panel such as LCD/LED/OLED/TV Flat panel, electrochromatic panel and transparent solar cell panel to be a smart window. FIG. 1A3 the MS type master smart window is constituted of the transparent multimedia panel and transparent solar panel; both the transparent multimedia panel and the solar panel have the full window size; the air circulation is embedded in the frame of window. FIG. 1A4 the ES type slave smart window is constituted of the electrochromic panel and the transparent solar panel; both the electrochromic panel and the transparent solar panel have the full window size; the air circulation is embedded in the frame of window. FIG. 1A5 the MES type master smart window is constituted of the transparent multimedia panel, electrochromic panel and the transparent solar panel; the transparent multimedia panel, electrochromic panel and the transparent solar panel have the full window size; the air circulation is embedded in the frame of window. FIG. 1A6 is one illustrating example of the smart home implemented with the system made of smart windows. FIG. 1E1 is the cross-section of the transparent touch-screen; FIG. 1E2 is the top-view of the conventional transparent touch-screen. FIG. 1E3 is the top-view of the filmless touch-screen. FIG. 1E4 is the touch on the top of the filmless touch-screen. FIG. 1E5 is the equivalent circuit of the touch on the top of the filmless touch-screen. FIG. 1E6 is the pulsing wave propagating in the conducting layer of the filmless touch screen. FIG. 1F1 is the smart fan having for the Smart Window of Smart Home. FIG. 1F2 is the section view of the smart fan embedded in the smart window. FIG. 1F3 is the working principle of the bladeless turbofan. FIG. 1F4A is the diode characteristic curves over temperature. FIG. 1F4B is the temperature sensor circuit to measure the on-chip temperature for the smart ventilation window, etc. FIG. 1G1 is the smart plug made of the FPSOC. FIG. 1G2 is the analogy between the phone plug and power plug. FIG. 1G3 is the combinatory Phone Plug and Power Plug made of the FPSOC is the Unipolar-DC/Bipolar-DC conversion of the battery charger and window driver, etc. with H-bridge. FIG. 1H1 is the AC/DC conversion of the rectifier and micro-inverter, etc. with the H-bridge. FIG. 1H2 the bladeless turbofan and humidity/de-humidity/filter air-conditional multi-function. FIG. 1I is the global view of the power conversions among different power resources. FIG. 1J1 is the block diagram of the H-Bridgeless power conversion. FIG. 1J2 is the circuit of H-Bridgeless power conversion injecting the power. FIG. 1J3 is the circuit of H-Bridgeless power conversion extracting the power. FIG. 1J4 is the timing diagram for the triggering action of the H-Bridgeless power conversion. FIG. 1K is an illustrated example to show the fundamental working principal of power re-cycling between the huge SMPS output switches; it is to reduce the power switch loss especially in high-frequency switching operation. FIG. 1L1 is the W5RS Window 5R System using the Wireless 5R Recycling Resonant Resynchronization Rectifier Regulator Supply, programmable LDOs of Analog LDO and Digital LDO. FIG. 1L2 is the waveforms of the Analog LDO for the power supply of bandgap circuit, etc. FIG. 1L3 is the waveform of the Digital LDO for the power supply of microprocessor, etc. FIG. 1L4 is the comparisons between Analog LDO and Digital LDO. FIG. 1M1 is the exterior view of the smart window. FIG. 1M2 is the interior view of the smart window. FIG. 1N1 is the air circulation loop of the smart window. FIG. 1N2 is the low frequency current oscillatory loop for the wireless charging. FIG. 1N3 is the antenna of the wireless charging for high frequency protocols such as POWiFi, Bluetooth BT and RFID, etc.

FIG. 4A is the analog chip. FIG. 4B is the digital chip having the substrate noise.

FIG. 6A is the conventional digital chip having the ground node (0 node) set at the board. FIG. 6B is the ground nodes (0 node) set at the substrate of the chip in the SPICE simulation. FIG. 6C is the noise isolation having the ground node (0 node) set at the board.

FIG. 6D is the analogy of the magnetic shield for the heat isolation in the fusion chamber. FIG. 6E is the electric shield for the noise isolation in the planar chip. It is the introduction of the noise isolation technique.

FIG. 8A is the substrate. FIG. 8B is the electric model for the substrate. FIG. 8C is the noise coupling in substrate model with separate ground buses. FIG. 8D is the hydraulic model for the noise coupling in substrate model with separate ground buses. FIG. 8E is the hydraulic model for the noise isolation technique. FIG. 8F is the electric model for the Noise Isolation Technology. It is the substrate model.

FIG. 10A is the noise isolation technique with the current regulator. FIG. 10B is the conventional analog chip using the voltage regulator to get rid of the power supply noise by the factor PSRR power supply rejection ratio. FIG. 10C is the comparisons between the "current regulator of the noise isolation technique" and the "voltage regulator of the analog chip in the noisy board" environment. FIG. 10D is the switching operation of the voltage regulator. FIG. 10E is the switching operation of the current regulator. It is the comparisons between the "current regulator noise isolation platform" and the "voltage regulator analog-digital multi-power-bus platform".

FIG. 11A is the voltage source. FIG. 11B is the current source. FIG. 11C is the current source of the current regulator. FIG. 11D is the adaptive current source of the current regulator. It is the comparison of voltage source and current source.

FIG. 12A is the digital switching noises in the power supply. FIG. 12B is the spectrum of the power supply having the digital switching noise. FIG. 12C1 is the waveforms of signals of current regulator. FIG. 12C2 is the block diagram of the current regulator. FIG. 12C3 is the input noise signal spectrum of the current regulator. FIG. 12C4 is the control signal spectrum of the current regulator; FIG. 12D1 is the signal waveform of voltage regulator. FIG. 12D2 is the block diagram of the voltage regulator. FIG. 12D3 is the input noise signal spectrum of of the voltage regulator. FIG. 12D4 is the control signal spectrum of the voltage regulator. It is the comparison of the current regulator and voltage regulator.

FIG. 13A is the current average. FIG. 13B is the voltage average. FIG. 13C is the current average of the current regulator being implemented with the voltage average. FIG. 13D1 is the preferred implementation of the current regulator of which pre-filter serving as the average function. FIG. 13D2 is the alternative implementation of the current regulator of which post-filter serving as the average function. FIG. 13D3 is the cascading current regulator; it has the pre-filter and post-filter for the feedback signal; the filter is for the feed forward output current. It is the average current generator for the current regulator.

FIG. 14A is the block diagram of the average. FIG. 14B is the window function in the time domain to implement the average with the integration and divider. FIG. 14C is the timing window function to implement the average function. FIG. 14D is the low pass filter to implement the average function. FIG. 14E1 is the waveform of the digital switching noise. FIG. 14E2 is the sampling to implement the average function.

FIG. 16A is the architecture having the current regulator and voltage regulator. FIG. 16B is the circuit and system having the current regulator and voltage regulator. The current regulator is for the digital circuit or whole chip; the voltage regulator is for the analog or RF circuit.

FIG. 19A is the system of the cascade current regulator and voltage regulator. FIG. 19B is the architecture of the cascade current regulator and voltage regulator. FIG. 19C is the circuit of the cascade current regulator and voltage regulator. It is the cascade of current regulator and voltage regulator.

FIG. 20A is the system of the cascade of the current regulator and switch mode power supply. FIG. 20B is the architecture of the cascade current regulator and switch mode power supply. FIG. 20C is the circuit of the cascade current regulator and the switch mode power supply. It is the cascade of the current regulator and switch mode power supply.

FIG. 21A is the switch mode power supply for the digital circuit or voltage regulator. FIG. 21B is the voltage regulator power for the analog circuit or RF circuit. FIG. 21C1 is the signal flow block diagram of the current regulator; the signal flowing direction is in the reverse direction of the voltage regulator. FIG. 21C2 is the signal flow block diagram of the current regulator; the signal flowing direction is in the normal left-to-right direction. It is the comparison of the conventional power supply with the current regulator power supply.

FIG. 22A is the current regulator having the constant current; FIG. 22B is the spectrum of the current regulator having the constant current. It is the current regulator.

FIG. 23A is the current regulator having the slow varying current. FIG. 23B is the spectrum of the current regulator having the slow varying current. It is the slow varying current regulator.

FIG. 24A is the current regulator located at the upper power layer. FIG. 24B is the current regulator located at the lower power layer. FIG. 24C is the multi-current regulator located at the upper and lower power layer. FIG. 24D is the hierarchical view of the multi-current regulator. FIG. 24E is the circuit model for the current regulator, it generates the voltage source for the digital circuit, etc. FIG. 24F is the general platform of the multiple current sources. It is the versatile arrangements of the on-chip multi-power supplies.

FIG. 26A is the system block diagram of the cascade current regulator or the hierarchical current regulator. FIG. 26B is the architecture of the cascade current regulator or the hierarchical current regulator. FIG. 26C is the circuit of the cascade current regulator or the hierarchical current regulator. FIG. 26D1 is the design hierarchy as shown in conventional I/O. FIG. 26D2 is the design hierarchy as shown in ground-bounceless I/O. FIG. 26E is the substrate-noiseless Power and Ground P&G-Plane. FIG. 26F is the ground-bounceless I/O.

FIG. 27A is the general current regulator noise isolation platform. FIG. 27B is the conventional mixed signal chip. FIG. 27C is the CR wrapper of the current regulator noise isolation platform for the conventional mixed signal chip.

FIG. 28A is the partition of the chips. FIG. 28B is the A/D waveform of the A/D ADC or D/A DAC. FIG. 28C is the S|P waveform of the Series to Parallel S/P or Parallel to Series P/S in SERDES. It is the conventional system integration.

FIG. 29A is the chip partition with the system integration of the A|D, S|P with FPGA, DSP and Embedded Controller, etc. FIG. 29B is the platform of the system integration of the A|D, S|P with FPGA, DSP and Embedded Controller, etc. It is the system integration of the A|D, S|P with FPGA, DSP and Embedded Controller, etc.

FIG. 30A is the system integration of all the RF, AF, A|D with FPGA, DSP and Embedded Controller, etc. FIG. 30B is the platform of the system integration of all the RF, AF, A|D, S|P with FPGA, DSP and Embedded Controller, etc. It is the system integration of all the RF, AF, A|D with FPGA. DSP and Embedded Controller, etc.

FIG. 31E1 is the wandering of oscillatory wave. FIG. 31E2 is the normal oscillatory wave. FIG. 31F1 is the spectra growth of ideal oscillatory wave. FIG. 31F2 is the spectra growth of the square wave. FIG. 31F3 is the spectra growth due to the parametric inductance and capacitance. FIG. 31G1 is the historical review of Xtaless Clock theory. FIG. 31G2 is the route map of the Xtaless Clock development. FIG. 31H is the magnetic enhanced transimpedance amplifier TIA of the optical SerDes as shown in FIG. 1A. FIG. 31I is the schematic symbol of the magnetic enhanced transformer type inductors. FIG. 31J is the 3-dimensional view of the magnetic enhanced transformer type inductors. FIG. 31K is the architecture and system of the Xtaless Clock having Bandgap Generator. FIG. 31L1 is the linear curvature compensation for the conventional bandgap voltage generator.

FIG. 31L2 is the bandgap generator for bandgap voltage and bandgap current having ($V_{BG}$, $I_{BG}$) coupling: it has both the 1st and the 2nd curvature compensation. FIG. 31M is the system and architect of $I_{BG}$ Bandgap Current generator. FIG. 31N1 is the system and architect of $V_{BG}$ Bandgap Voltage generator. FIG. 31N2 is the system and architect of Iso Bandgap current generator. FIG. 31O is the system and architect for the wide frequency PLL/Clock generator. FIG. 31P is the system and architect of the RC type Xtaless Clock. FIG. 31Q1 is the schematics of the N-type current buffer made of current mirror. FIG. 31Q2 is the schematics of the P-type current buffer made of current mirror.

FIG. 33D is the SMPS output stage of buck converter. FIG. 33E is the illustration of the fundament principle of the SMPS buck converter. FIG. 33F is the illustration of the operation of the Adaptive Optimum Constant On Time AOCOT Buck Converter with the hybrid voltage mode and current mode. It is the ultra-fast dynamic power supply for the high power-efficiency high peak-average-ratio PAR Power Amplifier.

FIG. 34A is the layered structure of the Thin-Film Battery and/or EC window. FIG. 34B is the electrical model of the Thin-Film Battery and/or EC window. FIG. 34C is the signal flow of the temperature compensated Thin-Film Battery and/or EC window. FIG. 34D is the optical hysteresis curve of Thin-Film Battery and/or EC window. FIG. 34E is the operation of the Thin-Film Battery and/or EC window. It is the operation characteristics of the Thin-Film Battery and/or Electrochromic EC window.

FIG. 35A is the bipolar operation of the Thin-Film Battery and/or EC window. FIG. 35B is the unipolar operation of the Thin-Film Battery and/or EC window. FIG. 35C is the non-linear unipolar operation of the Thin-Film Battery and/or EC window. FIG. 35D1 is the unipolar operation for the positive voltage. FIG. 35D2 is the unipolar operation for the negative voltage. It is the switching operation of Thin-Film Battery and/or EC window.

FIG. 36A is the unipolar operation of the region 1 charging up Battery and/or EC window. FIG. 36B is the unipolar operation of the region 2 hold Battery and/or EC window. FIG. 36C is the unipolar operation of the discharging Battery and/or EC window of region 3. FIG. 36D is the unipolar operation of the charging up Battery and/or EC window of region 4. FIG. 36E is the unipolar operation of the hold Battery and/or EC window of region 5. FIG. 36F is the unipolar operation of the discharging Battery and/or EC window of region 6. It is the Battery and/or EC window unipolar operation with the H-Bridge as shown in FIG. 35A and FIG. 35B.

FIG. 37A1 is the analog buffer circuit with the H-Bridge. FIG. 37A2 is the H-Bridge operating on the analog buffer to generate the voltage ramping circuit. FIG. 37B1 is the buck converter circuit with the H-Bridge. FIG. 37B2 is the H-Bridge operating on the capacitor load of the buck converter to generate the voltage ramping or current charging. FIG. 37C1 is the buck converter circuit with the H-Bridge operating on the inductor and capacitor, etc. FIG. 37C2 is the H-Bridge operating on the inductor and capacitor load of the buck converter to generate the voltage ramping or current charging. FIG. 37D1 is the buck converter circuit with the H-Bridge operating on the whole buck convener. FIG. 37D2 is the H-Bridge operating on the buck converter to generate the voltage ramping or current charging. It is the H-Bridge operating on the power circuit to generate the EC window controller.

FIG. 38A is the conventional wrong way to drive a big load with the unit-gain amplifier. FIG. 38B1 is the correct way to drive a big load with analog buffer. FIG. 38B2 is the Power Management Unit PMU having the Switch Mode Power Supply SMPS and Low Drop Voltage Regulator LDVR to supply power to the Battery type device such as battery, thin film battery and electrochromic glass devices, etc. FIG. 38B3 is the PMU Power Management Unit having the Switch Mode Power Supply SMPS and Analog Buffer to supply power to the Battery typed device such as battery, thin film battery and electrochromic glass devices, etc. FIG. 38B4 is the PMU Power Management Unit having the Switch Mode Power Supply SMPS and LDO typed Analog Buffer to supply power to the Battery type device such as battery, thin film battery and electrochromic glass devices, etc. FIG. 38B5 is the block diagram of the Analog Buffer; FIG. 38B6 is the detailed schematics of the Analog Buffer. FIG. 38B7 is the SMPS-LDO typed Analog Buffer and H-Bridge. FIG. 38B8 is the SMPS and H-Bridge with LDO typed Analog Buffer embedded in the H-Bridge. FIG. 38B9 is the SMPS-LDO typed Analog Buffer and H-Bridge. FIG. 38B10 is the analog buffer embedded in the H-Bridge. FIG. 38B11 is the LDO type analog buffer embedded in the H-Bridge for voltage control. FIG. 38C1 is the block diagram of the Switch Mode Power Supply combining with Low Drop Voltage Regulator (LDVR) type Analog Buffer to be the Rippleless battery charger and RF-Noiseless EC window controller. FIG. 38C2 is the design platform for the Rippleless battery charger and RF-Noiseless battery charger and/or EC window controller. FIG. 38D1 is the architecture of the H-Bridge buck converter typed battery charger and/or EC window controller. FIG. 38D2 is the block diagram of the H-Bridge buck converter typed EC window controller. FIG. 38D3 is the embedded battery charger and/or window controller. FIG. 38D4 is the operation of the embedded battery charger and/or window controller. FIG. 38E1 is the algorithm of the current-limited voltage ramping in charging up phase. FIG. 38E2 is the algorithm of the current-limited voltage ramping in discharging phase. FIG. 38F1 is the algorithm of the voltage-limited current charging in charging up phase. FIG. 38F2 is the algorithm of the voltage-limited current charging in discharging phase.

FIG. 40A is the conventional power supply system. FIG. 40B is the power supply made of the analog buffer for voltage ramping operations of the battery charger and/or EC window controller. FIG. 40C is the waveform of the voltage ramping operation of the analog buffer. FIG. 40D is the analog buffer circuit for the voltage ramping battery charger and/or EC window controller. It is the analysis of the analog buffer typed voltage ramping.

FIG. 42A is the energy injection into AC line. FIG. 42B1 is the energy injection into AC line at the peak voltage of the AC line. FIG. 42B2 is the energy injection into AC line at the valley voltage of the AC line.

FIG. 43A is the energy extraction out of AC line. FIG. 43B1 is the energy extraction out of AC line at the peak voltage of the AC line. FIG. 43B2 is the energy extraction out of AC line at the valley voltage of the AC line.

FIG. 45A1 is the fundamental Oscillatory Resonator. FIG. 45A2 is the equivalent fundamental Oscillatory Resonator having two different ends, $V_{DC}$ and Ground. FIG. 45A3 is the fundamental 5R Oscillatory Resonator which can be derived from FIG. 45A2. FIG. 45A4 is the basic 5R Recycling Resonant Resynchronization Rectifying Regulator which can be derived from FIG. 45A3. FIG. 45B1 is the Recycling Resonant mechanism for the switch of DC/DC converter. FIG. 45B2 is the timing diagram of the Recycling Resonant mechanism for the switch of DC/DC converter. FIG. 45C1 is the resonant oscillation of the LC resonator of the wireless power receiver. FIG. 45C2A is the rectifier operation without the bias voltage. FIG. 45C2B is the rectifier operation with the bias voltage. FIG. 45D1 is the resonant voltage, current and power of the ideal resonant circuit as shown in FIG. 45D2. FIG. 45D2 is the ideal resonant circuit. FIG. 45E1 is the resonant voltage, current and power of the resonant circuit having the diodes which emulates the rectifier circuit having H-bridge with Schottky diodes. FIG. 45E2 is the resonant circuit having the diodes which emulates the rectifier circuit having H-bridge Schottky diodes. FIG. 45F1 is the resonant voltage, current and power of the resonant circuit having the active MOS which emulates the rectifier circuit having H-bridge with MOS. FIG. 45F2 is the resonant circuit having MOS device which emulates the rectifier circuit having H-bridge with MOS. FIG. 45G1 is the resonant voltage, current and power of the resonant circuit having the active MOS which emulates the rectifier circuit having H-bridge with MOS and wave-shaper switching driver. FIG. 45G2 is the resonant circuit having the MOS which emulates the rectifier circuit having H-bridge with MOS and wave-shaper switching driver. FIG. 45H1 is the rectifier having wave-shaper switching driver as shown in FIG. 45H2. FIG. 45H2 is the fundamental wave-shaper. FIG. 45I1 is the rectifier having wave-shaper switching driver as shown in FIG. 45I2. FIG. 45I2 is the mutual-latching enhanced wave-shaper. FIG. 45J1 is the rectifier with multi-voltage Inductor-Free DC/DC converter. FIG. 45J2 is the waveform of the multi-voltage Inductor-Free DC/DC converter. FIG. 45K is the complete set of Recycling Resonant Resynchronization Rectifying Regulator 5R having the single power-conversion stage. FIG. 45I is the complete schematics of the 5R having the Analog Signal Process/Power Factor Correction ASP/PFC wave shaper. FIG. 45L2 is the alternative design of 5R circuit with Schottky Diodes. FIG. 45L3 is the alternative design of 5R circuit with active MOS. FIG. 45L4 is the alternative design of 5R circuit with Schottky Diodes. FIG. 45L5 is the alternative design of 5R circuit with active MOS. FIG. 45O is the generic wave shaper of WS. FIG. 45P is the gate-activated switching buffer driver type wave shaper. FIG. 45Q is the source-activated switch-energy recycling wave shaper WS2. FIG. 45R is the operational mechanism analysis of wave shaper. It is the fundamental principles of 5R Recycling Resonant Re-synchronous Rectifier Regulator.

FIG. 46A is the characteristics of the gas reaction sputtering process. FIG. 46B is the detonating phenomena in the gas reaction sputtering chamber. FIG. 46C is the self-cleaning sputtering process. FIG. 46D is the block diagram of the system for the self-cleaning sputtering chamber. It is the operation of the self-cleaning sputtering chamber.

DESCRIPTION AND OPERATION

The Green Technology is the reduction of energy consumption, noise generation and resource saving. The green technology integration system comprises an smart Insulated Glass Unit. The smart Insulated Glass unit is referred as the Intelligent Graphic Unit IGU. The Intelligent Graphical Unit IGU further comprises the transparent multimedia panel, electrochromic panel and the transparent solar cell panel, etc. The electrical energy generated by transparent Solar panel can provide to transparent Multimedia panel and Electrochromic panel, etc. Furthermore, the electrical energy generated by the green energy Smart Window can provide to the smart grid with wireline power line and provide to the mobile devices with wireless power supply, etc.

To be feasible, the smart window must be as transparent having window view as the conventional IGU Insulated Glass Unit. To have the same window view as conventional IGU, all the complex electronic components must be embedded in the frame of the smart window. To have all the complex electronic components embedded in the frame, all the complex components must be integrated to be chip, FPSOC field programmable system on chip. To prove all the electronic components being able to be integrated, the Field Programmable System On Chip FPSOC of Anlinx, Milinx and Zilinx is disclosed in detail. Therefore, the green energy smart window is based on the W5RS Wireless Window 5R System to integrate the electronic components in the FPSOC and embedded all the components in the frame. "5S" represents "Smart Solar Supply Silicon System". "W5" represents "Wireless Wireline Weave Wishful Window". "5R" represents "Recycling Resonant Resynchronization Rectifying Regulator". "W5RS" is the killer product applications of Silicon Valley and "5R" is the killer core IP technologies of Silicon Valley. Even for the Wireless Power Consortium WPC Qi and Alliance for Wireless Power A4WP wireless power supply standards, the novel "single-stage 5R" can have the AC/DC power efficiency as high as 95% which is the highest record in the world. The green energy smart home of iPhome has the green energy smart window/iPindow. The green energy smart window is constituted of the multiple types of smart windows. The multiple smart windows are such as transparent multimedia window, transparent solar window and electrochromic window, etc. These panels are integrated to be one smart window unit.

Figure 1B:
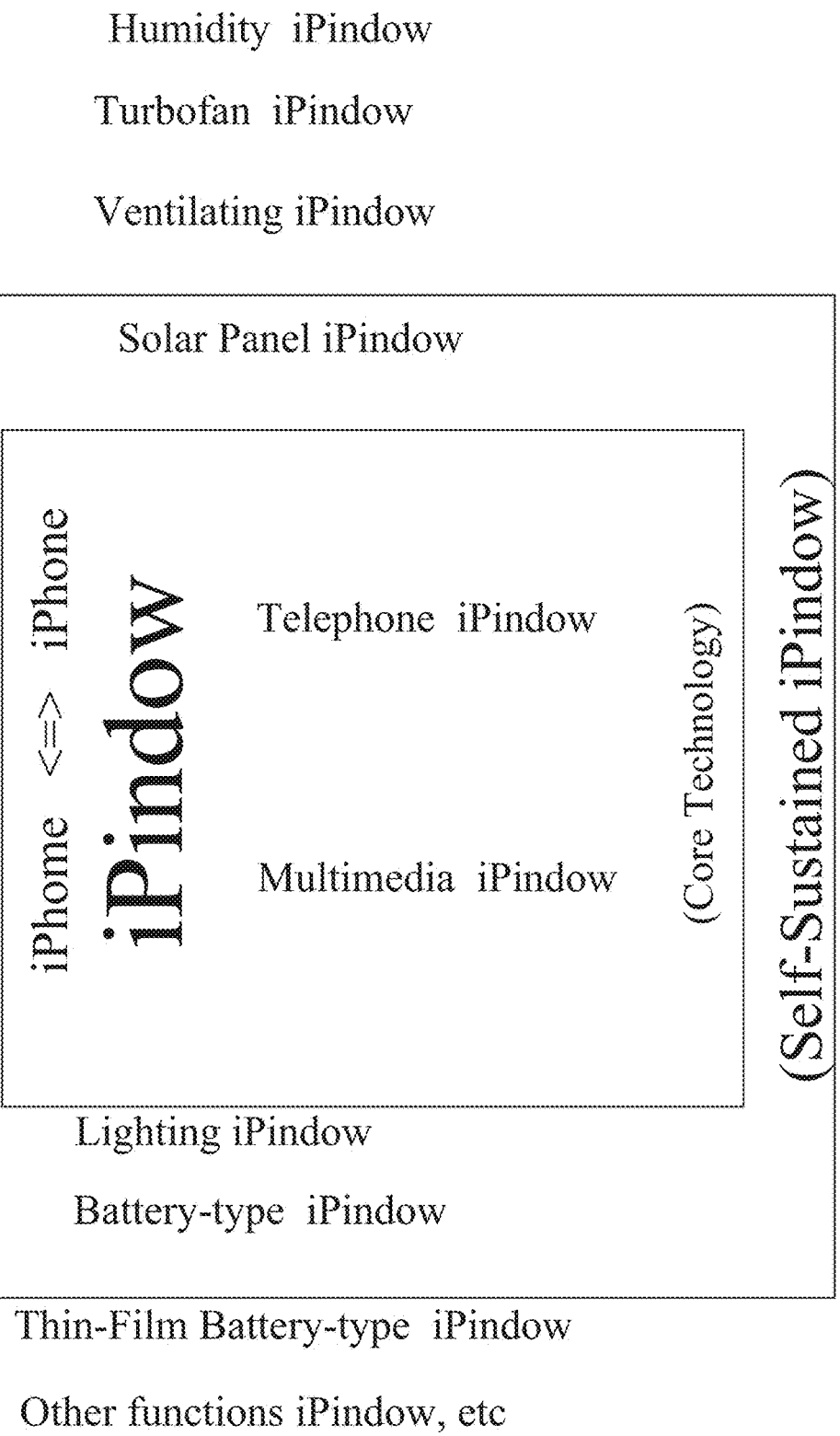
FIG. 1B is the architecture of the Smart Window of Smart Home.

As shown in FIG. 1A and FIG. 1B, the green energy Wireless Window 5R System W5RS is constituted of transparent Smart Multimedia Panel, Smart Electrochromic Panel and transparent Smart Solar Panel, etc. The transparent Smart Solar Panel harvests solar energy to be electric energy to provide power to the transparent Smart Multimedia Panel and Smart Electrochromic Panel, etc. The electrical energy further provides to smart grid and mobile means. There are versatile arrangements for the transparent multimedia panel and Electrochromatic panel in smart window. For the FIG. 1A, the LCD/LED/OLED TV/FlatPanel/Electrochromatic 140 can be replaced with (1) transparent LCD/LED/OLED/TV/FlatPanel multimedia panel only as shown in FIG. 1A3 to be the master window; or (2) Electrochromatic panel only as shown in FIG. 1A4 to be the slave window; or (3) LCD/LED/OLED % TV/Flat Panel/Electrochromatic multimedia panel and Electrochromatic panel as shown in FIG. 1A5 to be the master window. As shown in the FIG. 1B, the interior panel is transparent multimedia panel; the middle panel is Electrochromatic; the exterior panel is the transparent solar as shown in FIG. 1A5.

Furthermore, the smart window can be the transparent LCD/LED/OLED/TV/FlatPanel multimedia panel only serving as the master device.

The Green Energy System comprising the Master device of MES type smart window or MS type smart window and the Slave device of the ES type smart window.

As shown in FIG. 1A5, the MES type green energy smart window unit for smart home and smart grid comprises the electronic components having control circuitry, power supply and internet devices. The control circuitry comprises a processor, a multimedia window controller, an electrochromic window controller, a solar panel controller, and a power supply controller. The power supply comprises a rechargeable power supply, a wireless charging power supply circuit, an inverter circuit and a backlight circuit. The internet devices comprise a wireless internet remote access and control circuit. The green energy smart window has a transparent multimedia panel, an electrochromic panel and a transparent solar panel enclosed in an isolated glass unit IGU. The transparent multimedia panel, electrochromic panel and transparent solar panel have the whole panel size been the same as said smart window. The smart window has three operation modes, (1) normal open mode, (2) shut mode and (3) smart phone mode. The turbine fan and all the electronic components are embedded in the frame of said green energy smart window unit. In the normal open mode, the whole panel of the smart window view is clean and clear looking being transparent as the conventional dual panel window without any blockage in the open mode. In the shut mode, the whole smart window panel light is blocked by said smart window. In the shut mode, the whole smart window panel light is blocked either by coloring the electrochromic panel or by darkening the transparent multimedia panel. In the smart phone mode, the transparent multimedia panel of the smart window working as smart phone with huge smart phone, interactive TV screen, internet access and control of the smart window. The green energy smart window serves as the master device of the smart home and smart grid. All interactive and remote control for the smart home is through the interface of the transparent multimedia panel in said smart phone mode. The transparent solar panel is transparent and facing outside. The transparent multimedia panel is facing inside room and controlled by a host serving as master device. In the normal open mode, the multimedia panel is transparent and has no blockage of the window view. The isolated glass unit comprises an exterior glass panel located at a first side facing an external light source and an interior glass panel located at a second side, opposite the first side. The transparent solar cell panel is positioned on the exterior glass panel in the isolated glass unit, whereby exterior light transmitting through the transparent solar cell panel and received by the electrochromic panel and the transparent multimedia panel. The transparent solar cell panel is capable of generating power to smart grid and smart window unit including the control circuitry, the rechargeable power supply, the wireless charging power supply circuit, the electrochromic panel, and the transparent multimedia panel. The transparent multimedia panel is capable of displaying video being positioned on said interior glass panel in the isolated glass unit and further comprises a transparent touch screen displaying and detecting touch inputs. The green energy smart window further comprises a microcomputer to control the smart phone type Multimedia Panel. The Multimedia Panel is transparent in the open mode. The Multimedia Panel is the smart phone type huge screen to setup, control and communication, etc. in the smart phone Mode. The micro-computer controlled Multimedia Panel further comprises transparent touching screen to have user interactive with the Multimedia Panel. The transparent touching screen covers on the screen of the Multimedia Panel. Touching on the transparent touching screen, it makes the interaction with Multimedia Panel through the microcomputer. The transparent touching screen laying on the interior glass panel having layer of transparent sensor to detect the touching positions on the transparent touching screen. The electrochromic panel is positioned in the isolated glass unit, and is capable of blocking received light. The backlight provides light for the transparent multimedia panel during night. The transparent solar panel supplies power to the smart grid through the inverter. The transparent multimedia panel has the wireless internet remote access and control circuit controlling as master device. The mobile device charging unit comprises a wireless power pad charger inductively coupled to said wireless charging power supply circuit. The power supply controller is capable of controlling rechargeable power supply to selectively discharge current to an external electrical smart grid coupled to the smart window unit.

As shown in FIG. 1A3, the MS type green energy smart window unit for smart home and smart grid comprises electronic components comprising control circuitry, power supply and internet devices. The control circuitry comprises a processor, a multimedia window controller, a solar panel controller, and a power supply controller. The power supply comprises a rechargeable power supply; a wireless charging power supply circuit, an inverter circuit and a backlight circuit. The internet devices comprises a wireless internet remote access and control circuit. The green energy smart window has a transparent multimedia panel and a transparent solar panel enclosed in an isolated glass unit. The transparent multimedia panel and transparent solar panel has a whole panel size been the same as the smart window. The smart window has three operation modes, (1) normal open mode, (2) shut mode and (3) smart phone mode. The electronic components are embedded in the frame of the green energy smart window unit. In the normal open mode, the whole panel of the smart window view is clean and clear looking as the conventional dual panel window. The smart window is without any blockage and is transparent in the normal open mode. In the shut mode, the whole smart window panel light is blocked by the smart window. In the shut mode, the whole smart window panel light is blocked by darkening the transparent multimedia panel. In the smart phone mode, the transparent multimedia panel of the smart window works as smart phone with huge smart phone, interactive TV screen, internet access and control of the smart window. The green energy smart window serves as master device of the smart home and smart grid. All interactive and remote control for the smart home is through the interface of the transparent multimedia panel in the smart phone mode. The transparent solar panel is transparent and facing outside. The transparent multimedia panel being facing inside room and controlled by a host serving as master device. In the normal open mode, the multimedia panel is transparent and has no blockage of the window view. The isolated glass unit comprises an exterior glass panel located at the first side facing an external light source and an interior glass panel located at the second side, opposite the first side. The transparent solar cell panel is positioned on the exterior glass panel in the isolated glass unit. The exterior light transmits through the transparent solar cell panel and received by the transparent multimedia panel. The transparent solar cell panel is capable of generating power to smart grid and smart window unit. The smart window unit includes the control circuitry, the rechargeable power supply, the wireless charging power supply circuit and the transparent multimedia panel. The transparent multimedia panel is capable of displaying video being positioned on the interior glass panel in the isolated glass unit. The smart multimedia panel further comprises a transparent touch screen displaying and detecting touch inputs. The backlight provides light for the transparent multimedia panel during night. The transparent solar panel supplies power to the smart grid through the inverter. The wireless internet remote access and control circuit enable the transparent multimedia panel working as master device. The mobile device charging unit comprises a wireless power pad charger inductively coupled to the wireless charging power supply circuit. The power supply controller is capable of controlling rechargeable power supply to selectively discharge current to an external electrical smart grid coupled to the smart window unit.

As shown in FIG. 1A4, the ES type green energy smart window unit for smart home and smart grid comprises the electronic components comprising control circuitry, power supply and internet devices. The control circuitry comprises a processor, an electrochromic window controller, a solar cell panel controller, and a power supply controller. The power supply comprises a rechargeable power supply: a wireless charging power supply circuit; an inverter circuit and a backlight circuit. The internet devices comprising a wireless internet remote access and control circuit. The green energy smart window has an electrochromic panel and a transparent solar panel enclosed in an isolated glass unit. The electrochromic panel and transparent solar panel have a whole panel size been the same as said smart window. The smart window has three operation modes. (1) normal open mode, (2) shut mode and (3) smart phone mode. The turbine fan and all the electronic components being embedded in the frame of the green energy smart window unit. In the normal open mode, the whole panel of the smart window view is clean and clear looking as the conventional dual panel does The window view is transparent without any blockage in the open mode. In the shut mode, the whole smart window panel light is blocked by the smart window. In the shut mode, the whole smart window panel light is blocked by the coloring of the electrochromic panel.

In the smart phone mode, the smart window is controlled as slave device. The green energy smart window serves as slave device of the smart home. All interactive and remote control for the smart home is through the interface of said internet device in the smart phone mode. The transparent solar panel is transparent and facing outside. The smart window is controlled by host serving as a slave device in the smart phone mode. In the normal open mode, said electrochromic panel is transparent and has no blockage of the window view.

The isolated glass unit comprises an exterior glass panel located at a first side facing an external light source. An interior glass panel located at a second side, opposite the first side. The transparent solar cell panel is positioned on the exterior glass panel in the isolated glass unit. The exterior light transmits through the transparent solar cell panel and received by the electrochromic panel and the transparent multimedia panel. The transparent solar cell panel is capable of generating power to smart grid and smart window unit including the control circuitry, the rechargeable power supply, the wireless charging power supply circuit and the electrochromic panel. The electrochromic panel is positioned in the isolated glass unit and is capable of blocking received light. The transparent solar panel supplies the power to the smart grid through the inverter. The wireless internet remote access and control circuit control the smart window as a slave device. A mobile device charging unit comprises a wireless power pad charger inductively coupled to the wireless charging power supply circuit. The power supply controller is capable of controlling the rechargeable power supply to selectively discharge current to an external electrical smart grid coupled to the smart window unit.

The Transparent Solar Cell is transparent that exterior light passes through the Transparent Solar Cell and shines on the Electrochromic Panel and the transparent Multimedia Panel. The transparent multimedia widow is the video display such as LCD/LED/TV/Flat Panel to provide interactive entertainment, local/remote access and control to be the master device. The transparent Solar Cell Panel harvests the solar energy to be electric energy to provide power to the transparent Multimedia Panel and Electrochromic Panel. The electrical energy further provides to smart grid and mobile devices. Furthermore, the electrical energy can provide to mobile devices with wireless power.

The Smart Window of Smart Home is based on the 23Less Green Technology. The 23Less Green Technology for the Noiseless Field Programmable Integrated Circuit FPSOC are Curtainless Window, Bladeless Turbo Fan, Brakeless Vehicle, Sawless LNA, Resistorless SMPS and Transceiver, Capless LDVR, Inductorless SMPS, Diodeless Random Number Generator, Xtaless Clock Generator, Clockless Switch Mode Power Supply, etc.

Figure 1C:
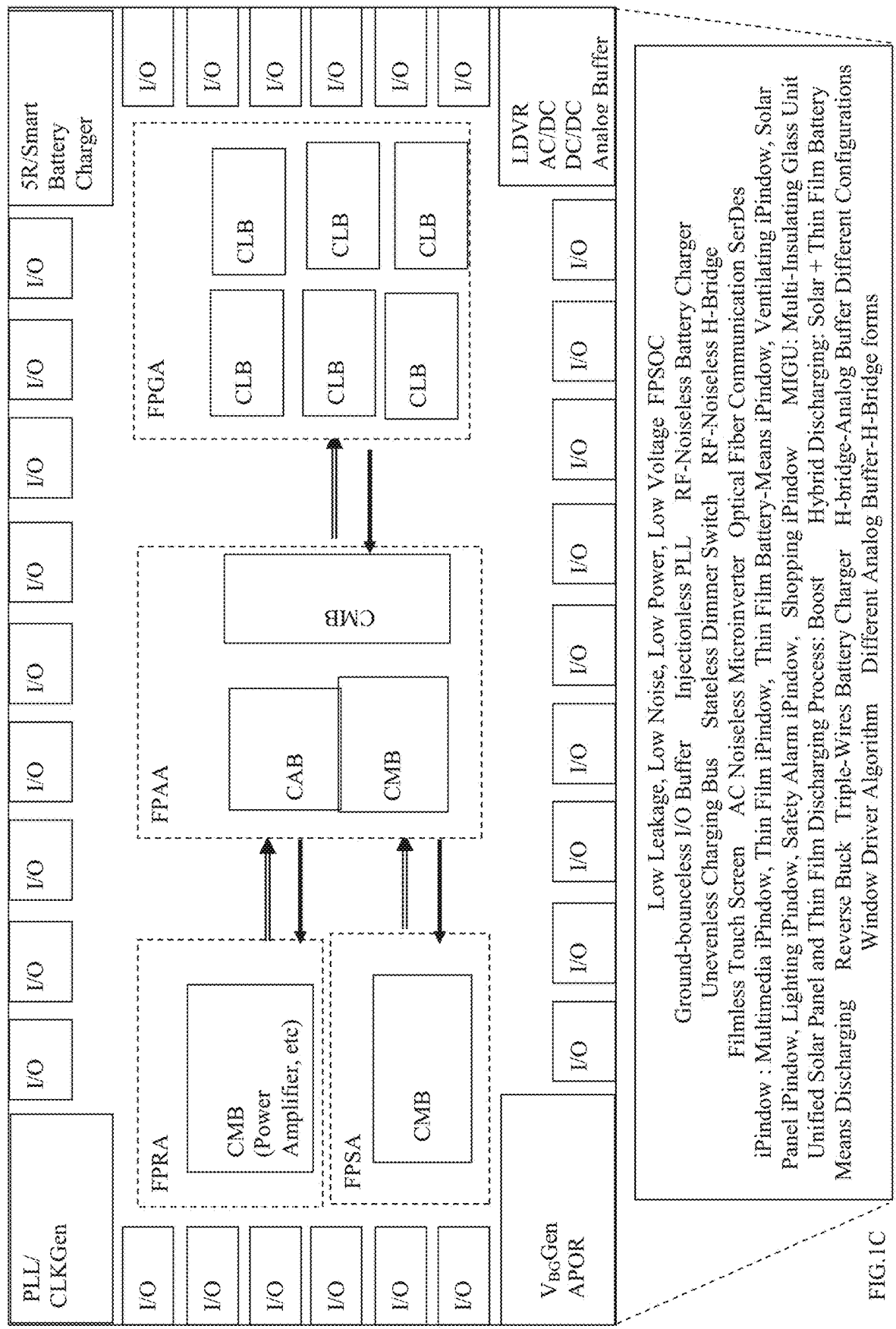
FIG. 1C is the Field System On Chip FPSOC for the Smart Window of Smart Home; the FPSOC includes sub-modules listed at the bottom.
Figure 48A:
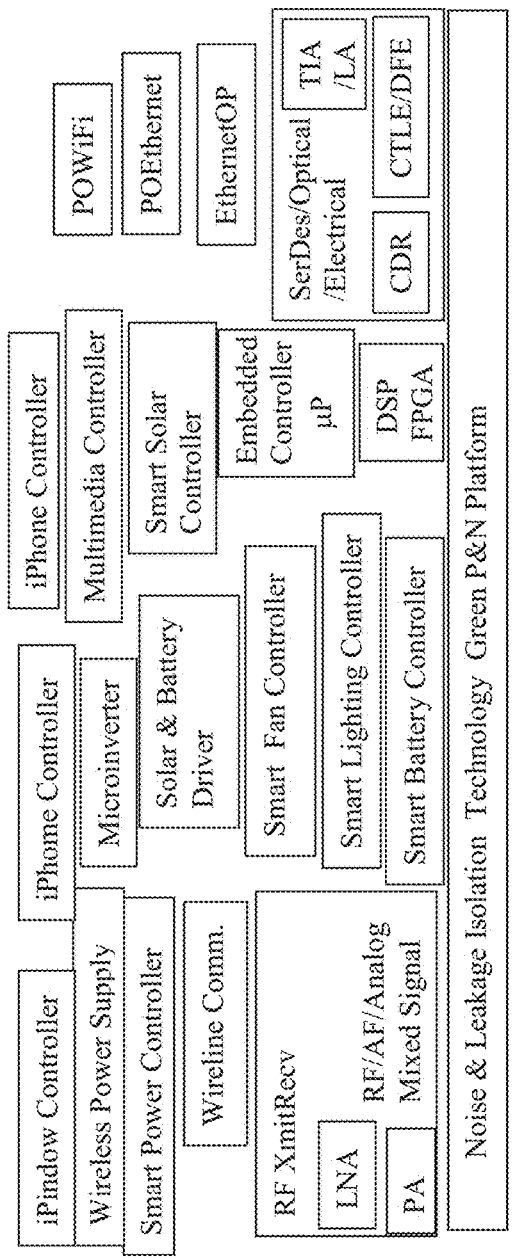
FIG. 48A is the platform of the Anlinx & Milinx & Zilinx FPSOC having the 23Less Green Technology for Smart Window.
Figure 48B:
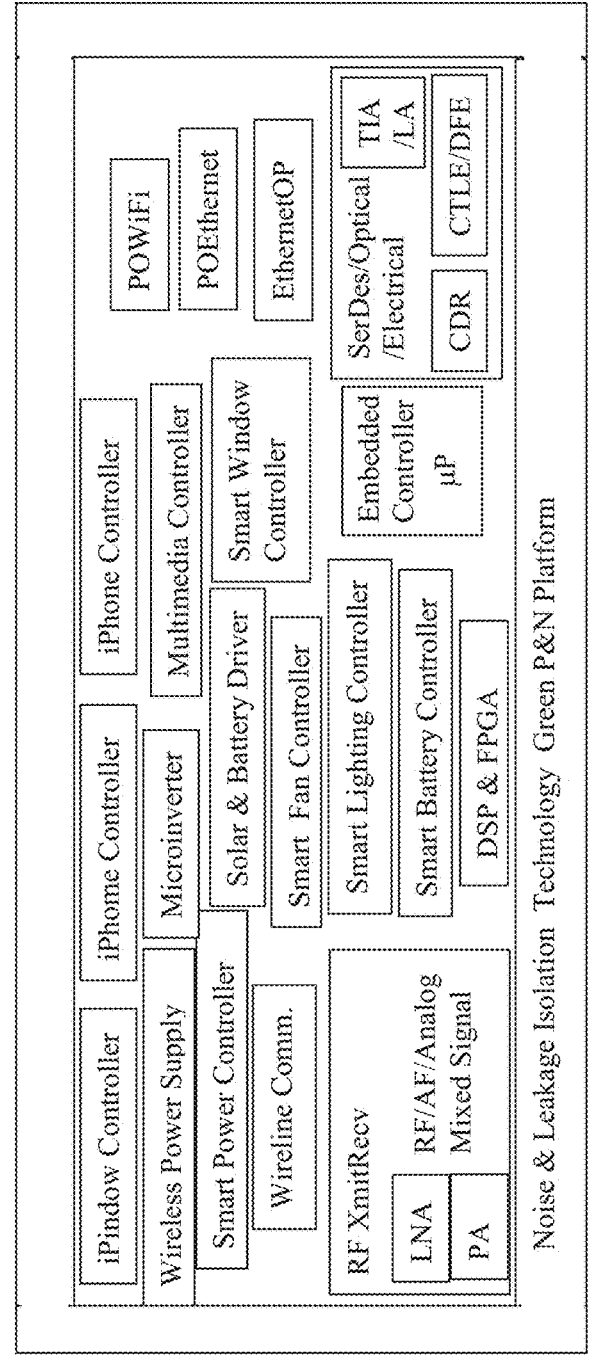
FIG. 48B is the Anlinx & Milinx & Zilinx FPSOC having the IP wrapper of Noise Isolation Technology for 23Less Green Technology for Smart Window. It is the Anlinx & Milinx & Zilinx Field Programmable System On Chip FPSOC with the 23Less Green Technology for Smart Window.

As shown in FIG. 1A and FIG. 1B, the green energy smart window 123 has the window 123g comprising transparent multimedia LCD panel, transparent solar panel 10 and EC panel 20, etc. On the right side of FIG. 1A, it is the sectional view of the green energy smart window. On the left side of the FIG. 1A, there are the functional blocks which are implemented as the electronic system embedded in the IGU frame of the green energy smart window. The Intelligent Graphical Unit IGU 123g has the multimedia LCD panel, transparent solar panel 10 and/or EC panel 20, etc. integrated to be one unit. The transparent solar panel 10 and the Switch Mode Power Supply SMPS 11 provide the solar power energy to the green energy smart window 123 and the smart fan. In the smart window, there are many smart controllers such as Smart Home controller, smart lighting controller, smart solar controller, smart battery controller, smart power controller and smart fan controller, etc. As shown in FIG. 1C, FIG. 48A and FIG. 48B, Anlinx & Zilinx & Zilinx' Field-System-On-Chip FPSOC will integrate all the smart controllers on the same platform to be FPSOC Field Programmable System On Chip.

The transparent Solar panel provides the electricity to the transparent Multimedia panel and Electrochromic panel, etc. to be "self-contained Intelligent Graphical Unit IGU". All the smart controllers will be embedded in the frame of the Intelligent Graphical Unit IGU. As shown in FIG. 1F1, the Intelligent Graphical Unit IGU further comprises the smart fan and the smart fan controller. In the smart fan, there are the multiple functional modules of the bladeless turbofan, air conditioner, the humidity/de-humidity and air-filter, etc. The bladeless turbine circulates the air for air conditioning and ventilation. In the winter, as shown in FIG. 1N1, the ceiling warm air will be sucked in to the channel inside the frame of the Intelligent Graphical Unit IGU then be blown out at the floor by the bladeless turbofan.

The green energy Wireless Window 5R System W5RS is constituted of Transparent Multimedia Panel, Electrochromic Panel and Transparent Solar Cell Panel. The Multimedia Panel. Electrochromic Panel and Transparent Solar Cell Panel are enclosed in the isolated glass unit IGU. The isolated glass unit IGU further comprises exterior glass and interior glass. The exterior glass faces the outside of building. The interior glass faces the inside of room. The Transparent Solar Cell Panel is attached on the exterior glass in the isolated glass unit IGU. The transparent Multimedia Window is attached on the interior glass in the isolated glass unit IGU. As shown in FIG. 1M1, the transparent solar panel is attached to the exterior transparent support such as glass or flexible plastics. As shown in FIG. 1M2, the transparent LCD/LED/OLED Flat Panel/etc and Electrochromic are attached to the exterior transparent support such as glass or flexible plastics. As shown in FIG. 1N1, the air 402, 403 doesn't flow through the channel between two glasses. The bladeless turbofan 40 is located at the corner of IGU. The IGU is completely isolated and filled with the clean inert gas. The IGU is to use the isolation of double window to keep the room temperature to save the energy. It is impossible to clean up the dust inside the IGU. Therefore, the IGU is completely isolated and filled with the inert gas. The air will flow through the tube inside the frame and will not flow through the channel between the two glasses of the window. As shown in FIG. 1N2, for the low frequency wireless charging system, the wireless charge uses the current loop 412, 413 embedded in the Frame of IGU. The magnetic field 422 and 423 oscillates to charge the wireless charger. As shown in FIG. 1N3, for the high frequency charging system, the wireless charge uses the Antenna embedded in the Frame of IGU. The chip 432 drives the antenna 433 to emit the EM wave to charge the wireless charger.

FIG. 1B is the architecture of Smart Window for the Smart Home. The Smart Window of Smart Home includes the multimedia iPindow and Telephone iPindow to be the core. The self-sustained iPindow is constituted of the core of iPindow, Solar Panel iPindow, Battery-type iPindow and Lighting iPindow, etc. The Smart Window of Smart Home further comprises the options of Ventilating iPindow, Turbofan iPindow, Humidity iPindow, Thin-Film Battery iPindow and other functions iPindow, etc. During night, the backlight 105 serves as the backlight for the LCD/LED/OLED/TV/FlatPanel Multimedia Panel 103. The antenna 30 and power amplifier 31 etc. of the RF/wireless circuits provide the wireless, internet, remote access and control for the smart windows with the multimedia panel 103.

The solar panel 10 is transparent and facing outside. The transparent multimedia panel 103 is facing inside room and controlled by host. In the open mode, the multimedia panel 103 is transparent having no blockage of the window view. In the shut mode, the window is blackout. In the open mode, the electrochromic panel has no voltage and the LCD multimedia panel is applied with full voltage. In the shut mode, the electrochromic panel is applied with voltage and the LCD multimedia panel has no voltage.

As shown in FIG. 1A3, to have the maximum energy harvest to supply electricity to the smart grid, the solar panel 10 has the full panel size of the Smart Window. Furthermore, the solar panel 10 is at the outmost layer closing to the external world and the solar panel has to be transparent not blocking the light of sunshine. This light of sunshine serves as the backlight of the multimedia panel 103 in the daytime. The smart window uses the IGU insulated Glass Unit that no dust will go into the smart window. The air circulation doesn't go through the space between the panels. The air circulation 40 goes through the pipe embedded inside the frame of smart window. As shown in FIG. 1A4, the Smart Window has the solar panel 10 is at the outmost layer closing to the external world and the solar panel has to be transparent not blocking the light of sunshine. The electrochromic panel 102 switches to reduce the light and heat injecting into the room. The panel relation is the innovative system design. As shown in FIG. 1A5, the smart window has the transparent solar panel 10 locating at outside room of the smart window and the transparent multimedia panel 103 locating inside room the smart window. The electrochromic panel 102 locates between the solar panel 10 and multimedia panel 103. The panel relation cannot arbitrarily change. FIG. 1A6 is the illustrated the example of smart home implemented with the smart windows. The MS and MES smart windows serve as the masters and the other ES smart windows serve as the slaves. For the different complex alignments of the smart home, the field programmable system on chips FPSOC of Anlinx, Milinx and Zilinx are needed to have the field programmable capabilities.

There are three different operation modes for the smart window: (1) Open/Normal Mode; (2) Shut/Tint Mode; (3) Smart Phone Mode. For the Open/Normal Mode, all the panels of the smart window are clean and clear having no blockage. The multimedia panel 103 is transparent in the Open/Normal Mode. The smart window looks like the conventional dual panel window. For the Shut/Tint Mode, the smart window looks dark and cannot see through. The Shut/Tint Mode can be implemented with either the electrochromic panel 102 or multimedia panel 103. For the Smart Phone Mode, the smart window becomes the huge smart phone having the whole multimedia panel 103 of smart window to be the touch screen. The multimedia panel 103 works as the huge smart phone. In the Smart Phone Mode, the multimedia panel 103 can perform the remote access and control of the master mode, the phone call, interactive TV and the internet/wireless access, etc. Using the wireless internet and remote access, etc., the smart window working as master to control the smart window working as slave.

As shown in FIG. 48B, the noise isolation is a platform serving as wrapper to integrate versatile combinations of ASIC, FPGA. ADC, DSP, microprocessor. RF/AF/Analog circuit and digital circuit to be FPSOC. FIG. 1C is the Field-System-On-Chip FPSOC for the Smart Window of Smart Home. Furthermore, the FPSOC has the versatile circuits of Ground-bounce-less I/O Buffer, Injectionless PLL, RF-Noiseless Battery Charger, Uneven-less Charging Bus, Stateless Dimmer Switch. RF Noiseless H-Bridge. Filmless Touch Screen, AC Noiseless Micro-inverter, iPindow, Multimedia iPindow, Thin-Film iPindow, Thin-Film Battery-Means iPindow, Ventilating iPindow, Solar Panel iPindow, Lighting iPindow, Safety Alarm iPindow, Shopping iPindow, MIGU: Multi-Insulating Glass Unit, Unified Solar Panel, Thin Film, Discharging Process with Boost, Hybrid Discharging for Solar and Thin Film Battery, Discharging with Reverse Buck, Triple-Wires Battery Charger, H-bridge-Analog Buffer Different Configurations. Low Leakage, Low Noise. Low Power. Low Voltage Window Driver Algorithm and Different Analog Buffer-H-Bridge forms, etc. These versatile circuits will be disclosed in the following description in details.

Figure 1D:
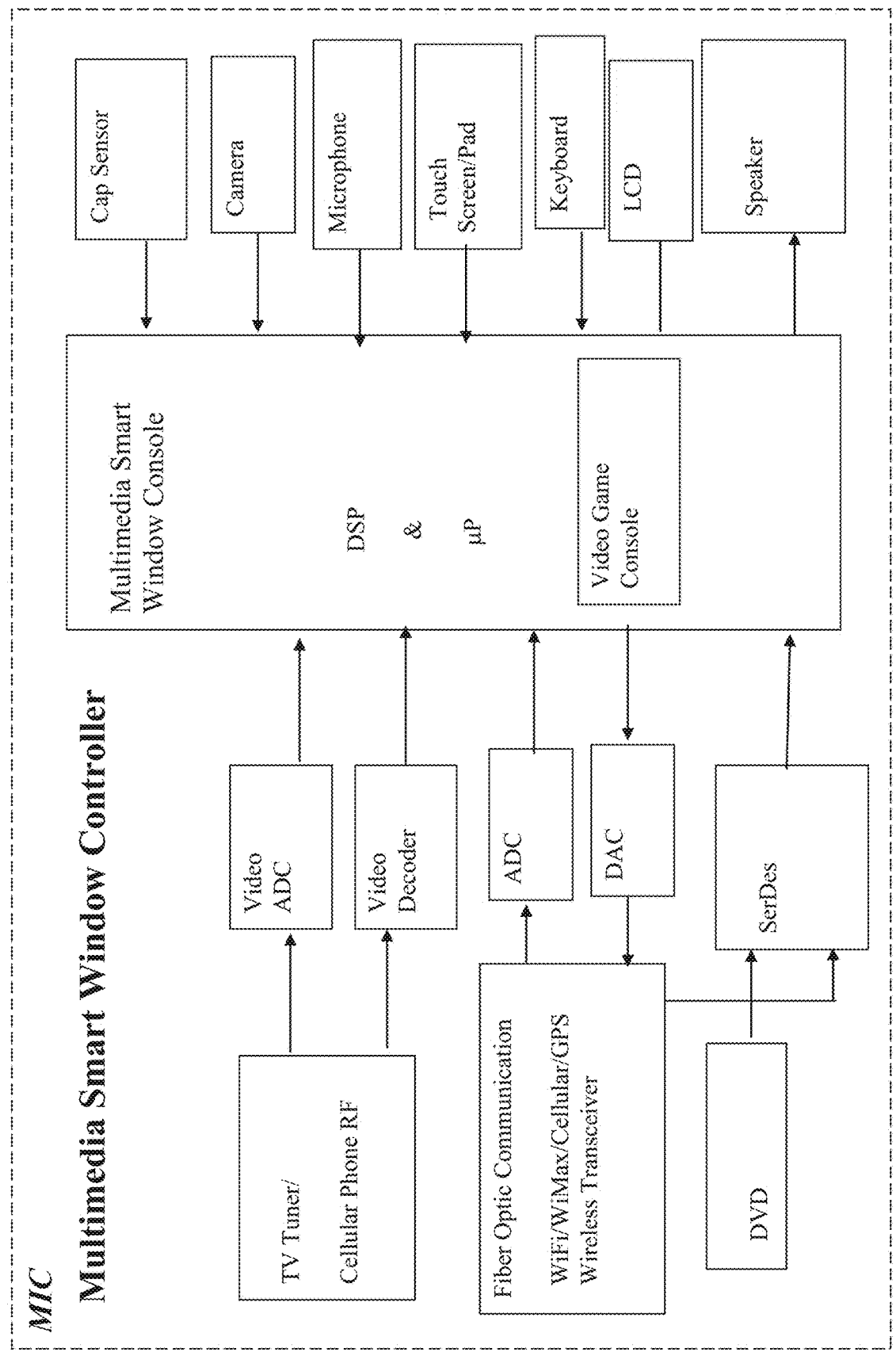
FIG. 1D is the system and architecture of the multimedia Smart Window Controller of Smart Home.

A green energy Wireless Window 5R System W5RS further comprises microcomputers to control Smart Multimedia Window/Panel. The microcomputer further comprising transparent touching sensor, video camera, etc to have both touch and touchless user interactive with the transparent Multimedia Window. FIG. 1D is the multimedia Window controller having the computer/communication/command function for the transparent multimedia Window. As shown in FIG. 32C, the multimedia Smart Window controller integrated system comprises the pipeline buffer ADC. The pipeline buffer ADC comprises high gain operational amplifier stage and dynamic switching output stage.

There is Cap Sensor for the transparent touch screen of LCD flat panel. The camera is for the touchless LCD panel application and Video phone, etc. The Touch screen pad is for the transparent touch screen of the transparent multimedia LCD panel of multimedia Smart Window. FIG. 1E1 is the cross-section of the transparent filmless LCD panel. The transparent conducting layer 103 is embedded in the glass type media. FIG. 1E2 is the orthogonal two layers transparent touch screen. FIG. 1E3 is the single layer transparent touch screen. FIG. 1E4 shows the finger touching on the screen having a single transparent conducting layer. FIG. 1E5 shows the circuit of transparent touch screen. FIG. 1E6 shows the signal waveform propagating on the transparent conducting layer.

A green technology IGU integrated system comprises smart fans. The smart fan comprises bladeless turbofan. The bladeless turbofan circulates the humidity-controlled and temperature-controlled air for air conditioning and ventilation. As shown in FIG. 1F1, it is the bladeless turbofan. The blade of the turbofan is hidden inside the ring frame and cannot be reached from outside that it is named as the bladeless. FIG. 1F2 shows the cross-section of the bladeless turbofan. As shown in FIG. 1F3, the gear 44 of the motor drives the blade 41 of the turbofan. The air is sucked to flow through the humidify/de-humidify/air-filter 41 and flows out of the slot 42. As shown in FIG. 1F1 and FIG. 1F2, the expanded cone 43 makes the air pressure to drop to suck more air to flow through the center of the cone. The air-multiplying factor is about 16, i.e., one volume of air flows through the blade, there are sixteen times air volume flows out the cone. As shown in FIG. 1A, the warm air at the ceiling is sucked into the side channels embedded in the frame of the IGU and is blown out at the floor. It keeps the fresh air circulating in the room that a lot of energy is saved.

Figure 4C:
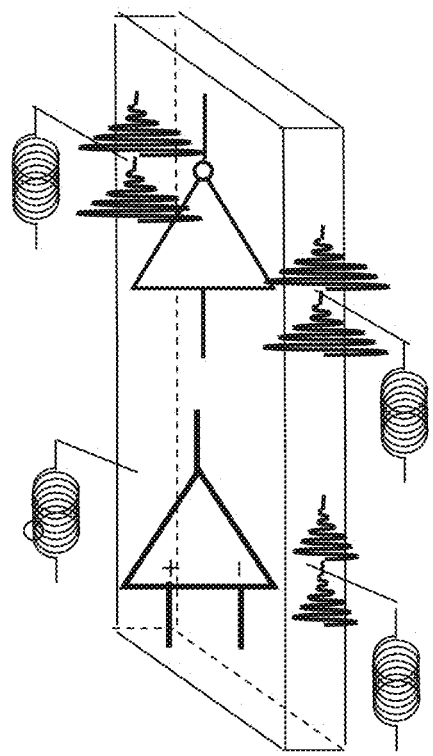
FIG. 4C is the substrate noise coupling in the integration of the analog chip and the digital chip.
Figure 4D:
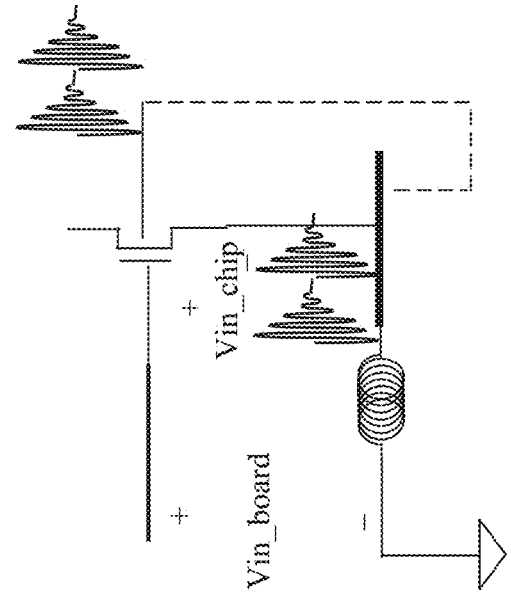
FIG. 4D is the noise coupling mechanism of the substrate noise. It is the impact of the substrate noise coupling.
Figure 4A:
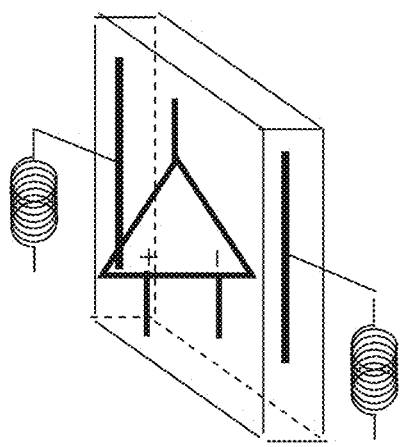
Figure 4B:
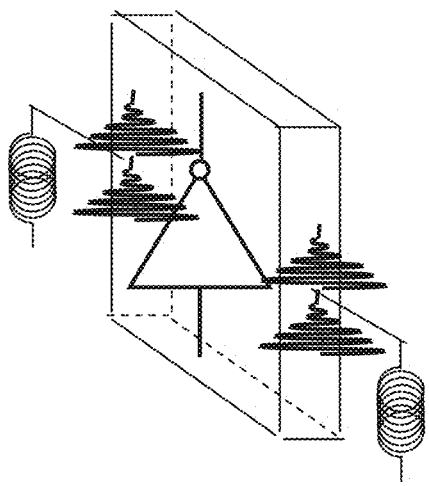

The Green Energy Smart Window 5R System W5RS comprises smart fans. The smart fan further comprises the bladeless turbofan. The bladeless turbofan circulates air for air conditioning. The turbofan needs the temperature sensor to detect the air temperature and the overheat of the motor, etc. As shown in FIG. 1F4A, the diode characteristic curve varies over temperature that we can use this diode characteristic curve to detect the temperature. As shown in FIG. 1F4B, the temperature sensor circuit can get the temperature as follows.

$I_{ref} = I_o e^{(Vdiode/VT)}$ where $V_T = kT/q$ $\ln(I_{ref}/I_o) = V_{diode}/(kT/q) => T = V_{diode}/[(k/q)\ln(I_{ref}/I_o)]$ As shown in FIG. 1G1, it is the Home Plug for Plug & Play Smart Battery Charger and/or Window Controller. There are AC port input, the DC port and the multimedia port. As shown in FIG. 1G2, the power plug is similar to the phone plug having the high frequency and low frequency port. As shown in FIG. 1G3, the Home Plug for Plug & Play Smart Battery Charger and/or Window Controller is constituted of the Ethernet. AC/DC converter, DC/DC converter and embedded controller, etc.

The Field-Programmable-System-On-Chip FPSOC needs to unify the different circuits to have the platform for the versatile different applications. For H-Bridge, the operation of Diode-Bridge is continuous and analog. However, the operation of MOS-Bridge is Impulse/digital. To unify the circuit, as shown in FIG. 1H1, the H-Bridge makes the conversion between the AC and DC. The rectifier, inverter and micro-inverter use the AC/DC conversion. As shown in FIG. 1H2, the H-Bridge makes the conversion between the Unipolar-DC/Bipolar-DC. The Battery Charger and EC-Window Driver use the Unipolar-DC/Bipolar-DC conversion. Therefore, the H-Bridge is unified to be the two-way "Bipolar-AC Unipolar-DC" for rectifier, inverter, micro-inverter, battery charger and EC-window driver, etc. As shown in FIG. 1H1, FIG. 45H1 and FIG. 45G1, for the H-Bridge, the AC/DC operation is "DIPFC: Digital/Impulse PFC Phase-Frequency Control". With the wave-shaper of the "DIPFC:Digital/Impulse PFC Phase-Frequency Control", the sinusoidal oscillation of LC resonator is converted to be the digital switch signal.

FIG. 1I shows the global map of the power conversions among different power supplies. The conventional way to convert the solar cell DC power to smart grid AC power conversion is to use micro-inverter. As shown in FIG. 1J2 and FIG. 42A, our innovation is to use the "H-Bridgeless In-Phase Synchronous Pulsing Boost Converter" to convert the solar cell DC power to smart grid AC power.

Figures 45M, 45N:
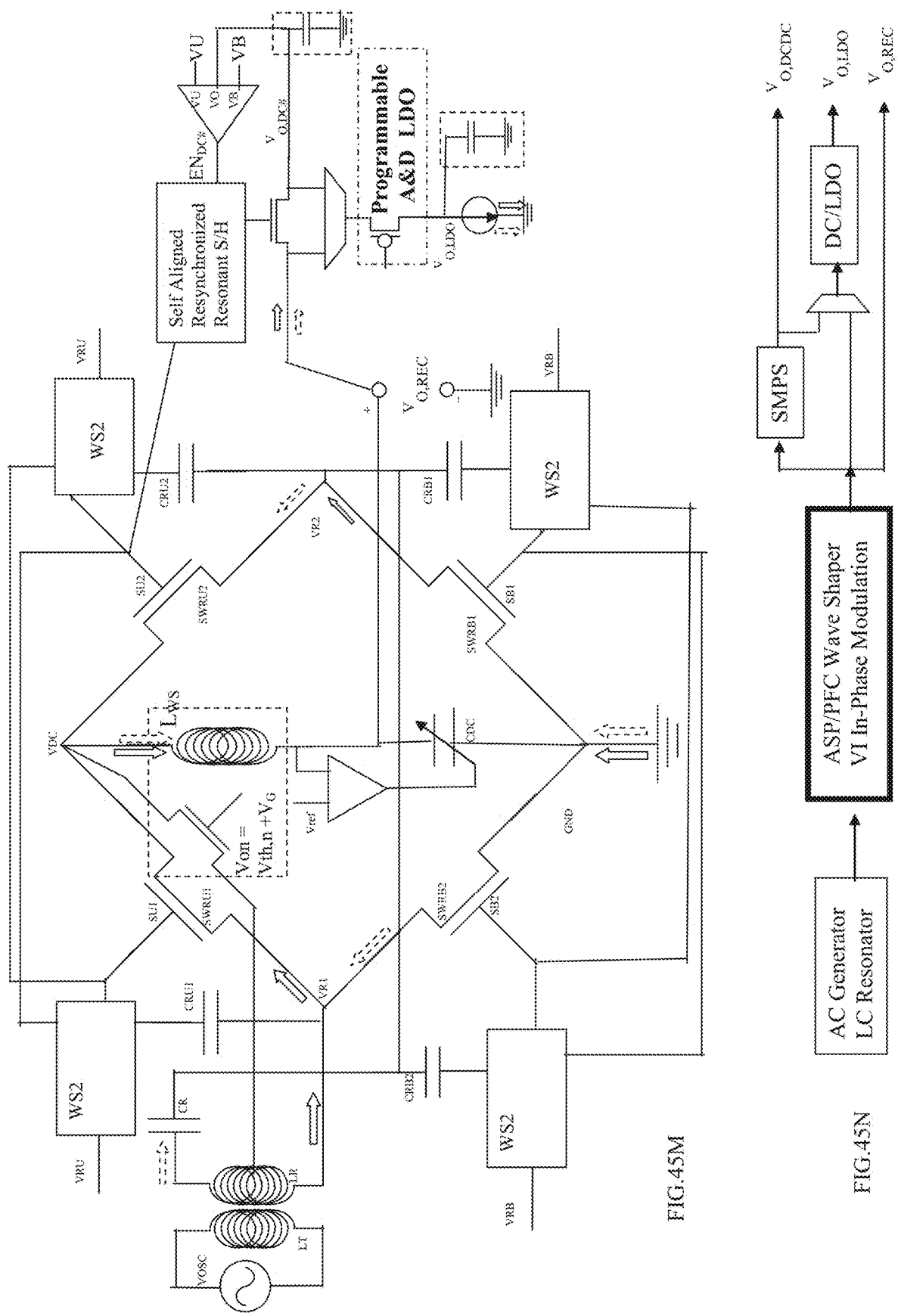
FIG. 45M is the complete schematics of the 5R having the ASP/PFC wave shaper. SMPS and A&D programmable LDO.
FIG. 45N is the functional block diagram of the 5R having ASP/PFC wave shaper, SMPS and A&D programmable LDO.

The conventional way for the AC power converting to DC power is going through "three stages" power conversion of "rectifier, buck converter and LDO". As shown in FIG. 1L1 and FIG. 45M, our innovation is "single stage" power conversion with "5R: Resonant Recycling Resynchronization Rectifier Register". With the wave-shaper, the "Current-Voltage out-of-phase" is converted to the "Current-Voltage in-phase" recycling operation to have switch-loss-less rectifier operation.

As shown in FIG. 1J1, it shows the block diagrams of the energy injected into another power supply and the energy extracted from another power supply. As shown in FIG. 1J2, the energy is injected into another power supply with triggering impulse action. As shown in FIG. 1J3, the energy is extracted from another power supply. As shown in FIG. 1J4, the impulse/triggering impulse action is constituted of the Pre-Building-Up energy-inductor and the triggering MOS. The Instant-Impulse is the instantaneously turn-off of the MOS switch to trigger the energy injection.

Figures 44A, 44D:
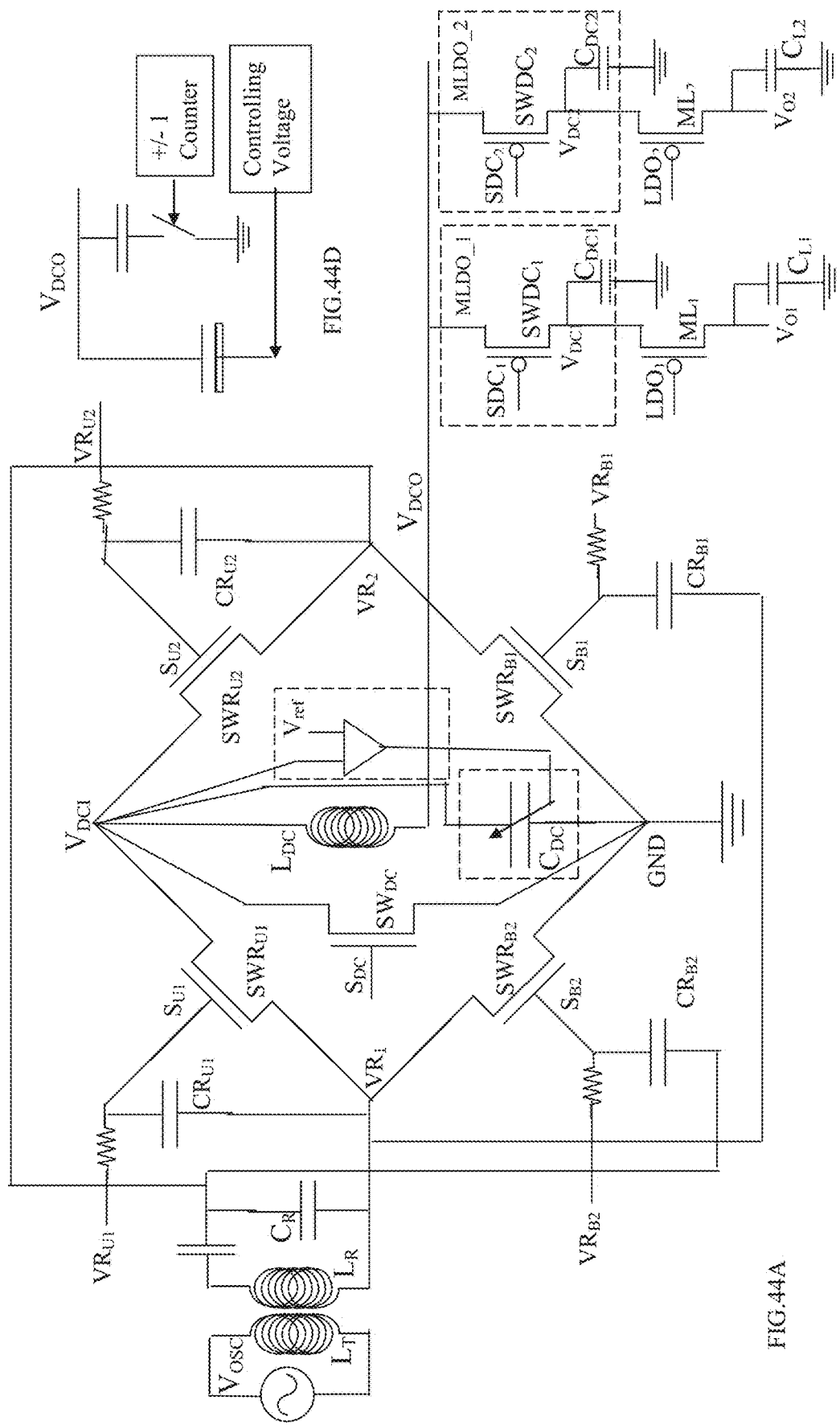
FIG. 44A is the Rectifier-DC/DC-Regulator.
FIG. 44D is the fine tune circuit for oscillation.
Figures 44B, 44C:
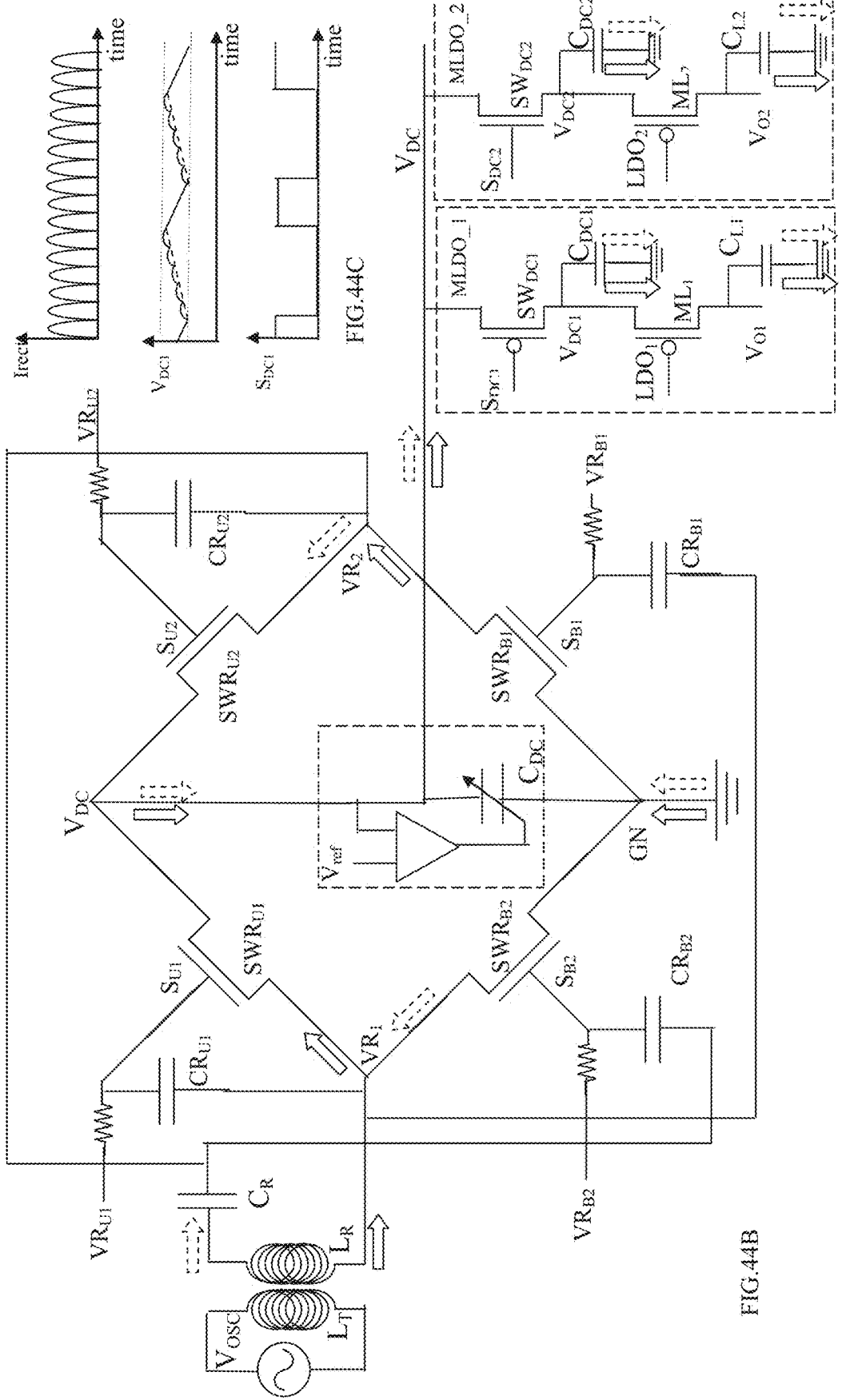
FIG. 44B is the 5R Recycling Resonant Re-synchronous Rectifier Regulator with the controlled capacitors for frequency tuning.
FIG. 44C is the timing diagram of the 5R.

FIG. 1K shows the fundamental principle of the recycling resonant oscillator to reduce the switch loss. To reduce the on-resistance of MOS switch, the switch gate voltage must be in the digital switch mode signal. The key issue is to convert the analog sinusoidal waveform to be the digital switch form with the wave-shaping techniques. As shown in FIG. 1L1, the A5RS is constituted of the wireless transmitter 5RT and Wireless Receiver 5R as shown in FIG. 44A and FIG. 44B. Referring to FIG. 1L1, FIG. 45G1, FIG. 45G2 and FIG. 45M, the wave-shaper in 5R converts the analog sinusoidal wave to be the digital switch.

Figure 26G:
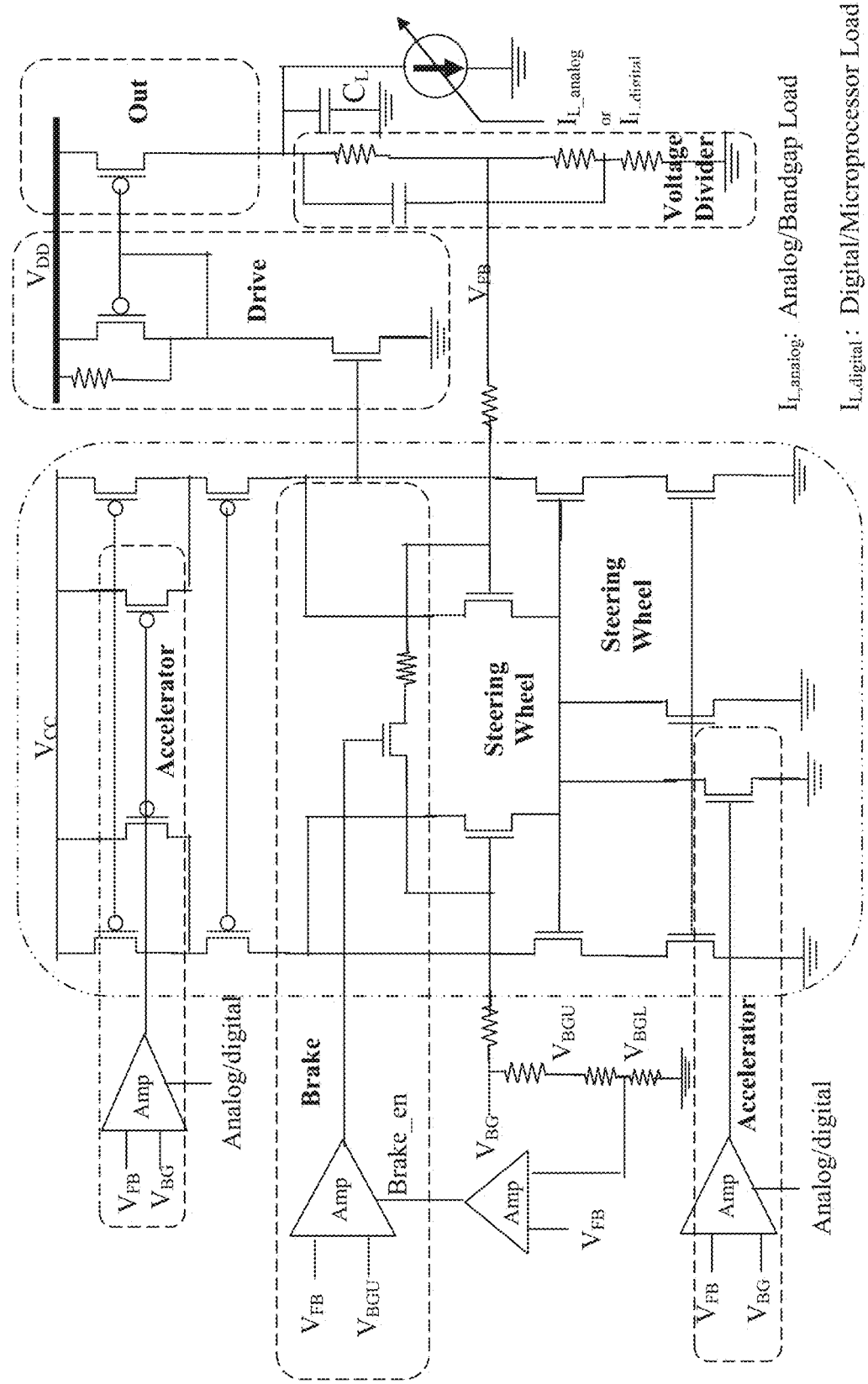
FIG. 26G is the analog/digital Programmable LDO having the Brake. Accelerating and steering wheel functions.

Referring to FIG. 1L1 and FIG. 26G, the Wireless Receiver 5R has the programmable Analog/Digital LDOs be able to be programmed to be Analog LDO and Digital LDO. For example, the Analog LDO supplies the 1.8V analog power of constant current to the Bandgap and analog circuits, etc.; the Digital LDO supplies the 1.2V digital power with pulsing current load to the microcomputer and digital circuit, etc. FIG. 1L4 shows the comparison between the analog LDO and digital LDO.

Figure 26H:
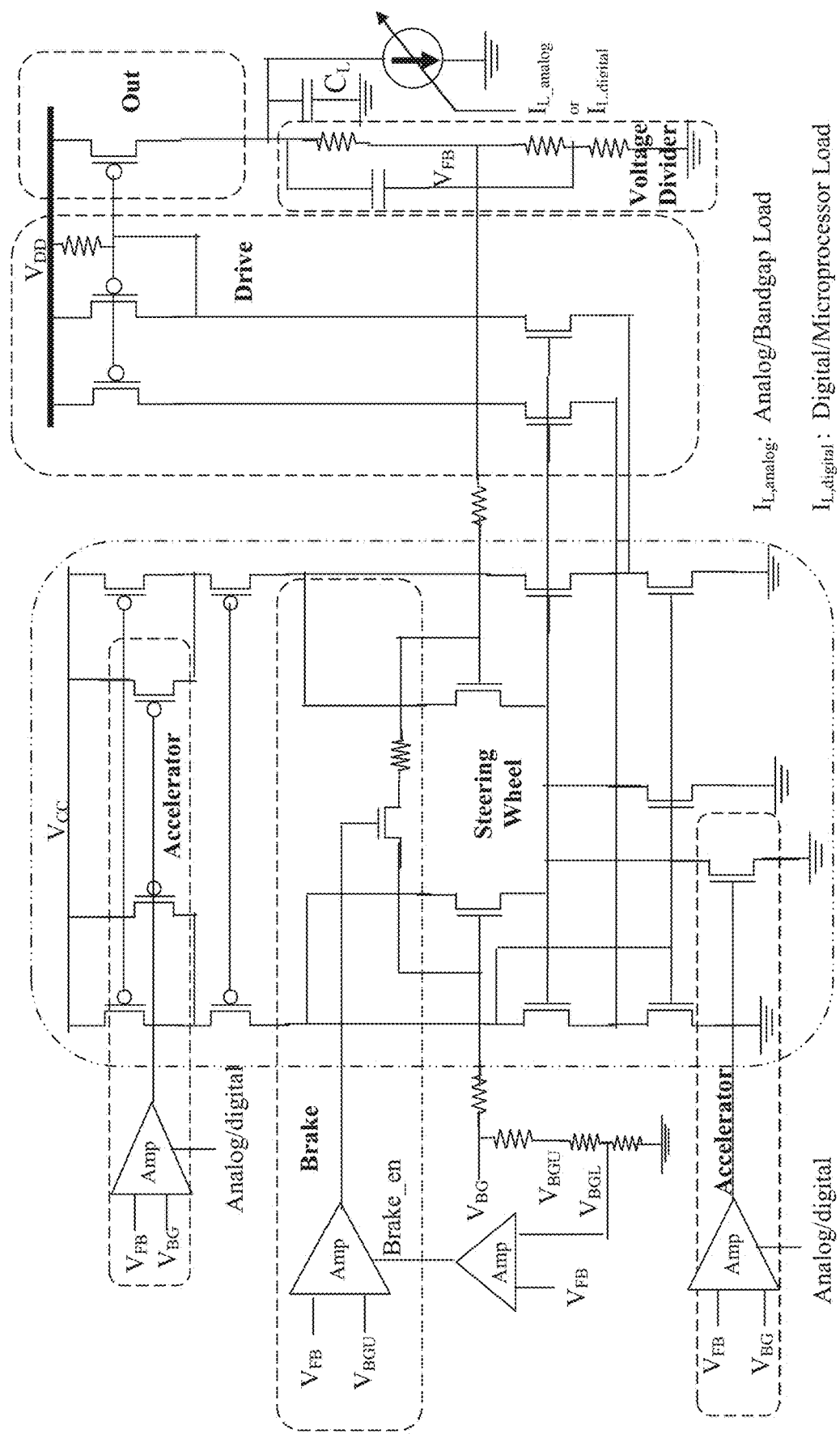
FIG. 26H is the alternative design of the analog/digital Programmable LDO with transimpedance cascade Amplifier. It is the cascade current regulator or the hierarchical current regulator shown in FIG. 24D.

Referring to FIG. 26G and FIG. 26H, a Wireless Window 5R System W5RS comprises a programmable LDO which further comprises programmable analog LDO/digital LDO mechanism, brake mechanism, accelerator mechanism and steering-wheel mechanism. Referring to FIG. 26G and FIG. 26H, the programmable analog LDO % digital LDO is programmed to be high-gain for analog LDO and high-bandwidth for digital LDO. The brake mechanism reduces the difference of the differential input voltages of said steering-wheel mechanism to eliminate the overshoot during the POS Power-On-Sequence. Due to the requirement of ripple reduction of the output voltage caused by digital loading of μP, as shown in FIG. 26G and FIG. 26H, the accelerator mechanism is orthogonal-conjugate with the steering-wheel mechanism of error amplifier to have the fast reaction to ripple.

There are the wire-line connection and/or the wireless connection for the dimmer/bi-state/multi-state smart window and light. They integrate the light, ventilation and smart window to be building management system. There are wireline and wireless connections and the switching powers for the battery charger and smart window. The wireless circuit is sensitive to noise. However, the switching power generates a lot of noise. To be the consumer product, the cost must be low. The switching power circuit, digital circuit, analog circuit and wireless circuit, etc. are integrated together to be a single Integrated Chip FPSOC. To enable the Green Energy Smart Window, we must have the Noise Isolation Technology NIT first.

Figure 2A:
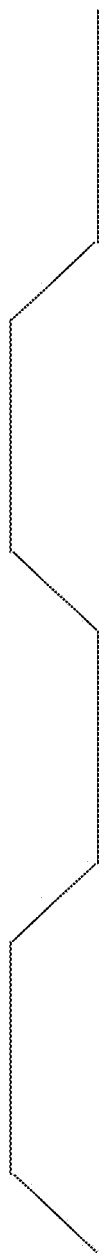
FIG. 2A is the low frequency clock/signal waveform.
Figure 2B:
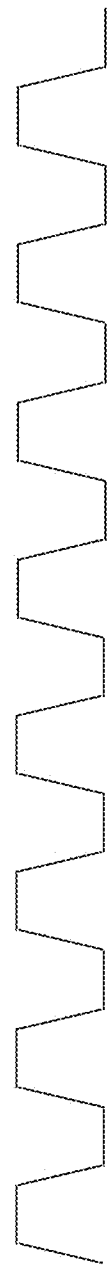
FIG. 2B is the high frequency clock/signal waveform.
Figure 2C:
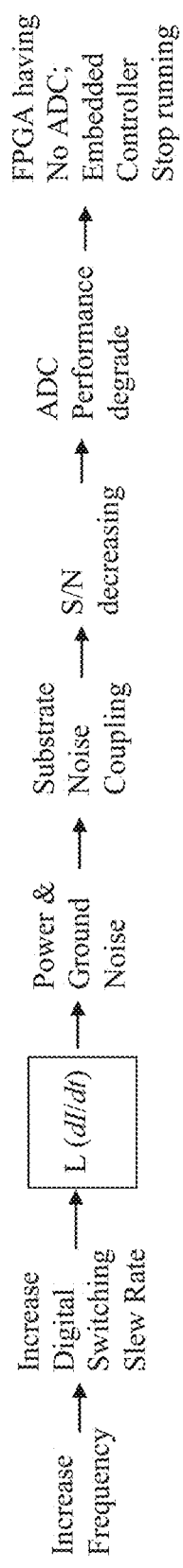
FIG. 2C is the chain reaction mechanism of frequency impacting on the system integration.

A Green Energy Smart Window integration system has noise isolation. The noise isolation has a plural of current regulators to regulate the current flowing through a plural of connections of pins and bonding wires, etc. The connections have parasitic inductors. The current regulator regulates the current flowing through the parasitic inductors to reduce noise generated by the parasitic inductor. As shown in FIG. 2A, FIG. 2B and FIG. 2C, the generated noise and system degraded as the frequency increases. As shown in FIG. 2A, the switching frequency is low that the slopes of the rising edges and falling edges can be slow. As shown in FIG. 2B, the switching frequency is high that the slopes of the rising edges and falling edges are fast. As shown in FIG. 2C, as the frequency increase, the slew rate of the digital switching increases. The switching noise of L (dI/dt) of the parasitic inductor increases. It induces the power and ground noises. The noise injected into the substrate becomes the coupling substrate noise.

The SINAD is the ratio of the signal (the fundamental) to the sum of all distortion and noise. As shown in FIG. 4D and FIG. 2C, the substrate coupling noise injected into the circuit and system causes the degradation of the circuit and system performance. The signal to noise ratio S/N and SINAD decrease. The Effective Number of Bits ENOB decreases where $$ENOB=(SINAD-1.76)/6.02$$

Figure 2D:
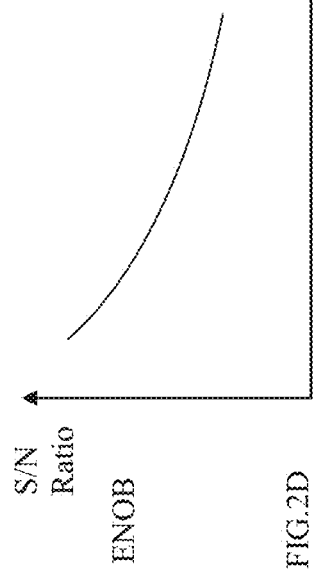
FIG. 2D is the performance degrade as the function of the frequency for the Analog/ADC or RF/LNA circuit. It is the frequency impact on the Green Technology.

As shown in FIG. 27B and FIG. 2D, the ENOB decrement of the ADC is unacceptable. Therefore, the ADC and DAC cannot be integrated on the FPGA.

Figure 3A:
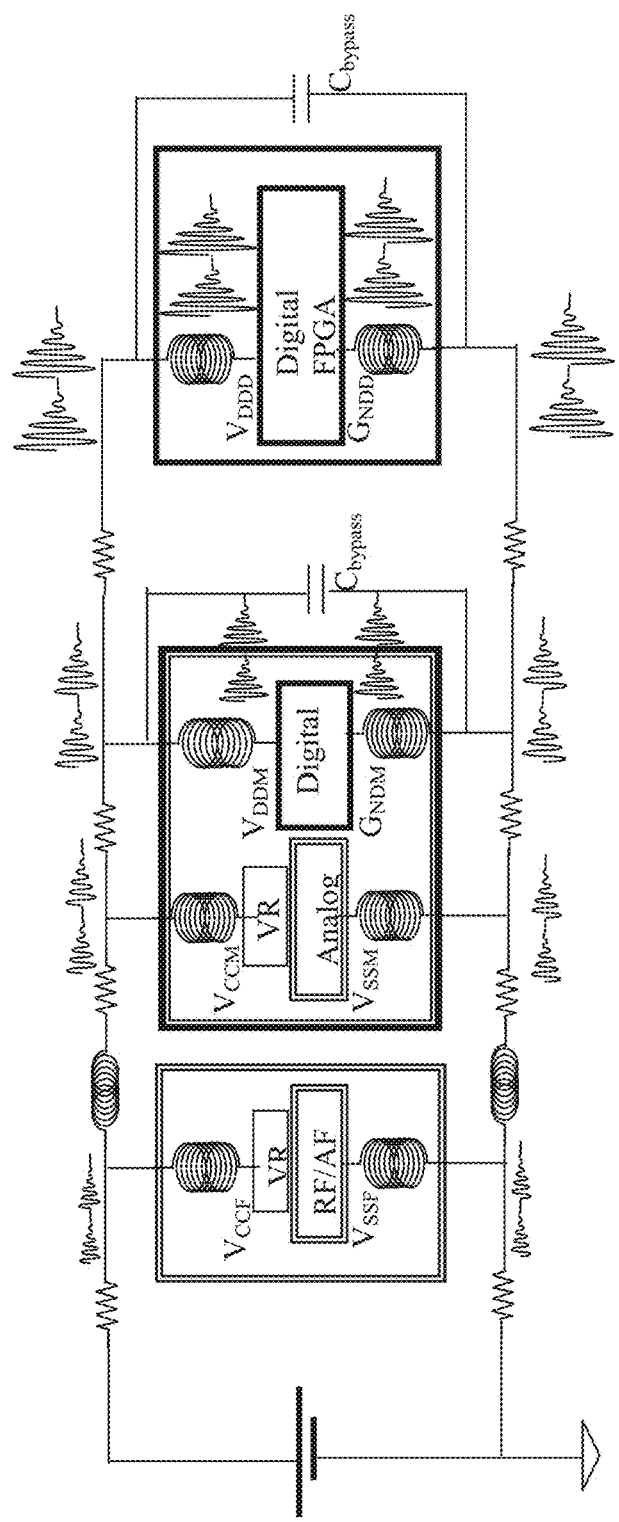
FIG. 3A is the partition of the system to be chips.
Figure 5B:
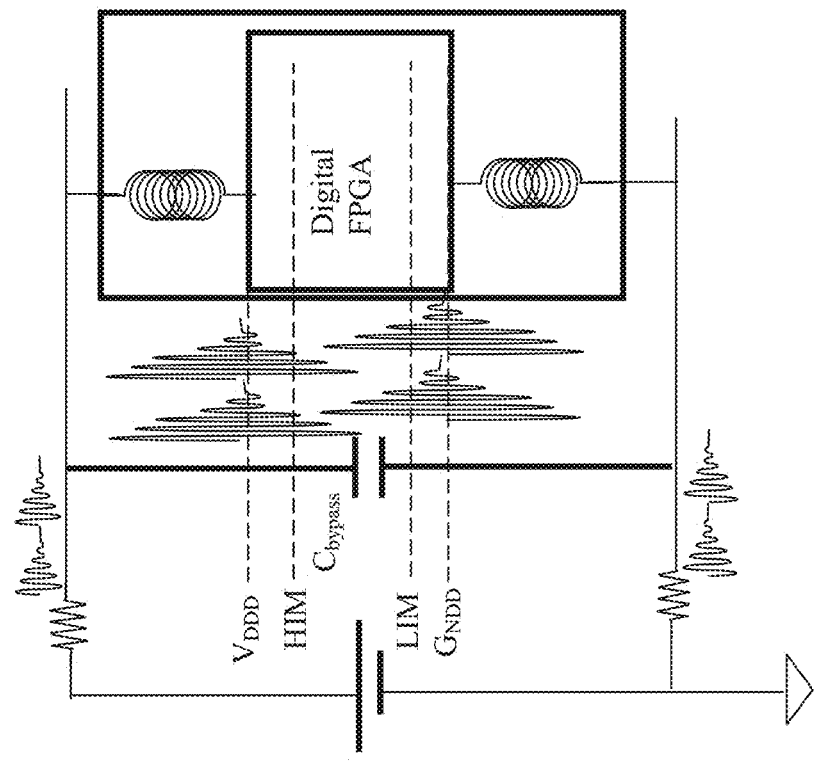
FIG. 5B is the switch noise augmented by the decoupling capacitor. It is the conventional digital and FPGA switching noise.
Figure 5A:
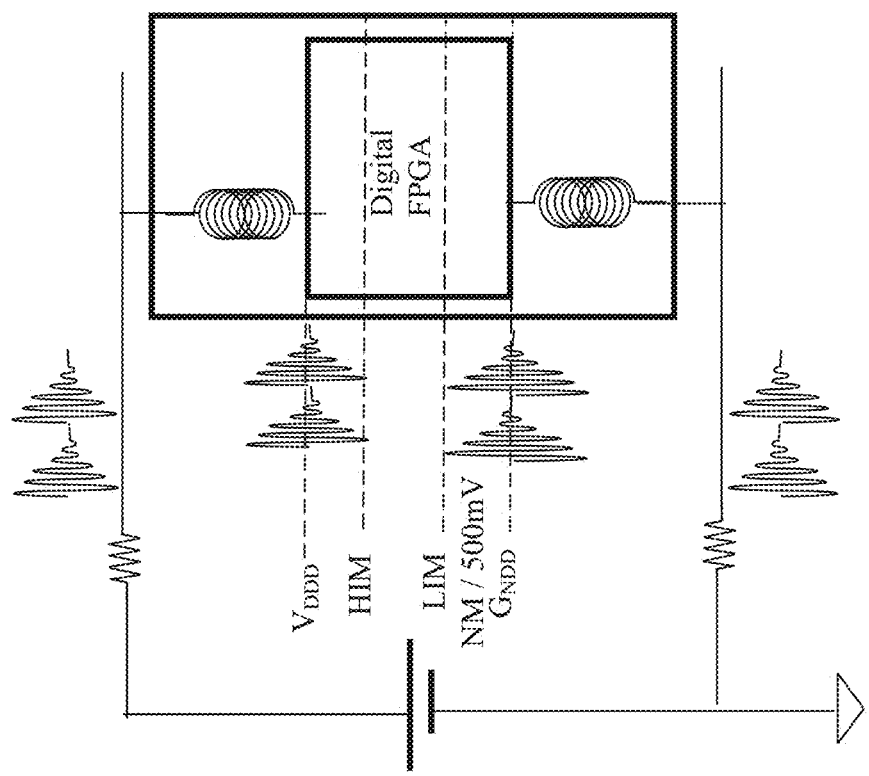
FIG. 5A is the switching noise generated by the digital and/or FPGA chips.

To solve the noise in system, the conventional system is partitioned as shown in FIG. 3A. The system is partitioned to be RF/AF chip, Mixed Signal Chip and Digital/FPGA chip. The parametric inductance of the package generates a lot oscillations in power and ground. To minimize the noise dumped on the board, there is the bypass capacitor $C_{bypass}$. However, as shown in FIG. 5A and FIG. 5B, this bypass capacitor $C_{bypass}$ makes the on-chip oscillatory noises even worse. All the switching noise is dumped on the board. For the analog chip and RF chip, there is the on-board inductor/choke to block the digital switching noise from the noise contamination.

Figure 3B:
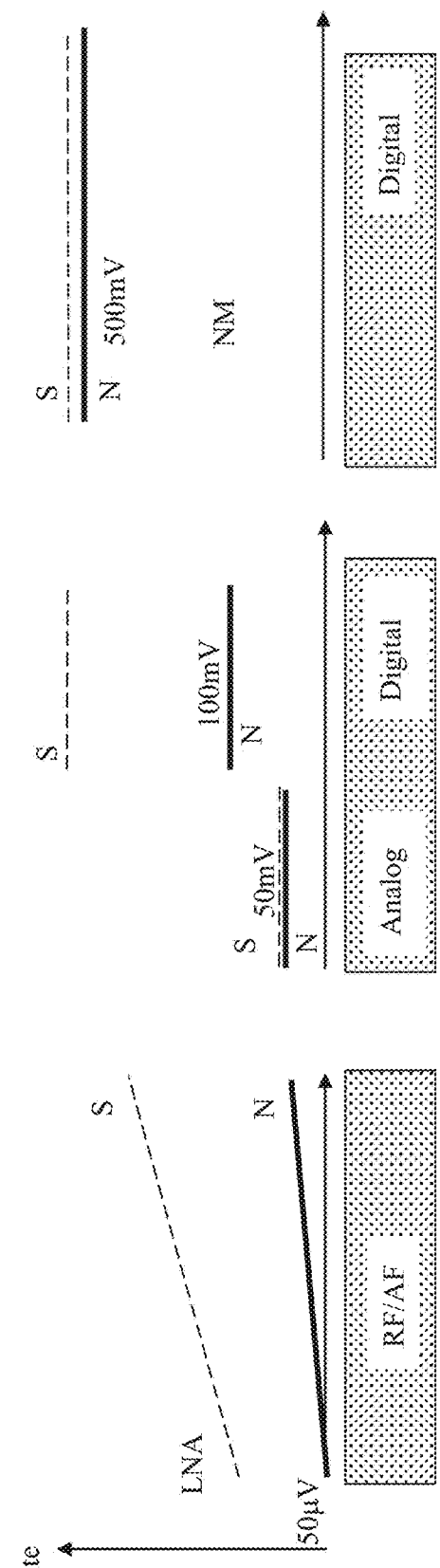
FIG. 3B is the signal level and the substrate noise level of the chips. It is the conventional system.

As shown in FIG. 3B, to keep the circuit performance requirement, the substrate noise for the RF/AF chip, Mixed Signal Chip and Digital/FPGA chip are bound at separate levels. The RF/AF signal and noise will be amplified along the chain. The noise level at the front end of LNA is very small. For the mixed signal, the substrate noise of the ADC signal has to be small. After the analog signal is converted to be the digital signal, the substrate noise can be raised to exceed the safety noise margin. The digital circuit has large substrate noise which exceeds the allowance of the substrate noise of the ADC. It makes the ADC not be integrated with the FPGA.

As shown in FIG. 4A, it is the analog circuit in the AF/RF chip. There is no switching noise in the power and ground. As shown in FIG. 4B, it is the digital circuit in the digital/FPGA chip. There is switching noise in the power and ground. As shown in FIG. 4C, it is the mixed signal chip switching noise injecting into the substrate to be the substrate noise.

FIG. 4D shows how the substrate noises coupling into the circuit destroying the circuit performance. First, the on-board signal Vin_board will be much different the on-chip Vin_chip.

$$Vin\_board=Vin\_chip+N\_substrate$$

$$Vin\_chip=Vin\_board-N\_substrate$$

It means the substrate noise N_substrate becomes the circuit input signal at the front gate. Second, the substrate noise N_substrate applies on the substrate of the input MOS. It is the back gate effect. Due to the dual substrate noise effect of the front gate and back gate, the RF circuit cannot have the digital switching circuit to be integrated into the RF/AF chip.

Regarding to the substrate noise, there are a lot of mistakes in the system design. As shown in FIG. 5A, the digital circuit or FPGA generates the switching current. As the switching current flows through the parametric inductor, the noise oscillations are generated. The switching noise is dumped on the board and it contaminates the board.

As the board shrinks, the assumption of the board having the infinite large capacitance is no more valid. The traditional way to dump the noise on the board is no more allowed. To reduce the noise dumped on the board, as shown in FIG. 5B, there is the bypass capacitor Ce, connecting between the power and ground. However, due to LC oscillation, this bypass capacitor $C_{bypass}$ makes the chip substrate noise even larger. Comparing FIG. 5B with FIG. 5A, it shows the substrate noise oscillation of chip having the bypass capacitor $C_{bypass}$ is much larger than the substrate noise of chip having no bypass capacitor $C_{bypass}$. To reduce the substrate noise, it had better not to add the bypass capacitor $C_{bypass}$. It completely reverses the conventional thinking in the design practice.

Due to the wrong concepts about the substrate noise, the substrate noise problem becomes the mysterious and nobody can solve it. Actually, the substrate noise is the essential problem of the planarization of the chip system integration. With the multi-disciplinary training, now the grand master Ming recognized the fundamental problem and solved this problem. The Noise Isolation Technology is introduced as follows.

Figures 18A, 18B, 18C:
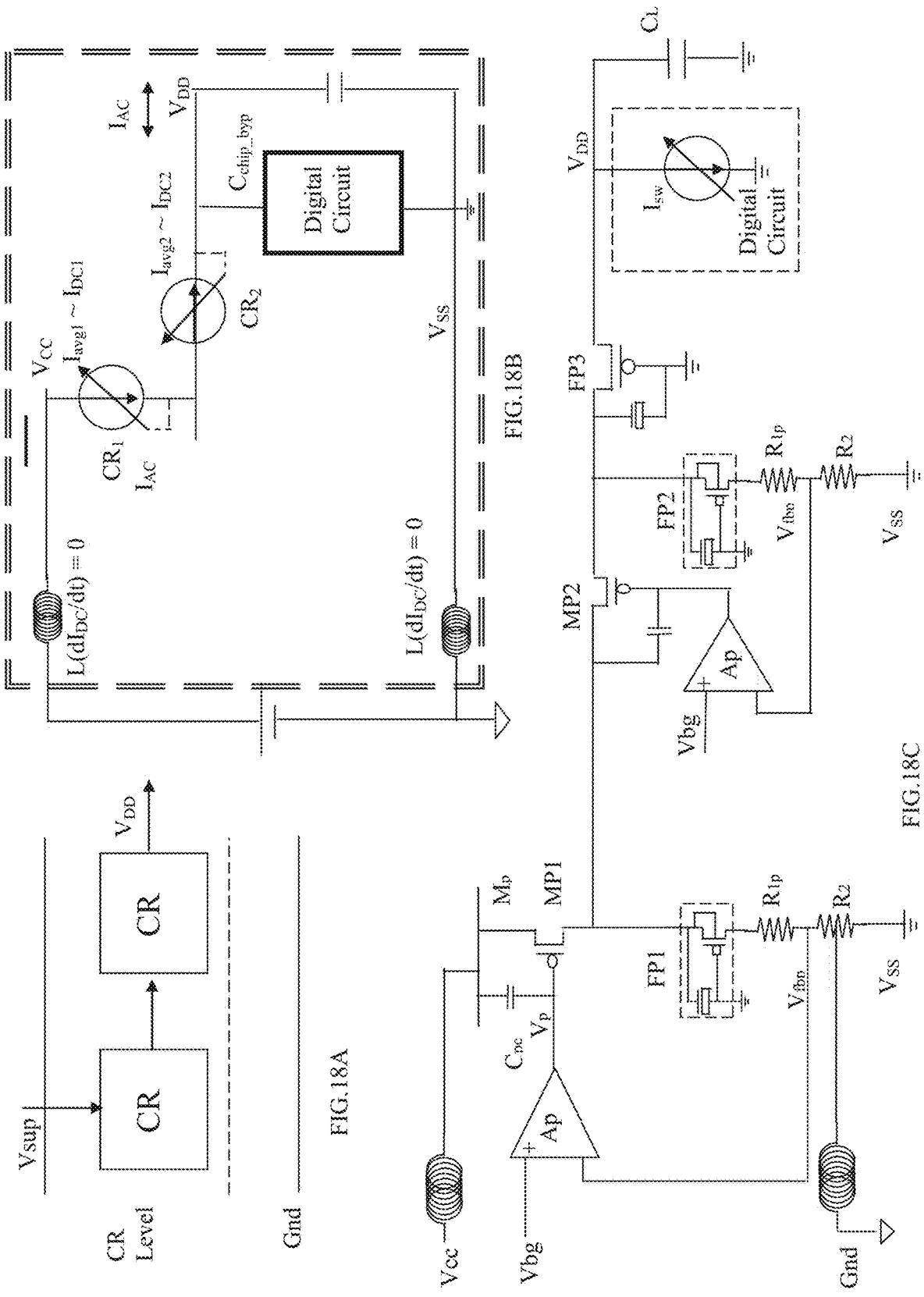
FIG. 18A is the system block diagram of the cascade current regulator.
FIG. 18B is the architecture of the cascade current regulator.
FIG. 18C is the circuit of the cascade current regulator.
Figure 18E:
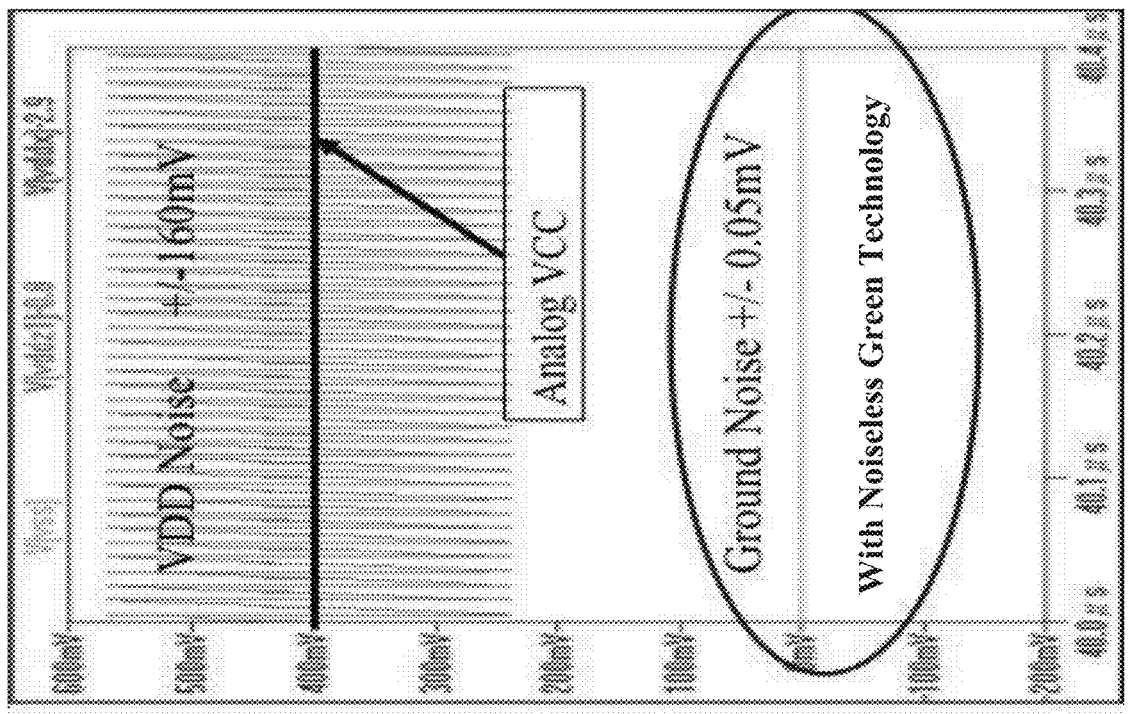
FIG. 18E is the simulation of power and ground curves of the Noise Isolation Technology. It is the cascade current regulator for the digital circuit or whole chip.
Figure 18D:
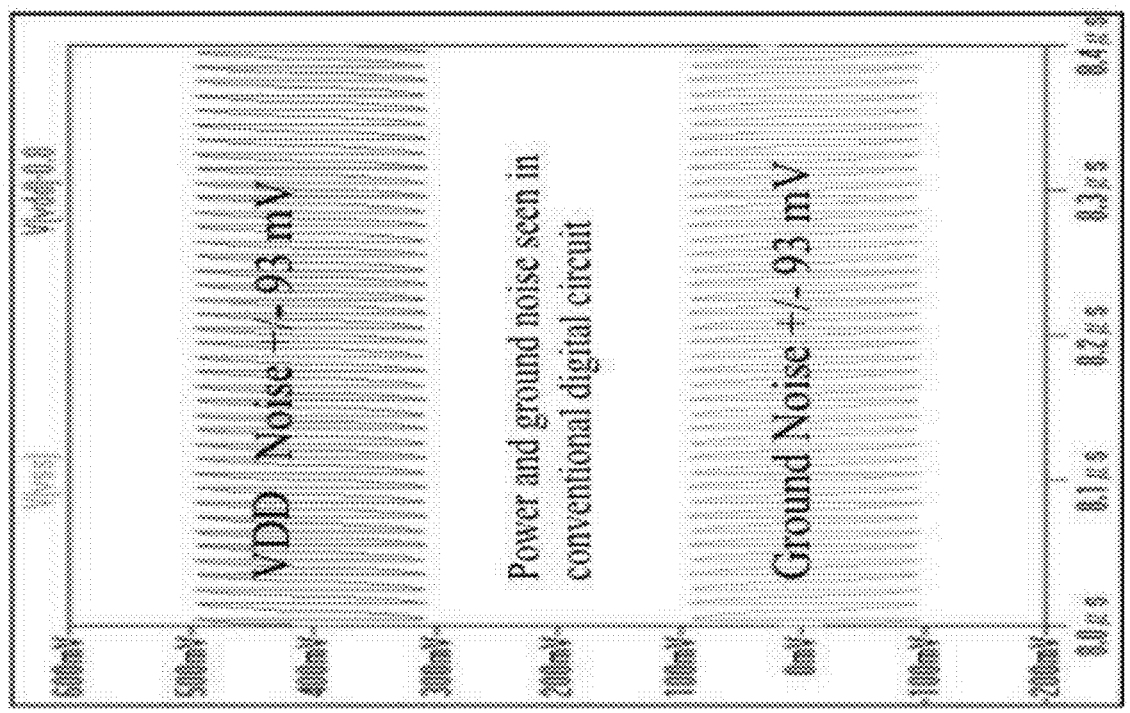
FIG. 18D is the simulation of power and ground curves of the conventional Power and Ground plan.

As shown in FIG. 6A and FIG. 18D, the Device Under Test DUT has the digital switch. The power and ground are oscillatory in the conjugate phases. The Vsrc+ node voltage is Vsrc and the Vsrc− is 0V. As the P-device and N-device of the digital circuit are both on, there is the crowbar current. At the same time, the parametric inductor tries to supply more current for the crowbar current. The continuous flows of the inductor will charge up the Vcc1 power node and discharge the Vss1 ground node. It causes the Vcc1 to go upward and the ground to go downward. The cycle of the power ground oscillation will be the doubling frequency of the switching frequency of the digital circuit. The oscillation of the power and ground are in conjugate 180° out of phase.

The substrate noise can be zero with the proper design of circuit. To illustrate the zero substrate noise concept, two different zero substrate noise conditions are introduced for comparison. FIG. 6B is virtual mathematical model. FIG. 6C is the real world Noise Isolation Technology.

As shown in FIG. 6B, the Vss2 has the 0V. Vsrc− has the Vss1 voltage. The Vsrc+=Vss1+Vsrc that the Vss+ curve is in phase of Vss−. For the two cases of FIG. 6A and FIG. 6B, the voltage across the inductor should be the same.

$$V(Vcc2) = V(Vsrc+) + V(L_P)$$
$$= V(L_P) + Vsrc + V(Vsrc-)$$
$$= V(L_P) + V(L_G) + Vsrc$$

$$V(Vss2) = 0$$
$$V_A(Vcc2) = V(L_P) + V(L_G)$$

with $$V(L_P) = -V(L_G) \mathrel{!}= 0$$
$$Vss2 = Gnd(0v)$$

It shows the substrate noise can be zero and the power oscillation is double. It gives the implication that the substrate noise can be zero.

Now, with our innovative Current Regulator of Noise Isolation Technology, as shown in FIG. 6C and FIG. 18E, in the physical real world, the substrate noise is real zero.

$$V(Vss3)=0$$
$$V_A(Vcc3)=V_A(Vcc2)$$

with $$V(L_P)=V(L_G)=0$$
$$Vsrc-=Gnd$$

As shown in FIG. 18D and FIG. 18E, the inductor at $V_{DD}$ is $L_{DD}$ and the inductor at GND is $L_{SS}$ and $L_{DD}=L_{SS}$. Furthermore, with the proof of the mathematical and simulation, due to the conservation of energy, the $(VDD)^2+(VSS)^2=(VDS)^2$ and VDD=VSS where VDD is the amplitude of the AC energy in FIG. 18D and VDS is the amplitude of the AC energy in FIG. 18E. Therefore, VDS ~$(2)^{1/2}$ VDD. The VDD amplitude increases and the noise energy is stored in the noise storage capacitor at the power node VDD of the digital circuit. The substrate VSS is clean out of noise.

The conventional noise technology is to try to reduce the digital switch noise. Our approach is completely different. Our innovation is to confine the noise in the local power node VCC3 and isolate it from the substrate. Just as the heat isolation using the magnetic shield in the fusion reaction as shown in FIG. 6D, our noise isolation uses the electric shield in the planar chip as shown in FIG. 6E. Instead of the dump of the noise on the board, our innovation is to confine the noise in the digital power bus chip locally. The board is clean without noise.

Figure 7B:
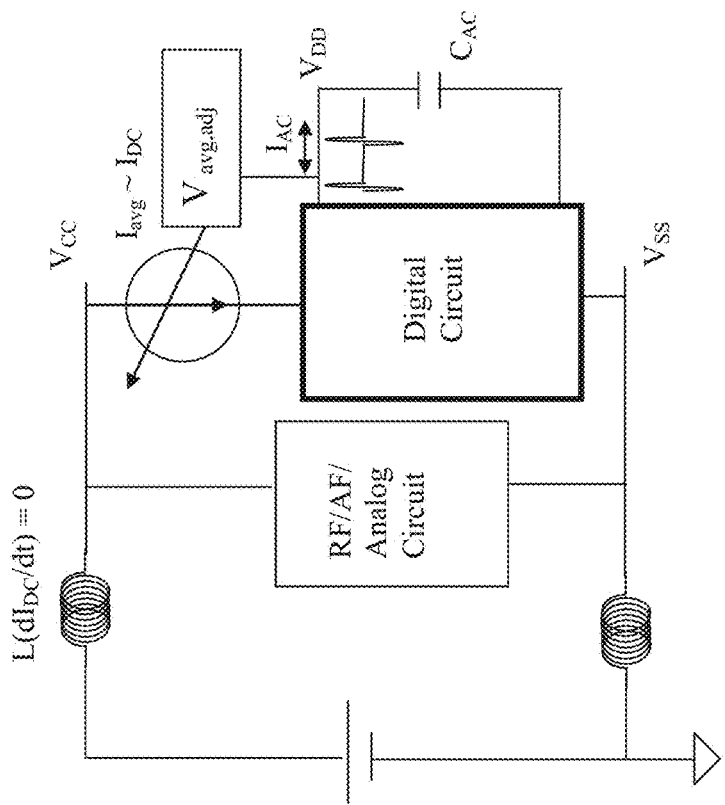
FIG. 7B the analog circuit can co-exist in the same chip having noiseless substrate. It is the fundamental pattern of the noise isolation technique.
Figure 7A:
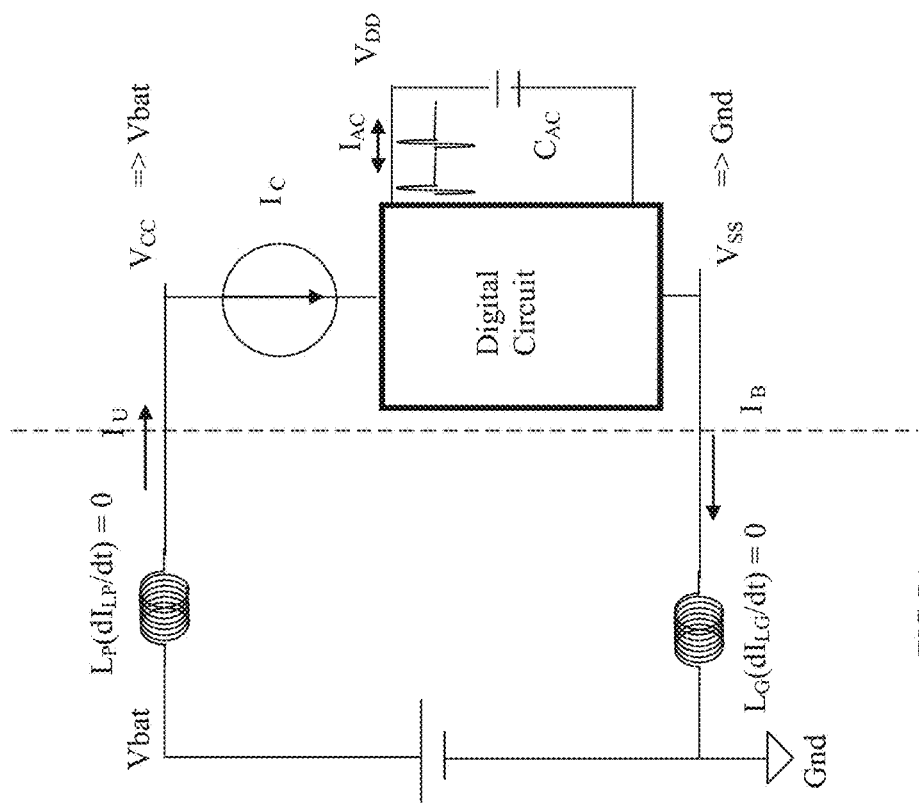
FIG. 7A is the noise isolation for the digital chip having the noiseless substrate; the Kirchhoff's Current Law (KCL) shows $I_U = I_B$ that only one current regulator is needed.

As shown in FIG. 7A, the current regulator regulates the current supply to be a constant current source IC. As the digital circuit is switched, all the time varying current $I_{AC}$ flows through the capacitor $C_{AC}$. $I_{LP}$ and $I_{LG}$ are the current flowing through the parametric inductors.

$$I_{LP}=I_U=I_C=\text{const}$$
$$L_P(dI_{LP}/dt)=0$$

Furthermore, according to Kirchhoff's Current Law, the section cut is shown as the dotted line, we have $I_U=I_B$.

$$I_{LG}=I_B=I_U=\text{const}$$
$$L_P(dI_{LG}/dt)=0$$

As shown in FIG. 5A, the inductor is the noise amplifier of the noisy instantaneous current with the L(dI/dt) mechanism. As shown in FIG. 7A, the noise isolation technique has the instantaneous current $I_{AC}$ to be confined locally with the local bypass storage capacitor $C_{AC}$. The $I_{AC}$ doesn't go through the inductor $L_G$. The capacitor $C_{AC}$ at the output absorbs variance of current to keep variance of current flowing through the current regulator $I_C$ to be minimum.

The Green Energy Smart Window integration system has noise isolation. The noise isolation means has the current regulator to regulate the current flowing a plural of bonding wires. The bonding wire connection has the parasitic inductor. The current regulator regulates the current flowing through the parasitic inductor of bonding wire to reduce the switching noise generated by the parasitic inductor.

As shown in FIG. 7A, with the short circuit $L_G(dI_{LG}/dt)=0$ of the parametric inductors, the substrate $V_{SS}$ is clamped to be the zero voltage. All the noise is confined and isolated at the node VDD. The ground and substrate are shorted and clamped by the ground 0 with the inductor $L_G$.

Since the VCC and VSS are quite, as shown in FIG. 7B, the RF/AF radio frequency, analog front and analog circuit can be connected to the quite power, ground VCC and VSS. The substrate is connected to the VSS that there is no substrate noise coupling problem. In other words, the RF/AF radio frequency, analog front and analog circuit can be integrated with the digital and FPGA to be a single chip. Furthermore, based on the average voltage of $V_{DD}$, the function block $V_{avg,adj}$ can vary the current to maintain the $V_{DD}$ at the proper voltage level for the dynamic circuit.

As shown in FIG. 8A, the on-chip metal ground line Gnd is connected to the substrate through the high density doping wells, etc. There are the parametric capacitors. As shown in FIG. 8B, it is the equivalent circuit of the substrate connection. The substrate has the resistance 3000Ω per square; the metal has the resistance about 0.001Ω per square. So, the ground metal shorts all the substrate circuit together to be a lump node. The low resistance metal has shortened all the substrate circuit together.

Comparing the conventional noise isolation techniques as shown in FIG. 8C, the digital noise injects into the substrate. This substrate noise is in the substrate under the analog circuit. The substrate noise contaminates the analog ground. So, the conventional separate power and ground doesn't solve the coupling substrate problem.

As shown in the FIG. 8D, it is the hydraulic model of the electron sea in the substrate. The substrate noise in the digital substrate will disturb the substrate of analog circuit. In other words, it must have all the substrate connected together to be a calm sea as shown in FIG. 8E. The separation of power and ground cannot eliminate the substrate noise to meet the high S/N or ENOB requirements that the analog RF/AF ASIC chip has to separate from the large digital or FPGA circuit.

Figure 9A:
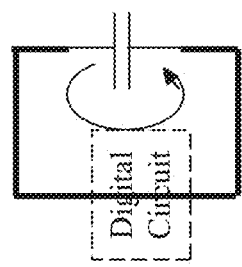
FIG. 9A is the capacitor with the current loop of charging and discharging.
Figure 9B:
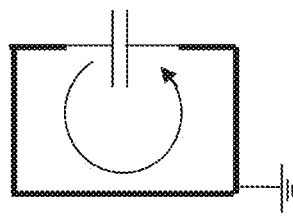
FIG. 9B is the capacitor with the current loop having the ground node for charging and discharging.
Figure 9C:
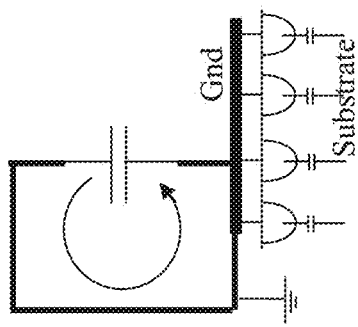
FIG. 9C is the capacitor with the current loop having the ground node and substrate for charging and discharging.
Figure 9D:
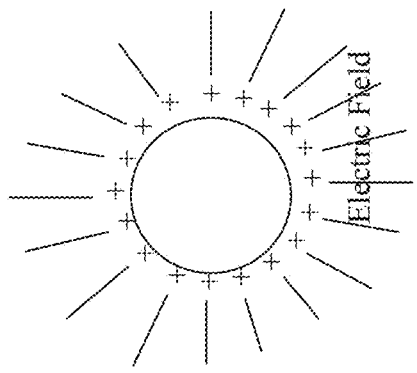
FIG. 9D is the Electric Field analogy of the Noise Isolation Technology.
Figure 9E:
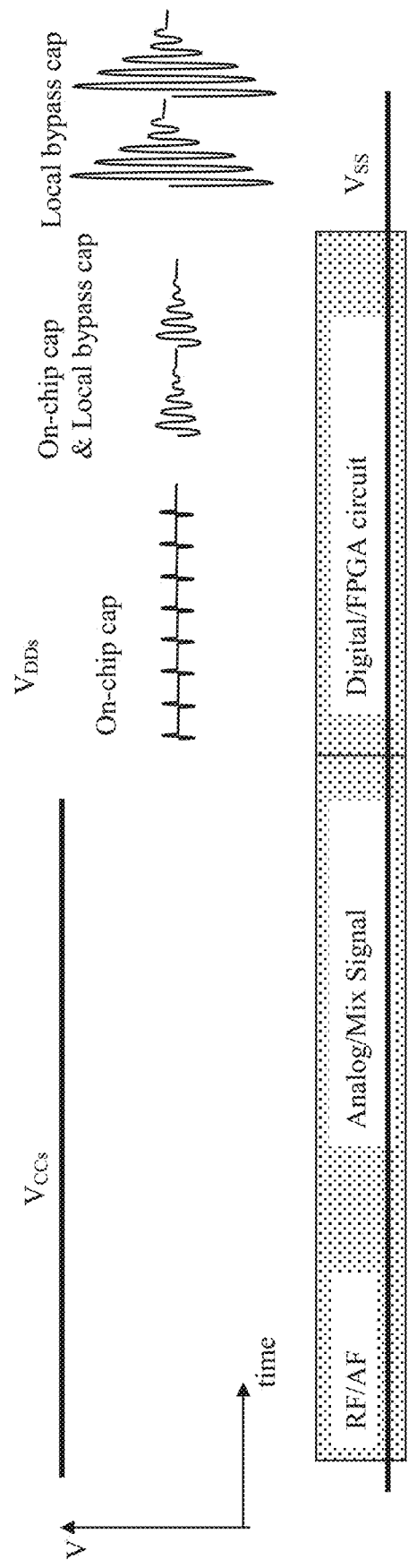
FIG. 9E is the power and ground voltages in the system integration with the noise isolation technology. It is the analysis of the power and ground voltages in the noise-isolation technique; it proves that there is no substrate noise injected into the substrate.

To have the quite ground for the digital substrate in the FIG. 8E, as shown in FIG. 8F, the current regulator CR confines all the digital noise at the power node $V_{DD}$. The ground is kept isolated from the noise to be the electrical isolation layer. With the innovative CR in FIG. 8F, the power voltage, ground voltage and noise voltage are shown in FIG. 9E. The ground voltage and the substrate voltage are clamped to be the ground 0V with the $L_G$ inductor. There is no substrate noise. All the digital switching noise is confined at the $V_{DD}$ node. Depending on the size of digital/FPGA circuit, the $C_{AC}$ might be the versatile combinations of the on-chip capacitor and on-board capacitor. However, the on-chip capacitor can reduce the inductor current that the peak voltage oscillation is reduced.

In the Noise Isolation Technology NIT, there is a question whether the oscillation of the current between the digital circuit and the capacitor will inject into the substrate to generate the noise. To answer this question, as shown in FIG. 9A, there is one capacitor with the positive terminal being connected to the negative terminal of this capacitor. There is no ground and/or substrate. The closed loop current will not inject to ground and/or substrate. As shown in FIG. 9B, the ground is added to the circuit, however, the loop current will be still the same. So, as shown in FIG. 9C, the loop current will not inject into the ground and/or substrate. In other words, just as the electric field inside the closed metal cavity as shown in FIG. 9D, the ground and substrate are shielded from the inject current FIG. 9C. FIG. 9D is the static electric field case; FIG. 9C is the dynamic current case. There is no switching noise outside the current loop and it is names as the Tangs' Law.

A green technology integration system comprises application specific integrated circuit ASIC and field programmable gate array FPGA. The green technology integration system integrates the ASIC and FPGA on a platform made of the noise isolation means to be the field programmable integrated chip FPSOC. FIG. 9E is the application of the Tangs Law to the platform of the system integration. All the Radio Front, Analog Front RF/AF, analog/mixed signal and Digital/FPGA circuit are integrated on the same chip to share the same substrate. With the Tangs' Law, the power $V_{CCS}$ of the RF/AF, analog circuit is constant over time. The switching noise is confined on the multiple $V_{DDS}$ digital power buses. For the switching current spikes, the switching noise is small. With the on-chip capacitor, the oscillation voltage is much smaller than the on-board capacitor.

FIG. 10A and FIG. 10B illustrate the differences between the innovative current regulator and conventional voltage regulator. As shown in FIG. 10A, the current regulator eliminates the internal on-chip substrate noise generated by the on-chip digital switching noise. As shown in FIG. 10B, the voltage regulator eliminates the external on-board power noise injected into the analog circuit.

The digital switch has the periodic curve that we can take advantage to get rid of the digital switch noise. As shown in FIG. 10A, the digital circuit consumes the switching current $I_{switch}=I_{AC}+I_{DC}$. The $I_{DC}$ is the slow varying low frequency average current which can be treated to be constant in the timing window. The current regulator CR only provides the constant average current $I_{DC}$. In the short time window, $I_{DC}$ can be approximated to be constant, $I_{DC}$=constant. For $I_{DC}$=constant, $L(dI_{DC}/dt)=0$. The substrate has $V(V_{SS})=V(0)$ to be the ground node voltage and has no digital switch noise. The capacitor $C_{AC}$ will smooth the voltage $V_{DD}$. The amplitude variance of $V_{DD}$ is the inverse proportional function of the capacitor $C_{AC}$. To make the variance of $V_{DD}$ smaller, we need the larger $C_{AC}$. However, there is the limit of the on-chip capacitor. Then the off-chip capacitor can be used with the combination of the on-chip capacitor. The on-chip capacitor reduces the peak voltage and the off-chip capacitor reduces the large variance of the $V_{DD}$ amplitude.

As shown in FIG. 10A, for the current regulator, the current switching occurs at node $V_{DD}$. The protected node $V_{CC}$ voltage is a constant voltage. On the contrary, as shown in FIG. 10B, the node $V_{CC}$ has the on-board injecting noise. This on-board injecting noise is coming from the digital switching noise of the neighboring digital or FPGA chips. The digital or FPGA chip dumps the digital switching noise on the board. Even having the bypass capacitor and/or choke, it still has the digital switching noise injecting into the RF/AF analog chip. Under the $V_{CC}$ injecting noise, the voltage regulator is trying to have the on-chip analog supply voltage $V_{AA}$ to be constant. Comparing FIG. 10D with FIG. 10E, the noise injecting node and the protected node are exactly reverse. It shows the essential difference between the current regulator CR and voltage regulator VR. The current regulator CR has the completely different functional features from the voltage regulator VR. Comparing the voltage regulator VR in FIG. 10D and the current regulator CR in FIG. 10E, the voltage regulator VR is to filter the voltage oscillation in Vcc to generate the constant voltage at $V_{AA}$ node; the current regulator CR is to filter the current spikes in the $V_{DD}$ to generate the constant current in the node Vcc. The current regulator CR has the conjugate and opposite functions of the voltage regulator VR.

As shown in FIG. 10C, the comparison table summarizes the difference between the conventional approach and the Green Technology. In the conventional approach, the system is partitioned to be multi-chip of the RF/AF analog chip, mixed signal chip, digital and FPGA chip. The Green Technology uses the single chip system approach. It saves power and has higher performance. The conventional multi-chip system uses the on-board bypass capacitor. The on-board bypass capacitor will generate much more on-chip digital switching noise. The conventional system dumps the noise on the board. The Green Technology confines the noise in the local chip. The conventional uses the voltage regulator to isolate the analog circuit from the on-board power and ground noise. The Green Technology uses the current regulator to isolate the digital switch circuit to keep the switching noise from the contamination of the on-board power and ground. The conventional system uses the voltage regulator VR to generate the internal constant chip voltage $V_{AA}$ for the analog circuit. The Green Technology uses the current regulator to generate the constant current for the digital switching circuit.

From the power source view, we compare and make the analysis for the characteristics of the current regulator. As shown in FIG. 11A, it is the characteristic curve and symbol of the voltage source of the voltage regulator VR. The output voltage is constant over all the current load. As shown in FIG. 11B, it is the characteristic curve and symbol of the current source. The output current is constant over all the voltage load. As shown in FIG. 11C, it is the characteristic curve and symbol of the current regulator. Both the output current and voltage are the specified constants. So, the current regulator is neither the voltage source nor the current source. The current regulator is a new kind of power source. Furthermore, for the dynamic loading, the output current load varies but the output voltage is constant. This is an adaptive smart current regulator. However, the current regulator is different from the voltage regulator. The voltage regulator is high speed and broad spectrum circuit to keep the output voltage to be constant. The current regulator is low speed and narrow spectrum circuit to keep the output current to be constant.

As shown in FIG. 12A, it is the digital switching curve with the slow wandering. The slow wandering comes from oscillation having the large on-board capacitance, etc. The spectrum of the digital switching curve is shown in the FIG. 12B. The high frequency band is the digital switch. The low frequency band is the wandering baseline coming from the large on-board capacitance, etc. FIG. 12C2, FIG. 12C3 and FIG. 12C4 are the waveform, symbol, spectrum of the input and output signals of the current regulator CR. FIG. 12D2, FIG. 12D3 and FIG. 12D4 are the waveform, symbol, spectrum of the input and output signals of the voltage regulator VR.

In FIG. 12C1 and FIG. 12C2, the power noise PNi input is at VDD and the output is constant or slow varying current ICC. The control signal Vctl slowly varies to keep the current ICC to be constant. As shown in FIG. 12C3, the power noise PNi input has both high frequency digital switching noise and the low frequency wandering baseline. As shown in FIG. 12C4, the control signal Vctl only has the low frequency control for the low frequency wandering baseline.

On the contrary, in FIG. 12D1 and FIG. 12D2, the power noise PNi input is at $V_{CC}$ and the output is the constant voltage $V_{AA}$. The control signal Vctl fast varies to keep the voltage $V_{AA}$ to be constant. As shown in FIG. 12D3, the power noise PNi input has both high frequency digital switching noise and the low frequency wandering baseline. As shown in FIG. 12D4, the control signal Vctl has high frequency control for the digital switching and the low frequency control for the low frequency wandering baseline.

To generate the low frequency control signal for the current regulator, we need to extract the baseline wandering information from the input PNi digital switching power noise signal. As shown in FIG. 13A and FIG. 13B, there are versatile different ways to extract the baseline wandering information from the input PNi digital switching power noise signal.

FIG. 13A is the basic block diagram of average circuit to extract the average value $I_{avg}$ from current I(t). FIG. 13B is the basic block diagram of average circuit to extract the average value $V_{avg}$ from current V(t). FIG. 13C is the block diagram which generates the average current from the voltage instead of the current directly. The fundamental principle of the current regulator is to minimize the variance of current flowing through the parasitic inductor of the bonding wire and pin, etc. The current flowing through the parasitic inductor is only the average of the current. The feedback control circuit provides the low frequency current to current loading and keeps the voltage to be the specified voltage level. The abrupt change and variance of switching current is absorbed by the storage capacitor. There are many different implementations of the above principles. As shown in FIG. 13D1 and as shown by the $F_P$ in FIG. 14F, the switching noise is filtered out first, then the low frequency signal is compared with the reference voltage to generate the control signal. This pre-filter is the preferred implementation. Of course, as shown in FIG. 13D2, it is possible to have the alternative post-filter implementation to feedback the voltage first, then filter the switch noise. However, in the practical implementation, as shown in FIG. 13D3 and FIG. 18C, the pre-filter of FP, post-filter made of the Cpc and the output impedance of amplifier AP are adopted. As shown in FIG. 18C, the cascade current regulators and the cascade filter FP3 are adopted. The green technology integration system has the current regulator further comprises the filter, feedback and comparing circuits. The filter filters out the high frequency variance of output to get low frequency variance of output. The comparing circuits feedback the information of variance of output current loading. The current devices are controlled based on the information of the low frequency variance of output loading current.

Figure 14F:
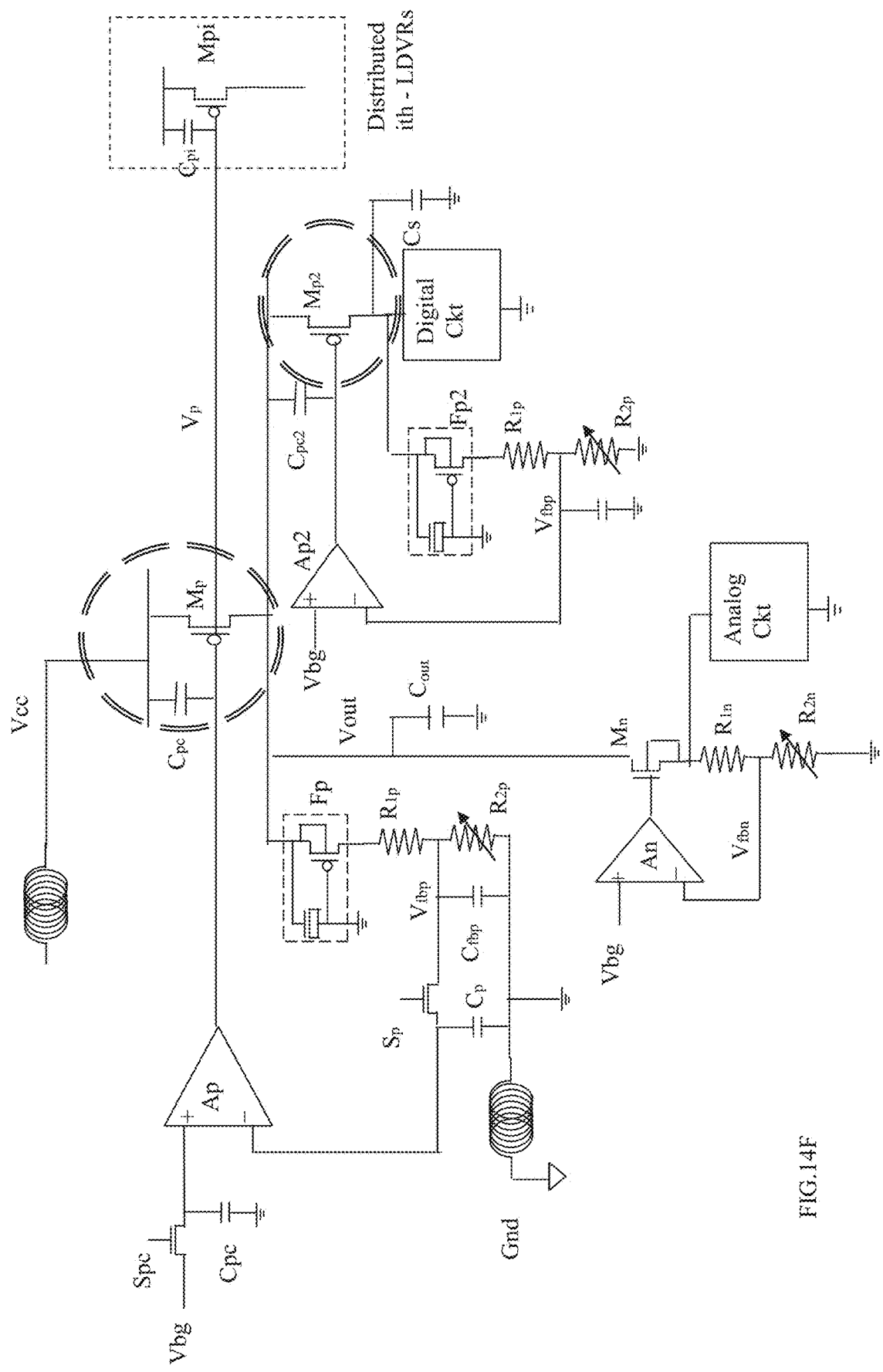
FIG. 14F is the current regulator adopting the filter as shown in the FIG. 14D and the sampling as shown in FIG. 14E2 to get the average current for the P-P type cascading current regulator.

FIG. 14A and FIG. 14B illustrate the versatile techniques to generate the dynamic average current. FIG. 14A is to use the average circuit to generate Iavg(t) from I(t). The current regulator comprises filter, feedback and comparator. The filter filters out high frequency variance of loading to get low frequency variance of loading. The comparator feedbacks information of variance of loading. A plurality of current device is controlled based on information of low frequency variance of loading. FIG. 14B is the timing integration block to generate the Iavg(t) from I(t). FIG. 14C is the timing window to generate the Iavg(t) from I(t). FIG. 14D is to use the low pass filter to generate the Iavg(t) from I(t). FIG. 14E1 shows the waveform of the power buses and clock. At the clock edge, the simultaneous switches of the digital circuit generate the switch noise instantly. The switch noise dies away to be the average value. As shown in FIG. 14E2, the sampling circuit samples the average value at the average value period to get the average value Iavg(t). According to the principle illustrated in the FIG. 13C, FIG. 14F shows the current regulator design which integrates of the above techniques to have the practical application. The filter $F_p$ is to serve as the filter as shown in FIG. 14D to generate the average voltage for the average current. The voltage divider $R_{1p}$, $R_2$ and $C_{fbp}$ are the feedback circuit and filter. The sampler $S_p$ is to sample the average value at the average period to have the much cleaner average value. The sampling gate $S_{pc}$ and capacitor is to compensate for the sampling noise generated by the switch gate $S_p$. The output capacitor $C_{pc}$ and the output resistance of the amplifier $A_p$ are another filter. So, there are four filters are in cascade to get the high quality average current. Finally, the average bias voltage for the average current applying on the P device $M_p$ to generate the constant "current source" which has the "constant" current value $I_{avg}(t)$ to be the "average" value of the current load I(t). It is noted that the circuit is dynamical that the $I_{avg}(t)$ is also dynamic. The "constant" means over a short time period of time window. The time window shifts and the "constant" value also varies and shift slowly at very low frequency. For a short period time, the average value can be treated as a constant. For the constant current. L(dIavg/dt)=0, the voltage across the inductor is zero, i.e., the switching noise generated by the inductor is zero.

Figure 14G:
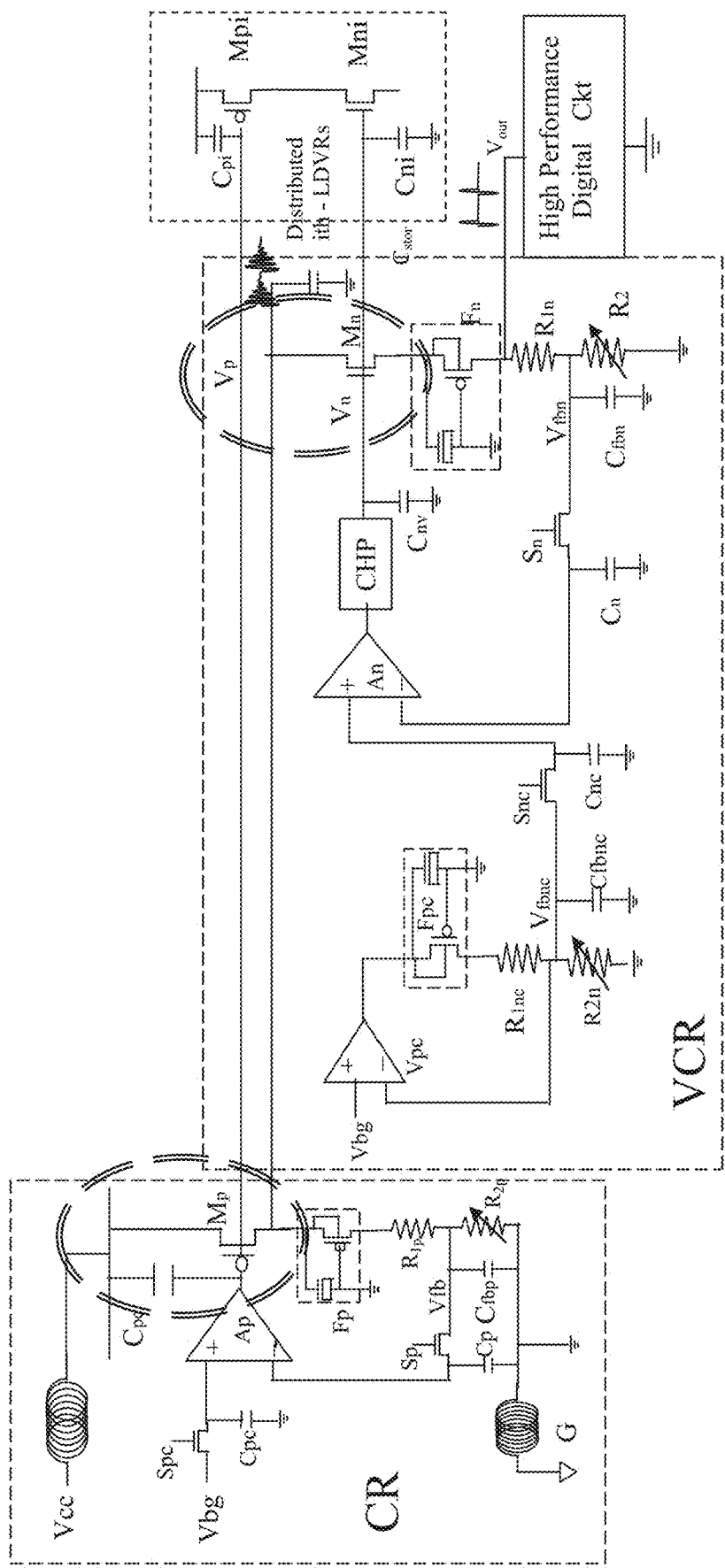
FIG. 14G is the alterative implementation of the current regulator; it adopts the filter as shown in the FIG. 14D; the sampling is as shown in FIG. 14E2; it is to get the average current for the P-N type cascading current regulator. It is noted that the current regulator having the filter Fp and Fn; the voltage regulator doesn't have a filter. It is the different ways to implement the average function.

To increase the switching noise rejection capability, the current regulator can be cascaded to get the high ratio of the switch noise rejection. The Noise Isolation Factor of the switch noise rejection is defined as NIF=Switching Noise in Isolated Power Bus; Switching Noise in Substrate As shown in FIG. 14F and FIG. 18C, the green technology integration system has the current regulator comprising P type current devices and N type current devices. The P type current device $M_P$ and N type current device $M_N$ are connected in cascade with drains. The capacitor $C_{OUT}$ is connected to the drains of devices. As shown in FIG. 14G, the Hybrid current regulator HCR is made of the P-type current regulator PCR and N-type current regulator NCR. FIG. 14G is the cascade of the voltage regulators of the current regulator and it is the hybrid voltage regulator of P-type current regulator PCR and N-type current regulator NCR. The current regulator CR has the constant current flowing through the P-type current regulator and the N-type current regulator is to minimize the switching noise as seen by the high performance circuit to have the fast circuit speed and less noise. The noise is isolated in the capacitor between the P-type current regulator and the N-type current regulator that both the inductor and circuit do not see the violent switching noise. The hybrid current regulator is much better than the two P-type cascaded current regulators as shown in FIG. 18. The two P-type cascaded current regulator has the NIF to be 1800; however, the hybrid current regulator has the NIF much larger than 1800.

Figures 15A, 15B:
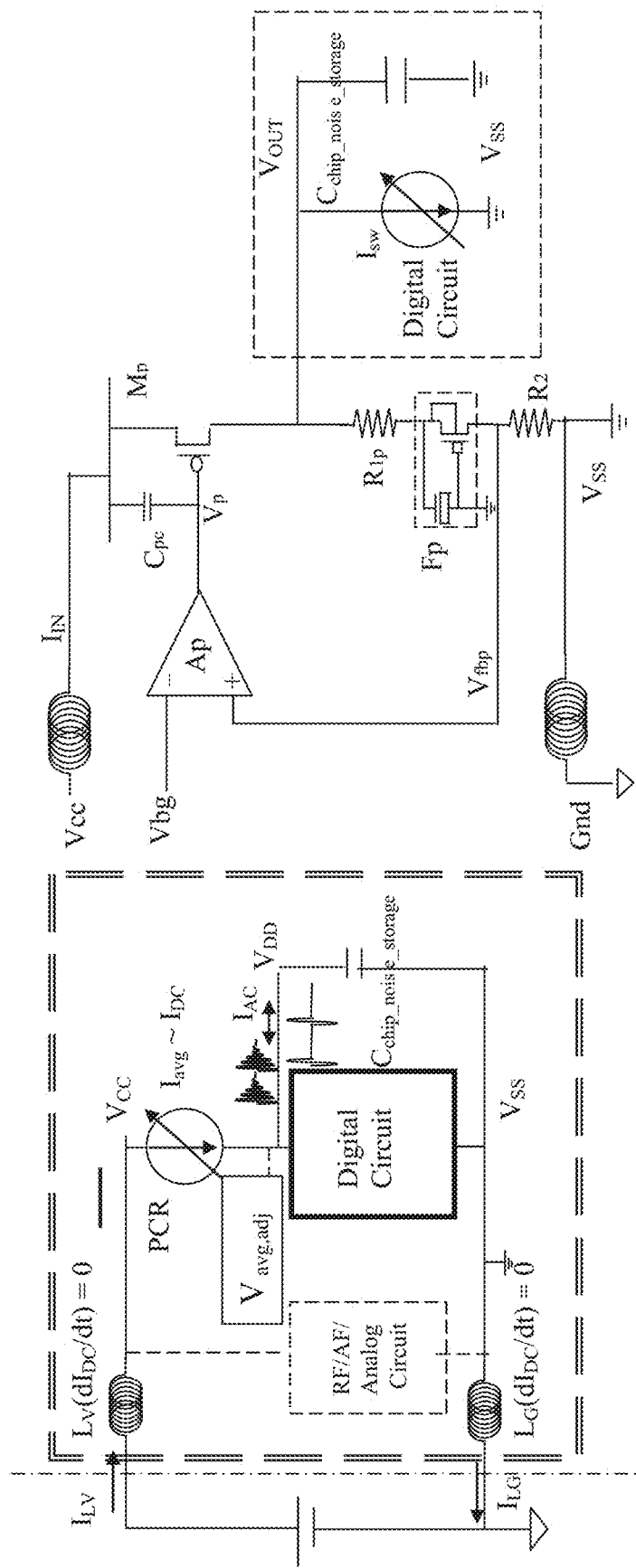
FIG. 15A is the architecture of the current regulator.
FIG. 15B is the circuit and system of the current regulator. It is the fundamental current regulator.

FIG. 15A is the basic system and architecture of the Noise Isolation Technology. The noise isolation comprises capacitor at the current output. It is to absorb the variance of current loading to keep the variance of current flowing through a current regulator to be minimum. FIG. 15B is the circuit implementation of the Noise Isolation Technology. FIG. 15A illustrates the fundamental principles of the Noise Isolation Technology. In FIG. 15A, the current regulator CR is the constant DC current $I_{DC}$ of the current average $I_{avg}$.

First, assumes the RF/AF/Analog circuit not existing that only the current flows through the current regulator CR. Applying the Kirchhoff's current law at the cross-section as shown in FIG. 15A, the current $I_{LC}$ flows through the inductor of the power supply is equal to the current $I_{LG}$ flows through the inductor of the ground, $I_{LV}=I_{DC}=I_{LG}$=constant. So the voltage across inductors $L_V(dI_{DC}/dt)$=0 and $L_G(dI_{DC}/dt)$=0. In other words, there is no switching noise generated by the inductor $L_V$ and $L_G$. The on-chip ground or substrate voltage Vss is the same voltage as the on-board ground.

The same argument can be applied to the circuit having the RF/AF/Analog circuit. As shown in FIG. 15A, the current flowing through the RF/AF/Analog circuit is constant. Both the current regulator and the RF/AF/Analog circuit are constants. The current flowing through inductor $L_V$ and $L_G$ is constant. The on-chip ground or substrate voltage Vss is the same voltage as the on-board ground.

FIG. 15B is the circuit for the current regulator. The current regulator is very similar to the voltage regulator. However, the function of the circuit is much different from the voltage regulator. The voltage regulator is to keep the "output voltage" to be constant. The current regulator is to keep the "input current" to be constant. The difference between the current regulator and voltage regulator is the current regulator having the low pass filters such as Fp and Cpc. The voltage regulator needs to have the fast response to the high frequency switch noise. However, the current regulator is only to trace and follow the low frequency average current.

As shown in FIG. 16A, for the cascade current regulator, the total SNRR $$NIF_{Total}=NIF_1 \times NIF_2$$

where the $NIF_1$ is the Noise Isolation Factor NIF of the first stage current regulator; the $NIF_2$ is the Noise Isolation Factor NIF of the second stage current regulator. Usually one stage current regulator has the SNRR to be 50. For the two stage current regulator, the SNRR is bout 2500. It is equivalent to 13 Bits improvement for ADC. FIG. 16B is the circuit for the 2-stage cascade current regulator.

Figures 17A, 17B, 17C:
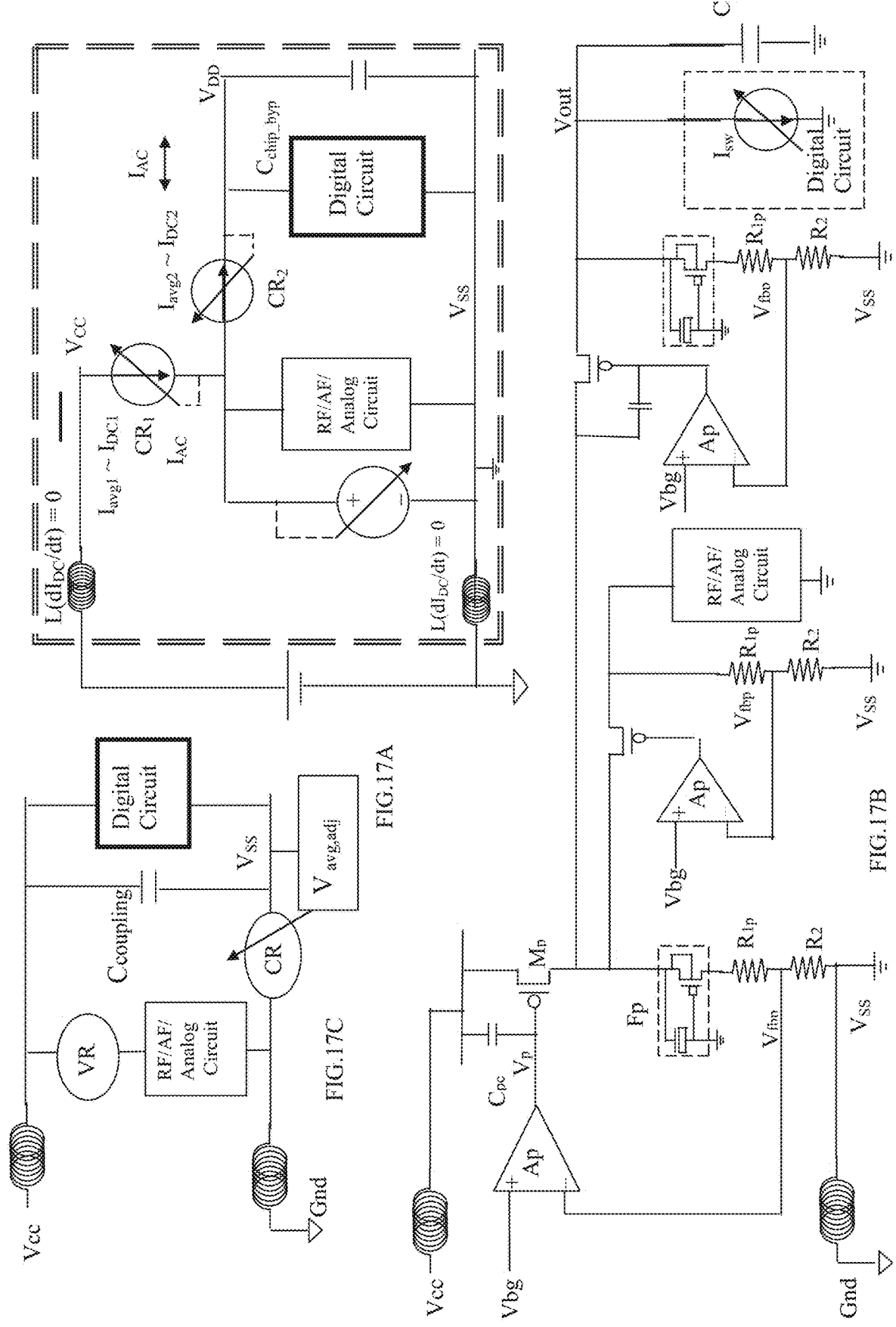
FIG. 17A is the architecture of the cascade current regulator and voltage regulator.
FIG. 17B is the circuit of the cascade current regulator and voltage regulator.
FIG. 17C is the architecture for the current regulator being at the ground side of the digital circuit, the voltage regulator being for the AF/RF circuit and the big coupling capacitor having the connection between the power line and ground line of the digital circuit. It is the cascade current regulator for the digital circuit or whole chip; the voltage regulator is for the analog or RF circuit.

As shown in FIG. 17A, for the cascade current regulator architecture, the RF/AF/Analog Circuit is between two current regulators. FIG. 17B is the circuit implementation of the FIG. 17A. As shown in FIG. 17C, based on the average voltage of $V_{SS}$, the function block $V_{avg,adj}$ can vary the current to maintain the $V_{SS}$ at the proper voltage level for the dynamic circuit. Comparing FIG. 17C with FIG. 7B and FIG. 15A, FIG. 17C is the ground side current regulator; FIG. 7B and FIG. 15A are the power side current regulator.

Referring to FIG. 18C, the green technology integration system having the noise isolation means is constituted of a plurality of cascading controlled current devices MP1 and MP2. It is to regulate the current flowing through the parasitic inductor to reduce noise generated by the parasitic inductor. Furthermore, with the basic patterns, we can have the versatile combinations of the different patterns for the noise isolation technology. The noise isolation means further comprises a plurality of filters FP1 and FP2 to filter out the high-frequency noise to control cascading controlled current devices. FIG. 18A, FIG. 18B and FIG. 18C are the basic pattern of the cascade current generators. FIG. 18A is the block diagram for the cascade current generators. FIG. 18B is the system and architecture of the cascade current generators. FIG. 18C is the circuit of the cascade current generators. As shown in FIG. 18D, the SPICE simulation shows the switching noise of digital circuit as shown in FIG. 6A. It is the SPICE simulation with the Noise Isolation Technology Circuit in FIG. 18E to show the switching noise of digital circuit as shown in FIG. 6C. The Noise Isolation Factor NIF is 1800. Referring to FIG. 18C, the noise isolation comprises a plurality of cascading controlled current devices MP1, MP2 and filters FP3 to reduce the noise generated by the parasitic inductor.

FIG. 19A, FIG. 19B and FIG. 19C are the cascade connection of the current regulator and voltage regulator. FIG. 19A is the block diagram of the current regulator and the voltage regulator. FIG. 19B is the system and architecture of the cascade current generator and voltage regulator. FIG. 19C is the circuit of the cascade current generator and voltage regulator.

FIG. 20 is the cascade of the current regulator and the Switch Mode power supply. FIG. 20A is the block diagram of the current regulator and Switch Mode power supply. FIG. 20B is the system and architecture of the cascade current generator and Switch Mode power supply. FIG. 20C is the cascade current generator and Switch Mode power supply of buck converter. The switch mode power supply can be boost converter, buck converter, etc.

FIG. 21A, FIG. 21B and FIG. 21C are the comparisons among three different power management units, Switch Mode SM, Voltage Regulator VR and Current Regulator CR. In FIG. 21A, the Switch Mode power supply changes the power from one voltage level to another. The output voltage has the ripple voltage. The output voltage is fed into the voltage regulator VR or low voltage digital circuit, etc. In FIG. 21B, the voltage regulator VR is to filter the input power noise to have the output voltage to be the constant voltage for the analog circuit. FIG. 21C1 is the block diagram of the current regulator which is analogy to the voltage regulator VR. However, the signal flow is in the reverse direction. The signal flow diagram is shown in FIG. 21C2. FIG. 22A is the current regulator for the constant average current output loading $I_L$. FIG. 22B is the frequency spectrum of the current regulator. FIG. 23A is the current regulator. FIG. 23B is the frequency spectrum of the current regulator.

Figure 25B:
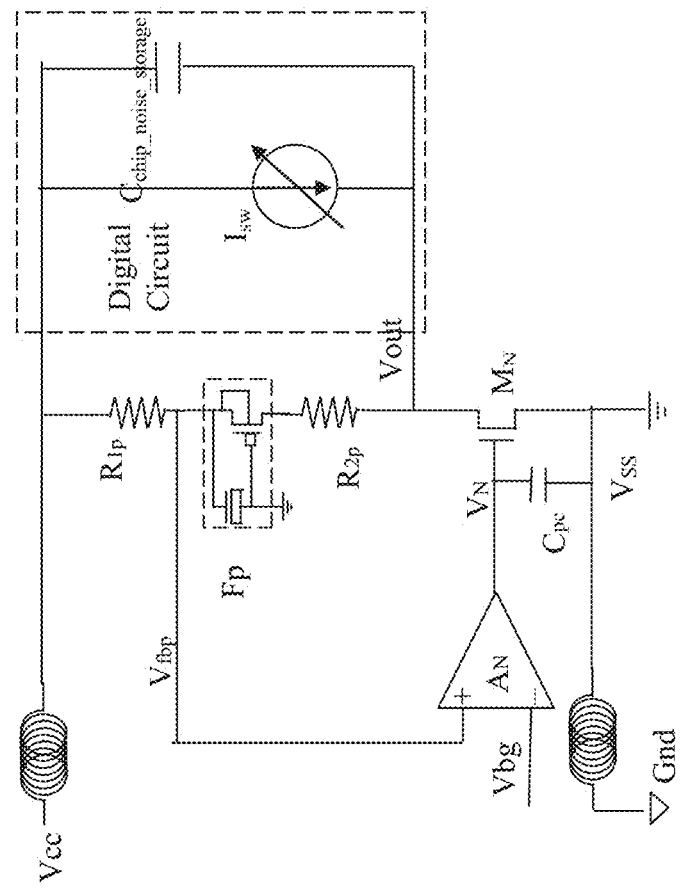
FIG. 25B is the circuit and system of the N-type current regulator. It is the N-type fundamental current regulator; it is shown by the CR in bottom ground layer in FIG. 24B.

With the manipulation of the block diagrams, we can make novel innovations of the Noise Isolation Technology in the system and architecture level. FIG. 24A is the basic system and architecture of the noise isolation technology. The current regulator is at the upper power layer; the voltage regulator and the switch mode power supply are at the low layer. FIG. 24B is the conjugate architecture of FIG. 24A. The current regulator is at the lower ground layer; the voltage regulator and the switch mode power supply are at the upper layer. The architecture is shown as FIG. 25A and the circuit implementation is shown as FIG. 25B.

To have the higher Noise Isolation Factor NIF, as shown in FIG. 24C, the current regulators are in both upper layer and ground layer. The total Noise Isolation Factor $NIF_{Total}$ is $$NIF_{Total} = NIF_P \times NIF_G$$

where the $NIF_P$ is the NIF of the current regulator at upper power layer; the $NIF_G$ is the NIF of the current regulator at bottom ground layer.

Similarly, we can have the different ways to cascade the current regulator. As shown in FIG. 24D, all the current regulators are in the upper power layer. It can be interpreted that the current regulator CR is the hierarchical current regulator having the current regulator $CR_1$ to be cascaded with the current regulator $CR_2$. FIG. 18A is the system and block diagram of the cascade current regulator. FIG. 18B is the architecture of the cascade current regulator. FIG. 18C is the circuit of the cascade current regulator.

Applying the hierarchical principles to the versatile combination of the current regulator, voltage regulator and switch mode power supply, there are many different novel power and ground plans. As shown in FIG. 24E, it is the equivalent circuit for the ideal power supply. The board provides the constant current source to the chip. Then the chip generates the constant voltage source to the circuit. As shown in FIG. 24F, it is the architecture of the ideal power supply which is corresponding to the ideal circuit in FIG. 24E. It is equivalent to the system and block diagram in FIG. 24C.

The current regulator comprises a plurality of P type current devices and N type current devices. The P type current device and N type current device are connected in cascade with the draining nodes being connected together. The capacitor is connected to draining nodes.

Figure 25A:
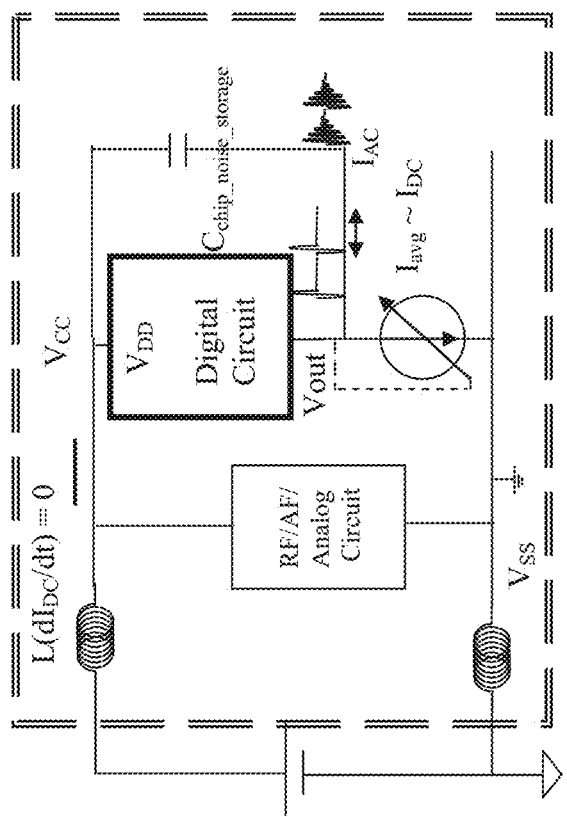
FIG. 25A is the architecture of the N-type current regulator.

A green technology noise isolation integration system comprises a plural of cascading controlled current device with addition of a plurality of cascading filter to regulate the current flowing through the parasitic inductor. It is to reduce the noise generated by the parasitic inductor. FIG. 25A is the conjugate Noise Isolation Technology as shown in FIG. 15A. The P device is changed to be the N device $M_N$ and the power bus Vcc is changed to be the Ground Bus Vss. FIG. 26A is the alternative design of the FIG. 24C. It has the cascade current regulator effect to increase the Noise Isolation Factor NIF. The FIG. 26 E is the Preferred implementation. As shown in FIG. 26C, the green technology integrated system noise isolation comprises a plurality of cascading controlled current device and filter. It is to regulate current flowing through the parasitic inductor to reduce noise generated by the parasitic inductor. As shown in FIG. 26F, to reduce the ground bounce, we can reduce the undershoot. The voltage-clamping device $M_{CN}$ is biased at the voltage $V_{CN}$. As the undershoot occurs, the voltage clamping device $M_{CN}$ turns off the output device $M_{CN}$. As the ground bounce occurs, the output device MON is turned-off that the overshoot of the ground will not show at the node $D_{out}$. Similarly, as shown in FIG. 26F, to reduce the power surge, we can reduce the overshoot of the $V_{DD}$. The voltage-clamping device $M_{CP}$ is biased at the voltage $V_{CP}$. As the overshoot of $V_{DD}$ occurs, the voltage-clamping device $M_{CP}$ turns off the output device $M_{OP}$. As the ground bounce occurs, the output device $M_{ON}$ is turned-off that the overshoot of the ground will not show at the node $D_{out}$.

As a summary, as shown in FIG. 15A, FIG. 15B, FIG. 18E and FIG. 26E, the Green Energy Smart Window Wireless Window 5R System W5RS comprises substrate noiseless P&G plan having all the ground nets being connected together to have one LDO typed constant current source. In FIG. 26E, all the ground nets are connected together. Furthermore, the Green Energy Smart Window Wireless Window 5R System W5RS further comprises ground-bounce-less output buffer. As shown in FIG. 26D2 and FIG. 26F, the output buffer has non-overlap, tri-state and voltage clamping mechanism made of MCP and MCN. The ground-bounce-less output buffer comprises non-overlapping mechanism, tri-state mechanism and clamping mechanism. The clamping mechanism detects the undershoot of the ground-bounce-less output buffer and turns off the N type output device. The clamping mechanism detecting overshoot of the ground-bounce-less output buffer and turns off the P type output device.

As shown in FIG. 26G, the Green Energy Smart Window Wireless Window 5R System W5RS has a rippleless LDO to deliver rippleless DC output power at the output voltage. The rippleless LDO has an error amplifier and a voltage divider. The voltage divider divides the output voltage to generate a feedback voltage $V_{FB}$. The error amplifier has the reference voltage $V_{BG}$ and the feedback voltage $V_{FB}$ been connected as inputs.

FIG. 26G is the programmable LDO which can be programmed to be analog LDO and digital LDO. Furthermore, programmable LDO is the "Auto-LDO" which is constituted of the steering-wheel, brake and accelerator. The combinatory operations of brake mechanism and accelerator mechanism of the "Auto-LDO" can have the smooth and fast transition without overshoot in the startup and POS Power-On-Sequence. A Green Energy Smart Window Wireless Window 5R System W5RS further comprises a overshootless LDO. It has the brake module to deliver overshootless output power during the startup process. As a summary, the overshootless LDO has an error amplifier. The error amplifier has the steering wheel function module and voltage divider. The voltage divider divides the output voltage to generate a feedback voltage $V_{FB}$. The error amplifier has a reference voltage $V_{BG}$ and the feedback voltage $V_{FB}$ been connected as inputs. As the feedback voltage $V_{FB}$ is less than the reference voltage $V_{BG}$, a switch MOS connects the reference voltage $V_{BG}$ input with feedback voltage $V_{FB}$ input. There are two orthogonal conjugated accelerator modules. The accelerator modulates the biasing current in the error amplifier. As the feedback voltage $V_{FB}$ is not equal to reference voltage $V_{BG}$, we increase the bandwidth of the error amplifier to speedup the error amplifier. FIG. 26H is the alternative design with trans-impedance cascade amplifier. The trans-impedance cascade amplifier can reduce the ripples of digital circuit to be rippleless LDO.

FIG. 27 shows how the Noise Isolation Technology is applied to the conventional chip to serve as IP with the wrapper structure. FIG. 27A is the general Noise Isolation Technology architecture. FIG. 27B is the general mixed-signal type chip which integrates all the RF/AF/Analog with Digital/FPGA. As shown in FIG. 15A. FIG. 15B. FIG. 18E and FIG. 26E. FIG. 27C is the wrapper structure of the IP of the current regulator. It wraps around the mixed-signal type chip.

FIG. 28 shows the details of the general mixed-signal chip. It illustrates the state of art of semiconductor industry. A|D represents analog to digital conversion A/D and/or digital to analog conversion D/A. S|P represents serial to parallel conversion S/P and/or parallel to serial conversion P/S. The FPGA has merged the logic, Digital Signal Processor DSP, the Serial/Parallel and Parallel/Serial two-way Conversions S|P together. The Radio Front RF. Analog Front AF, the Analog to Digital Conversion (ADC) and Digital to Analog Conversion (DAC) A|D are excluded due to the substrate noise. As shown in FIG. 28B, it is the A|D overlapping waveform of the analog input and digital output. As shown in FIG. 28C, it is the logic signal of the S|P in the analog wave form. The AD signal steps are much smaller than the S|P logic signal. The small A|D signal steps make the A|D is much more susceptible to the substrate noise. The FPGA has a lot digital circuit and injects a lot of switching noise into the substrate. Even worse, the higher frequency is, the higher slew rate is, the larger switching noise is, the poorer the circuit performance is. The substrate switching noise forbids the integration of the high speed and high performance A|D. So, today the FPGA only can integrate the S|P and low speed and low performance ADC. Even for the low performance ADC, the embedded controller still needs to shut down all the digital circuit during the ADC operation.

For the signal path, after A|D, it is the DSP. For the logic path, after S|P, it is the combinatory logic. As shown in FIG. 28A, today FPGA only can integrate DSP, S|P and Logic circuit. As shown in FIG. 29A, with our novel Noise Isolation Technology, the A|D of ADC and DAC can be integrated into FPGA. FIG. 29B shows the Noise Isolation Technology is the platform to integrate the A|D, S|P, FPGA, DSP and Logic all together.

A Green Energy Smart Window comprises the field programmable gate array FPGA, the ADC and DAC conversion between analog and digital. The Green Energy Smart Window integrates the FPGA, the ADC and DAC on the platform made of noise isolation technology to be field programmable system on chip FPSOC. Furthermore, as shown in FIG. 30A, with our noise isolation technology, the RF and AF are all integrated into one single chip FPSOC. As shown in FIG. 30B, the Noise Isolation Technology is the platform for the FPSOC. Both the ADC and the LC resonator of the Xtaless Clock are very sensitive to the substrate noise.

The Green Energy Smart Window comprises the digital signal processing DSP and the application specific integrated circuit ASIC. The ASIC can be the combinatory integration of the radio front RF, analog front AF, analog and mixed signal, etc. The Green Energy Smart Window integrates the ASIC with DSP on the platform made of the noise isolation technology to be field programmable system on chip FPSOC. This DSP can be the portion of FPGA. The ASIC is integrated with FPGA. The green technology integration system comprises microprocessor and the application specific integrated circuit ASIC. The Green Energy Smart Window integrates the ASIC and microprocessor to be the field programmable system on chip FPSOC. This microprocessor can be the portion of FPGA that the ASIC is integrated with FPGA, too.

As shown in FIG. 15A. FIG. 15B, FIG. 18E, FIG. 26E, FIG. 27C, FIG. 30A and FIG. 30B, the Green Energy Smart Window has the noise isolation to be the platform. The noise isolation serves as wrapper to integrate the versatile combinations of application specific integrated circuit ASIC, field programmable gate array FPGA, conversion between analog and digital, digital signal processing DSP, microprocessor, RF/AF/Analog circuit and digital circuit to be the field programmable system on chip FPSOC. With FPSOC being embedded in the frame of IGU, the smart window has the clear view without any blockage as the conventional IGU does.

In summary of the above discussion of the Noise Isolation Technology, as shown in FIG. 15A, the green energy system comprises the noise isolation technology. The green energy system comprises the power node $V_{CC}$, ground node Gnd, RF/AF/analog circuit, digital circuit. The analog circuit connects between the power node $V_{CC}$ and ground node $V_{SS}$. A noise energy storage capacitor Cchip_noise_storage connects between the power node $V_{DD}$ of digital circuit and a ground node $V_{SS}$ of said digital circuit. The noise isolation technology NIT comprises a P-type noise isolation circuit having P type current regulator PCR connecting between the power node $V_{CC}$ of the green energy system and the power node $V_{DD}$ of the digital circuit. The ground node of the green energy system $V_{SS}$ being connected to the ground node of the digital circuit. The noise energy is stored in the noise energy storage capacitor Cchip_noise_storage at the power node $V_{DD}$ of the digital circuit. From the power node $V_{CC}$ of the green energy system to the power node $V_{DD}$ of the digital circuit means, a regulated current of Iavg of the P type current regulator is supplied to the digital circuit through the power node $V_{DD}$ of the digital circuit. The regulated current Iavg is regulated with the switch voltage $V_P$ between the $V_{CC}$ power node of the green energy system and the PMOS switch of the P type current current regulator. The switch voltage $V_P$ is generated with the average of voltage $V_{DD}$ of the power node of the digital circuit to maintain the pre-designed voltage level of the power node $V_{DD}$ of the digital circuit at a proper digital circuit voltage operation level.

As shown in FIG. 25A, the green energy system comprises noise isolation technology NIT having the N-type noise isolation circuit with the N type current regulator connecting between the ground node $V_{SS}$ of the green energy system and the ground node Vout of the digital circuit. The power node Vcc of the green energy system is connected to the power node $V_{DD}$ of the digital circuit. The noise energy is stored in the noise energy storage capacitor Cchip_noise_storage at the ground node Vout of the digital circuit. From the ground node $V_{SS}$ of the green energy system to the ground node Vout of the digital circuit means, the regulated current Iavg of the N type current regulator is drained from the digital circuit through the ground node Vout of the digital circuit means. The regulated current is regulated with the switch voltage $V_N$ between the ground node $V_{SS}$ of the green energy system and the NMOS switch of the N type current current regulator. The switch voltage $V_N$ is generated with the average of voltage Vout of the power node of the digital circuit to maintain a pre-designed voltage level of the ground node of the digital circuit at the proper digital circuit voltage operation level.

Figure 31A:
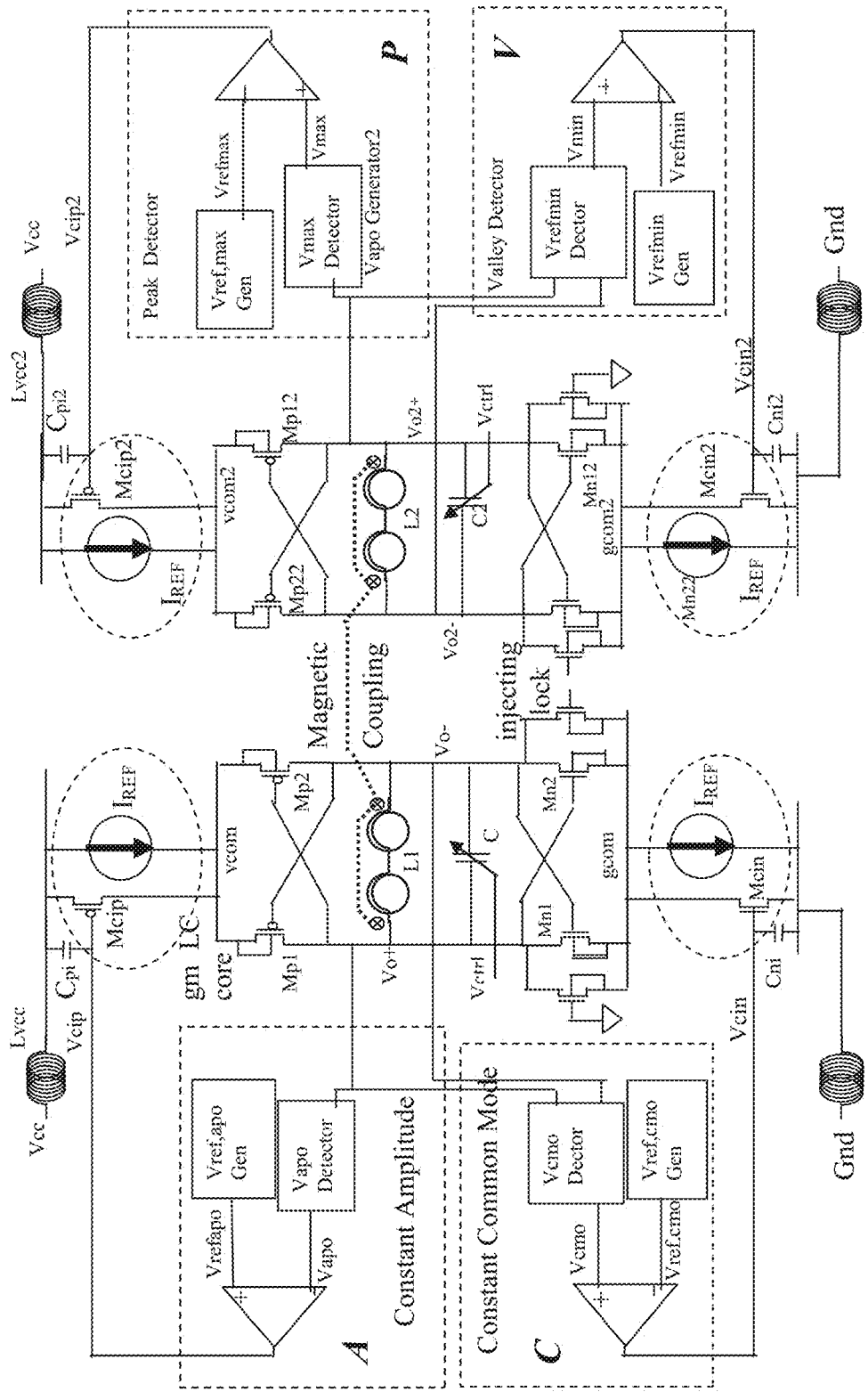
FIG. 31A is the Xtaless Clock circuit with the embedded Noise Isolation Technology: the embedded Noise Isolation Technology is implemented as shown in FIG. 30A.

As shown in FIG. 14G and FIG. 31A, the Xtaless oscillator adopts the embedded Hybrid Current Regulator Noise Isolation technology. As shown in FIG. 31A, the xtaless clock adopts the combination of the FIG. 14G and FIG. 25B with the magnetic enhanced coupled inductor as shown in FIG. 31I and FIG. 31J. Furthermore, as shown in FIG. 24C, the LC resonator of the Xtaless Clock uses the Hybrid current regulators at both the power and ground layer to have the highest quality noise isolation. As shown in FIG. 31A, FIG. 31Q1 and FIG. 31Q2, the P-device and N-device marked with the dotted circle are corresponding to the P-type current regulator PCR and the N-type current regulator NCR. As shown in FIG. 15A, the LC resonator of the Xtaless Clock is located in the RF/AF/Analog Circuit region to the embedded Hybrid current generator Noise Isolation Technology as shown in FIG. 31A.

As shown in FIG. 31K, the fundamental principle of the LCO equation is $$f(t)=V_{REF}+A_{REF}\sin(\omega t)$$

In other words, to have the high accurate clock, it must have the control parameters ($\omega$, $A_{RF}$, $V_{REF}$) to control the LCO. The conventional LCO has only L and C to control the oscillatory frequency. It doesn't have the control of $A_{REF}$ and $V_{REF}$. It generates a lot problems of jitter and phase noises. Therefore, as shown in FIG. 31A and FIG. 31K, the P-device of the hybrid current regulator is controlled by the amplitude control or maximum voltage control; the N-device of the hybrid current regulator is controlled by the common mode control or the minimum voltage control.

Furthermore, $$V_{REF}=(V_{PEAK}+V_{VALLEY})/2$$

$$A_{REF}=(V_{PEAK}-V_{VALLEY})/2$$

Therefore, as shown in the left side FIG. 31A, the system of the combination of constant peak voltage feedback control and the constant valley voltage feedback control is the same as the combination of constant peak voltage feedback control and the constant valley voltage feedback control as shown in the right side FIG. 31A.

The modulation has the innovation of modulation from the amplitude modulation AM to frequency modulation FM. Similarly, the oscillator has the innovation of control from frequency control FC to amplitude control AC.

Modulation innovation: AM=>FM
Oscillator innovation: FC=>AC

Furthermore, we make the unified approach to generalize the passive circuit to be the active circuit as follow passive circuit; $Q=E(L,C)/R_{dissipative}$
Damping Curve RC decaying envelop⇔Q
active circuit; $Q=E(L,C)/[R_{dissipative}+(-R)]^{1/2} I^2$
Virtual Damping RC decaying envelop⇔Q Constant Amplitude Control will boost-up the Q as follows.

$(-R)>R_{dissipative}$: amplitude/voltage envelop exponential grow
$(-R)<R_{dissipative}$: amplitude/voltage envelop exponential decay
$(-R)=R_{dissipative}$: amplitude/voltage envelop=const
$-R$: gain of circuit
$Q=E(L,C)/\{[(R_{dissipative}+(-R)]^{1/2}I^2\}=E(L,C)/0=\infty$
Constant Common Mode Control boost-up the Q
gain=f(operating point) $f(V_{baseline})$
As the baseline wandering, the gain changes as $R(t)!=$constant
$R_{dissipative}-R(t)!=0$
$Q=E(L,C)/\{[R_{dissipative}+(-R)]^{1/2}I^2\}!=E(L,C)/0!=\infty$
We need to have both Constant Amplitude Control and Constant Common Mode Control at the same time to guarantee to have $R(t)=$constant$=R_{dissipative}$ and $Q=\infty$
Constant Amplitude Control and Constant Common Mode Control
=>$R_{dissipative}=C(-R)$
=>$Q=\infty$ LC oscillator has the gain to oscillate. It also finds the active circuit has larger Q than the passive circuit. However, is not necessary to have the perfect matching of $-R(t)=R_{dissipative}$ all the time.

Due to the relation of $R_{dissipative}+(-R)<R_{dissipative}$ the active circuit has larger Q than the passive circuit. However, Q!=$\infty$. To have the perfect matching of $-R(t)=R_{dissipative}$ all the time to have Q=$\infty$ all the time. As shown in FIG. 31E1 and FIG. 31E2, we especially mention the Constant Amplitude Control and Constant Common Mode Control to be the gain-boost Q.

Furthermore, as shown in FIG. 31A, FIG. 31I and FIG. 31J, the inductor is the magnetic enhanced ME-LCO. The magnetic enhanced ME-LCO has magnetic enhanced inductor MEL. As shown in FIG. 31A, there are the magnetic coupling between two LCOs. Being similar to the electronic inject locking to increase the Q of LC oscillation, the magnetic coupling together between the two LCOs is to have magnetic inject locking to increase Q of LC oscillation.

As shown in FIG. 31G1, it is the global innovation history of the Xtaless Clock Chip. As shown in FIG. 31G2, it is the route map for the Xtaless Clock Chip, m Xtaless Clock is to replace Xtal Oscillator. As shown in FIG. 31G1, the Xtaless Technology actually came from UC Berkeley and developed by Dr. Min Ming Tarbg in 1980. As shown in FIG. 31K, FIG. 31L1 and FIG. 31L2, all the final f curves show the bandgap variation characteristics.

As shown in FIG. 31G2, the customer, Broadcom, requests the clock to have <20 ppm. The object of the Xtaless Clock is to replace the high-end Xtal Oscillator. It has to be the complete set of ultra-high-Q Xtaless LCO XLXO technologies.

As shown in FIG. 31E1 and FIG. 31E2, LCO itself is the switching noise generator and causing baseline wandering.

As shown FIG. 31F1, FIG. 31F2 and FIG. 31F3, they show Spectra Re-Growth. The Spectra Re-Growth is NOT always causes jitter. So, we need to separate the Waveform-Shaping Spectra Re-Growth and Jitter Noise Spectra Re-Growth.

In the RFIC design, we need to consider the Waveform-Shaping Spectra Re-Growth. However, in the Clock design, we cares Jitter Noise Spectra Re-Growth. So, it is wrong to use the PLL for RF Spectra Re-Growth to be the clock Jitter Noise Spectra Re-Growth. As shown in FIG. 31F 1, under the current Injection of the Active Device, the Sinusoidal Oscillatory Wave is not the idealized sinusoidal wave. There is the spectra-growth. However, for the periodic wave, it will not cause the Jitter. As shown in FIG. 31F2 and FIG. 31F3, for the extreme case, both the xtal type output waveforms have the same jitter, however, the spectra is completely different. It implies the failure of the current spectra approach and the success of our Jitter approach with the modified spectra.

Figure 31B:
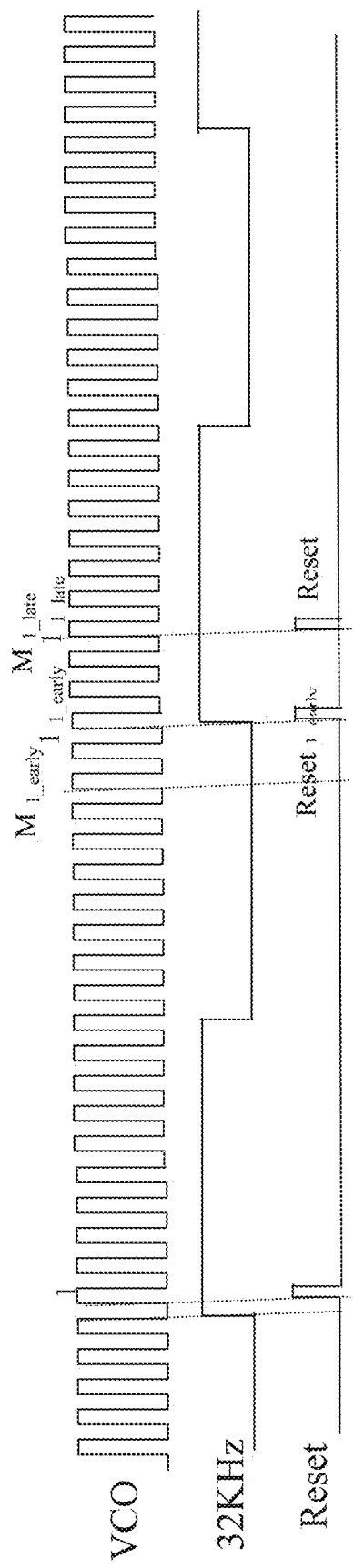
FIG. 31B the timing diagram of the Rippleless Fast lock FPLL.
Figure 31C:
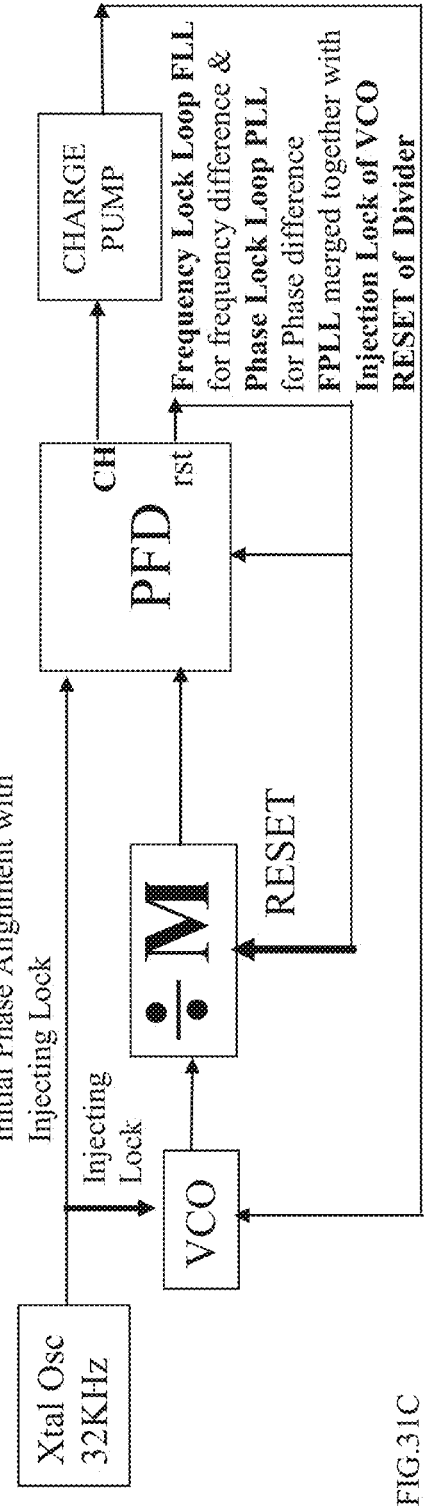
FIG. 31C is the block diagram of the Rippleless Fast lock FPLL.
Figure 31D:
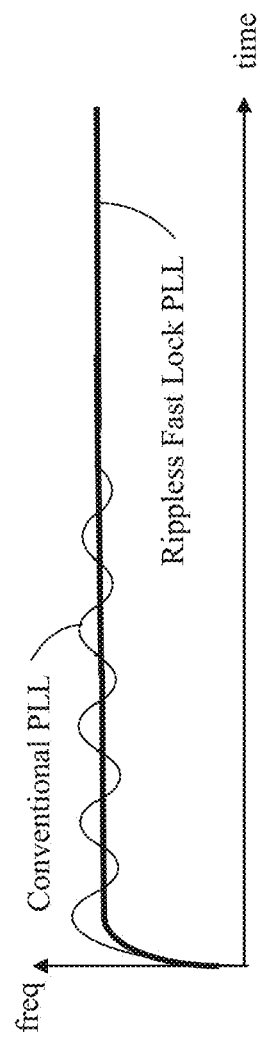
FIG. 31D is the comparison between the conventional PLL and the Rippleless Fast lock FPLL.

As shown in FIG. 31B, FIG. 31C and FIG. 31D, the Wireless Window 5R System W5RS further comprises the Rippleless Fast Locked frequency phase lock loop FPLL. The Rippleless Fast Locked frequency phase lock loop FPLL comprises a clock-divider to divide clock and the phase frequency detector PFD. The PFD generates the reset signal. As shown in FIG. 31C, it is the merge of Frequency Lock Loop and the Phase Lock Loop with injection of VCO/LCO and the RESET of Divider. The reset signal resets the clock divider after the reset signal being generated by the phase frequency detector PFD. To make the phase alignment, the Initial Phase Alignment is done with Injecting Lock of VCO/LCO. The Rippleless Fast Locked frequency phase lock loop FPLL has (1) the frequency lock mechanism embedded in the divider; and (2) the phase lock mechanism embedded in the PFD.

To have the multimedia window, the Optical Fiber SerDes night be adopted. The transimpedance amplifier TIA is the key issue of the Optical Fiber SerDes. Now, the bit rate is 100 Gb/s for one channel. In the next generation, it will target for 150 Gb/s. As shown in FIG. 31H, the differential amplifier is the core of the proposed transimpedance amplifier TIA architecture for 150 Gb/s. The differential TIA has the negative feedback network and ME-RGC magnetic enhanced regulate cascade input to achieve enhanced bandwidth. To achieve wide-band response shunt-series peaking inductors $T_{L2}$ and $T_{B2}$ are incorporated in the architecture. The peaking inductors can increase the bandwidth up to 10 times the uncompensated bandwidth by forming a ME-RTRN magnetic enhanced reverse triple resonant network. To improve the bandwidth, a capacitive degeneration network, RS-CS is employed to introduce additional peaking in the frequency response. The magnetic enhanced regulated cascade (ME-RGC) is used for broadband TIA design in high-speed optical communication. The ME-RGC network is inserted between the inputs of differential amplifier and photodiode to attain wide band response. ME-RGC is a common gate amplifier with a local feedback. The transistor $M_2$ with resistor $R_2$ forms the local feedback of RGC amplifier. Local feedback acts as a common source amplifier which gets a small portion of input signal and creates a voltage at the gate of $M_1$. This signal is amplified at the output of $M_1$. Moreover, it increases the effective transconductance of common gate structure which reduces the input resistance. Reduction in input resistance isolates the input pole associated with large parasitic capacitance Cpd from the bandwidth determination. As a result, the dominant pole of ME-TIA magnetic enhanced transimpedance amplifier is located within the amplifier rather than at the input node. To increase the bandwidth more, shunt peaking magnetic enhanced inductor $T_{L1}$ and series peaking inductor $L_{S1}$ are also incorporated in the ME-RGC structure. The negative feedback network formed by transistor $M_4$ is implemented for bandwidth enhancement. Feedback network increases the bandwidth by splitting the poles with stagger bandwidth tuning.

As shown in FIG. 31I, the magnetic enhanced circuit is implemented with the couple of the transformer type inductors. The dotted line is the magnetic coupling between the two inductors. As shown in FIG. 31J, the magnetic enhanced circuit has the magnetic conduction loop between the transformer type inductors. The circled cross symbol represents the magnetic couple between two inductors having the magnetic flux connection between two coupled inductors.

As shown in FIG. 31L1, the conventional bandgap generator has the $V_{BG}$ generator only. It has the linear curvature compensation to have $(\Delta V_{BG}/V_{BG})$ to be 12 ppm. It cannot meet the requirement for the high performance Xtaless Clock having Δf/f to be 25 ppm. Furthermore, on the chip, the resistor R has the temperature variance about 6%, 60000 ppm. However, the linear curvature compensation of bandgap current $(\Delta I_{BG}/I_{BG})$ needs to be 6 ppm only. Therefore, we cannot get $I_{BG}$ with the division of $(V_{BG}/R)$.

As shown in FIG. 31K, the Xtaless clock comprises the Bandgap Generator and the LCO. The Bandgap Generator has both the Bandgap Voltage $V_{BG}$ Generator and the Bandgap Current $I_{BG}$ Generator. The $V_{BG}$ Generator has the output bandgap voltage $V_{BG}$ feeding into the $I_{BG}$ Generator, the $I_{BG}$ Generator has the output bandgap current $I_{BG}$ feeding into the $V_{BG}$ Generator. The BG bandgap generator comprises of a coupling pair $(V_{BG}, I_{BG})$. It is noted that $V_{BG}$ is coupled with $I_{BG}$ to generate the bandgap references $(V_{BG}, I_{BG})$. Theoretically, with $I_{BG}$=constant, then we can have $V_{BG}$=constant. Due to the non-ideal situations in the real world, with the coupling pair $(V_{BG}, I_{BG})$, as shown in FIG. 31L2, the BG bandgap generator can generate the $V_{BG}$ having the variance of $(\Delta V_{BG}/V_{BG})$ to be 1 ppm and the $I_{BG}$ having the variance of $(\Delta I_{BG}/I_{BG})$ to be 6 ppm.

The $V_{BG}$ generator has the $V_{BG}$, $V_{PTAT}$ and $I_{PTAT}$ to be output. As shown in FIG. 31M, the $I_{BG}$ generator has the inputs of $V_{BG}$, $V_{PTAT}$ and $I_{PTAT}$. The coefficients a, b, c, d are the parameters. The on-chip resistor R has the temperature dependent coefficients, R=Ro+bT+cT². With the $(a*V_{PTAT}/R)$ cancelling the bT effect of R, the output current has much smaller nonlinearity left in the output current. With the summation of $(d*I_{PTAT}/R)$ and $I_{CTAT}$, we can get $I_{BG}$.

As shown in FIG. 31N1 and FIG. 31N2, the bandgap current $I_{BG}$ is fed back to the $V_{BG}$ Generator Core. Theoretically, with $I_{BG}$=constant, we can have $V_{BG}$=constant. However, due to the no ideality of $I_{BG}$, as shown in FIG. 31L2, with the $I_{BG}$ generator we can get $I_{BG}$ having $(\Delta I_{BG}, I_{BG})$ to be 6 ppm over the PVT corners with temperature varying from −40° C. to 125° C. Accordingly, we can get $V_{BG}$ having $(\Delta V_{BG}/V_{BG})$ to be 1 ppm over the PVT corners with temperature varying from −40° C. to 125° C. To have the extra performance of $(\Delta V_{BG}/V_{BG})$ to be 1 ppm, it is noted that the bandgap current $I_{BG}$ generator cannot be merged with bandgap voltage $V_{BG}$ Generator. The bandgap current $I_{BG}$ generator and the bandgap voltage $V_{BG}$ Generator have to be treated to be separate blocks and constructed to be a feedback system. Furthermore, as shown in FIG. 31N1, it is noted that the nonlinear compensation is to compensate the nonlinearity of the bipolar device directly, therefore, the connections of $R_{NL1}$ and $R_{NL2}$ are needed to connected to the emitters of the bipolar devices directly. This nonsymmetrical circuit of the bandgap voltage $V_{BG}$ Generator, it makes the bandgap current $I_{BG}$ generator and the bandgap voltage $V_{BG}$ Generator have to be treated to be separate blocks and constructed to be a feedback system. Therefore, with the bandgap generator feedback system approach, our bandgap generator can have the extra performance of $V_{BG}$ having ($\Delta V_{BG}/V_{BG}$) to be 1 ppm over the PVT corners with temperature varying from −40° C. to 125° C. On the contrary, having no system concept with the wrong approach of the merge of bandgap voltage and bandgap current circuits, the ($\Delta V_{BG}/V_{BG}$) to be 5 ppm over the PVT corners with temperature varying from 0° C. to 80° C. It cannot be adopted in the high performance xtaless clock.

As shown in FIG. 31K, the complete set description of the sinusoidal oscillation for the xtaless clock is $$f(t)=V_{ref}+A_{ref}\sin(\omega t).$$

Therefore, the LC oscillator has three dominating factors ($\omega$, $A_{REF}$, $V_{REF}$).

For $V_{REF}$=constant, we adopt the Common Mode $V_R$ Feedback.

For $A_{REF}$=constant, we adopt the Constant Amplitude $A_{ref}$ Feedback.

The clock generator is to have the $\omega$=constant, $A_{REF}$=constant and $V_{REF}$=constant. As shown in FIG. 31A and FIG. 31K, the xtaless clock comprises (1) the common-mode-constant-amplitude CMCA LC oscillator; and (2) the bandgap coupling pair ($V_{BG}$, $I_{BG}$) BG bandgap generator.

As shown in FIG. 31K, the Xtaless Clock is constituted of the CMCA-LC Oscillator and VI-BG Generator. The xtaless clock has ($\Delta f/f$) to be less than 25 ppm over all the PVT corners with temperature varying from −40° C. to 125° C. Due to the layout area constraint, the LCO has the defect of narrow frequency range. To have the wide frequency range, as shown in FIG. 31O, the clock buffer has the programmable dividers 2/3/4 that the LCO can operate at high frequency to have smaller layout area.

For the low power and low frequency clock, the Xtaless clock is made of the RC oscillator and the coupling pair ($V_{BG}$, $I_{BG}$) BG bandgap generator. As shown in FIG. 31K and FIG. 31P, the RCO type Xtaless Clock uses the $V_{BG}$ and $I_{BG}$ as the reference inputs. As shown in FIG. 31A. FIG. 31N and FIG. 31P, for the high performance timing products such as clock generator, the current buffer is made of the high accurate current minor as shown in FIG. 31Q1 and FIG. 31Q2. With the high gain amplifier to equalize the $V_D$s voltage, the reference MOS and the mirrored MOS has exactly the same $V_{GS}$ and $V_{DS}$ that the current mirror has very accurate value.

Figure 32A:
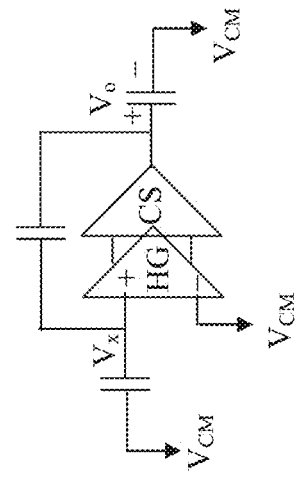
FIG. 32A is the MDAC of the conventional pipeline ADC.

As shown in FIG. 32A, it is the conventional OPAMP embedded in the Multiplying DAC, MDAC of ADC. The high-speed and high-performance ADC converter adopts the pipeline architecture. The MDAC is the analog circuit which consumes a lot of power and determines the speed of the conversion. The key issue is to increase the conversion speed at the high resolution and reduce the power consumption. These are conflict goals. The solution is the dynamic switching type analog circuit.

Figure 32B:
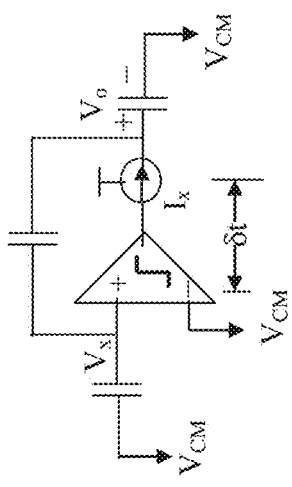
FIG. 32B is the MDAC of the comparator based ADC.
Figure 32C:
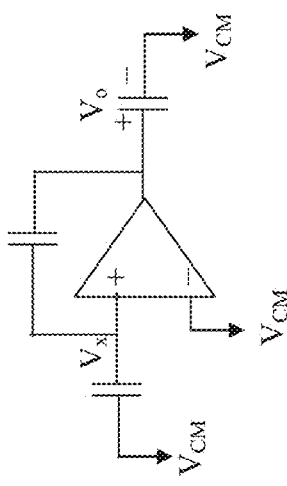
FIG. 32C is the MDAC of the super-drive ADC.

There are A type OPAMP and AB type OPAMP. At the steady state, they both consume DC current. The biasing current serves as both the switching current and biasing current. They treat the OPAMP as a whole circuit. As shown in FIG. 32B, at beginning, the Vx is the slew rate to approach $V_{CM}$. Finally, it is the RC delay of $C/g_m$ for Vx to approach $V_{CM}$ where $g_m$ is the gain of the small signal. As shown in FIG. 32B, it is the comparator in the MDAC. There is a constant current source which is corresponding to the slew rate of the OPAMP in the conventional MDAC. It is just to eliminate the RC delay of C/gm with the constant current source which is the duplicate of the biasing current. However, it is at the cost of losing the accuracy. There is the comparator switching delay which causes the inaccuracy of the Vx. Even with the delay compensation techniques for the deviation c, this inaccuracy is still uncertain. It is impossible to have the accuracy, $Vx=V_{CM}$.

Figure 32D:
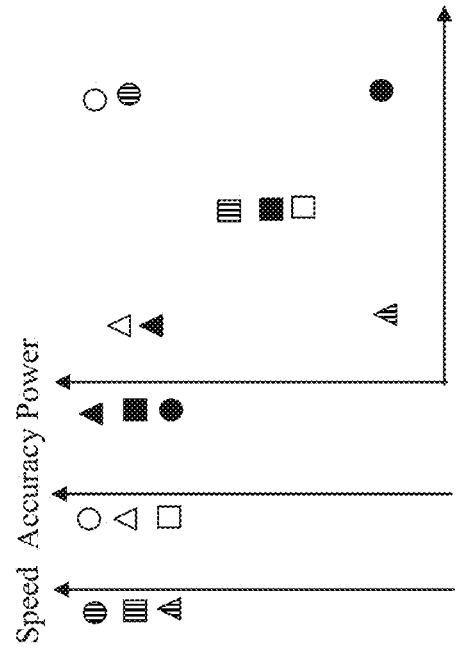
FIG. 32D is the comparison of speed of the super-drive ADC with the conventional ADC and the comparator based ADC.
Figure 32E:
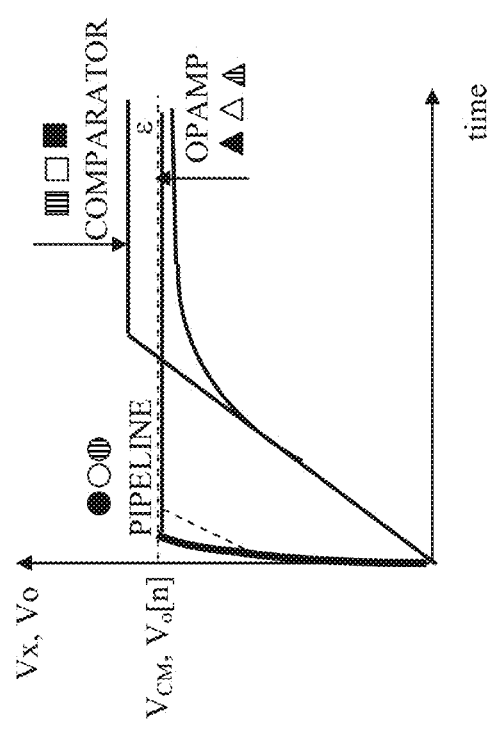
FIG. 32E is the comparison of speed, accuracy and power of the super-drive ADC with the conventional ADC and the comparator based ADC.
Figure 32F:
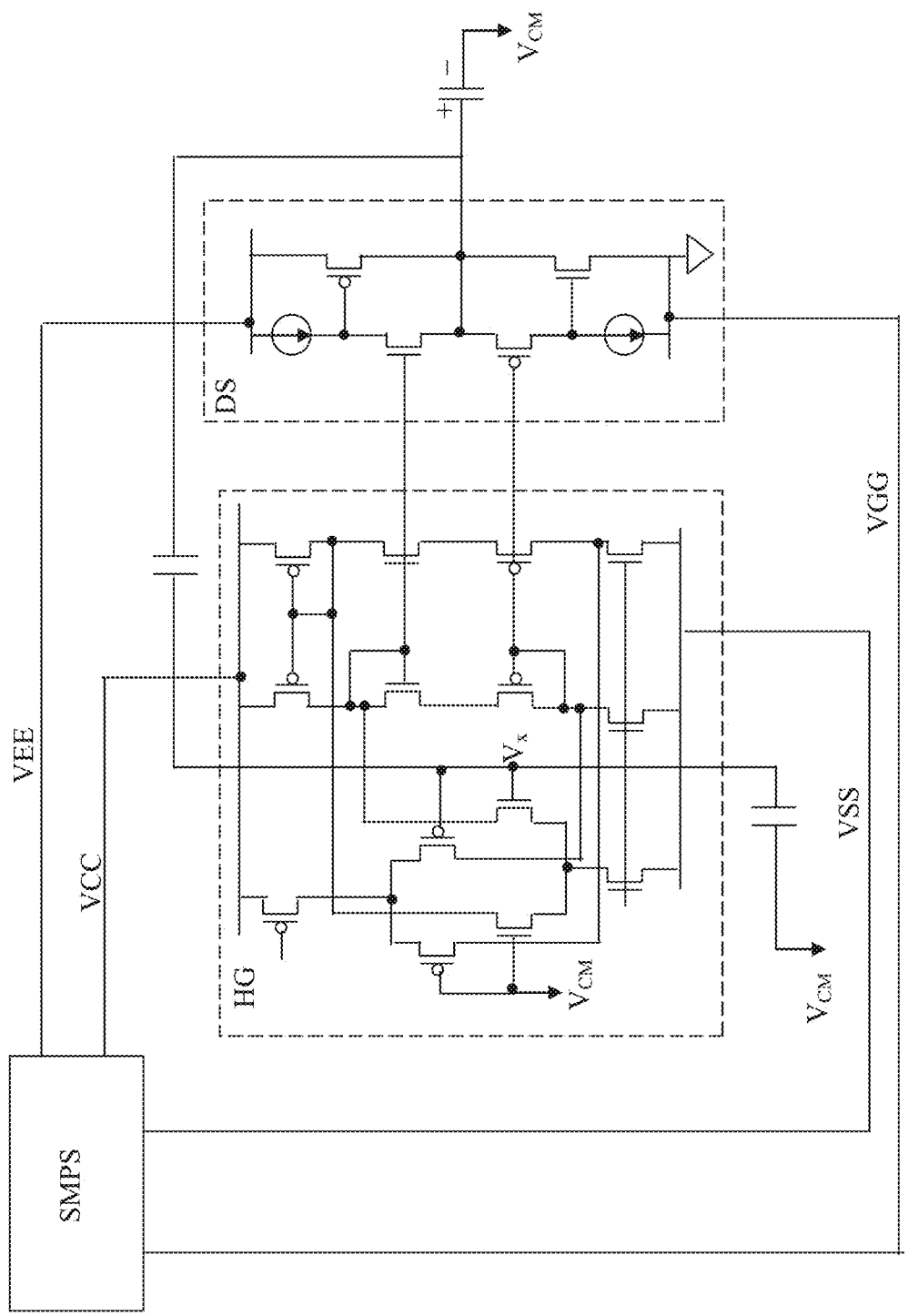
FIG. 32F is the schematics of the MDAC of the super-drive ADC where MDAC is multiplying digital-to-analog converter. It is the performance comparison among the super-drive ADC, the conventional ADC and the comparator based ADC.

The FPGA having the Low power pipeline ADC with pipeline buffer will enable the merge the industrial ASIC with FPGA to be the green technology FPSOC. As shown in FIG. 32C and FIG. 32F, the pipeline OPAMP adopts the dynamic switch technique in both High Gain HG OPAMP stage and Clamping Switch CS output stage. Referring to FIG. 32F, the green technology integration system comprises the pipeline buffer ADC. The pipeline buffer ADC is constituted of the high gain operational amplifier stage and dynamic switching output stage. The Dynamic Clamping Switch DS OUTPUT has the digital switching effect to drain a large amount current. So, the slew rate of the pipeline OPAMP is dynamic and is not limited by the biasing current. As shown in FIG. 32D, the dynamic switch of the pipeline OPAMP has the much higher slew rate due to the dynamic switch of the DS output stage. At the small signal stage, due to the clamping mechanism having much higher gain, the settling time is much faster and having the highest accuracy. FIG. 32E is the MDAC comparison result of the pipeline OPAMP, the comparator and the conventional OPAMP. The MDAC made of the pipeline OPAMP has the highest speed, highest accuracy and the least power.

Figures 33A, 33B:
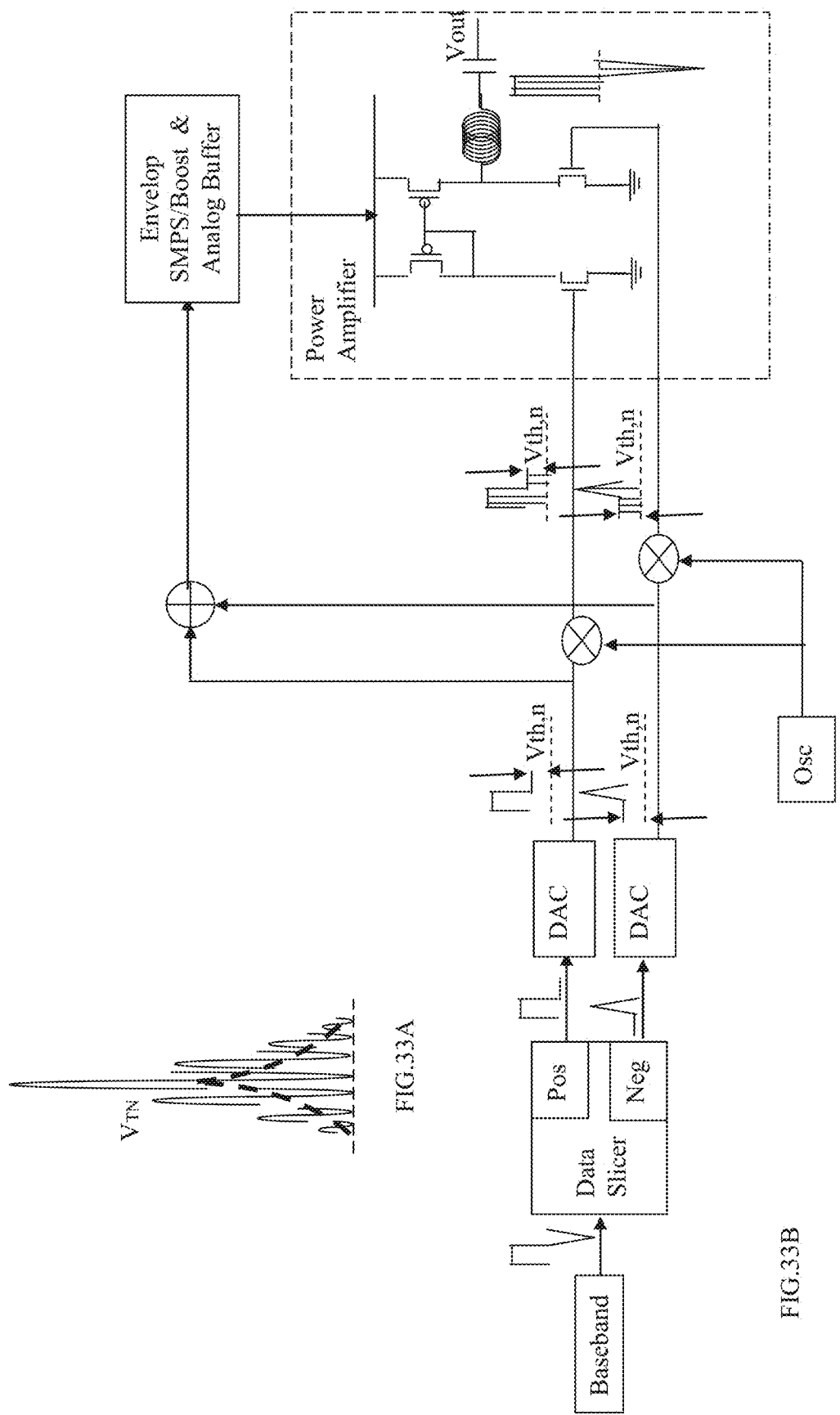
FIG. 33A is the waveform of the high PAR signals.
FIG. 33B is the RF system having the high power efficiency Power Amplifier.
Figure 33C:
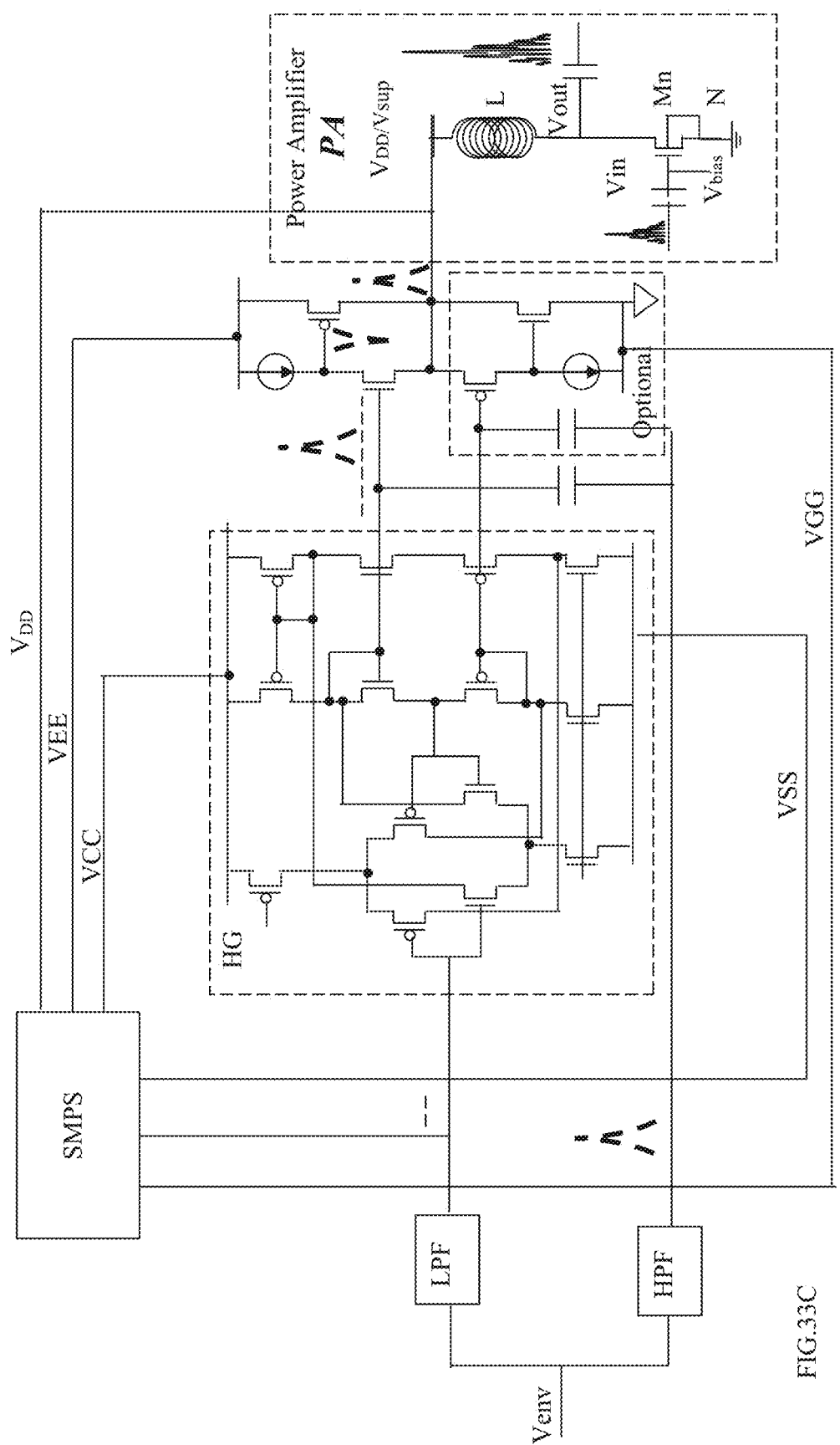
FIG. 33C is the circuit of the low power ultra-fast dynamic power supply for the power amplifier having the high power efficiency and low power operation.

As shown in FIG. 1A, there is the need for the wireless connection for the Green Energy Smart Window. The most power consumption for the high Peak-Average-Ratio PAR wireless signal in FIG. 33A is the power amplifier. We need to use the dynamic power supply to reduce the power consumption of the power amplifier. A green technology integrated system comprising RF Power Amplifier dynamic power supply. The RF Power Amplifier dynamic power supply has boost converter and Low Drop Voltage Regulator LDVR type analog buffer power supply. Referring to FIG. 33C, the green technology integration system comprises the RF Power Amplifier dynamic power supply. The RF Power Amplifier dynamic power supply has the Low Drop Voltage Regulator LDVR type analog buffer power supply.

The Green Energy Smart Window 5R System W5RS further comprises a high-power-efficiency conjugated power amplifier. The conjugated power amplifier takes analog signals of positive sliced data and negative sliced data to operate at amplifier B mode and/or amplifier C mode. As shown in FIG. 33B, the baseband generates the data to be transmitted by the power amplifier. The data slicer slices the transmitted data to be the positive and negative data streams. The DACs converts the positive and negative data streams to be the analog signal with the voltage level shift of Vth.n. The oscillator generates the high frequency carrier signals to carry the baseband analog signals to be the RF signal having the zero signal level to be Vth,n. Then the positive and negative modulated RF signals are fed into the dual conjugated power amplifier which is operated between the modes of amplifier B and amplifier C with the fidelity of class A. Class-A is exceptionally linear, and forms the basis of many more complex circuits. Class B has a maximum theoretical efficiency of π/4, (i.e. 78.5%). Therefore, as shown in FIG. 33B and FIG. 33C, the W5RS Green Energy Smart Window 5R system has the dual conjugated power amplifier with the envelop tracing power supply. The green energy smart_Window 5R System W5RS comprises a high-power-efficiency conjugated power amplifier system. The conjugated power amplifier takes analog signals of positive sliced data and negative sliced data to operate at amplifier B mode and amplifier C mode. The data stream coming from baseband is sliced to be positive sliced data and negative sliced data. Two separate DACs converting the positive sliced data and the negative sliced data to be two separate analog signals of positive sliced data and negative sliced data.

As shown in FIG. 33D, FIG. 33E and FIG. 33F, the Switch Mode Power Supply SMPS adopts the Adaptive Optimum Constant On Time AOCOT operation to have the best power efficiency. To be simple to explain, FIG. 33D is the output stage of buck converter. The same principles can be applied and extended to the other type SMPS. FIG. 33E shows the fundamental principle of the SMPS buck converter. The duty cycle is determined by the ratio of the voltage. Assume the input supply voltage is fixed, the duty is determined by the output voltage Vo only. The frequency is determined by the ripple amplitude ΔVo. To have the adaptive optimum operation, we use the equivalent relations.

$$Vo+=Vo+\Delta Vo/2$$

$$Vo-=Vo-\Delta Vo/2$$

Therefore, we might use Vo+ and Vo− to have the optimum operation. This is the voltage mode to control the switch voltage of the PMOS power supply charging device.

For the energy recycling operation of recycling NMOS device, as current $I_L=0$, the recycling NMOS will be shut off. As the switch out node VSW is zero, the current $I_L>0$, the NMOS device is turned on. This is the current mode for the NMOS power recycling device.

For the adaptive optimum constant on time operation AOCOT of SMPS, we use the hybrid operation of (1) the switch of PMOS with voltage mode control for switch voltage VP and (2) the switch of NMOS with current mode control for switch voltage VN. The constant on time COT is adaptive to the buck converter operation to have the optimum value automatically.

The green energy smart window is an Intelligent Graphic Unit IGU. The Intelligent Graphic Unit IGU further comprises battery, thin-film battery and/or electrochromic window and transparent solar window/panel. The transparent solar window/panel provides electricity to the battery, thin-film battery and/or electrochromic window to be the self-sustained IGU. As shown in FIG. 1M1, FIG. 1M2, FIG. 1N1, FIG. 1N2 and FIG. 1N3, the transparent Multimedia panel, Electrochromic panel and transparent Solar panel are the same size as the IGU window size. In other words, since the solar window/panel is transparent, the solar window/panel has the fill factor to be 100% to cover the whole frame of IGU. It can generate electricity supplying the smart window, the smart home and smart grid.

FIG. 34A is the cross section of the thin film battery and/or Electro-Chromic Window (EC Window). The thin film battery/EC window is made of five layers, Transparent Conductor (TC), Electro/chromic Electrode (EC). Ion Conductor (IC), Counter Electrode (CE) and Transparent Conductor (TC). As shown in FIG. 34A, being similar to the MOS and Bipolar devices, there are the hot-ion I. and break-down/reliability voltage problems for the EC window. The current-limited voltage ramping is the adaptive increment of voltage difference according to constant current/field. As shown in FIG. 34B, the constant current/field is the difference of the applying voltage and the built in potential of Cstore. Basically, there are two different operations of window controller. The first kind operation is the Current-Limited Voltage Ramping circuit. The second kind operation is the Voltage-Limited Current Charging circuit. The voltage limit and current limit are the function of temperature. In the real case, the operations are the versatile hybrid combinations of the above two basic operations.

The ion resistance $R_{jon}$ is function of the temperature. As shown in FIG. 34C, we can get the temperature of the EC window from the value of $R_{jon}(T)$ with the relations as follows.

$$Vw=I(t)R(T)+\Sigma I(t)/C$$

$$Vw1=I1(t)R(T)+\Sigma I(t)/C$$

$$Vw2=I2(t)R(T)+\Sigma I(t)/C$$

$$Vw2-Vw1=[I2(t)-I1(t)]R(T)$$

$$R(T)=(Vw2-Vw1)/[I2(t)-I1(t)]$$

$$I=Niv\ Ni\ E=Ni(Vw-\Sigma I(t)/C)/d_{ion}$$

$$I(t)=(Vw-\Sigma I(t)/C)/R(T)$$

$$R(T)=d_{ion}/Ni$$

The battery and/or EC window have the bi-stability as shown in FIG. 34D. The battery and/or EC window can operate as shown in FIG. 34E to reduce the leakage current.

FIG. 35A shows the switching operation of the battery and/or EC window. The voltage difference across the battery and/or EC window is (W+−W−). The voltage of the bleach might be different from the voltage of the color. There is polarity. To protect the battery and/or EC window, there are the voltage limit and the current limit. To avoid the current limit, in the switching from bleaching to the coloring and vice versa, there is the voltage ramping of the switch. As shown in FIG. 35A, the EC window switching time is the start of bleaching or coloring. The voltage starts to ramp up or down. The polarity switch is the time the ramping voltage across the zero voltage, W+=W−.

The thin film Battery/EC window has two limits, current limit and voltage limit. Due to the hot-ion effect, the speed limit of the ion is limited to the maximum ion speed. The hot-ion speed limit can be observed with the current-limit. The thin film battery/EC window can be thought as the battery. The voltage limit is the electrical field causing the reliability of the thin film battery/EC-window battery. As shown in FIG. 36, during the operations of the thin film battery/EC window, the voltage source or the current source are varying to keep both the voltage-limit and current limit. According to the switching operation in FIG. 35, the fundamental thin film batter/EC-window switching operation are classified to be six phases.

Phase 1 is the start or continue switching of coloring phase;
Phase 2 is the hold of the color;
Phase 3 is the start of discharge/bleach;
Phases 4 is the start or continue switching of discharging/bleaching phase;

Phase 5 is the hold of the discharge/bleach;

Phase 6 is the start of charging/coloring.

All the operations of the thin film battery/EC-window H-bridge switch are followed this fundamental switching principle. To protect the thin film battery/EC window, the power is current-limited and/or voltage-limited source depending on the operational requirements.

Furthermore, the H-Bridge Switch structure can be applied to have the different components. As shown in FIG. 37A1, it is the thin film battery/EC window driven by the analog buffer. It is the fundamental voltage ramping mode. From the electric model of the thin film batter/EC window, the thin film battery/EC window can be treated as the capacitor with the dissipative current source. Applying the H-Bridge structure to the capacitor of the thin film battery/EC window, the circuit of the H-Bridge with the analog buffer is shown as FIG. 37A2. The resistor is served as the current sensing. With the feedback of the current sensing, the circuit in FIG. 37A2 can be served as the current-limited voltage ramping.

The H-Bridge structure applying to the Switch Mode Power Supply has much more versatile novel structures. As shown in FIG. 37B1, it is the basic Buck converter. Applying the H-Bridge to the thin film battery/EC window, the current-limit window controller is as shown in FIG. 37B2. As shown in the FIG. 37C1, the H-Bridge structure is applied to the inductor, current-sensing resistor, capacitor and the battery/EC window. The corresponding current-limited window controller is shown as FIG. 37C2. Applying the H-Bridge to the whole buck converter as show in FIG. 37D1, the corresponding window controller is as shown in FIG. 37D2. In the H-Bridge, the MOS devices serve as not only the switches but also the switching gates of the buck converter, too.

There are different thin film battery/EC window controller algorithms of
(1) voltage-ramping,
(2) current-limited,
(3) current-limited voltage-ramping and
(4) voltage-ramping current-limited, etc.

We can apply the different H-Bridge window controller architectures in FIG. 37A2 to the different thin film battery/EC window controller algorithms.

FIG. 38C1 and FIG. 38C2 show the design platform having the implementations of the thin film battery/EC window controller. The buck converter is to convert the high voltage power supply to the low voltage power having the large current. There are many different ways to implement the thin film battery/EC controller. The green technology integrated Current-Limited Voltage Ramping mode having an analog buffer to drive the H-bridge switch, drive battery, thin-film battery and Electrochromic Window. The Voltage-Limited Current Charging mode further comprises a buck converter to drive a H-bridge switch a battery and/or Electrochromic Window. The Voltage-Limited Current Charging mode also can comprise H-bridge switching Buck Converter to drive battery, thin-film battery and Electrochromic Window. As shown in FIG. 38C1, the control input signals can be either current charging signal or the voltage ramping signal.

However, for the networking consideration, there is the need for the embedded controller. The embedded controller has the Pulse Width Modulation PWM signals. In the practical design, the thin film battery/EC window controller is designed with the embedded controller.

As shown in FIG. 38E1 and FIG. 38E2, the green energy smart window comprises Current-Limited Voltage Ramping circuit to charge a battery or switch battery/Electrochromic Window. As shown in FIG. 38F1 and FIG. 38F2, the green energy smart window comprises Voltage-Limited Current Charging circuit to charge a battery or switch battery and/or Electrochromic Window means.

As shown in FIG. 35B, there are the charging process and the discharging process. As the voltage increases from 0 to the voltage limit, it is the charging process. As the voltage decreases from the voltage limit to 0, it is the discharging process. The voltage limit for the tint/coloring is different from the voltage limit of the charge/discharge and/or transparent/bleach. The discharging process for the LDVR type single side pull up analog buffer can be done by the short of the thin film battery/EC window as shown in FIG. 36C and FIG. 36F. For the two-sided pull-up and pull-down analog buffer, the discharging process can be done by the pull-down of the analog buffer as shown in FIG. 36A and FIG. 36D by the short of the thin film battery/EC window as shown in FIG. 36C and FIG. 36F. For the SNIPS buck converter, there is no discharging mechanism. However, as the polarity changes, the voltage becomes the negative. It still can use the SNIPS to charge up in the discharging process as long as the voltage limit and the current limit is in the safe range. As shown in FIG. 35A and FIG. 35B, for the polarity switch, it can be applied to both voltage ramping and current charging methods. For the charge/discharge and color/bleach switch, it is applied to the current charging method only.

There are two major algorithms to switch the thin film battery charger/EC window controller, the current-limited voltage-ramping and the voltage-limited current-charging. As shown in FIG. 38C1, it is the charging process of the current-limited voltage-ramping; As shown in FIG. 38C2, it is the discharging process of the current-limited voltage-ramping. As shown in FIG. 38D, it is the charging process of the voltage-limited current-charging. As shown in FIG. 38D2, it is the discharging process of the voltage-limited current-charging. The current-limited voltage-ramping methodology is the conjugate of the voltage-limited current-charging. They are the general fundamental algorithms. They can be easily modified to fit for the different systems and architectures of the thin film battery charger/EC window controller.

As shown in FIG. 38C1, the voltage ramping up and the ramping rate is bounded by the constant current of current limit. The current is fed back to modify the voltage ramping up rate. The ramping voltage rate is reduced or increased for the ramping voltage. As shown in FIG. 38A2 and FIG. 38C1, for the embedded controller having the PWM signal to generate the voltage ramping signal, it can use the PWM signal to generate the voltage ramping signal. As shown in FIG. 38A2 and FIG. 38D1, for the current Switch battery/EC window controller, the current feedback is to adjust the PWM duty-cycle.

For the voltage ramping algorithm, as shown in FIG. 35C, the voltage ramping |W+−W−| signal is sent to the PWM generator. The RC filter filters out the digital switch and get the |W+−W−| analog signal. The |W+−W−| analog signal is sent to the analog buffer to generate the voltage ramping voltage source to drive the battery/EC window. As the voltage ramping voltage become zero, the polarity switch signals are generated to switch the H-Bridge. This is the feed forward system.

If the embedded controller uses the current-sensing resistor feedback current signal information to adjust the voltage ramping rate, it is the current-limited voltage ramping. Then it becomes the feed forward system with the addition of the feedback signal control. For the current limited algorithm, the duty-cycle signal is sent to the PWM generator to generate the corresponding PWM signal. The PWM signal is the switching signal of the Buck Converter type Switch Mode Power Supply SNIPS. The current-sensing resistor senses the current and feedback to the embedded controller to adjust the duty-cycle. This is the feedback system.

If the embedded controller uses the feedback signal of (W+−W−) voltage to adjust and enable/disable the PWM signal due to the maximum voltage limit allowance, it becomes the voltage-limited current charging. Then it becomes the current feedback system with the addition of the voltage feedback signal control. As shown in the upper-right portion in the FIG. 38C2, the green technology integration system is made of the Voltage-Limited Current Charging circuit. It further comprises a buck converter to drive a H-bridge switch structure to drive a thin film batter/Electrochromic Window.

As shown in FIG. 38A, it is the design mistake in the conventional of battery charger % electrochromatic window driver, etc. to use the unit gain amplifier as the driver. It causes (1) the overheat of the chip and board, (2) the wastes of power (3) no driving capability. As shown in FIG. 38B1, it is the combining switch mode power supply with analogy buffer having the input varying voltage capability. It is the buck regulator with analog output voltage having no ripple to be the radio-RF-Noiseless buck regulator.

As shown in FIG. 38B2, FIG. 38B3 and FIG. 38B4, comparing the conventional "SMPS & LDVR" with our unique "SMPS & Analog Buffer" and "SNIPS & LDVR type Analog Buffer", the conventional "SMPS & LDVR" has the constant voltage output with ripple. However, our unique "SMPS & Analog Buffer" and "SNIPS & LDVR type Analog Buffer" have the varying output voltage being equal to input voltage. The output voltage has no ripple to be the RF-Noiseless. The building block diagram of Analog Buffer is shown in FIG. 38B5. The detailed schematic of Analog Buffer is shown in FIG. 38B6.

There are versatile combinatory innovations of our innovations of SMPS, analog buffer, LDO type analog buffer and H-Bridge. As shown in FIG. 38B4, FIG. 38B7, FIG. 38C1 and FIG. 38C2, they show the architecture and system made of the SMPS/Buck Converter, analog buffer and H-Bridge. The Analog Buffer accepts the output voltage of SMPS/BUCK converter as input power supply. The Analog Buffer input is the dynamic varying "signal input" Vi. The Analog Buffer output is the output power having Vo=Vi.

As shown in FIG. 38B5. FIG. 38B6 and FIG. 38B7, the green energy system comprises a smart window unit for the smart home and smart grid wherein the power supply controller further comprises a smart battery charger to drive battery and the electrochromic window. The smart battery charger further comprises the switch mode power supply SMPS, low drop-offset LDO type analog buffer with an option of the addition of a H-Bridge for discharging. The switch mode power supply SMPS provides power to the low drop-offset LDO type analog buffer and the low drop-offset LDO type analog buffer provides power to the H-Bridge. The charging and discharging voltage signal is applied to the input of the analog buffer or LDO analog buffer. The switching mode power supply has the input connected to power node. The switching mode power supply has the output connected to the power node of the low drop-offset LDO type analog buffer to supply power to the low drop-offset LDO type analog buffer. The low drop-offset LDO type analog buffer has the output voltage being equal to the input voltage. The low drop-offset LDO type analog buffer has output connected to the input of the H-Bridge. The low drop-offset LDO type analog buffer is either analog buffer or the LDO analog buffer. The H-Bridge charging and discharging the battery and the electrochromic window with switches embedded in the H-Bridge. The low drop-offset LDO type analog buffer further provides the rippleless RF-Noiseless output power to the battery of the electrochromic window according to the specified input voltages of the low drop-offset LDO type analog buffer.

A Wireless Window 5R System W5RS comprises a smart battery charger to drive battery and electrochromic window. The smart battery charger comprises switch mode power supply SMPS, low drop-offset LDO type analog buffer with the option of the H-Bridge for discharging. The switch mode power supply SMPS provides power to the low drop-offset LDO type analog buffer. The low drop-offset LDO type analog buffer provides power to the H-Bridge. The low drop-offset LDO type analog buffer is either analog buffer or LDO analog buffer. The H-Bridge charges and discharges the battery and electrochromic window, etc. with switches embedded in the H-Bridge.

As shown in FIG. 38B4 and FIG. 38B9, they show the alternative design of the architecture and system made of the SMPS/Buck Converter. LDO typed analog buffer and H-Bridge. As shown in FIG. 38B8. FIG. 38B10 and FIG. 38B11, they show the alternative design of the architecture and system made of the SMPS/Buck Converter, H-Bridge and LDO type analog buffer. The analog buffers are embedded in the H-Bridge. A Wireless Window 5R System W5RS comprises a smart battery charger to drive battery, thin-film battery and electrochromic window, etc. The smart battery charger further comprises switch mode power supply SMPS and H-Bridge. The switch mode power supply SMPS provides power to the H-Bridge. The H-Bridge further comprises low drop-offset LDO type analog buffers and switches. The H-Bridge charges and discharges the battery and the electrochromic window with switches and low drop-offset LDO type analog buffer embedded in the H-Bridge. The low drop-offset LDO type analog buffer is either analog buffer or LDO analog buffer. The low drop-offset LDO type analog buffer further provides rippleless RF-Noiseless output power to the battery and the electrochromic window.

As shown in FIG. 38B8, FIG. 38B9, FIG. 38B10 and FIG. B11, the green energy system comprises the smart window unit for smart home and smart grid wherein the power supply controller further comprises a smart battery charger to drive battery of the electrochromic window. The smart battery charger further comprises the switch mode power supply SMPS and H-Bridge. The switch mode power supply SMPS provides power to the H-Bridge. The switching mode power supply has input connected to power and output connected to the H-Bridge. The H-Bridge further comprises the low drop-offset LDO type analog buffer and switches. The switches connect to the battery and electrochromic window. The H-Bridge charges and discharges the battery and the electrochromic window with the switches and the low drop-offset LDO type analog buffer embedded in the H-Bridge having output connected to the switches to control the gate voltage of the switches. The low drop-offset LDO type analog buffer is either the analog buffer or the LDO analog buffer. The low drop-offset LDO type analog buffer further provides rippleless RF-Noiseless output power to the battery and the electrochromic window according to specified input voltages of the analog buffer or the low drop-offset LDO type analog buffer.

FIG. 38D1 and FIG. 38D2 show the application of FIG. 37D2 being applied to the thin film battery charger/EC window controller. As shown in FIG. 38D3, the green technology integration system is made of the Voltage-Limited Current Charging circuit. It further comprises H-bridge switching Buck Converter to drive a thin film battery/Electrochromic Window. The embedded window controller sends the polarity and SMPS switching signals to the H-Bridge. There are many different ways for the combination of the polarity and SMPS switching signals. For simplicity, the PMOS signal is the SMPS signal gated by the polarity signal. The NMOS signal is the polarity signal. For the high power efficiency, both the PMOS and NMOS signals can be SMPS signal gated by the polarity signal.

Figure 39A:
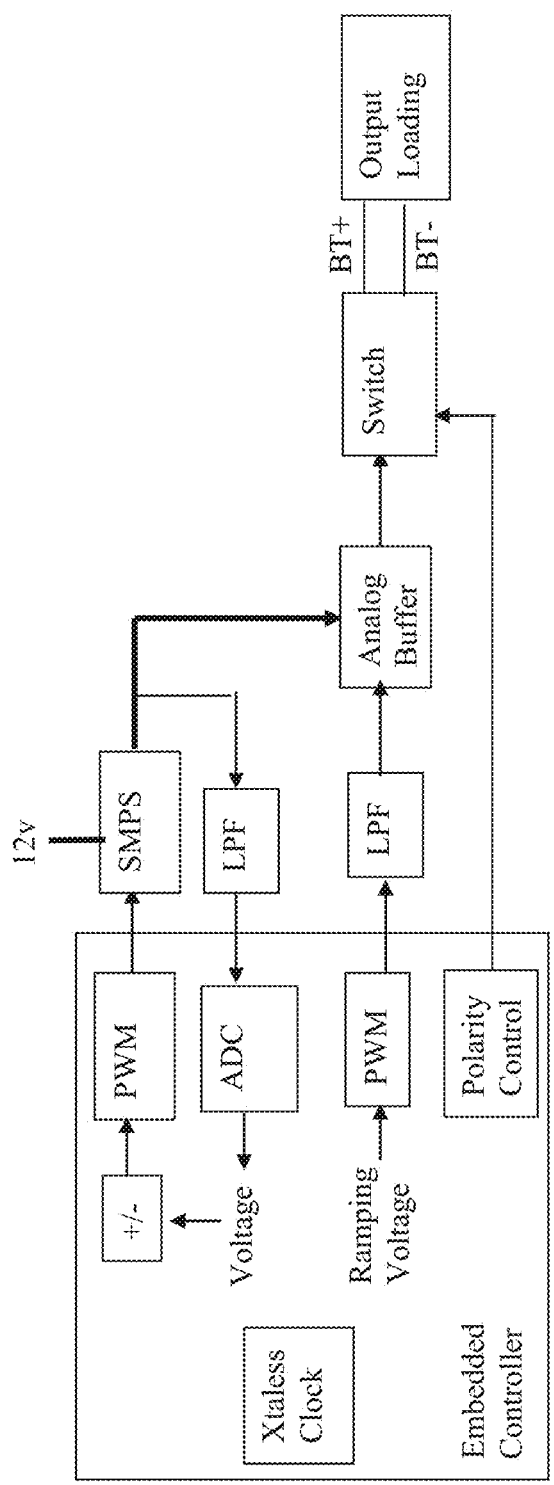
FIG. 39A is the block diagram for the current-limited super-performance battery, thin-film battery and/or voltage-ramping EC window controller, etc.
Figure 39B:
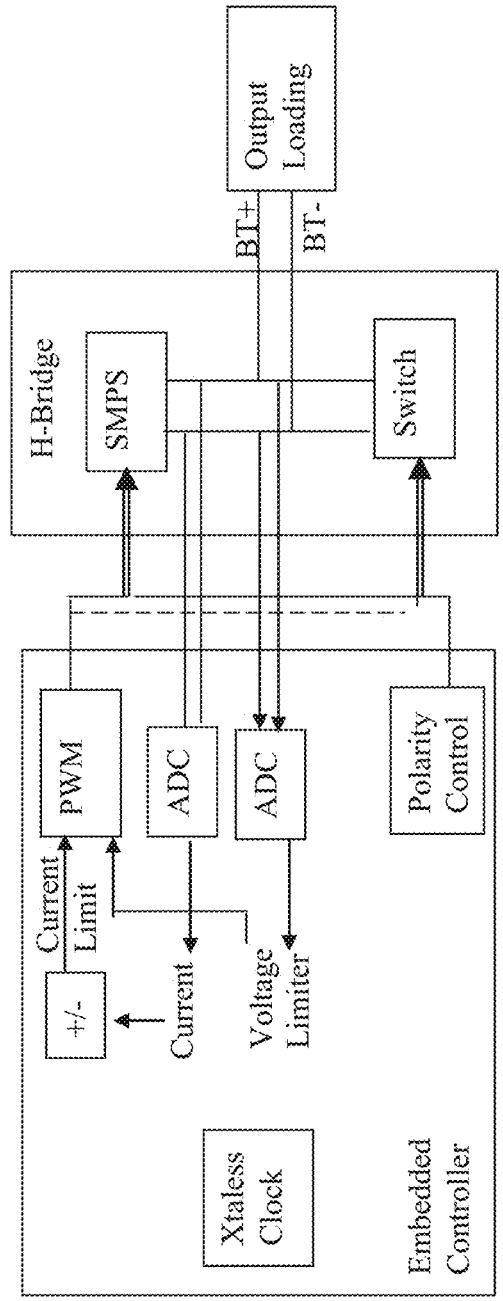
FIG. 39B is the block diagram for the current-limited super-performance battery, thin-film battery and/or voltage-limited current-charging EC window controller, etc.

The Battery Charger and/or EC window controller, etc. in the Smart Window can be independent device. As shown in FIG. 1A, the smart Battery Charger and the smart EC window 20 can be operated as either the dimmer battery/window or bi-state battery/window. As shown in FIG. 39A and FIG. 39B, the battery charger/window controller adopts the embedded controller. FIG. 39A is the system block diagram for the current-limited voltage ramping Battery Charger/EC window controller. FIG. 39B is the system block diagram for the voltage-limited current charging Battery Charger/EC window controller. In the embedded controller, there are embedded ADC and embedded Xtaless Clock. In the embedded Xtaless Clock, there are the embedded current regulators.

Figure 39E:
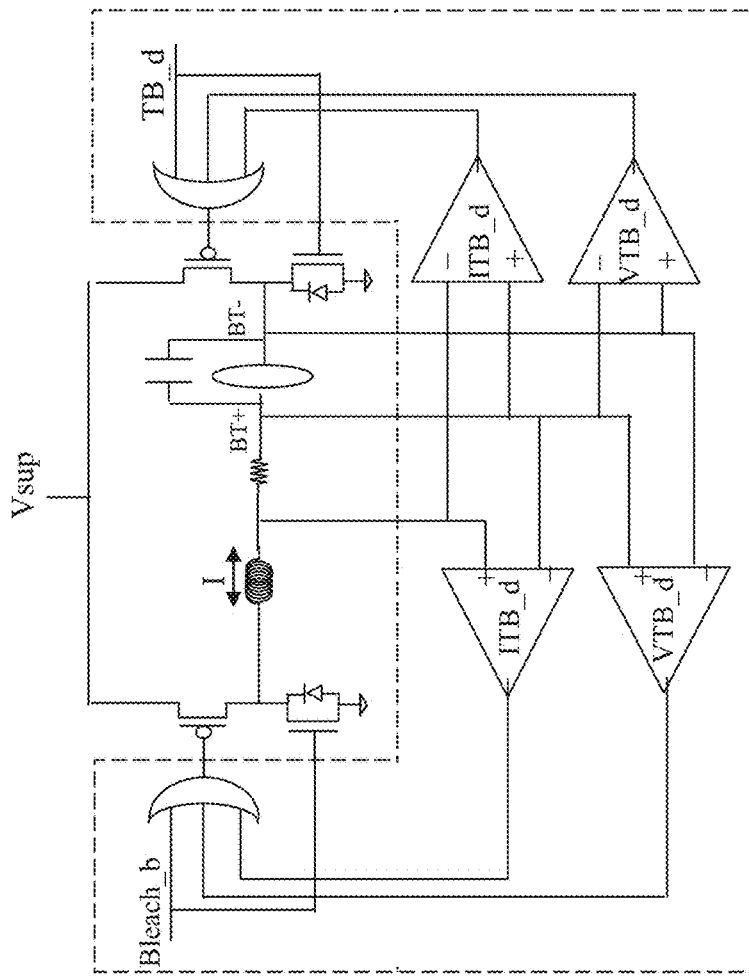
FIG. 39E is the complete super-performance battery, thin-film battery and/or EC window driver, etc. It is the super-performance battery, thin-film battery and EC window driver, etc. which can be developed to be the dedicated chip.
Figure 39C:
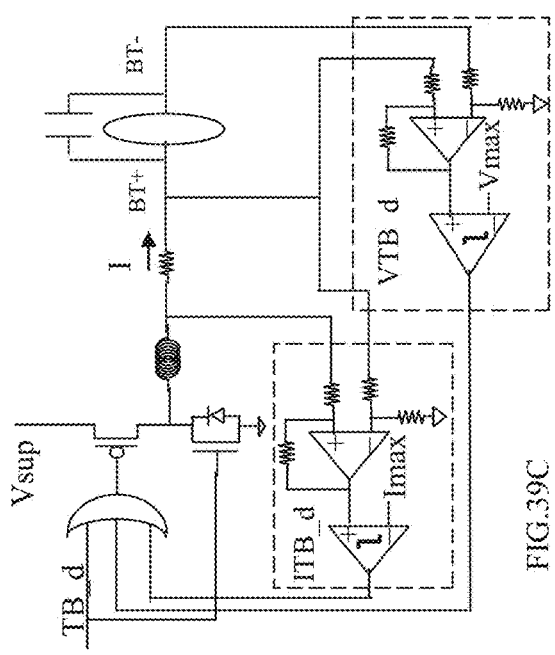
FIG. 39C is the bleaching/discharging process.
Figure 39D:
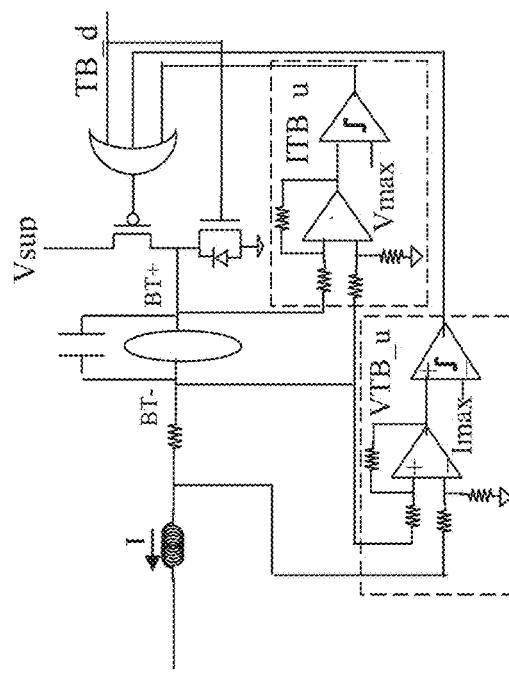
FIG. 39D is the coloring/charging process.

As shown in FIG. 39C, during the discharge/bleach, the current flows in one direction. Bleach_b is the discharge/bleach signal. The ISW_b circuit is the current-limit detect circuit to switch off the switching gate. The VSW_b circuit is the voltage-limit detect circuit to switch off the switching gate. This is the event-driven switch mode buck converter. As shown in FIG. 39D, during the color, the current flows in the reverse direction. Color_b is the charge/Color signal. The ISW_c circuit is the current-limit detect circuit to switch off the switching gate. The VSW_c circuit is the voltage-limit detect circuit to switch off the switching gate. This is the event-driven switch mode buck converter. FIG. 39E are the combinatory circuit of the FIG. 39C and FIG. 39D to be the complete Battery Charger and/or EC window controller circuit.

As shown in FIG. 21A and FIG. 40A, the Switch Mode Power supply SMPS provides the power to Low-Drop Voltage Regulator LDVR to generate the clean power. Similarly, as shown in FIG. 40B, the analog buffer of the EC window controller will filter out the switching noise of the SMPS. With the analog buffer in FIG. 40D and the H-Bridge operation in FIG. 36, the operation curve is shown as FIG. 40C. There are many ways to implement the current sensing technique. As shown in FIG. 38A, the current sensing resistor can feedback the current information to the embedded controller or the SMPS. Use the SMPS to control the current to be current-limited voltage ramping. We can also use the resistorless current sensing in the prior applications. As shown in FIG. 40D, we can also use the current limit sensor embedded in the analog buffer.

The green technology integration system is made of the Current-Limited Voltage Ramping circuit having an analog buffer to drive the Electrochromic Window with a H-bridge switch structure. As shown in FIG. 34E and FIG. 40C, the analog buffer can filter out the noise of the switch mode power supply. As shown in FIG. 40D, the analog buffer has the output stage serves as LDVR type operation. In other words, it is single side pull-up that no DC biasing current for the output stage. It will not burn the DC biasing current for the output stage as the conventional unit gain amplifier does. Furthermore, the current limit sensing mechanisms are implemented with the current mirror mechanism in the analog buffer.

Figures 41A, 41B:
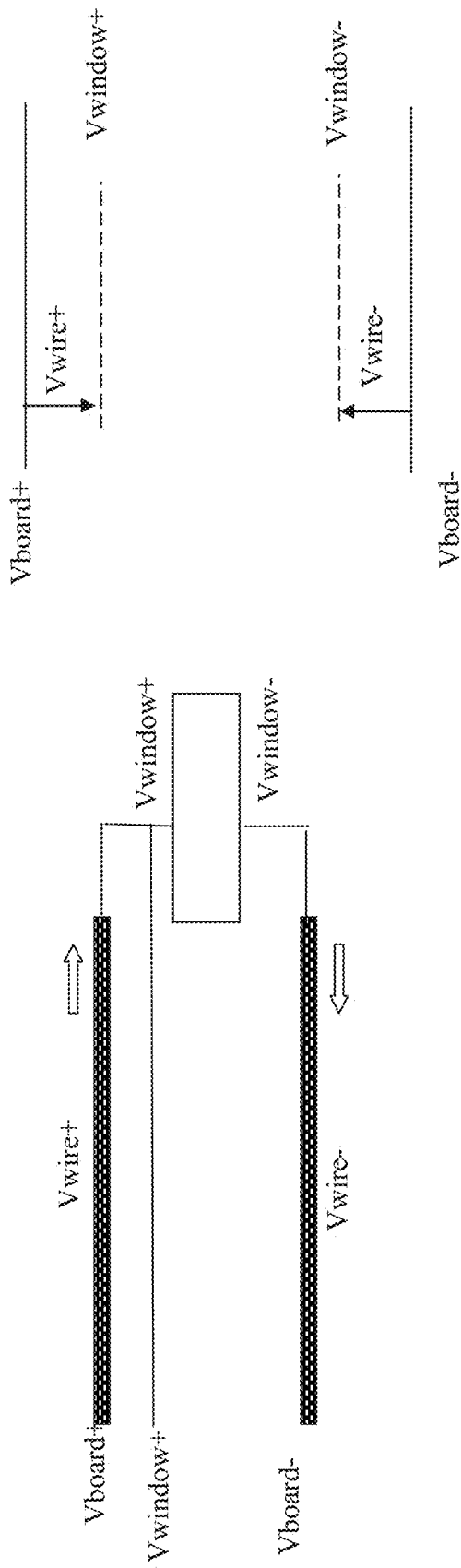
FIG. 41A is the triple-wire connection for long-distance connection to drive device.
FIG. 41B is the wire architecture of the triple-wire connection for long distance connection to drive device.

As shown in FIG. 41A, the two power wires "$V_{board+}$~$V_{window+}$", "$V_{board-}$~$V_{window-}$" and one single wire "$V_{window+}$~$V_{window+}$" constituted to be one triple-wire. As shown in FIG. 41B, the window voltage Vwindow can be calculated as $$V_{window} = 2*V_{window+} - (V_{board+} + V_{board-})$$

A Green Energy Smart Window 5R System W5RS means further comprises a micro-inverter to convert Solar window harvesting solar energy to be electric energy. The micro-inverter adopts in-phase power injection to inject the energy. It increases the amplitude of injected energy waveform in phase. It minimizes the phase interruption of the injected energy waveform. The amplitude in the AC oscillator is the energy of the AC oscillator. As the current injects into the AC oscillator, the phase of the AC oscillation will not be influenced to be In-Phase injection. FIG. 42A shows the "In-Phase Current Injection" into the AC oscillation. The amplitude of AC oscillation increases as "In-Phase Current Injection" into the AC oscillation. FIG. 42B1 is the circuit having the "In-Phase Current Injection" into the AC oscillation. The current is injected at the peak voltage of the AC oscillation. FIG. 42B2 is the circuit having the "In-Phase Current Injection" to inject the current into the AC oscillation at the valley voltage of the AC oscillation. As shown in FIG. 42B1, the boost converter injects the current into the AC oscillation. As the Peak Detector detects the peak of AC waveform, the peak detector switches off the NMOS and switch on the PMOS, the inductor injects the inductor current into AC oscillator. As shown in FIG. 42B2, the buck-boost converter extracts the current out of the AC oscillation at the valley. As the Valley Detector detects the valley of AC waveform, the valley detector switches off the NMOS and switch on the PMOS, the inductor extracts the inductor current out of the AC oscillator. It pulls down the valley to increase the amplitude of the AC oscillation.

The same principle can be applied to the conjugated circuit to extract the energy from the AC oscillator. As the current extract the energy out of the AC oscillator at either the peak or valley of AC waveform, the phase of the AC oscillation will not be influenced to be In-Phase extraction. FIG. 43A shows the "In-Phase Current extraction" out of the AC oscillation. The amplitude of AC oscillation decreases as "In-Phase Current extraction" out of the AC oscillation. FIG. 43B1 is the circuit to have the "In-Phase Current extraction" out of the AC oscillation at the peak voltage of the AC oscillation. FIG. 43B2 is the circuit to have the "In-Phase Current Extraction" out of the AC oscillation at the valley voltage of the AC oscillation. As shown in FIG. 43B1, the buck-boost converter extracts the current out of the AC oscillation. As the Peak Detector detects the peak of AC waveform, the peak detector switches off the NMOS and switch on the PMOS, the inductor extracts the inductor current out of AC oscillator. As shown in FIG. 43B2, the buck converter injects the current into the AC oscillation at the valley. As the Valley Detector detects the valley of AC waveform, the valley detector switches off the NMOS and switches on the PMOS, the inductor injects the inductor current into the AC oscillator to push up the valley to decrease the amplitude of the AC oscillation.

W5RS is the platform for the multiple standards. Referring to FIG. 1L1, FIG. 44A and FIG. 44B, W5RS has the 5R: Resonant Resynchronization Rectifier Regulator. It has %% Power Efficiency. The circuit enclosed in the dotted lines are optional. As shown in FIG. 44A, FIG. 44B, FIG. 45H1, FIG. 45I1, FIG. 45J1 and FIG. 45K, the Wireless Window 5R System W5RS comprises a wireless power supply 5R Recycling Resonant Resynchronization Rectifier Regulator. The wireless power supply, Recycling Resonant Resynchronization Rectifier Regulator 5R, is connected between LC resonator means and DC output loading, etc. The 5R converts energy in the LC resonator to be DC power to supply DC output loading. The 5R has only one single stage. It integrates conventional rectifier, DC/DC converter and LDO three stages to be a single stage AC/DC converter. The 5R further comprises capacitors biased at different threshold voltage level to have boost voltage. The boost voltage recycles the resonating energy in the LC resonator to turn on switch devices synchronously. The capacitors have one end been connected to output terminal of the LC resonator and another end been connected to switching MOS devices of rectifier.

The Green Energy Smart Window 5R System W5RS comprises a wireless power supply Recycling Resonant Resynchronization Rectifier. The capacitors are connected between the terminals of the LC resonator and switches. The switch is weakly biased at proper biasing voltages. As the LC resonator resonates, the capacitors drive the switch to switch-on and switch-off the switch device. Furthermore, the switching energy of capacitor is recycled through the LC resonator.

As shown in FIG. 44A, FIG. 44B, FIG. 45H1, FIG. 45I1, FIG. 45J1, FIG. 45K, FIG. 45L1, FIG. 45L2, FIG. 45L3, FIG. 45L4, FIG. 45L5 and FIG. 45M, the green energy system comprises a smart window unit for smart home and smart grid wherein said wireless charging power supply circuit further comprises a Recycling Resonant Resynchronization Rectifier Regulator 5R wireless power supply. The Recycling Resonant Resynchronization Rectifier Regulator 5R wireless power supply has only one single stage integrating the conventional rectifier, DC/DC switch mode power and LDO three stages to be single stage AC/DC converter. The Recycling Resonant Resynchronization Rectifier Regulator 5R wireless power supply is a passive switch mode power supply to charge up an output load. The Recycling Resonant Resynchronization Rectifier Regulator 5R wireless power supply is connected between the LC resonator and DC output loading. The Recycling Resonant Resynchronization Rectifier Regulator 5R wireless power supply converts energy in the LC resonator to be DC power to supply the DC output loading. The Recycling Resonant Resynchronization Rectifier wireless power supply further comprises LC resonator, switches and capacitors. The switches are connected in a circuit as bridge rectifier. The capacitors are connected between the ends of the LC resonator. The capacitors boost gate voltages of the switches to reduce switch-on resistance of the switches. The gate of the switch are biased at the threshold voltage of the switch to turn on and off the switch instantly as the LC resonator oscillates. As the LC resonator resonates, the capacitors drives the switch with switching energy to switch-on and switch-off the switches to perform rectifying function, the switching energy of the capacitor is recycled through the LC resonator. The capacitor has one end been connected to the output terminal of the LC resonator and another end is connected to the MOS_type switch of rectifier. The MOS_type switches of rectifier further comprises capacitors with switch gate voltage being biased at different level to have boost voltage to recycle resonating energy in the LC resonator to turn on and off the switches in the Recycling Resonant Resynchronization Rectifier Regulator 5R wireless power supply synchronously. The switch is weakly biased at proper biasing voltages of MOS threshold voltage. The Recycling Resonant Resynchronization Rectifier Regulator 5R wireless power supply has the wave-shaping capability. The wave-shaping shapes up the switching voltage of the switch to have the sharp rising and falling edge to reduce on-resistance of the switches in the switching transition process. At the output of the bridge rectifier is series connection of an inductor and MOS switch serving as DC/DC converter LDO.

As shown in FIG. 45A1, the W5RS has the LC oscillator made of $L_R$ and $C_R$. As shown in FIG. 45A2, the W5RS is transformed to be the serial resonator made of $L_R$ and $C_R$. As shown in FIG. 45A3, the W5RS is transformed to be the serial resonator made of $L_R$, $C_R$ and $C_{DC\#}$. The 5R further comprises LC resonator, switch and capacitors. As shown in FIG. 45A4, the W5RS is transformed to be the serial resonator with the insertion of power-loss-less switches. Comparing FIG. 44A and FIG. 44B with FIG. 45A4, the W5RS is just "single stage" power conversion. Comparing with the conventional Rectifier, DC/DC buck converter and LDO "three-stage" power conversion mechanism, the single stage W5RS is super-power-efficient to have the power efficiency 96%.

Referring to FIG. 44C, FIG. 44A and FIG. 44B, the $C_{DC}$ has the multiple functions to make the fine-tune of the Rectifier output voltage $V_{DC}$ or $V_{DC1}$. The $C_{DC}$ is fine-tuned according to the output voltage $V_{DC}$ or $V_{DC1}$ with the frequency fine-tuning relative the resonant frequency. In other words, there are three voltage fine-tuning mechanisms, (1) the rectifier output voltage fine-tuning mechanism, (2) the DC/DC output voltage fine-tuning mechanism and (3) the LDO output voltage fine-tuning mechanisms. The closer the output voltages are, the higher the power efficiency is. The smaller the capacitor $C_{DC}$ and $C_{DC\#}$ are, the higher the power efficiency is. For the limited case, the capacitor $C_{DC}$ and $C_{DC\#}$ are eliminated that the rectifier, DC/DC and LDO are merged to be one single stage 5R Recycling Resonant Resynchronization Rectifier Regulator.

Referring to FIG. 45C2A and FIG. 44B, the threshold voltage Vth,n will decrease the power efficiency of the Rectifier and DC/DC conversion. Referring to FIG. 45C2A and FIG. 44C, $VR_{U1}$, $VR_{U2}$, $VR_{B1}$ and $VR_{B2}$ are biased at the proper voltage. $VR_{U1}$ and $VR_{U2}$ are biased at the voltage to be the sum of the $V_{DC}$ and Vth,n. $VR_{U2}$ and $VR_{B2}$ are biased at the voltage to be the sum of the Ground and Vth,n. i.e., Vth,n. With the proper bias of $VR_{U1}$, $VR_{U2}$, $VR_{B1}$ and $VR_{B2}$, under the boost kick of capacitors $CR_{U1}$, $CR_{U2}$, $CR_{B1}$ and $CR_{B2}$, The 5R power efficiency increases a lot in FIG. 45C2B. Furthermore, as shown in FIG. 45B1 and FIG. 45B2, the $S_{U1}$, $S_{U2}$, $S_{B1}$, $S_{B2}$, $S_{DC1}$ and $S_{DC2}$ gates voltages are recycling with the synchronizing resonant energy. $S_{U1}$, $S_{U2}$, $S_{B1}$ and $S_{B2}$ are boosted up by the recycling energy of $L_R$ and $C_R$. $S_{DC1}$ and $S_{DC2}$ are boosted up by the sampled and hold recycling energy of $L_R$ and $C_R$. Therefore, the 5R power efficiency can be as high as 96%.

The 5R is compatible to both WPC Wireless Power Consortium Qi standard and A4WP Alliance for Wireless Power standard. (1) Due to 5R factors, the 5R can be considered as "single-stage" power conversion. (2) Due to the power recycling, the switching loss of rectifier and DC/DC power conversion, etc. are eliminated. (3) Due to wave shaping, the Rectifier operation can be considered to be switching operation instead of analog operation. Due to the above three factors, from AC to DC, the 5R has the highest power efficiency 96% in all the world.

FIG. 45D1 is the resonant voltage, current and power of the ideal resonant circuit as shown in FIG. 45D2. FIG. 45D2 is the ideal resonant circuit. The 5R can be transformed from the ideal resonant circuit to make the analysis and design. FIG. 45E1 is the resonant voltage, current and power of the resonant circuit having the diodes. FIG. 45E2 is the resonant circuit having the diodes. The Schottky diode reduces the power efficiency a lot.

To eliminate the power loss due to the Schottky diode, the active MOS devices are adopted. FIG. 45F1 is the resonant voltage, current and power of the resonant circuit having the active MOS. FIG. 45F2 is the resonant circuit having the MOS. The MOS device is not only to reduce the power loss but also to have the power factor correction PFC effect. The current of MOS device increases with the gate voltage of MOS that the MOS device has the power factor correction effect.

To reduce the loss of MOS at low voltage, the resonant voltage of LC resonator needs to sharpen the rising edge and falling edge. Therefore, the waveform shaper circuit is needed to shape up the analog sinusoidal voltage to be the digital switching voltage. FIG. 45G1 is the resonant voltage, current and power of the resonant circuit having wave-shaper switching driver. FIG. 45G2 is the resonant circuit having the wave-shaper switching driver.

Combing the above Rectifier Design & Analysis with Virtual Resonant, the Wireless Window 5R System W5RS comprises a 5R. The 5R further comprises wave-shaping and switches. The wave-shaping shapes up the switching voltage of switches to have sharp rising and falling edge. It is to reduce on-resistance of the switches in switching transition process. FIG. 45H1 is the rectifier having MOS with wave-shaper switching driver as shown in FIG. 45H2. FIG. 45H2 is the fundamental wave-shaper. The rectifier has the voltage regulating capability with the frequency tuning of the capacitor $C_{DC}$. The rectifier can stand alone as the power supply. There is no need for the DC/DC converter and regulator. FIG. 45I1 is the rectifier having regulated output voltage capability with wave-shaper switching driver as shown in FIG. 45I2. FIG. 45J2 is the mutual-latch enhanced wave-shaper.

To have multi-voltage supply capability, the inductor-free DC/DC converter technique is adopted. The DC/DC converter shares the inductor with the rectifier to recycle the energy. FIG. 45J1 is the rectifier with multi-voltage Inductor-Free DC/DC converter. FIG. 45J2 is the waveform of the multi-voltage Inductor-Free DC/DC converter. FIG. 45K is the complete set of 5R having the rectifier, multi-voltage Inductor-Free DC/DC converter and Digital/Analog Programmable LDO integrated single power-conversion stage. FIG. 45L1 is the complete schematics of the 5R having the ASP/PFC wave shaper. FIG. 45O is the generic wave shaper WS. FIG. 45P is the gate-activated wave shaper. FIG. 45Q is the source-activated switch-energy recycling wave shaper WS2. FIG. 45R is the operational analysis of wave shaper. As VR, voltage is less than $V_{out}+2V_{th,n}$, the active rectifying MOS SWR is not turned on, where m represents 1 or 2 and $V_{out}$ represents VDC. The oscillating current makes the $VR_{in}$ voltage rises up rapidly. As $VR_{in}$ voltage is larger than $V_{out}+2V_{th,n}$, the active rectifying MOS SWR is turned on and the oscillating current rushes into $L_{WS}$. The $VR_{in}$ voltage rises up rapidly due to L(di/dt). As shown in FIG. 45Q, accordingly, the $S_{xm}$ rapidly rises to switch on SWR. The on-resistance of SWR is minimized. As the resonant current reverses flowing direction, the VRm voltage decreases rapidly. As shown in FIG. 45Q, the $S_{xm}$ rapidly switches off SWR. It is the "digital switch" mode of SMPS Switch Mode Power Supply. As the ASP/PFC wave shaper increases the slopes of the rising edge and falling edge, the on-resistance and power loss are reduced a lot. Based on the same wave shaping principle, FIG. 45L2 is the alternative design of 5R circuit with Schottky Diodes. FIG. 45L3 is the alternative design of 5R circuit with active MOS. FIG. 45L4 is the alternative design of 5R circuit with Schottky Diodes. FIG. 45L5 is the alternative design of 5R circuit with active MOS. It shows the alternative design for the frequency tuning of the LC resonator. All the alternative and optional designs are circled with dotted lines. FIG. 45M is the complete schematics of the 5R having the ASP/PFC wave shaper, SMPS and A&D programmable LDO. FIG. 45N is the functional block diagram of the 5R having the ASP/PFC wave shaper, SMPS and A&D programmable LDO. It illustrates the VI In-Phase Modulation. The ASP/PFC Wave Shaper VI In-Phase Modulation makes the necessary phase modulation of the voltage V and current I from 90 degree to be in-phase. The phase modulation from 90 degree to 0 degree in-phase, it increases the power-efficiency tremendously. If the voltages of $V_{O,RECT}$, $V_{O,DC}$ and $V_{O,LDO}$ are closed enough, the inductor sends the current through the series of switch gates of rectifier, DC/DC converter and LDO. The power resistance loss is minimized. Furthermore, with the wave shaped up the switching type voltage waveform and recycling the switching energy, the rectifier has very high power efficiency as more than 96%.

There are many ways to manufacture the thin Film Battery/EC window. The Window 5R System W5RS further comprising thin film being planarized with assistance of ultrasonic wave. The deposition is cleaned with assistance of ultrasonic wave. The thin films are deposited to be layers. The layer is first deposited one interfacing layer. Then plating and hardening the interfacing layer to form a well-crystallized foundation. Then, the Layer depositing on the well-crystallized foundation to grow the layer. For the mass production, the gas reaction sputtering process is preferred. The deposition comprises a gas reaction sputtering. It comprises the ultrasonic self-cleaning target to clean passion deposition on the target.

As shown in FIG. 46A, the gas reaction sputtering has the poison effect. The sputtering material will coat on the target. As shown in FIG. 46B, it causes the unstable operation of the sputtering chamber. It causes the missing layer and debris spreading problem. To avoid the poison problem in the sputtering chamber, it uses the ultrasonic self-cleaning target. The sputtering material will be vaporized from the target instead of coating on the target. The system design of the self-cleaning sputtering chamber is as shown in FIG. 46D.

Figure 47A:
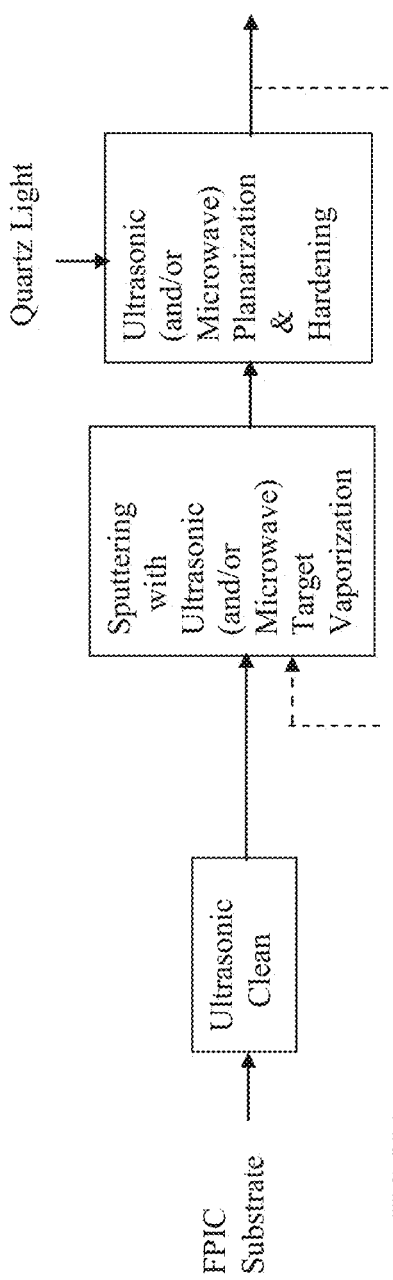
FIG. 47A is the recursive/pipeline manufacturing process for the high performance EC window manufacturing process.
Figure 47C:
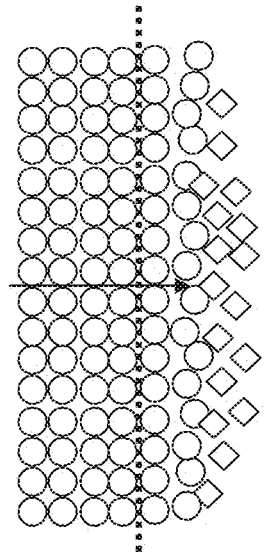
FIG. 47C is the section view with the plating and hardening process. It is the high performance EC window manufacturing process.
Figure 47B:
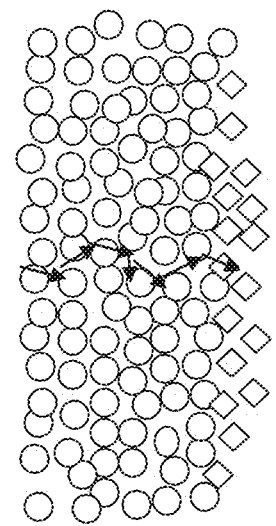
FIG. 47B is the section view without the plating and hardening process.

The general manufacture flow for the thin Film Battery/EC window is shown in FIG. 47A. Furthermore, as shown in FIG. 47A, the ultrasonic wave is not only for the self-cleaning sputtering but also for the glass cleaning, plating and hardening, etc. The ion conduction layer is plating and hardening the layer with ultrasonic. As shown in FIG. 47B, the thin film battery, solar window and/or EC window layer grows the ion conduction layer without the plating and hardening. As shown by the solid line, the ion path zigzag and the ion has low speed. It causes the switch of the battery and/or EC window taking a much longer time. As shown in FIG. 47C, the EC window upper layer is deposited one thin layer. After the sputtering this thin layer, using the plating and hardening process to organized this thin interface layer. Then begin the formal sputtering of this layer. This layer will grow on the plating and hardening thin layer with the ordering way to form good crystal structure. As shown by the solid line, the ion movement is in straight line and the ion moves fast. The EC window can switch fast. The green technology integration system comprises the Layers. In general, the layers are deposited to be layers. The layer is first deposited to be one interfacing layer. Then apply the plating and hardening process to the interfacing layer to form a well-crystallized foundation. Then the Layer is deposited on the well-crystallized foundation to grow this layer. The layer is very much important for the ion conduction layer. It can increase the performance of the EC window a lot. Normally, the heating and hardening are done with the quartz light. The heating and hardening the layer with the versatile combination of the assisted ultrasonic and/or microwave have the plating effect, too. For example, the planarization platening is assisted with ultrasonic and the heating hardening is assisted with microwave.

The green energy system comprises a smart window unit for smart home and smart grid. The electrochromic window comprises an electrochromic panel. The electrochromic panel has substrate glass. On the substrate glass has the thin film being made of a plurality of layers deposited on said substrate glass. Each layer is planarized and hardening with the assistance of versatile combination of ultrasonic and microwave and deposition with assistance of ultrasonic. The thin film is deposited to be layers. The layer first is deposited as one interfacing layer, then plating and hardening said interfacing layer to form a well-crystallized foundation. Then another layer is deposited on the well-crystallized foundation to grow said another layer. Repeating the above processes successfully for a plurality of layers. The deposition comprises a gas reaction sputtering with ultrasonic self-cleaning target to clean passion deposition on the target.

FIG. 48 shows the application of the Anlinx & Milinx & Zilinx FPSOC with the 23Less Green Technology for Smart Window. As shown in FIG. 30B, FIG. 48A is the platform of the Anlinx & Milinx & Zilinx FPSOC having the 23Less Green Technology for Smart Window. As shown in FIG. 27C, FIG. 48B is the Anlinx & Milinx& Zilinx FPSOC having the IP wrapper of Noise Isolation Technology for 23Less Green Technology of Smart Window.

The green energy smart window W5RS is the new standard promoted by the innovative company Tang System. "S" is System and Supply. "W5" represents "Wireless Wireline Weave Wishful Window". "5R" represents "Recycling Resonant, Resynchronization Rectifying Regulator". "W5RS" is the killer application product of Silicon Valley and "5R" is the killer core technology of Silicon Valley. Even for the WPC Qi and A4WP wireless power supply standards, the novel single stage 5R even can have the AC/DC power efficiency as high as 95% which is the highest record in all the world. While the invention has been particularly shown and described with reference to the preferred embodiments thereof, it will be understood by those skilled in the art that various changes in form and details may be made therein without departing from the spirit and scope of the invention.

We claim:

1. A green energy system comprising a smart window unit for smart home and smart grid comprising:
   electronic components comprising control circuitry, power supply and internet devices,
   said control circuitry comprising: a processor, a multimedia window controller, an electrochromic window controller, a solar panel controller, and a power supply controller; said power supply comprising a rechargeable power supply; a wireless charging power supply circuit, an inverter circuit and a backlight circuit; said internet devices comprising a wireless internet remote access and control circuit;
   said green energy smart window having a transparent multimedia panel, an electrochromic panel and a transparent solar panel enclosed in an isolated glass unit; said transparent multimedia panel, said electrochromic panel and transparent solar panel having a whole panel size been same as said smart window;
   said smart window having three operation modes, (1) normal open mode, (2) shut mode and (3) smart phone mode;
   said electronic components being embedded in a frame of said green energy smart window unit that
   in said normal open mode having whole panel of said smart window view being clean and clear looking being transparent as a conventional dual panel window without any blockage in said open mode;
   in said shut mode having whole smart window panel light being blocked by said smart window;
   in said shut mode, said whole smart window panel light being blocked either by coloring said electrochromic panel or by darkening said transparent multimedia panel;
   in said smart phone mode having said transparent multimedia panel of said smart window working as smart phone with huge smart phone, interactive TV screen, internet access and control of said smart window;
   said green energy smart window serving as master device of said smart home and smart grid; all interactive and remote control for said smart home being through interface of said transparent multimedia panel in said smart phone mode;
   said transparent solar panel being transparent and facing outside;
   said transparent multimedia panel being facing inside room and controlled by a host serving as master device;
   in said normal open mode, said multimedia panel being transparent and having no blockage of the window view;
   said isolated glass unit comprising an exterior glass panel located at a first side facing an external light source and an interior glass panel located at a second side, opposite the first side;
   said transparent solar cell panel being positioned on said exterior glass panel in said isolated glass unit, whereby exterior light transmitting through said transparent solar cell panel and received by said electrochromic panel and said transparent multimedia panel, said transparent solar cell panel being capable of generating power to smart grid and smart window unit including the control circuitry, said rechargeable power supply, said wireless charging power supply circuit, said electrochromic panel, and said multimedia panel;
   said transparent multimedia panel being capable of displaying video being positioned on said interior glass panel in said isolated glass unit and further comprising a transparent touch screen displaying and detecting touch inputs; said green energy smart window further comprising a micro-computer to control said smart phone type Multimedia Panel; said Multimedia Panel being transparent in said open mode; said Multimedia Panel being smart phone type screen to setup, control and communication, etc in said smart phone Mode;
   said micro-computer controlled Multimedia Panel further comprising transparent touching screen to have user interactive with said Multimedia Panel; said transparent touching screen covering on a screen of said Multimedia Panel; touching on said transparent touching screen to make interaction with said Multimedia Panel through said micro-computer; said transparent touching screen laying on said interior glass panel having layer of transparent sensor to detect touching positions on said transparent touching screen;

said electrochromic panel being positioned in said isolated glass unit, and being capable of blocking received light;

said backlight providing light for said transparent multimedia panel during night;

said transparent solar panel supplying power to said smart grid through said inverter; said transparent multimedia panel having said wireless internet remote access and control circuit controlling as master device;

a mobile device charging unit comprising a wireless power pad charger inductively coupled to said wireless charging power supply circuit; and said power supply controller capable of controlling rechargeable power supply to selectively discharge current to an external electrical smart grid coupled to said smart window unit.

2. A green energy system comprising a smart window unit for smart home and smart grid comprising:

electronic components comprising control circuitry, power supply and internet devices, said control circuitry comprising: a processor, a multimedia window controller, a solar panel controller, and a power supply controller; said power supply comprising a rechargeable power supply; a wireless charging power supply circuit, an inverter circuit and a backlight circuit; said internet devices comprising a wireless internet remote access and control circuit;

said green energy smart window having a transparent multimedia panel and a transparent solar panel enclosed in an isolated glass unit; said transparent multimedia panel and transparent solar panel having a whole panel size been same as said smart window;

said smart window having three operation modes, (1) normal open mode, (2) shut mode and (3) smart phone mode;

said electronic components being embedded in a frame of said green energy smart window unit that in said normal open mode having whole panel of said smart window view being clean and clear looking as a conventional dual panel window without any blockage being transparent in said normal open mode;

in said shut mode having whole smart window panel light being blocked by said smart window;

in said shut mode, said whole smart window panel light being blocked by darkening said transparent multimedia panel;

in said smart phone mode having said transparent multimedia panel of said smart window working as smart phone with huge smart phone, interactive TV screen, internet access and control of said smart window;

said green energy smart window serving as master device of said smart home and smart grid; all interactive and remote control for said smart home being through interface of said transparent multimedia panel in said smart phone mode;

said transparent solar panel being transparent and facing outside;

said transparent multimedia panel being facing inside room and controlled by a host serving as master device;

in said normal open mode, said multimedia panel being transparent and having no blockage of the window view;

said isolated glass unit comprising an exterior glass panel located at a first side facing an external light source and an interior glass panel located at a second side, opposite the first side;

said transparent solar cell panel being positioned on said exterior glass panel in said isolated glass unit, whereby exterior light transmitting through said transparent solar cell panel and received by said transparent multimedia panel, said transparent solar cell panel being capable of generating power to smart grid and smart window unit including the control circuitry, said rechargeable power supply, said wireless charging power supply circuit and said multimedia panel;

said transparent multimedia panel being capable of displaying video being positioned on said interior glass panel in said isolated glass unit and further comprising a transparent touch screen displaying and detecting touch inputs;

said backlight providing light for said transparent multimedia panel during night;

said transparent solar panel supplying power to said smart grid through said inverter;

said wireless internet remote access and control circuit controlling said transparent multimedia panel as master device;

a mobile device charging unit comprising a wireless power pad charger inductively coupled to said wireless charging power supply circuit; and said power supply controller capable of controlling rechargeable power supply to selectively discharge current to an external electrical smart grid coupled to said smart window unit.

3. A green energy system comprising a smart window unit for smart home and smart grid comprising:

electronic components comprising control circuitry, power supply and internet devices, said control circuitry comprising: a processor, an electrochromic window controller, a solar cell panel controller, and a power supply controller; said power supply comprising a rechargeable power supply; a wireless charging power supply circuit, an inverter circuit and a backlight circuit; said internet devices comprising a wireless internet remote access and control circuit;

said green energy smart window having an electrochromic panel and a transparent solar panel enclosed in an isolated glass unit; said electrochromic panel and transparent solar panel having a whole panel size been same as said smart window;

said smart window having three operation modes, (1) normal open mode, (2) shut mode and (3) smart phone mode;

said electronic components being embedded in a frame of said green energy smart window unit that in said normal open mode having whole panel of said smart window view being clean and clear looking as a conventional dual panel window without any blockage being transparent in said open mode;

in said shut mode having whole smart window panel light being blocked by said smart window;

in said shut mode, said whole smart window panel light being blocked by coloring of said electrochromic panel;

in said smart phone mode having said smart window being controlled as slave device;

said green energy smart window serving as slave device of said smart home; all interactive and remote control for said smart home being through interface of said internet device in said smart phone mode;

said transparent solar panel being transparent and facing outside;

said smart window being controlled by host serving as a slave device in said smart phone mode;

in said normal open mode, said electrochromic panel being transparent and having no blockage of the window view;

said isolated glass unit comprising an exterior glass panel located at a first side facing an external light source and an interior glass panel located at a second side, opposite the first side;

said transparent solar cell panel being positioned on said exterior glass panel in said isolated glass unit, whereby exterior light transmitting through said transparent solar cell panel and received by said electrochromic panel and said transparent multimedia panel, said transparent solar cell panel being capable of generating power to smart grid and smart window unit including the control circuitry, said rechargeable power supply, said wireless charging power supply circuit, and said electrochromic panel;

said electrochromic panel being positioned in said isolated glass unit, and being capable of blocking received light;

said transparent solar panel supplying power to said smart grid through said inverter;

said wireless internet remote access and control circuit controlling said smart window as a slave device;

a mobile device charging unit comprising a wireless power pad charger inductively coupled to said wireless charging power supply circuit; and said power supply controller capable of controlling rechargeable power supply to selectively discharge current to an external electrical smart grid coupled to said smart window unit.

4. A green energy system comprising a smart window unit for smart home and smart grid according to claim 1 further comprises noise isolation technology, said green energy system comprising power node, ground node, analog circuit means, digital circuit means, said analog circuit means connecting between said power node and ground node;

a noise energy storage capacitor connecting between a power node of digital circuit and a ground node of said digital circuit;

said noise isolation technology comprising a P-type noise isolation circuit having P type current regulator connecting between said power node of said green energy system and said power node of said digital circuit means;

said ground node of said green energy system being connected to said ground node of said digital circuit;

noise energy being stored in said noise energy storage capacitor at said power node of said digital circuit;

from said power node of said green energy system to said power node of said digital circuit means, a regulated current of said P type current regulator being supplied to said digital circuit means through said power node of said digital circuit means;

said regulated current being regulated with an switch voltage between said power node of said green energy system and a switch of said P type current current regulator;

said switch voltage being generated with an average of voltage of said power node of said digital circuit means to maintain a pre-designed voltage level of said power node of said digital circuit means at a proper digital circuit voltage operation level.

5. A green energy system comprising a smart window unit for smart home and smart grid according to claim 4 of which said noise isolation technology comprising a N-type noise isolation circuit having N type current regulator connecting between said ground node of said green energy system and said ground node of said digital circuit means;

said power node of said green energy system being connected to said power node of said digital circuit;

noise energy being stored in said noise energy storage capacitor at said ground node of said digital circuit;

from said ground node of said green energy system to said ground node of said digital circuit means, a regulated current of said N type current regulator being drained from said digital circuit means through said ground node of said digital circuit means;

said regulated current being regulated with an switch voltage between said ground node of said green energy system and a switch of said N type current current regulator;

said switch voltage being generated with an average of voltage of said power node of said digital circuit means to maintain a pre-designed voltage level of said power node of said digital circuit means at a proper digital circuit voltage operation level.

6. A green energy system comprising a smart window unit for smart home and smart grid according to claim 1 comprises a bandgap generator, said bandgap generator generating bandgap voltage and bandgap current which being constant over a wide range of temperature;

said bandgap generator further comprising a bandgap voltage generator and bandgap current generator;

said bandgap voltage generator having bandgap current Ibg as input and generating bandgap voltage Vbg and current proportional to temperature Iptat as outputs to feed into said bandgap current generator;

said bandgap current generator having said bandgap voltage Vbg and said current proportional to temperature Iptat as inputs to generate bandgap current Ibg as an output;

said bandgap voltage generator and said bandgap current generator being coupled together as a feedback system.

7. A green energy system comprising a smart window unit for smart home and smart grid according to claim 6 further comprises xtaless clock being made of RC oscillator and bandgap generator;

said RC oscillator comprising a pair of capacitors and activating driving circuit to charge and discharge said pairs of capacitors;

said RC oscillator having said bandgap current and said bandgap voltage as input to generate reference current and reference voltage;

said reference current charging up said capacitor of said RC oscillator until said reference voltage be reached and said capacitor being discharged instantly and another capacitor of said RC oscillator being charged up with said reference current instantly; as said another capacitor being charged up to said reference voltage and being discharged instantly and said capacitor being charged up; said charging up capacitors and discharging instantly repetitively to generate oscillation of said RC oscillator;

said reference current generated from bandgap current with a current buffer made of current mirror;

said current buffer having an input reference current and an output current; said output current will be the same as said input reference current with a high gain differential amplifier;

an output MOS device of said current buffer having the same gate connection with an reference MOS device;

a source of said output MOS of said current buffer and a source of said reference MOS device being connected together;

a drain voltage of said output MOS and a drain voltage of reference MOS being input of a high gain differential amplifier;

an output of said high gain differential amplifier being connected with a gate of cascade output MOS of said current buffer;

a source of said cascade output MOS being connected with a drain of said output MOS device.

8. A green energy system comprising a smart window unit for smart home and smart grid according to claim 1 further comprises xtaless clock being made of LC oscillator and bandgap generator;

said bandgap generator generating reference voltage and reference current which being constant over wide range of temperature; said bandgap generator having said reference voltage and reference current as outputs connecting to inputs of said LC oscillator;

said LC oscillator comprising an inductor and a capacitor and active driving circuit to maintain oscillation of said LC oscillator;

said LC oscillator controlling amplitude, centerline and frequency of oscillation;

said LC oscillator being controlled to oscillate at constant frequency for a wide range of temperature;

said LC oscillator using said bandgap voltage Vbg as an input to make a common mode control and a constant amplitude control or the peak voltage control and valley voltage control to control oscillation of said LC oscillator;

said common mode control being to control a center line of said oscillation to be constant of said LC oscillator;

said constant amplitude control being to control an amplitude to be constant of said oscillation of said LC oscillator;

said peak voltage control being to control a peak voltage of said oscillation of said LC oscillator;

said valley voltage control being to control a valley voltage of said oscillation of said LC oscillator;

amplitude being controlled with constant amplitude feedback loop for said oscillation;

centerline being controlled with common mode feedback for said oscillation;

said xtaless clock having an option of a plurality of pairs of magnetic enhanced ME-LCO having said LC oscillator to be magnetic enhanced ME-LC oscillator:

said magnetic enhanced ME-LC oscillator comprising a plurality of magnetic enhanced inductor MEL;

said magnetic enhanced ME-LCO further having said magnetic enhanced inductor MEL being magnetic coupling together to have magnetic inject locking to increase Q of said oscillation;

said magnetic enhanced inductor MEL having magnetic conductive material wrapped around electric conductive wires to confine magnetic field not penetrating into package.

9. A green energy system comprising a smart window unit for smart home and smart grid according to claim 1 wherein said power supply controller further comprising an overshootless smart Hot-Swap LDO comprising brake mechanism to deliver power from high voltage power to output smoothly;

said overshootless smart Hot-Swap LDO having one error amplifier, output driver, bandgap voltage, upper reference voltage, lower reference voltage, output voltage divider and reference voltage divider;

said upper reference voltage and lower reference voltage being generated from said bandgap voltage and reference voltage divider;

said output driver driving said output voltage; said output voltage divider connecting said output voltage to ground node; said voltage divider dividing said output voltage to generate a feedback voltage;

said error amplifier having a reference voltage and said feedback voltage been connected as inputs and having an output of said error amplifier connecting to an input of said output driver;

a brake mechanism made of analog switch connecting inputs of said error amplifier to be a steering-wheel mechanism of said error amplifier; as said output and said high voltage power having large voltage difference inducing rushing current, said brake mechanism switching on said analog switch to reduce voltage difference of said inputs of said error amplifier to limit current delivering from said high voltage power to output; an output feedback voltage coming from said output; as said feedback voltage being less than said lower reference voltage, said brake mechanism reducing difference of voltage difference of said inputs of said steering-wheel mechanism; said brake mechanism having said analog switch connecting to an output of error amplifier having reference voltage and said output feedback as inputs, said output driver having PMOS type current mirror pulled by NMOS which being controlled by said error amplifier; said PMOS device having resistor biased to enable said overshootless smart Hot-Swap LDO having high speed and stable operation;

said overshootless smart LDO Hot-Swap having an option of biasing current injecting modulating biasing current in said error amplifier as said feedback voltage being not equal to said reference voltage to increase bandwidth of said error amplifier to speedup said error amplifier in correct direction in orthogonal conjugated common-mode accelerator mode; said accelerator mechanism being orthogonal conjugated with said steering-wheel mechanism to have fast reaction to ripple of output voltage, said overshootless smart Hot-Swap LDO having an option of programmable analog LDO/digital LDO mechanism, accelerator mechanism and steering-Wheel mechanism, said programmable analog LDO/digital LDO being able to programmable to be high-gain for analog LDO and high-bandwidth for digital LDO.

10. A green energy system comprising a smart window unit for smart home and smart grid according to claim 1 wherein processor further comprising Rippleless Fast Locked Frequency Phase Lock Loop FPLL, said Rippleless Fast Locked Phase Lock Loop FPLL further comprising an voltage controlled oscillator VCO, charge pump CHG, a clock-divider to divide clock and a phase frequency detector PFD generate reset signal; said Rippleless Fast Locked Phase Lock Loop FPLL embedding frequency lock in said clock-divider and embedding phase lock in said PFD;

said Rippleless Fast Locked Frequency Phase Lock Loop FPLL separating said frequency detect from phase detect; said frequency detect being performed with clock-divider, said phase frequency detector PFD being for phase detection;

said voltage controlled oscillator VCO generating clock as an output sent to said clock-divider, said clock divider having output sent to said PFD, said PFD having output sent to said charge pump CHG, said charge pump CHG sent controlled voltage through loop filter to said voltage controlled oscillator VCO to generating clock;

an input reference clock injecting said oscillator to make phase alignment of said input reference clock and oscillation of said oscillator;

said reset signal resetting said clock divider after each reset signal being generated by said phase frequency detector PFD, said Rippleless Fast Locked PLL having an option of programmable clock buffer;

said programmable clock buffer having programmable divider to divide oscillation of said oscillator to widen frequency range of output clock.

11. A green energy system comprising a smart window unit for smart home and smart grid according to claim 1 wherein said power supply controller further comprising a micro-inverter to convert said Solar Cell Panel harvesting solar energy to be electric energy, said micro-inverter adopting in-phase power injection to inject the energy with in-phase micro-inverter to increase amplitude of injected energy waveform in phase to minimize phase interruption of said injected energy waveform;

said micro-inverter further comprising peak type micro-inverter and valley type micro-inverter;

said peak type micro-inverter comprising a peak detector to inject current at peak of output voltage to have said in-phase power injection; said peak type micro-inverter having peak detector having a inductor connecting DC input node and a driving node, a N type switch connecting said driving node to ground, a P type switch connecting said driving node to AC output; as AC voltage peak being detected, said N type switch being switched off and said P type switch being switched on and power being delivered from DC power to AC output;

said valley type micro-inverter comprising valley detector to pull current at valley of output voltage to have said in-phase power injection; said valley type micro-inverter having valley detector having a N type switch connecting DC input node and a driving node, an inductor connecting between said driving node and ground; a P type switch connecting between said AC output and said driving node; as AC voltage valley being detected, said N type switch being switched off and said P type switch being switched on and power being delivered from ground to AC output.

12. A green energy system comprising a smart window unit for smart home and smart grid according to claim 1 wherein multimedia window controller further comprising optical SerDes, said optical SerDes further comprising transimpedance amplifier;

said transimpedance amplifier comprising magnetic enhanced regulated cascade ME-RGC Network, magnetic enhanced reversed triple resonant network ME-RTRN Differential Amplifier and Feedback Network;

a pair of differential inputs connected to said transimpedance amplifier comprising magnetic enhanced regulated cascade ME-RGC Network, a pair of outputs of to said transimpedance amplifier comprising magnetic enhanced regulated cascade ME-RGC Network connected to said magnetic enhanced reversed triple resonant network ME-RTRN Differential Amplifier and, a pair of outputs of said magnetic enhanced reversed triple resonant network ME-RTRN Differential Amplifier connected to a pair of inputs of Feedback Network, a pair of outputs of said Feedback Network being connected to a pair of inputs of said said magnetic enhanced reversed triple resonant network ME-RTRN Differential Amplifier;

said magnetic enhanced regulated cascade ME-RGC Network being a pair of differential regulated cascade RGC having a differential cross-coupling magnetic enhanced coupled inductor;

said magnetic enhanced reversed triple resonant network ME-RTRN Differential Amplifier being a triple resonant network TRN differential amplifier having differential cross-coupling magnetic enhanced coupled inductors;

said magnetic enhanced regulated cascade ME-RGC Network having a pair of input and sending output to a pair of input of said magnetic enhanced reversed triple resonant network ME-RTRN;

said magnetic enhanced reversed triple resonant network ME-RTRN sending output to a pair of input said Feedback Network;

a pair of output of said Feedback Network connected to a pair of said magnetic enhanced reversed triple resonant network ME-RTRN to have negative feedback to enhance bandwidth.

13. A green energy system comprising a smart window unit for smart home and smart grid according to claim 1 wherein wireless internet remote access and control circuit further comprising a high-power-efficiency conjugated power amplifier system, said conjugated power amplifier being a differential amplifier having a pair of positive input and negative input;

said conjugated power amplifier taking analog signals of positive sliced data and negative sliced data;

said conjugated power amplifier taking analog signals of positive sliced data feeding into positive input to operate at amplifier B mode and amplifier C mode;

said conjugated power amplifier taking analog signals of negative sliced data feeding into negative input to operate at amplifier B mode and amplifier C mode; said negative sliced data having same polarity as said positive sliced data;

a composite output recovering original signal at output node of said power amplifier;

said power-efficiency conjugated power amplifier system having an option to have data stream coming from baseband being sliced to be said positive sliced data and said negative sliced data with data slicer means; DACs converting said positive sliced data and said negative sliced data to be positive analog signals of positive sliced data and negative analog signal of negative sliced data, said positive analog signal being connect positive input of said conjugated power amplifier and said negative analog signal being connect negative input of said conjugated power amplifier;

said power amplifier operating at amplifier B mode and/or amplifier C mode.

14. A green energy system comprising a smart window unit for smart home and smart grid according to claim 1 wherein power supply controller further comprising Adaptive Optimum Constant On Time AOCOT switch mode power, said Adaptive Optimum Constant On Time AOCOT switch mode power controlling with the combination of voltage mode and current mode;

said switch mode power supply comprising a plurality of power charging devices such as PMOS, energy recycling devices such as NMOS and inductors;

said inductors being connected between a driving node and an output load; said power charging devices such as PMOS, energy recycling devices such as NMOS and inductors being connected at said driving node;

said power charging devices being switched with voltage mode control first, then as said voltage mode control detecting a specified low voltage to switch on said power charging devices, then said voltage mode control detecting a specified upper voltage to switch off said power charging devices, then said energy recycling devices being switched with current mode control, then as said current mode control detecting a zero voltage of drain node and inductor current continuing charging said output load, said energy recycling devices being switched on to provide recycling power to said output load;

then as said current mode control detecting zero inductor current, said energy recycling devices being switched off, then said Adaptive Optimum Constant On Time AOCOT switch mode power starting charging up with voltage mode, said voltage mode and current mode being adaptive control to have an optimum constant on time.

15. A green energy system comprising a smart window unit for smart home and smart grid according to claim 1 wherein said wireless charging power supply circuit further comprising a Recycling Resonant Resynchronization Rectifier Regulator 5R wireless power supply, said Recycling Resonant Resynchronization Rectifier Regulator 5R wireless power supply having only one single stage integrating conventional rectifier, DC/DC converter and LDO three stages to be single stage AC/DC converter; said Recycling Resonant Resynchronization Rectifier Regulator 5R wireless power supply being a passive switch mode power supply to charging up an output load;

said Recycling Resonant Resynchronization Rectifier Regulator 5R wireless power supply being connected between LC resonator and DC output loading; said Recycling Resonant Resynchronization Rectifier Regulator 5R wireless power supply converting energy in said LC resonator to be DC power to supply said DC output loading;

said Recycling Resonant Resynchronization Rectifier wireless power supply further comprising LC resonator, switches and capacitors; said switches being connected as a bridge rectifier; said capacitors being connected between ends of said LC resonator and said switches to boost gate voltages of said switches to reduce switch-on resistance of said switches; said gate of said switch being biased at threshold voltage of said switch to turn on and off said switch instantly as the LC resonator voltage oscillating;

as said LC resonator resonating, said capacitors driving said switch with switching energy to switch-on and switch-off said switches to perform rectifying function; the switching energy of said capacitor being recycled through said LC resonator; said capacitors having one end been connected to an output terminal of said LC resonator and another end being connected to gates of MOS type switches of rectifier;

said MOS type switches of rectifier further comprising capacitors with switches gate voltage being biased at different level to have boost voltage to recycle resonating energy in said LC resonator to turn on and off said switches in said Recycling Resonant Resynchronization Rectifier Regulator 5R wireless power supply synchronously;

said switch being weakly biased at proper biasing voltages; said Recycling Resonant Resynchronization Rectifier Regulator 5R wireless power supply having wave-shaping capability; said wave-shaping shaping up switching voltage of said switches to have sharp rising and falling edge to reduce on-resistance of said switches in switching transition process;

at an output of said bridge rectifier being a series connection of an inductor and MOS switch serving as DC/DC converter LDO.

16. A green energy system comprising a smart window unit for smart home and smart grid according to claim 1 wherein said power supply controller further comprising a smart battery charger to drive battery and said electrochromic window, said smart battery charger further comprising switch mode power supply SNIPS, low drop-offset LDO type analog buffer with an option of the addition of a H-Bridge for discharging;

said switch mode power supply SMPS providing power to said low drop-offset LDO type analog buffer, said low drop-offset LDC) type analog buffer providing power to said H-Bridge;

a charging and discharging voltage signal being applied to an input of said analog buffer or LDO analog buffer;

said switching mode power supply having input connected to power node; said switching mode power supply having output connected to power node of said low drop-offset LDO type analog buffer to supply power to said low drop-offset LDO type analog buffer;

said low drop-offset LDO type analog buffer having output voltage being equal to input voltage; said low drop-offset LDO type analog buffer having output connected to input of said H-Bridge;

said low drop-offset LDO type analog buffer being either analog buffer or LDO analog buffer;

said H-Bridge charging and discharging said battery and said electrochromic window with switches embedded in said H-Bridge;

said low drop-offset LDO type analog buffer further providing rippleless RF-Noiseless output power to said battery and said electrochromic window according to specified input voltages of said low drop-offset LDO type analog buffer.

17. A green energy system comprising a small window unit for smart home and smart grid according to claim 1 wherein said power supply controller further comprising a smart battery charger to drive battery and said electrochromic window, said smart battery charger further comprising switch mode power supply SMPS and H-Bridge;

said switch mode power supply SMPS providing power to said H-Bridge;

said switching mode power supply having input connected to power and output connected to said H-Bridge;

said H-Bridge further comprising low drop-offset LDO type analog buffer and switches;

said switches connecting to said battery and electrochromic window;

said H-Bridge charging and discharging said battery and said electrochromic window with said switches and said low drop-offset LDO type analog buffer embedded in said H-Bridge having output connected to said switches to control the gate voltage of said switches;

said low drop-offset LDO type analog buffer being either analog buffer or LDO analog buffer;

said low drop-offset LDO type analog buffer further providing rippleless RF-Noiseless output power to said battery and said electrochromic window according to specified input voltages of said analog buffer or said low drop-offset LDO type analog buffer.

18. A green energy system comprising a smart window unit for smart home and smart grid according to claim 1 wherein said electronic components further comprising ground-bounce-less output buffer, said ground-bounce-less output buffer further comprising a N type output device, P type output device, P type clamping mechanism and N type clamping mechanism, said N type output device connecting ground node with an output node of said ground-bounce-less output buffer;

said P type output device connecting power node with said output node of said ground-bounce-less output buffer;

said N type clamping mechanism detecting undershoot of said ground-bounce-less output buffer and turning off said N type output device; said N type clamping mechanism having N type device being biased at threshold voltage, drain of said N type device being connected to gate of said N type output devices and source of said N type device being connected to ground;

said P type clamping mechanism detecting overshoot of said ground-bounce-less output buffer and turning off said P type output device; said P type clamping mechanism having P type device being biased at threshold voltage, drain of said P type device being connected to gate of said P type output devices and source of said P type device being connected to power.

19. A green energy system comprising a smart window unit for smart home and smart grid according to claim 1 wherein said green energy smart window further comprising smart fan;

said smart fan further comprising pipe means, bladeless turbofan and temperature sensor inside frame of said green energy smart window;

said bladeless turbofan locating at opening of said pipe means and circulating air for air conditioning through said pipe means;

said temperature sensor detecting temperatures of air to activate said smart fans.

20. A green energy system comprising a smart window unit for smart home and smart grid according to claim 1 wherein said electrochromic window further comprising an electrochromic panel, said electrochromic panel having substrate glass, on said substrate glass_having thin film being made of a plurality of layers deposited on said substrate glass, each layer of said layers being planarized and hardening with option of assistance of versatile combination of ultrasonic and microwave and deposition with option of being cleaned with assistance of ultrasonic;

said thin film being deposited to be layers said layer first being deposited as one interfacing layer, then plating and hardening said interfacing layer to form a well-crystallized foundation;

then another layer of said layers depositing on said well-crystallized foundation to grow said another layer;

repeating the above processes successively for said a plurality of layers;

said deposition comprising a gas reaction sputtering further comprising ultrasonic self-cleaning target to clean passion deposition on said target.

* * * * *